United States Patent
Lee et al.

(10) Patent No.: US 11,849,630 B2
(45) Date of Patent: Dec. 19, 2023

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Eunyoung Lee, Sejong-si (KR); Soo-Byung Ko, Yongin-si (KR); Sungbum Kim, Yongin-si (KR); Jaesung Lee, Hwaseong-si (KR); Hyunjung Lee, Pohang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 601 days.

(21) Appl. No.: 17/074,493

(22) Filed: Oct. 19, 2020

(65) Prior Publication Data
US 2021/0288270 A1     Sep. 16, 2021

(30) Foreign Application Priority Data

Mar. 4, 2020  (KR) .................. 10-2020-0026896

(51) Int. Cl.
| | |
|---|---|
| H10K 85/30 | (2023.01) |
| C09K 11/06 | (2006.01) |
| C07F 15/00 | (2006.01) |
| H10K 50/11 | (2023.01) |
| H10K 101/10 | (2023.01) |

(52) U.S. Cl.
CPC ....... H10K 85/346 (2023.02); C07F 15/0086 (2013.01); C09K 11/06 (2013.01);
(Continued)

(58) Field of Classification Search
CPC .. H01K 85/346; H01K 50/11; H01K 2101/10; C09K 11/06; C09K 2211/1029;
(Continued)

(56) References Cited

U.S. PATENT DOCUMENTS

| 9,318,725 B2 | 4/2016 | Li |
| 9,385,329 B2 | 7/2016 | Li et al. |
| | (Continued) | |

FOREIGN PATENT DOCUMENTS

| CN | 108250248 A | 7/2018 |
| KR | 10-2015-0043225 A | 4/2015 |
| | (Continued) | |

*Primary Examiner* — Michael M. Bernshteyn
(74) *Attorney, Agent, or Firm* — Lewis Roca Rothgerber Christie LLP

(57) ABSTRACT

An organic electroluminescence device of an embodiment includes a first electrode, a second electrode on the first electrode, and an emission layer between the first electrode and the second electrode, wherein the emission layer includes an organometallic compound represented by Formula 1, and may show high emission efficiency properties.

20 Claims, 2 Drawing Sheets

Formula 1

(52) U.S. Cl.
CPC ............... *C09K 2211/1029* (2013.01); *C09K 2211/1044* (2013.01); *C09K 2211/185* (2013.01); *H10K 50/11* (2023.02); *H10K 2101/10* (2023.02)

(58) Field of Classification Search
CPC ....... C09K 2211/1044; C09K 2211/185; C07F 15/0086
USPC .......................................................... 428/690
See application file for complete search history.

(56) References Cited

U.S. PATENT DOCUMENTS

| | | |
|---|---|---|
| 9,923,155 B2 | 3/2018 | Li et al. |
| 10,008,679 B2 | 6/2018 | Chen et al. |
| 2018/0026210 A1* | 1/2018 | Dyatkin ................ H10K 85/40 257/40 |
| 2018/0182981 A1* | 6/2018 | Chen .................... C09K 11/025 |
| 2018/0337350 A1* | 11/2018 | Li ......................... C07F 15/006 |
| 2018/0362567 A1 | 12/2018 | Hwang et al. |
| 2019/0036042 A1* | 1/2019 | Kim ..................... H10K 85/346 |
| 2019/0074455 A1* | 3/2019 | Chen ................... C07F 15/0086 |
| 2019/0214584 A1* | 7/2019 | Chen ................... H10K 85/6572 |
| 2019/0319196 A1* | 10/2019 | Sim ...................... C07D 403/10 |

FOREIGN PATENT DOCUMENTS

| | | |
|---|---|---|
| KR | 10-2015-0118549 A | 10/2015 |
| KR | 10-2016-0012941 A | 2/2016 |
| KR | 10-2018-0077023 A | 7/2018 |
| KR | 10-2018-0137311 A | 12/2018 |

* cited by examiner

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0026896, filed on Mar. 4, 2020, the entire contents of which are hereby incorporated by reference.

BACKGROUND

1. Field

The present disclosure herein relates to an organic electroluminescence device and an organometallic compound used therein.

2. Description of the Related Art

Recently, the development of an organic electroluminescence display as an image display is being actively conducted. Different from a liquid crystal display, the organic electroluminescence display is so-called a self-luminescent display in which holes and electrons injected from a first electrode and a second electrode, respectively, recombine in an emission layer, and a light-emitting material including an organic compound in the emission layer emits light to attain display.

In the application of an organic electroluminescence device to a display, a decrease of the driving voltage, and an increase of the emission efficiency and the life of the organic electroluminescence device are desired, and developments of materials for an organic electroluminescence device stably attaining these features are being continuously investigated.

Further, the development of an organometallic compound used as a dopant material has been continued in developing a material for an emission layer, but the development of a dopant material showing high efficiency in a blue emission region is still desired.

SUMMARY

Embodiments of the present disclosure provide an organometallic compound showing excellent emission efficiency and long-life characteristics.

In addition, embodiments of the present disclosure also provide an organic electroluminescence device including an organometallic compound in an emission layer and having high efficiency and long-life characteristics.

According to an embodiment of the present disclosure, there is provided an organic electroluminescence device, including a first electrode; a second electrode disposed on the first electrode; and an emission layer disposed between the first electrode and the second electrode, wherein the emission layer includes an organometallic compound represented by Formula 1:

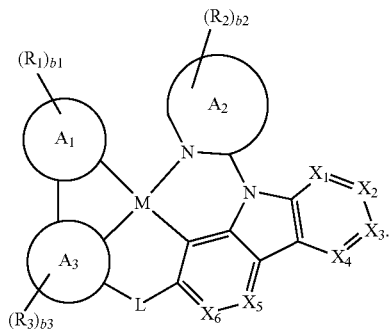

Formula 1

In Formula 1, M is a transition metal, one or two selected from $X_1$ to $X_6$ are N, and the remainder are $CR_4$, if $X_1$ is N, any one selected from among $X_2$ to $X_6$ is N, $R_4$ is a hydrogen atom, a deuterium atom, or a substituted or unsubstituted alkyl group having 1 to 10 carbon atoms, $A_1$ to $A_3$ are each independently a substituted or unsubstituted hydrocarbon ring of 5 to 60 carbon atoms for forming a ring, or a substituted or unsubstituted heterocycle of 1 to 60 carbon atoms for forming a ring, b1 to b3 are each independently an integer of 1 to 4, $R_1$ to $R_3$ are each independently a hydrogen atom, a deuterium atom, a halogen atom, a hydroxyl group, a cyano group, a nitro group, a substituted or unsubstituted silyl group, a substituted or unsubstituted amine group, a substituted or unsubstituted oxy group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 carbon atoms for forming a ring, or a substituted or unsubstituted heterocyclic group having 1 to 10 carbon atoms for forming a ring, at least one selected from among $R_1$ to $R_3$ is a deuterium atom or $CD_3$, or at least one selected from among $R_1$ to $R_3$ is substituted with a deuterium atom or $CD_3$, L is a direct linkage, O, S, $-CR_{11}R_{12}-$, $-CR_{13}=CR_{14}-C\equiv C-$, $-C(=O)-$, $-C(=S)-$, $-BR_{15}-$, $-NR_{16}-$, $-PR_{17}R_{18}-$, or $-GeR_{19}R_{20}-$, and $R_{11}$ to $R_{20}$ are each independently a hydrogen atom, a deuterium atom, a halogen atom, a substituted or unsubstituted alkyl group having 1 to 30 carbon atoms, or a substituted or unsubstituted aryl group having 6 to 30 carbon atoms for forming a ring.

In an embodiment, M may be Pt, Pd, Cu, or Os.

In an embodiment, the emission layer may emit phosphorescence.

In an embodiment, the emission layer may include a host and a dopant, and the dopant may include the organometallic compound represented by Formula 1.

In an embodiment, Formula 1 may be represented by the following Formula 2-1 or Formula 2-2:

Formula 2-1

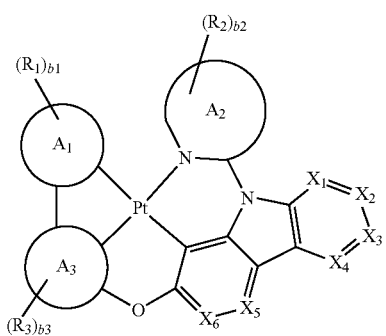

Formula 2-2

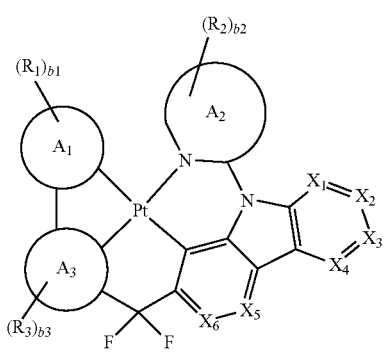

In Formula 2-1 and Formula 2-2, $A_1$ to $A_3$, $X_1$ to $X_6$, $R_1$ to $R_3$, and $b_1$ to $b_3$ are the same as defined with respect to Formula 1.

In an embodiment, Formula 1 may be represented by the following Formula 3:

Formula 3

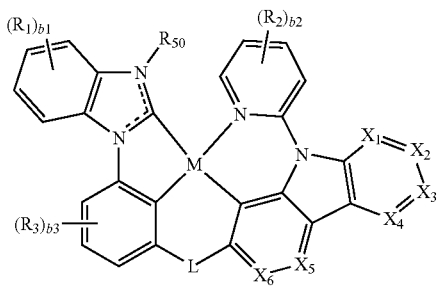

In Formula 3, $R_{50}$ is a hydrogen atom, a deuterium atom, a halogen atom, a substituted or unsubstituted alkyl group having 1 to 30 carbon atoms, or a substituted or unsubstituted aryl group having 6 to 30 carbon atoms, and M, L, $X_1$ to $X_6$, $R_1$ to $R_3$, and $b_1$ to $b_3$ are the same as defined with respect to Formula 1.

In an embodiment, Formula 3 may be represented by the following Formula 3-1:

Formula 3-1

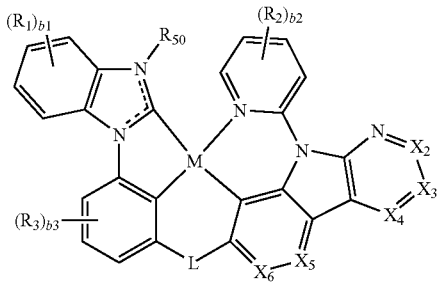

In Formula 3-1, any one selected from among $X_2$ to $X_6$ is N, and the remainder are $CR_4$, and M, L, $R_1$ to $R_4$, $R_{50}$ and $b_1$ to $b_3$ are the same as defined with respect to Formula 3.

In an embodiment, Formula 3 may be represented by the following Formula 3-2 or Formula 3-3:

Formula 3-2

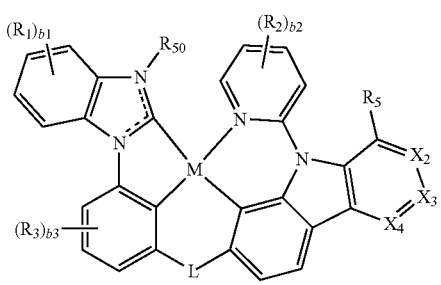

Formula 3-3

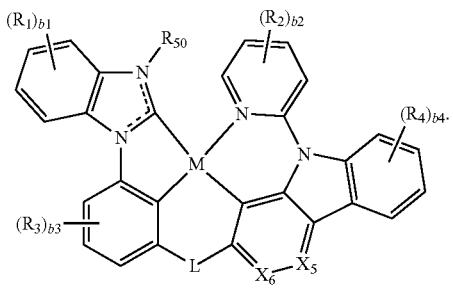

In Formula 3-2, any one selected from among $X_2$ to $X_4$ is N, and the remainder are $CR_4$, and $R_5$ is a hydrogen atom, a deuterium atom, or a substituted or unsubstituted alkyl group having 1 to 10 carbon atoms, and in Formula 3-3, any one selected from among $X_5$ and $X_6$ is N, and the remainder is $CR_6$, $b_4$ is an integer of 1 to 4, $R_6$ is a hydrogen atom, a deuterium atom, or a substituted or unsubstituted alkyl group having 1 to 10 carbon atoms, and M, L, $R_1$ to $R_4$, $b_1$ to $b_3$, and $R_{50}$ are the same as defined with respect to Formula 3.

In an embodiment, $R_{50}$ may be represented by any one selected from among compounds represented in the following Compound Group R:

Compound Group R
R-1 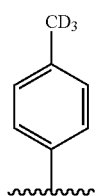
R-2 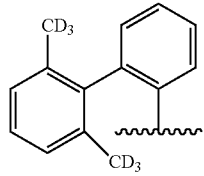
R-3 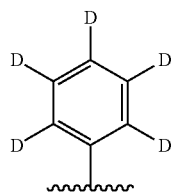
R-4 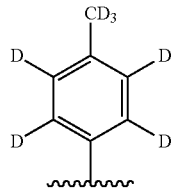
R-5 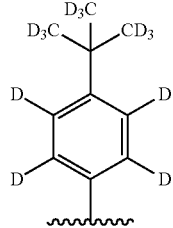
R-6 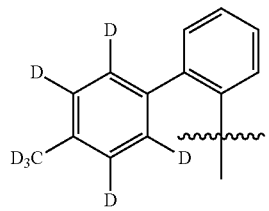
R-7 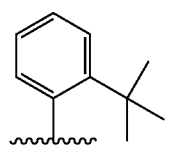
R-8 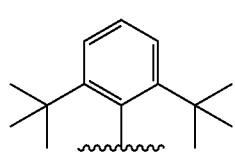
R-9 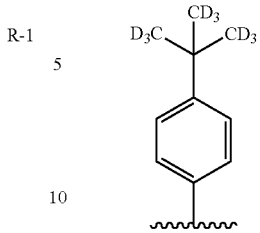
R-10 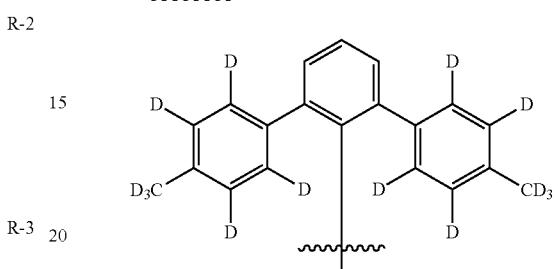
R-11 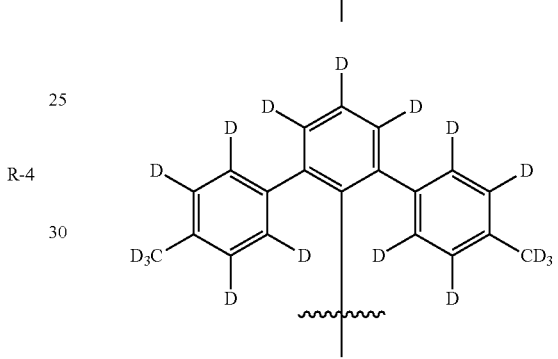
R-12 
R-13 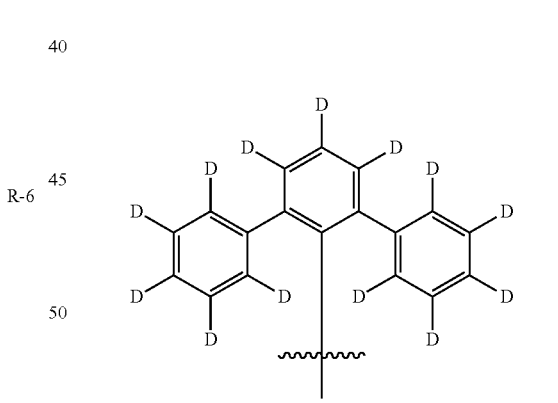
R-14 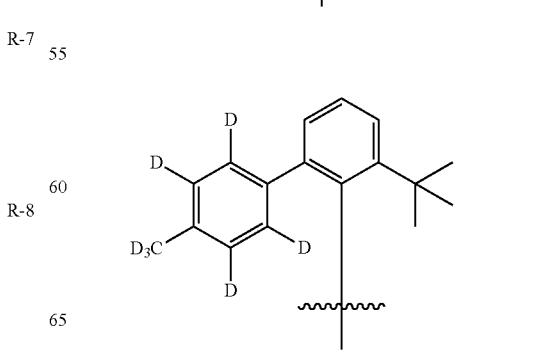

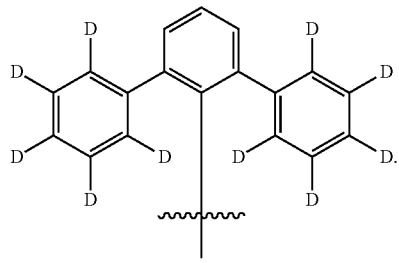

R-15

In an embodiment, if $R_{50}$ is Compound R-7 or R-8, $R_1$ may include at least one deuterium atom.

According to an embodiment of the present disclosure, there is provided an organometallic compound represented by Formula 1.

BRIEF DESCRIPTION OF THE FIGURES

The accompanying drawings are included to provide a further understanding of the present disclosure and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
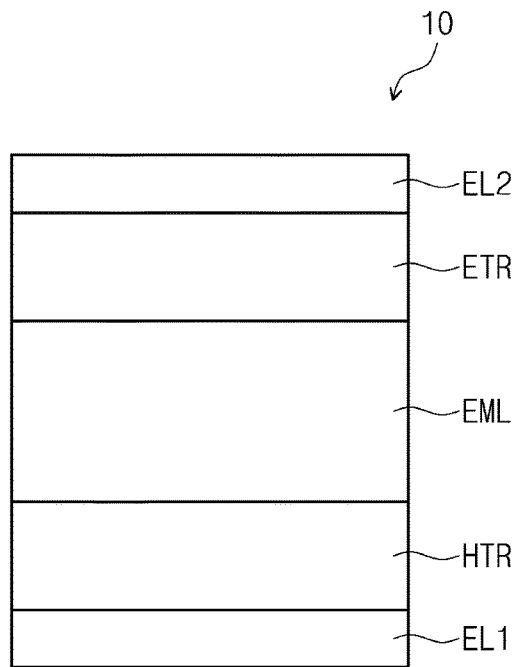
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the appended claims, and equivalents thereof.

It will be understood that when an element (or region, layer, part, etc.) is referred to as being "on," "connected to," or "coupled to" another element, it can be directly on, directly connected to, or directly coupled to the other element or a third intervening element may be present.

Like reference numerals refer to like elements throughout. In addition, in the drawings, the thickness, the ratio, and the dimensions of constituent elements may be exaggerated for effective explanation of certain features.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the scope of the present disclosure. Similarly, a second element could be termed a first element. As used herein, the singular forms are intended to include the plural forms as well, unless the context clearly indicates otherwise.

In addition, the terms "below," "beneath," "on," and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, acts, operations, elements, parts, or the combination thereof, but do not preclude the presence or addition of one or more other features, numerals, acts, operations, elements, parts, or the combination thereof.

Hereinafter, the organic electroluminescence device according to an embodiment of the present disclosure and a compound of an embodiment, included therein will be explained with reference to attached drawings.

FIG. 1 to FIG. 4 are cross-sectional views schematically showing organic electroluminescence devices according to exemplary embodiments of the present disclosure. Referring to FIG. 1 to FIG. 4, in an organic electroluminescence device 10 of an embodiment, a first electrode EL1 and a second electrode EL2 are oppositely located, and an emission layer EML may be between the first electrode EL1 and the second electrode EL2.

In addition, the organic electroluminescence device 10 of an embodiment further includes a plurality of functional layers between the first electrode EL1 and the second electrode EL2 in addition to the emission layer EML. The plurality of the functional layers may include a hole transport region HTR and an electron transport region ETR. For example, the organic electroluminescence device 10 according to an embodiment may include a first electrode EL1, a hole transport region HTR, an emission layer EML, an electron transport region ETR, and a second electrode EL2, stacked in order. In addition, the organic electroluminescence device 10 of an embodiment may include a capping layer CPL on the second electrode EL2.

The organic electroluminescence device 10 of an embodiment may include an organometallic compound of an embodiment, which will be further explained herein below, in the emission layer EML which is disposed between the first electrode EL1 and the second electrode EL2.

Figure 2:
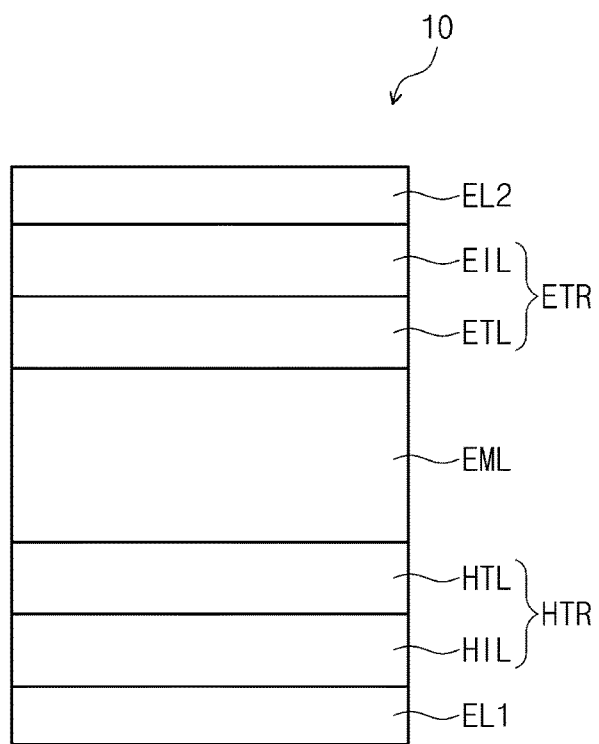
FIG. 2 is a cross-sectional view schematically illustrating an organic electroluminescence device according to an embodiment of the present disclosure.
Figure 3:
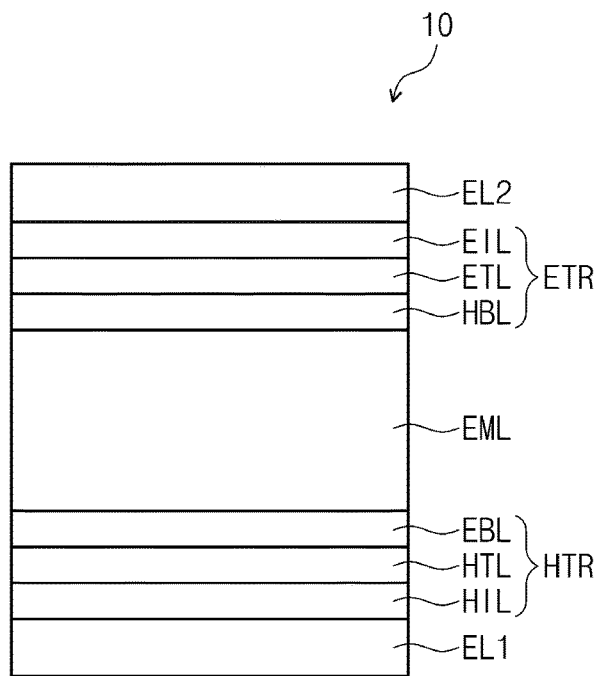
FIG. 3 is a cross-sectional view schematically illustrating an organic electroluminescence device according to an embodiment of the present disclosure.
Figure 4:
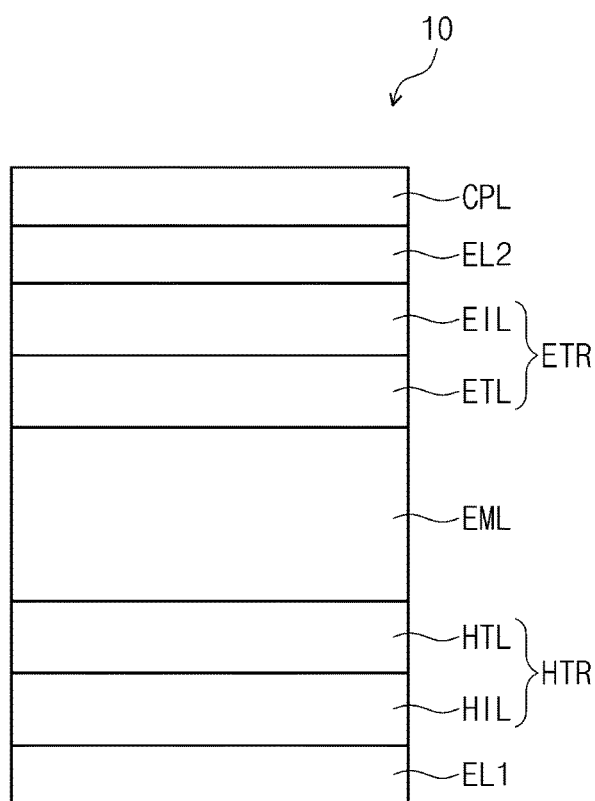
FIG. 4 is a cross-sectional view schematically illustrating an organic electroluminescence device according to an embodiment of the present disclosure.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment, including a capping layer CPL on a second electrode EL2.

The first electrode EL1 has conductivity (e.g., electrical conductivity). The first electrode EL1 may be formed using a metal alloy or a conductive compound. The first electrode EL1 may be an anode. Also, the first electrode EL1 may be a pixel electrode. The first electrode EL1 may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, and/or ITZO. For example, the first electrode EL1 may include a three-layer structure of ITO/Ag/ITO. The present disclosure, however, is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL. The thickness of the hole transport region HTR may be in a range of from about 50 Å to about 15,000 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-phenyl-4,4'-diamine (DNTPD), 4,4',4''-[tris(3-methylphenyl)phenylamino] triphenylamine (m-MTDATA), 4,4', 4''-tris(N,N-diphenylamino)triphenylamine (TDATA), 4,4', 4''-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include, for example, carbazole derivatives such as N-phenyl carbazole and/or polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4''-tris (N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be in a range from about 50 Å to about 10,000 Å, for example, from about 100 Å to about 5,000 Å. The thickness of the hole injection region HIL may be in a range of, for example, from about 30 Å to about 1,000 Å, and the thickness of the hole transport layer HTL may be from about 30 Å to about 1,000 Å. For example, the thickness of the electron blocking layer EBL may be in a range of from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and/or 2,3,5,6-tetrafluoro-7,7',8,8'-tetracyanoquinodimethane (F4-TCNQ), metal oxides such as tungsten oxide, and/or molybdenum oxide, and/or inorganic metal compounds such as CuI, and/or RbI, without limitation.

As described above, the hole transport region HTR may further include at least one of a hole buffer layer or an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer. The electron blocking layer EBL prevents or reduces electron injection from the electron transport region ETR to the hole transport region HTR.

The emission layer EML is provided on the hole transport region HTR. The emission layer EML may have a thickness in a range of, for example, about 100 Å to about 1,000 Å or from about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include an organometallic compound of an embodiment, which will be further explained herein below.

In the present description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the present description, examples of the halogen atom include a fluorine atom, a chlorine atom, a bromine atom, or an iodine atom.

In the present description, the alkyl group may be a linear, branched or cyclic alkyl group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the term "alkenyl group" means a hydrocarbon group including one or more carbon double bonds at a main chain (e.g., in the middle) or at a terminal end (e.g., the terminus) of an alkyl group having 2 or more carbon atoms. The alkenyl group may be a linear chain or a branched chain alkenyl group. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the present description, the term "alkynyl group" means a hydrocarbon group including one or more carbon triple bonds at a main chain (e.g., in the middle) or at a terminal end (e.g., the terminus) of an alkyl group having 2 or more carbon atoms. The alkynyl group may be a linear chain, a branched chain, or a ring alkynyl group. The carbon number is not specifically limited but may be 2 to 30, 2 to 20, or 2 to 10. Examples of the alkynyl group may include an ethynyl group, a propynyl group, etc., without limitation.

In the present description, the hydrocarbon ring group may be an optional functional group or substituted, which is derived from an aliphatic hydrocarbon ring, or an optional functional group or substituent derived from an aromatic hydrocarbon ring. The carbon number of the hydrocarbon ring for forming a ring may be 5 to 60, 5 to 30, or 5 to 20.

In the present description, the term "aryl group" means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the present description, the term "heterocyclic group" means an optional functional group or substituent derived from a ring including one or more heteroatoms selected from among B, O, N, P, Si and S. The heterocyclic group includes an aliphatic heterocyclic group and an aromatic heterocyclic group. The aromatic heterocyclic group may be a heteroaryl group. The aliphatic heterocycle and the aromatic heterocycle may be a monocycle or polycycle.

In the present description, the heteroaryl group may include one or more selected from among B, O, N, P, Si and S as heteroatoms. If the heteroaryl group includes two or more heteroatoms, two or more heteroatoms may be the same or different. The heteroaryl group may be a monocyclic heterocyclic group or a polycyclic heterocyclic group. The carbon number for forming a ring of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the present description, the term "silyl group" includes an alkyl silyl group, and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the present description, the oxy group may include an alkoxy group and an aryl oxy group. The alkoxy group may be a linear, branched or cyclic chain alkoxy group. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. The present disclosure, however, is not limited thereto.

In the present description, the carbon number of the amine group is not specifically limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., without limitation.

In the present description, the symbol "⁓ξ⁓" means a connected position.

The organometallic compound according to an embodiment may be represented by the following Formula 1:

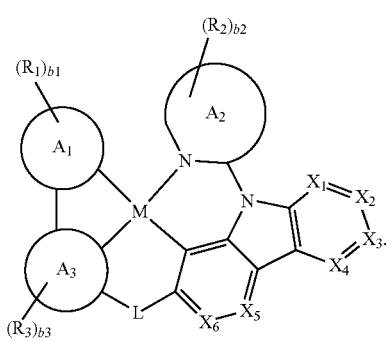

Formula 1

In Formula 1, M is a central metal element, and M is a transition metal.

In Formula 1, one or two selected from among $X_1$ to $X_6$ are N (nitrogen), and the remainder are $CR_4$. If one selected from among $X_1$ to $X_6$ is selected (e.g., is N), one selected from among $X_2$ to $X_6$ may be selected (e.g., may be N). In addition, if two selected from among $X_1$ to $X_6$ are selected (e.g., are N), $X_1$ may be selected (e.g., may be N), and one selected from among $X_2$ to $X_6$ may be selected (e.g., may be N), or two selected from among $X_2$ to $X_6$ may be selected (e.g., may be N). In Formula 1, an aromatic condensed ring in which one or two selected from $X_1$ to $X_6$ are N, and the remainder are $CR_4$, may be a carboline group.

If $X_1$ is N, at least one selected from among $X_2$ to $X_6$ is N. For example, a case where $X_1$ is N, and $X_1$ to $X_6$ are all $CR_4$, is excluded. $R_4$ is a hydrogen atom, a deuterium atom, or a substituted or unsubstituted alkyl group having 1 to 10 carbon atoms. For example, if $X_1$ is N, $X_3$ may be N, and $X_2$, $X_4$, $X_5$ and $X_6$ may be CH.

$A_1$ to $A_3$ may be each independently a substituted or unsubstituted hydrocarbon ring of 5 to 60 carbon atoms for forming a ring, or a substituted or unsubstituted heterocycle of 1 to 60 carbon atoms for forming a ring. For example, $A_1$ and $A_2$ may be each independently a heteroaryl group having 5 to 10 carbon atoms for forming a ring, and $A_3$ may be an aryl group having 5 to 10 carbon atoms.

b1 to b3 are each independently an integer of 1 to 4. If b1 to b3 are integers of 2 or more, a plurality of $R_1$ to $R_3$ may be each independently the same, or at least one thereof may be different. For example, if b1 is an integer of 2 or more, a plurality of $R_1$ may be the same, or at least one $R_1$ may be different from the remaining $R_1$.

$R_1$ to $R_3$ may be each independently a hydrogen atom, a deuterium atom, a halogen atom, a hydroxyl group, a cyano group, a nitro group, a substituted or unsubstituted silyl group, a substituted or unsubstituted amine group, a substituted or unsubstituted oxy group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 carbon atoms for forming a ring, or a substituted or unsubstituted heterocyclic group having 1 to 10 carbon atoms for forming a ring.

At least one selected from among $R_1$ to $R_3$ may be a deuterium atom or $CD_3$, or at least one selected from among $R_1$ to $R_3$ may be substituted with a deuterium atom or $CD_3$. "D" may be a deuterium atom. For example, if b1 is an integer of 2 or more, a plurality of $R_1$ may be deuterium atoms. Differently, $R_1$ may be an aryl group substituted with a deuterium atom.

For example, $R_2$ may be a t-butyl group or a methyl group substituted with three deuterium atoms. $R_3$ may be a hydrogen atom or a t-butyl group. In addition, $R_3$ includes a phenyl group substituted with an alkyl group, where the alkyl group may be any one selected from among a methyl group, an isopropyl group, and a methyl group substituted with a deuterium atom. These are only illustrations, however, and the present disclosure is not limited thereto.

L may be a direct linkage, O, S, $—CR_{11}R_{12}—$, $—CR_{13}=CR_{14}—$, $—C{\equiv}C—$, $—C(=O)—$, $—C(=S)—$, $—BR_{15}—$, $—NR_{16}—$, $—PR_{17}R_{18}—$, or $—GeR_{19}R_{20}—$. For example, L may be an oxygen atom.

$R_{11}$ to $R_{20}$ may be each independently a hydrogen atom, a deuterium atom, a halogen atom, a substituted or unsubstituted alkyl group having 1 to 30 carbon atoms, or a substituted or unsubstituted aryl group having 6 to 30 carbon atoms for forming a ring.

In the organometallic compound of an embodiment, represented by Formula 1, one or two selected from among $X_1$ to $X_6$ are nitrogen atoms, and an improved metal to ligand charge transfer (MLCT) ratio may be shown. The organometallic compound of an embodiment shows a high MLCT ratio and, if used as a material for an emission layer, may contribute to the increase of the efficiency of an organic electroluminescence device. The MLCT ratio in the description refers to a triplet metal to ligand charge transfer ($^3$MLCT) ratio and shows a relative ratio based on a case where 100% charge transfer is carried out from a metal atom to a ligand.

In addition, the organometallic compound of an embodiment includes a deuterium atom as a substituent, and if used as a material for an emission layer, device characteristics including improved life and efficiency may be shown.

In Formula 1, M may be a metal atom which is combined with four-coordination bonded ligands. M may be a metal atom such as platinum (Pt), palladium (Pd), copper (Cu), or osmium (Os), and, for example, M may be Pt.

In some embodiments, Formula 1 may be represented by Formula 2-1 or Formula 2-2. Formula 2-1 corresponds to an organometallic compound of Formula 1, in which a metal atom M is Pt, and L is O. Formula 2-2 corresponds to an organometallic compound of Formula 1, in which a metal atom M is Pt, and L is $—CR_{11}R_{12}—$, wherein $R_{11}$ and $R_{12}$ are all fluorine atoms.

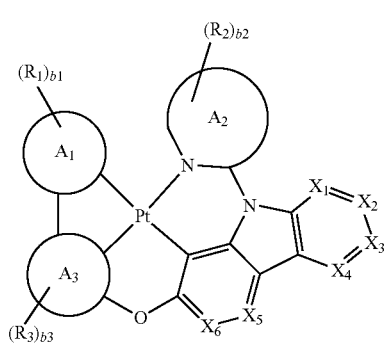

Formula 2-1

Formula 2-2

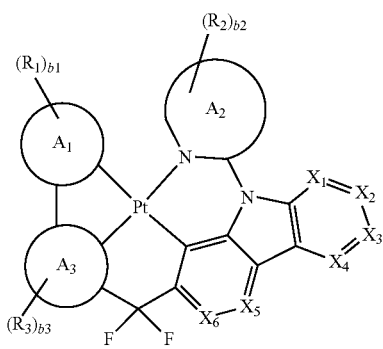

In Formula 2-1 and Formula 2-2, the same explanation for $X_1$ to $X_6$, $R_1$ to $R_3$, and $b_1$ to $b_3$ provided with respect to Formula 1 may be respectively applied to each. In addition, Formula 1 may be represented by Formula 3 below. Formula 3 represents Formula 1 where $A_1$ to $A_3$ are aromatic rings. In Formula 3, $A_1$ is imidazole, $A_2$ is pyridine, and $A_3$ is an aryl group.

Formula 3

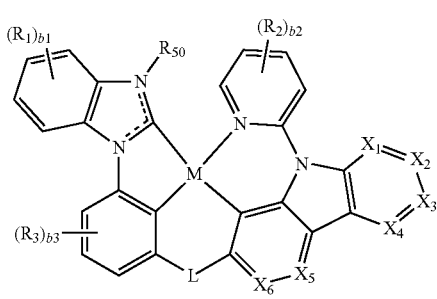

In Formula 3, $R_{50}$ may be a hydrogen atom, a deuterium atom, a halogen atom, a substituted or unsubstituted alkyl group having 1 to 30 carbon atoms, or a substituted or unsubstituted aryl group having 6 to 30 carbon atoms.

For example, $R_{50}$ may include any one selected from among a deuterium atom and an aromatic ring. $R_{50}$ may be a methyl group substituted with a deuterium atom, or an aryl group substituted with a deuterium atom. $R_{50}$ may be a phenyl group substituted with two isopropyl groups, or a phenyl group substituted with one or two phenyl groups. The one or two phenyl groups may include the deuterium atom as a substituent, and all hydrogen atoms of the phenyl group may be substituted with the deuterium atoms. These are only illustrations, however, and the present disclosure is not limited thereto.

In Formula 3, with respect to M, L, $X_1$ to $X_6$, $R_1$ to $R_3$, and $b_1$ to $b_3$, the same explanation provided with respect to Formula 1 may be applied.

Formula 3 may be represented by Formula 3-1 below. Formula 3-1 represents Formula 3 where two selected from among $X_1$ to $X_6$ are N.

Formula 3-1

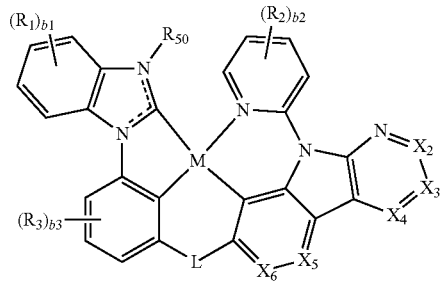

In Formula 3-1, $X_1$ is N, any one selected from among $X_2$ to $X_6$ may be N, and the remainder may be $CR_4$. For example, $X_1$ and $X_3$ may be N, and $X_2$, $X_4$, $X_5$ and $X_6$ may be CH.

In Formula 3-1, with respect to M, L, $R_1$ to $R_4$, $R_{50}$ and $b_1$ to $b_3$, the same explanation provided with respect to Formula 3 may be applied.

In addition, Formula 3 may be represented by Formula 3-2 or Formula 3-3 below. Different from Formula 3-1, one selected from among $X_1$ to $X_6$ is N, and Formula 3-2 and Formula 3-3 represent cases where $X_1$ is $CR_5$, any one selected from among $X_2$ to $X_6$ is N, and the remainder are $CR_4$.

Formula 3-2

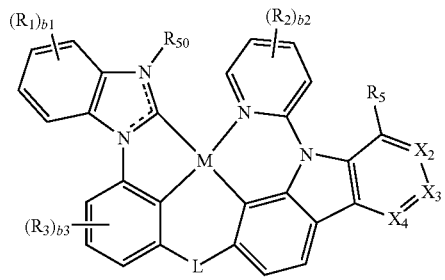

Formula 3-3

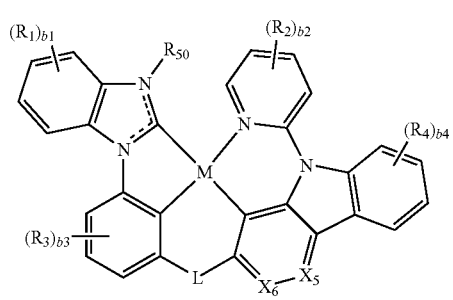

In Formula 3-2, any one selected from among $X_2$ to $X_4$ may be N, and the remainder may be $CR_4$. For example, $X_2$ may be N, and $X_3$ and $X_4$ may be $CR_4$. $R_5$ may be a hydrogen atom, a deuterium atom, or a substituted or unsubstituted alkyl group having 1 to 10 carbon atoms. For example, $R_4$ and $R_5$ may be the same as a methyl group.

In Formula 3-3, any one selected from among $X_5$ and $X_6$ may be N, and the remainder may be $CR_6$. $R_6$ may be a hydrogen atom, a deuterium atom, or a substituted or unsubstituted alkyl group having 1 to 10 carbon atoms. b4 may be an integer of 1 to 4. For example, $X_5$ may be N, $X_6$ may be CH, and $R_4$ may be a deuterium atom.

In Formula 3-2 and Formula 3-3, with respect to M, L, $R_1$ to $R_4$, $b_1$ to $b_3$, and $R_{50}$, the same explanation provided with respect to Formula 3 may be applied.
In some embodiments, $R_{50}$ may be represented by any one selected from among the compounds in the following Compound Group R:
Compound Group R
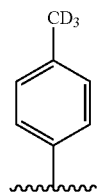
R-1
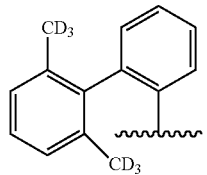
R-2
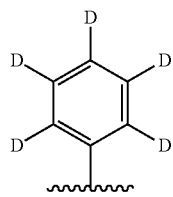
R-3
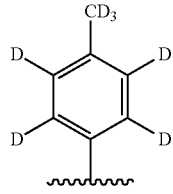
R-4
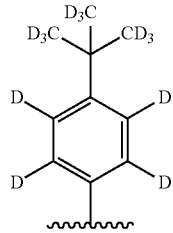
R-5
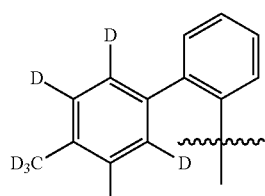
R-6
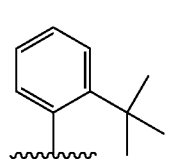
R-7
-continued
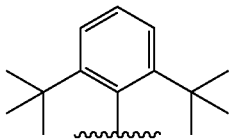
R-8
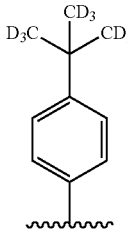
R-9
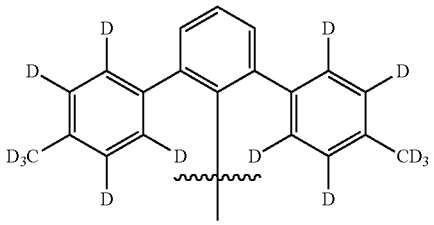
R-10
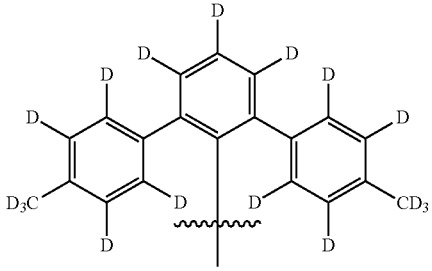
R-11
R-12
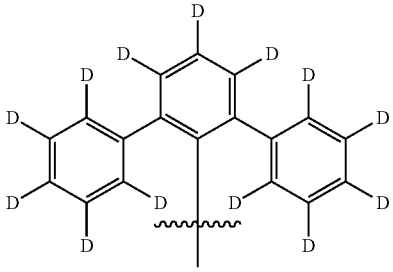
R-13
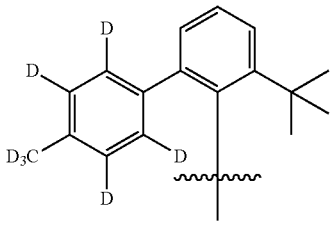
R-14

-continued

R-15

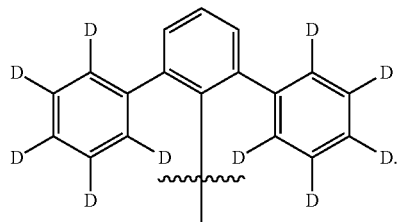

In Compound Group R, if $R_{50}$ is a compound not including a deuterium atom, $R_1$ may include a deuterium atom as a substituent. If $R_{50}$ is Compound R-7 or R-8, $R_1$ may be a deuterium atom. For example, if $R_{50}$ is Compound R-7, and b1 is 4, a plurality of $R_1$ may be all deuterium atoms.

The organometallic compound of an embodiment may be a light-emitting dopant emitting blue light. In addition, the organometallic compound of an embodiment may be a phosphorescence dopant.

The organometallic compound of an embodiment may be represented by any one selected from among the compounds represented in Compound Group 1 below. An emission layer EML may include at least one selected from among the compounds represented in the following Compound Group 1:

Compound Group 1

1

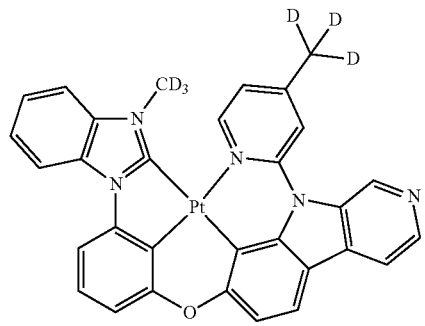

2

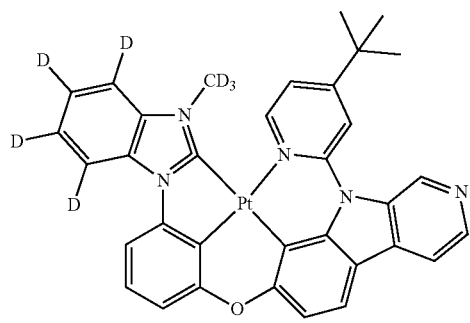

3

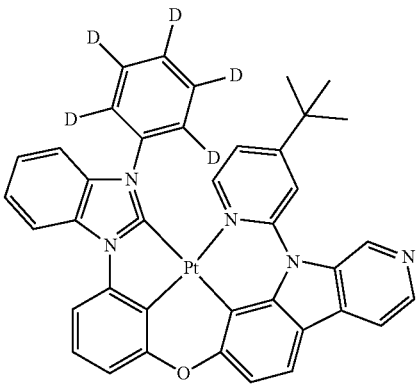

4

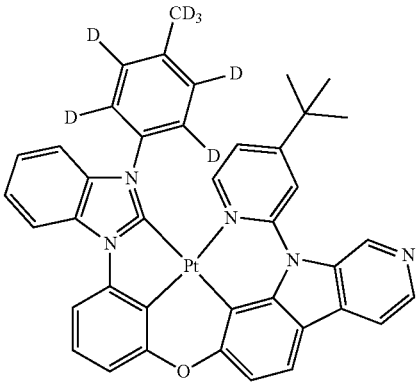

5

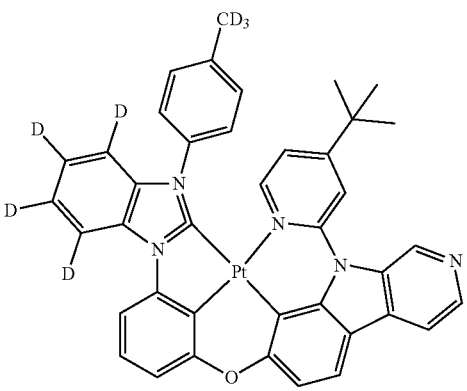

6

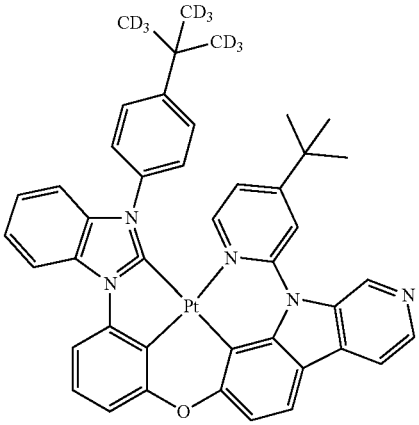

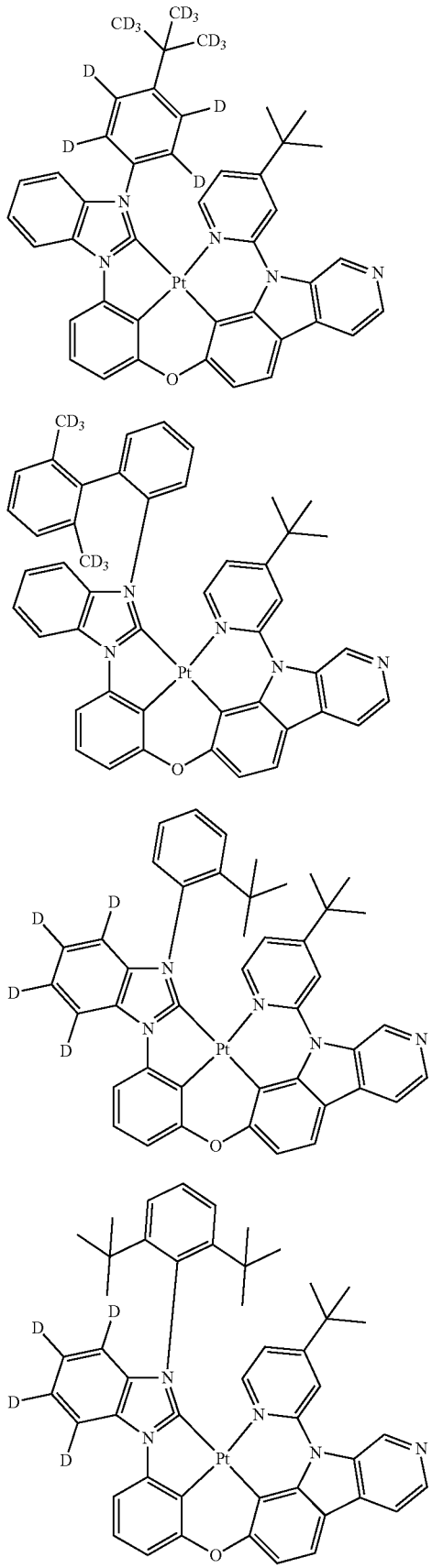
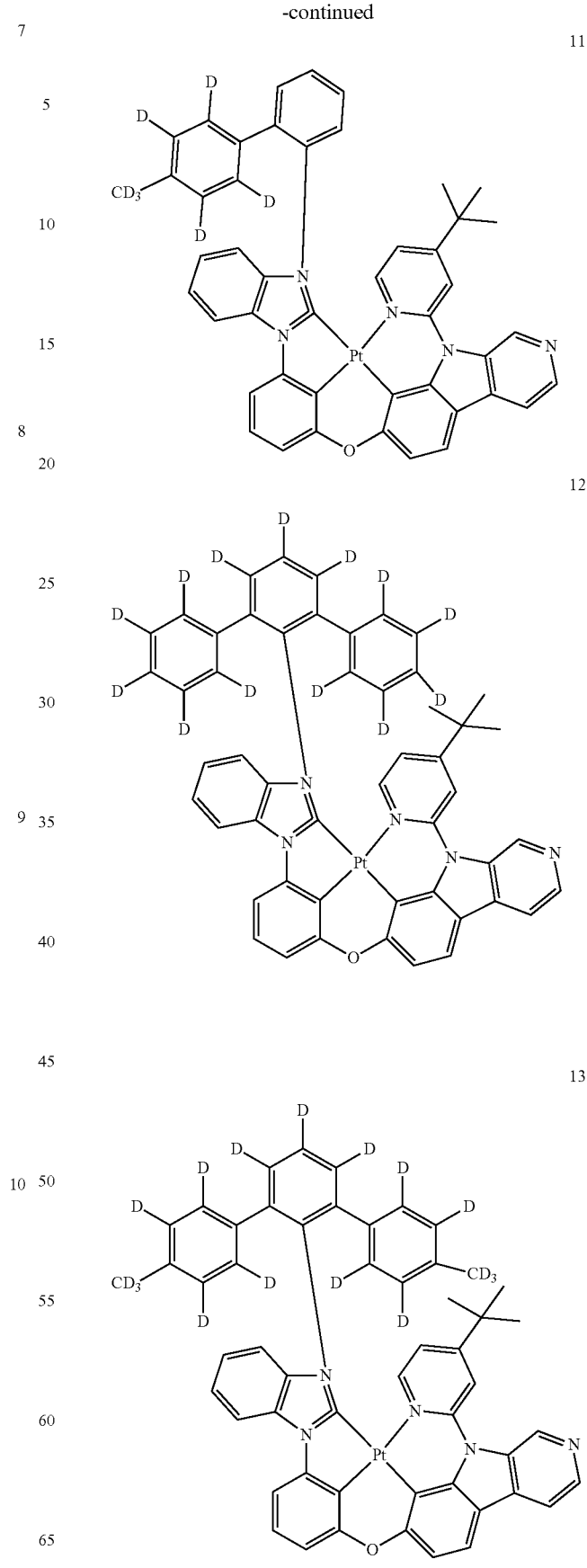

14
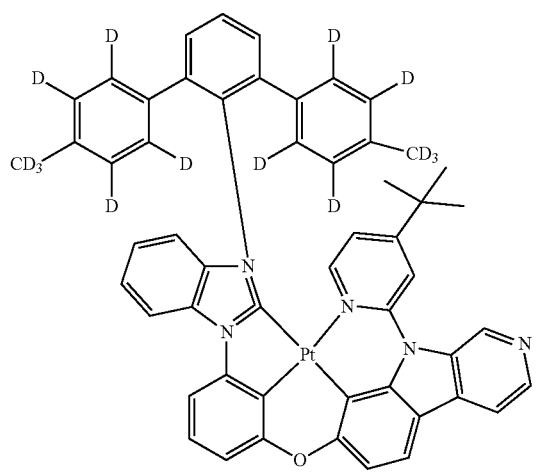
15
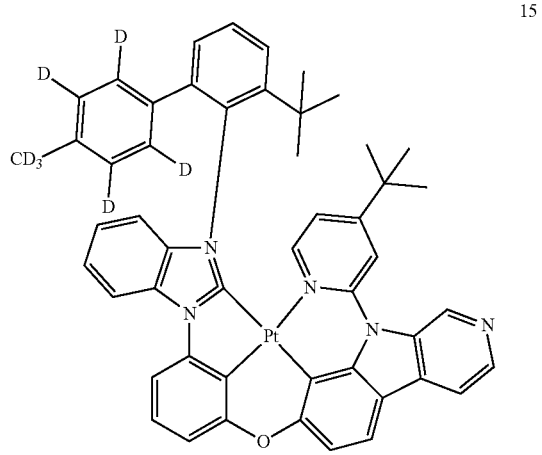
16
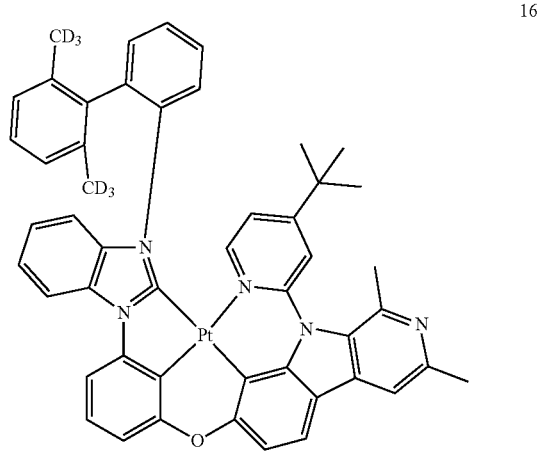
17
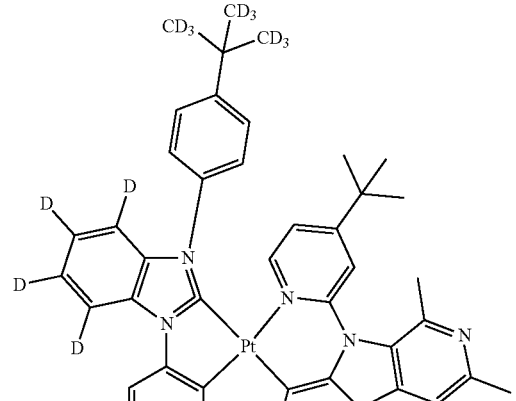
18
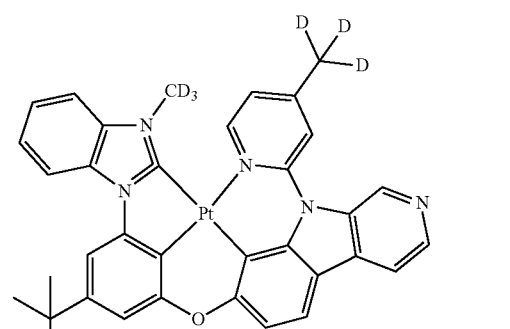
19
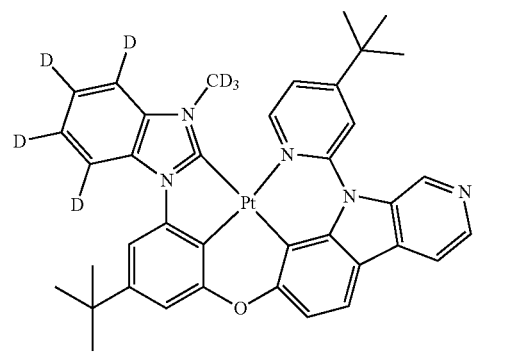
20
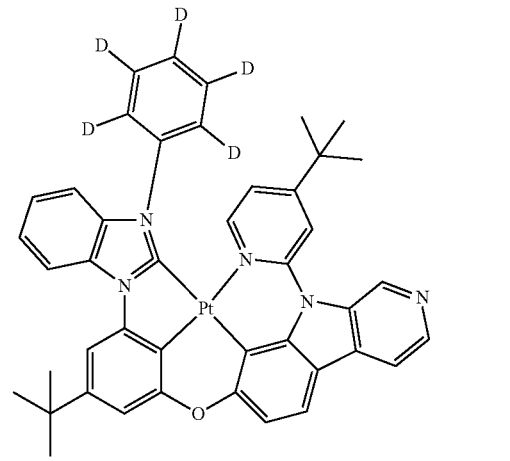

21
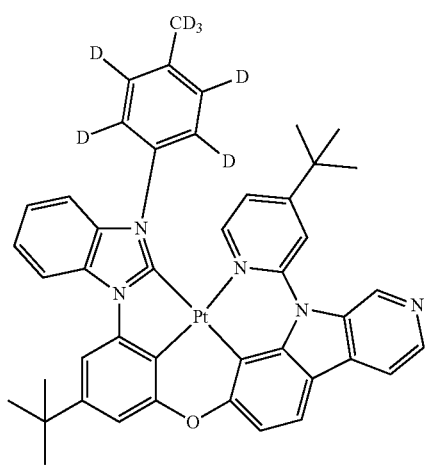
22
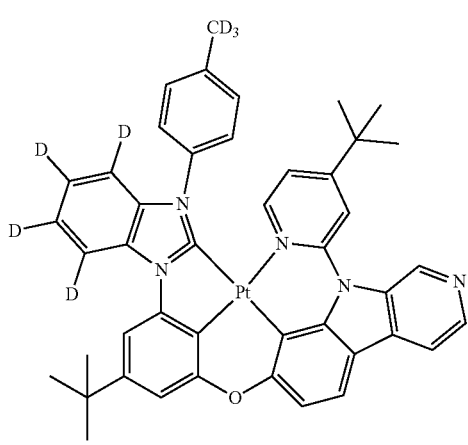
23
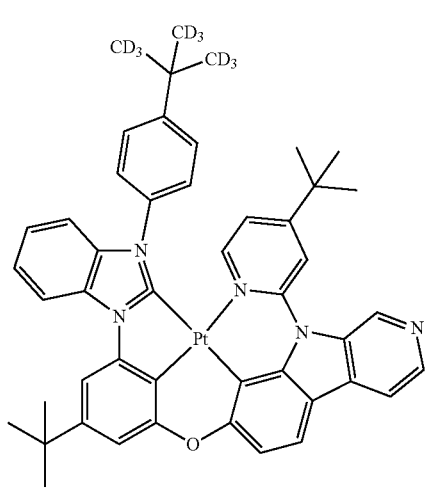
24
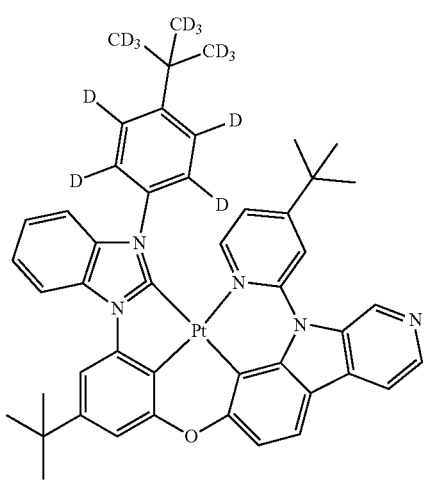
25
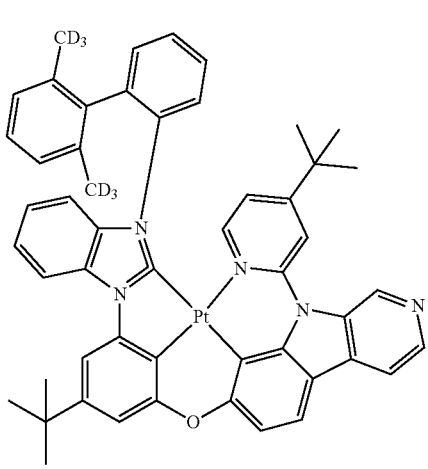
26
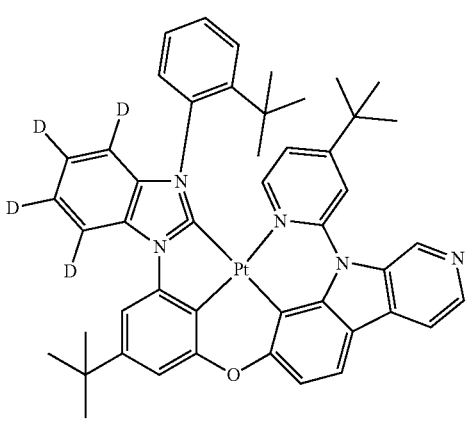

27
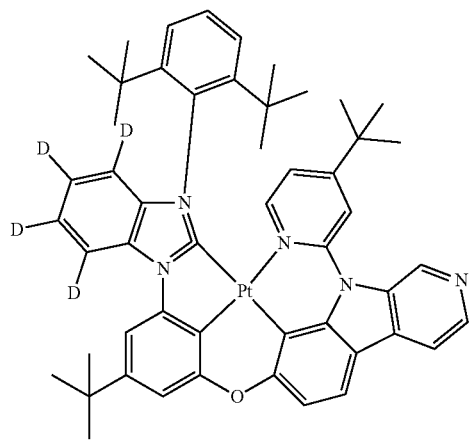
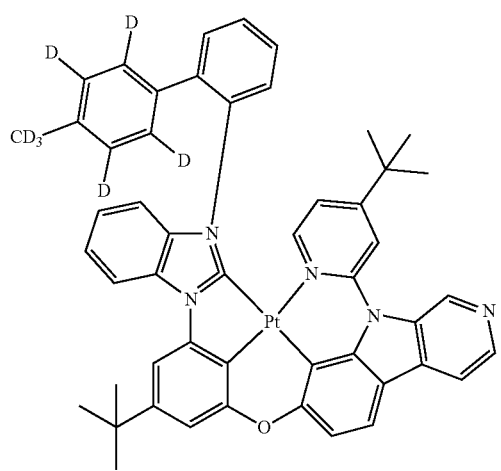
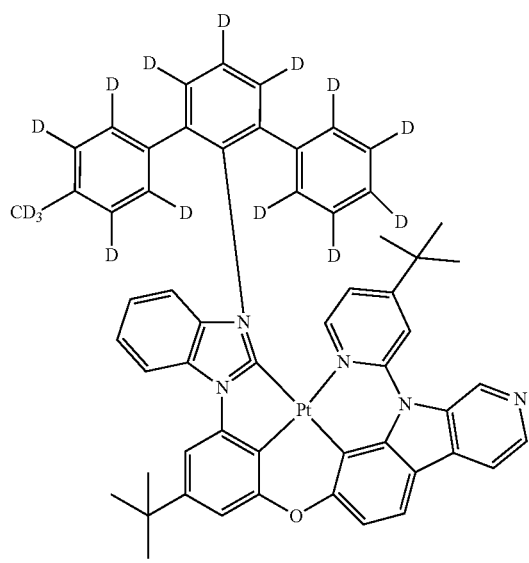
28
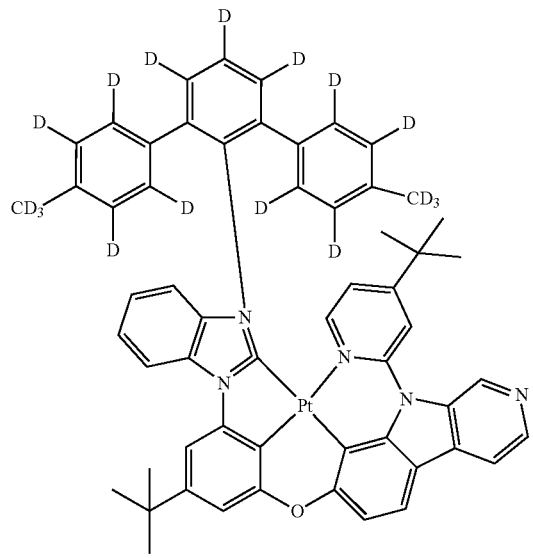
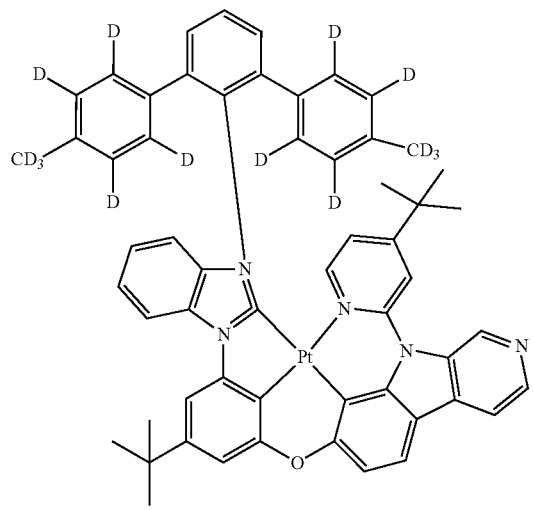
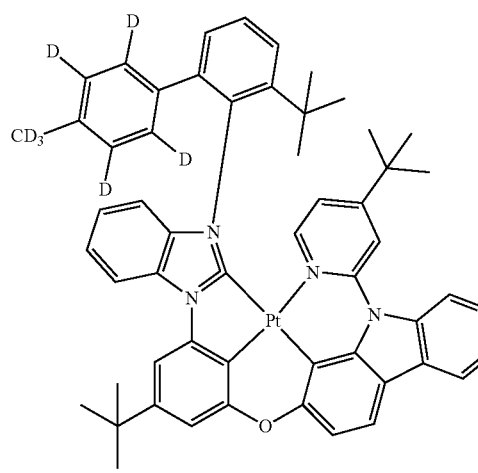

33
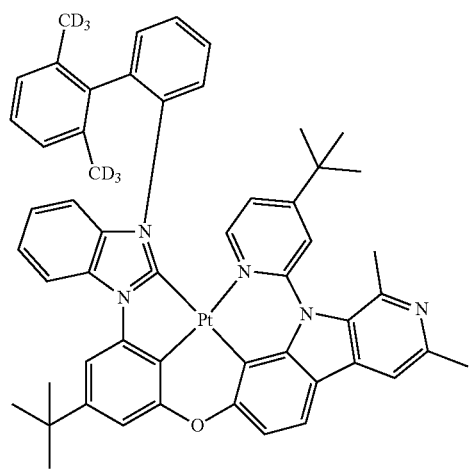
34
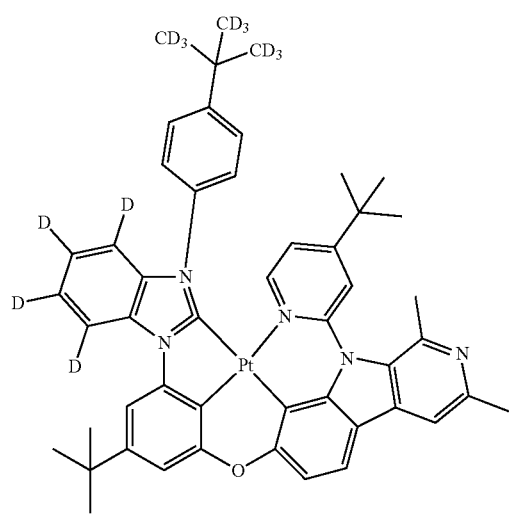
35
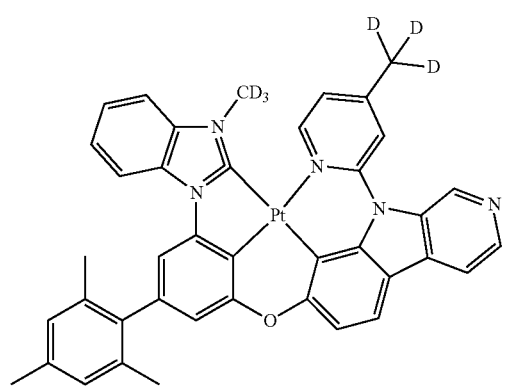
36
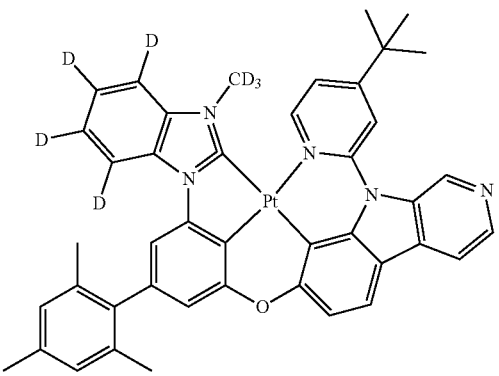
37
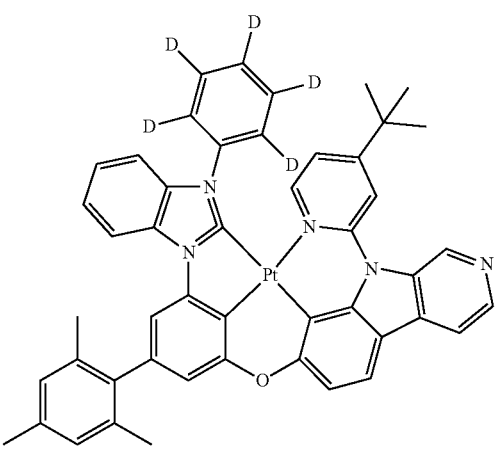
38
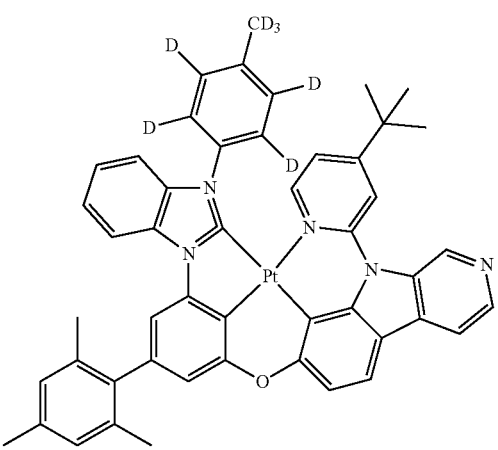

31
-continued
39
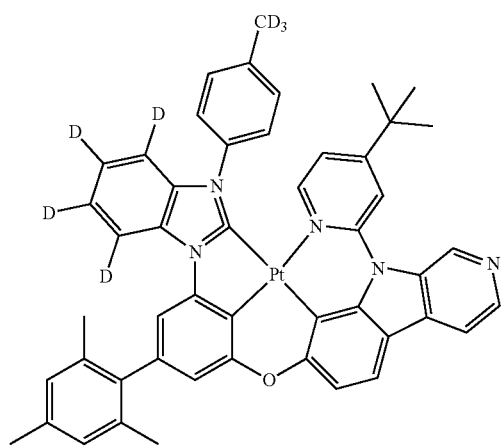
40
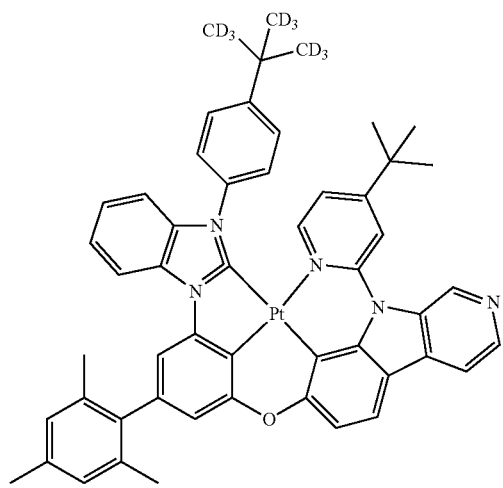
41
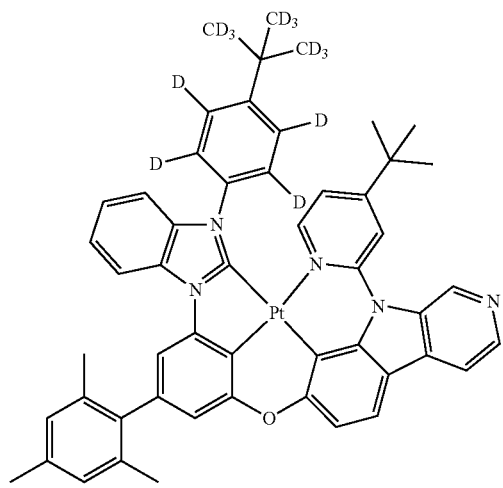
32
-continued
42
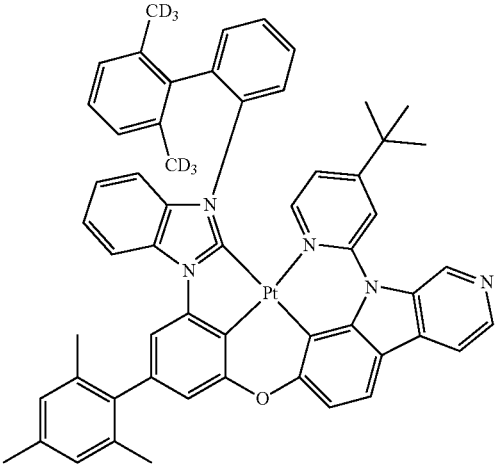
43
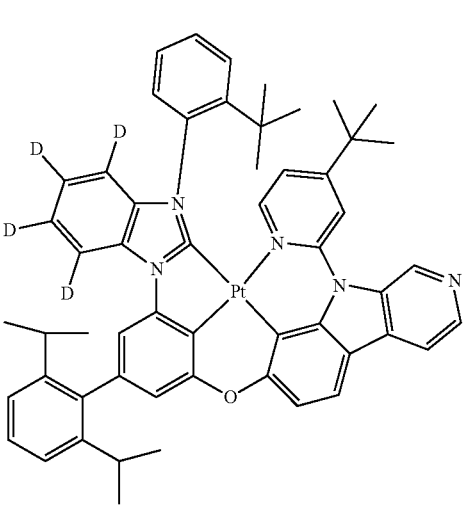
44
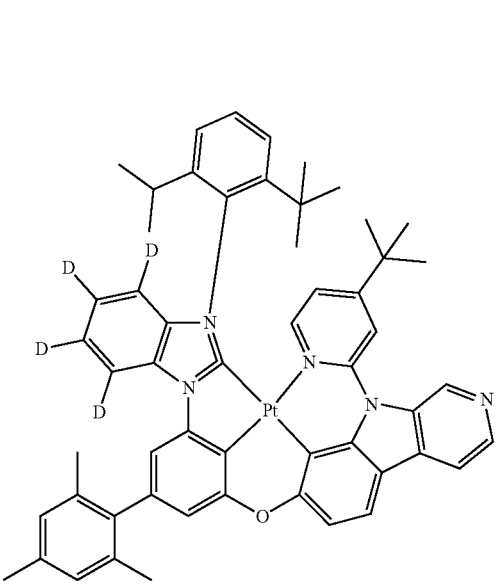

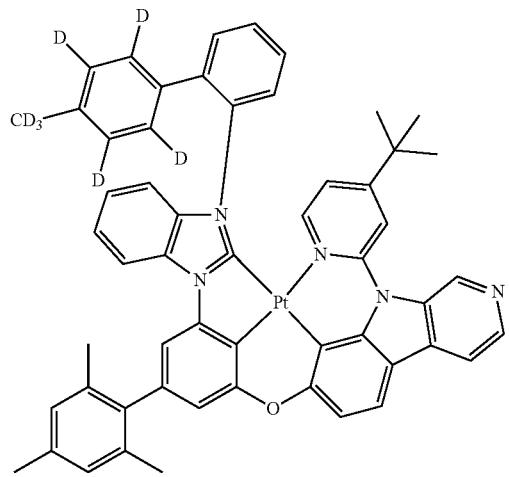
45
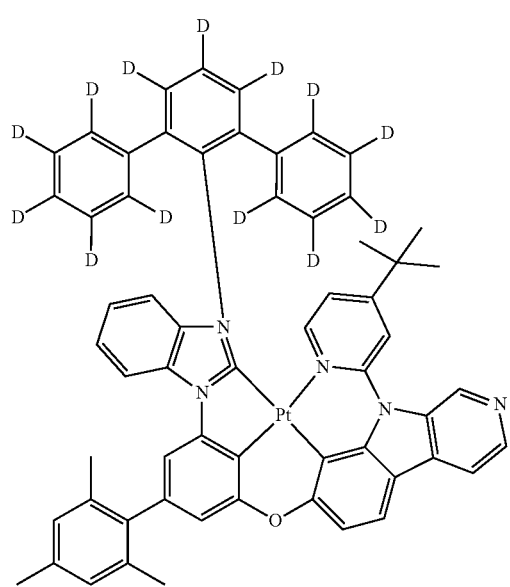
46
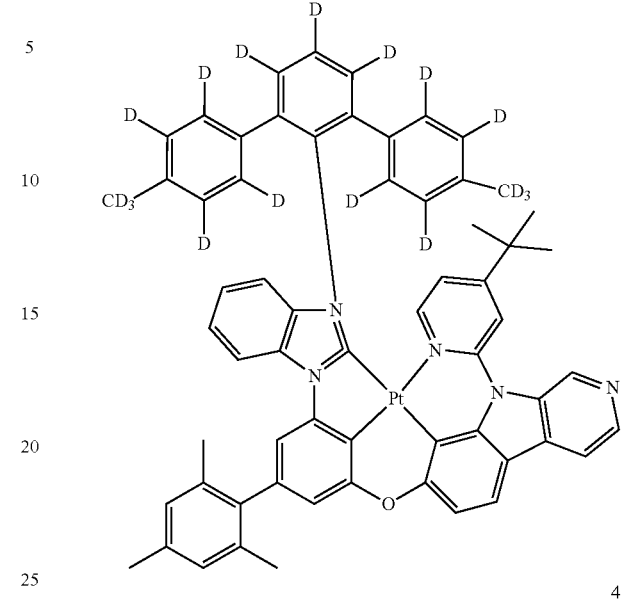
47
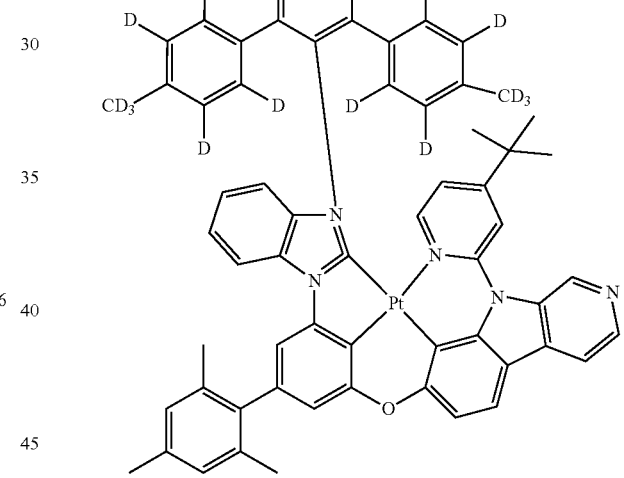
48
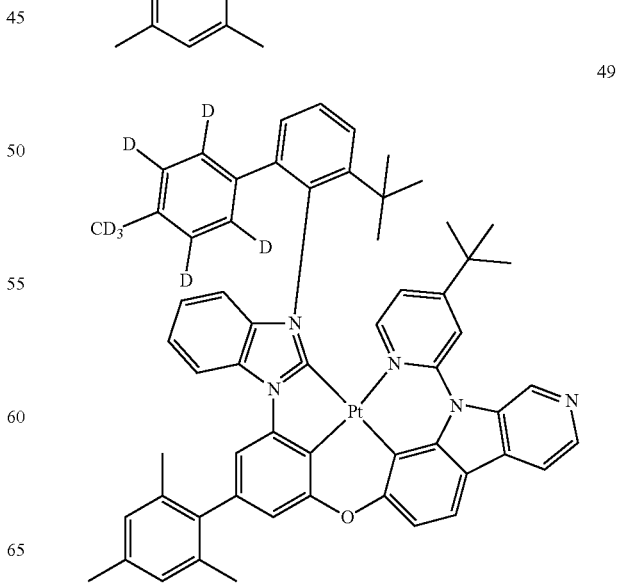
49

35
-continued
50
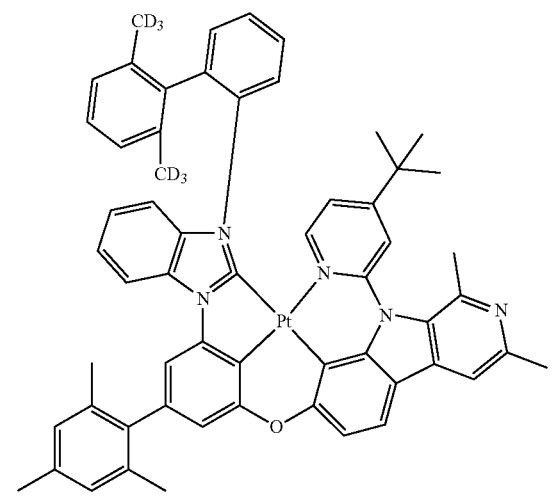
51
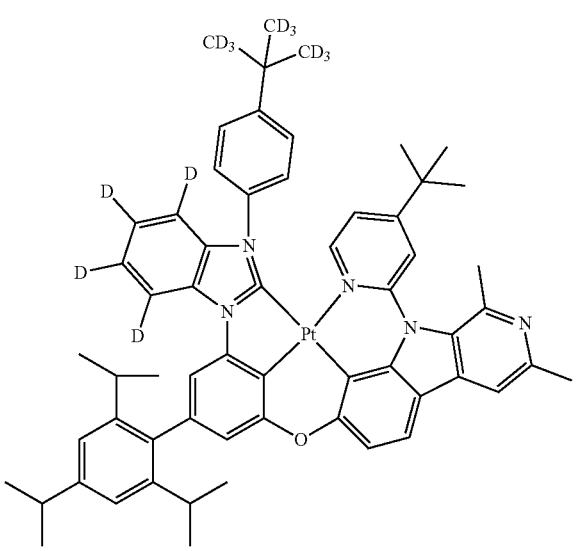
52
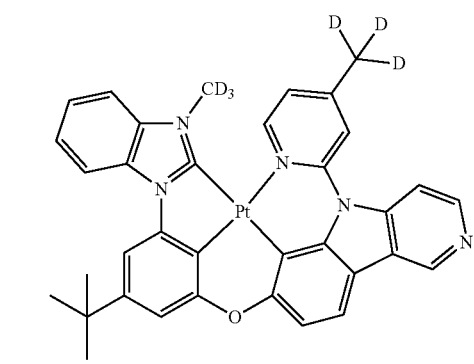
36
-continued
53
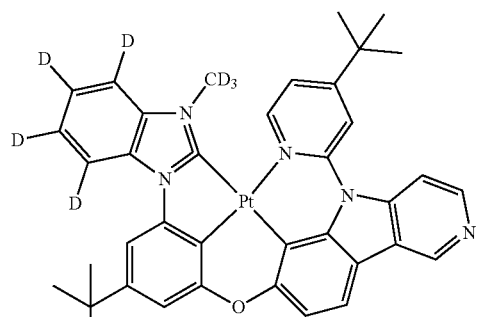
54
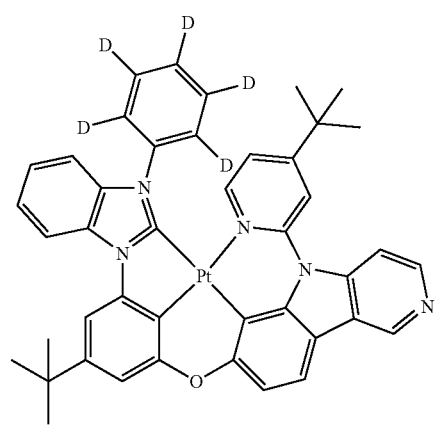
55
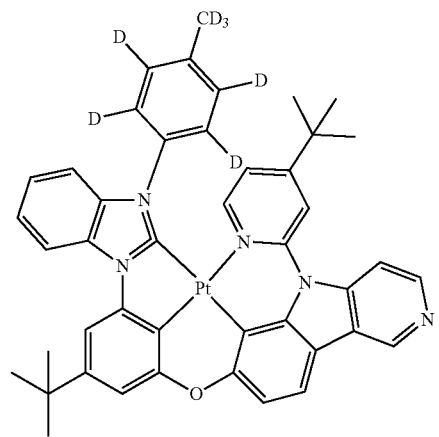
56
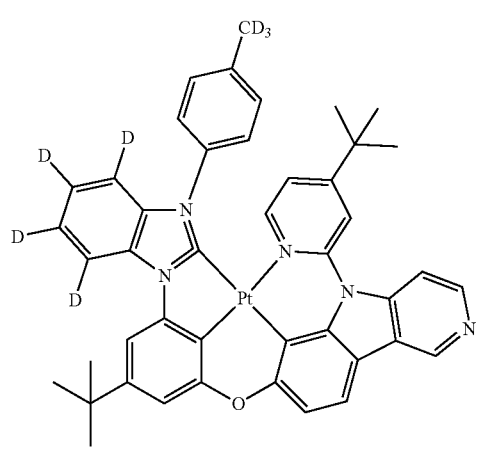

57
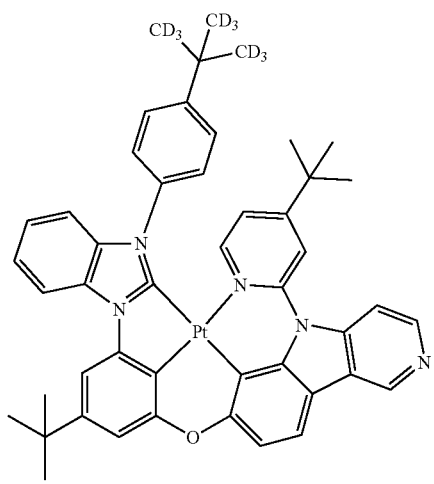
58
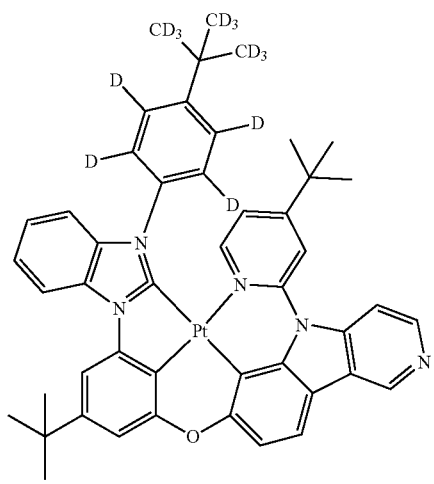
59
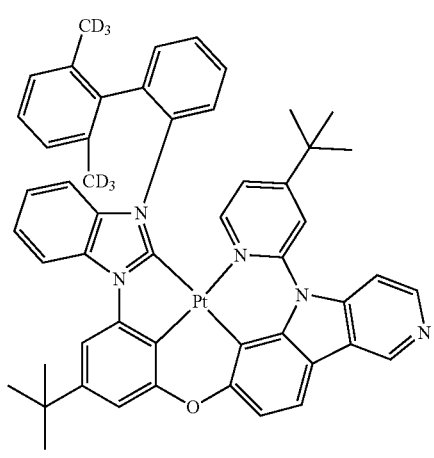
60
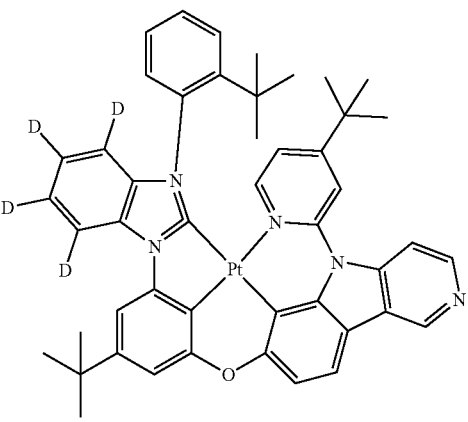
61
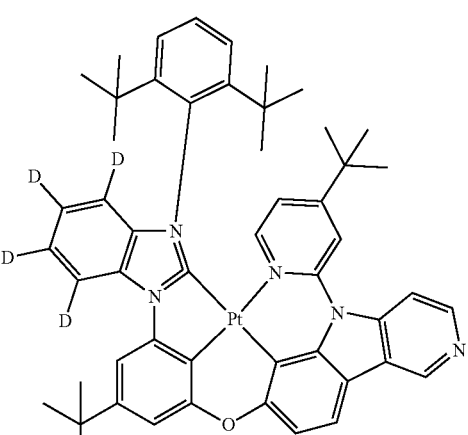
62
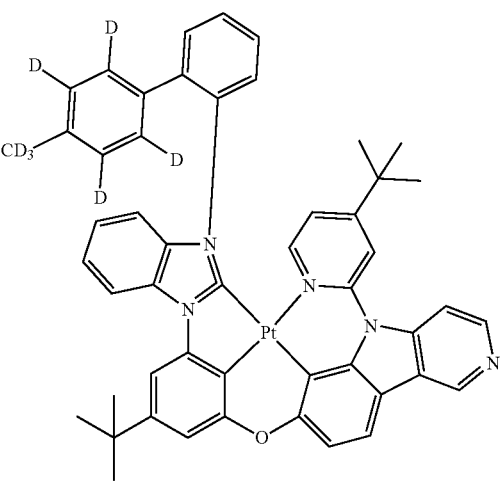

63
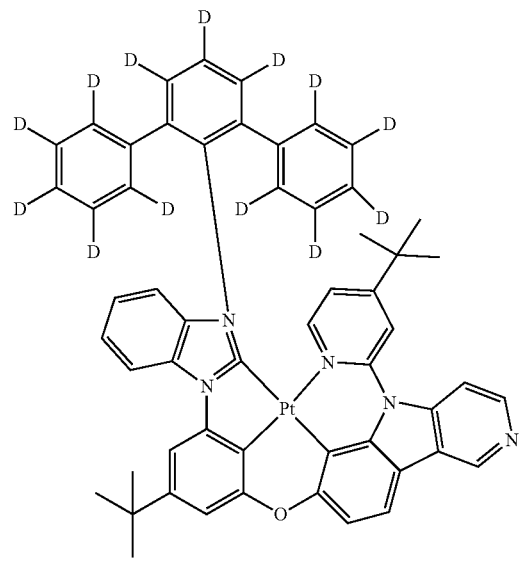
64
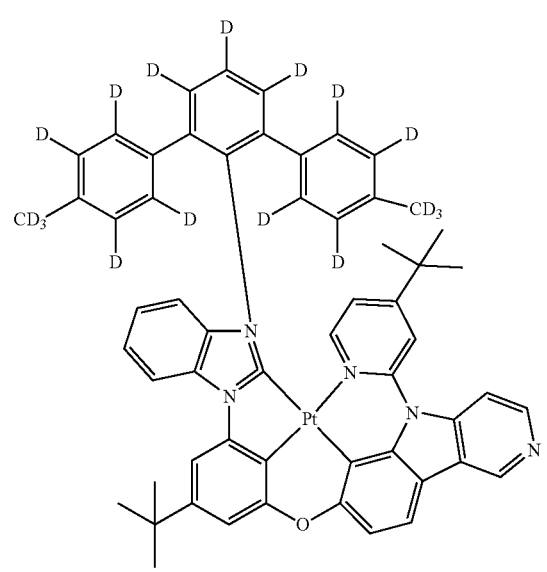
65
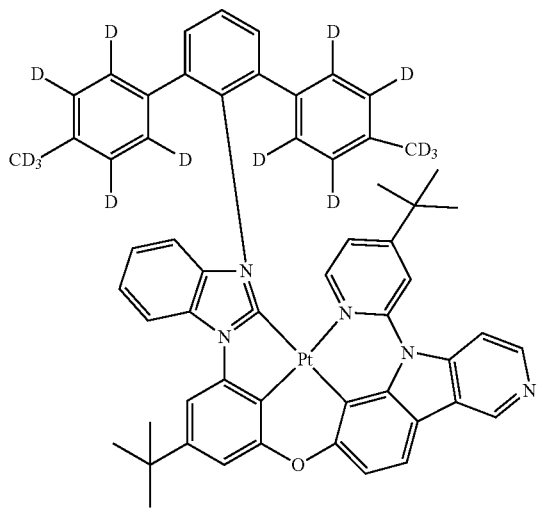
66
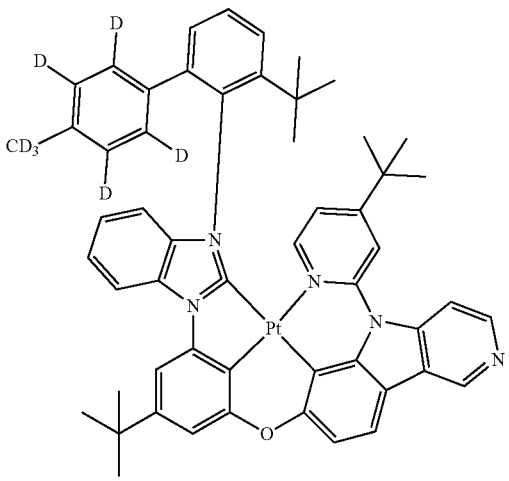
67
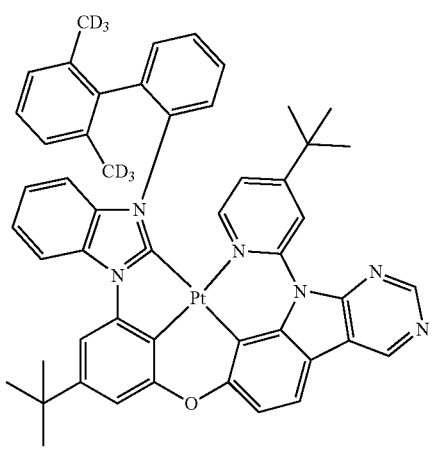

68
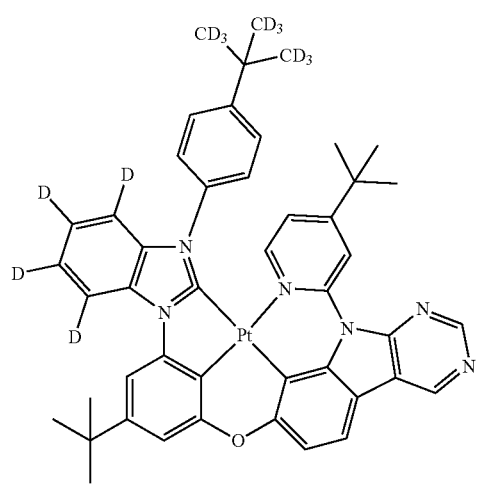
69
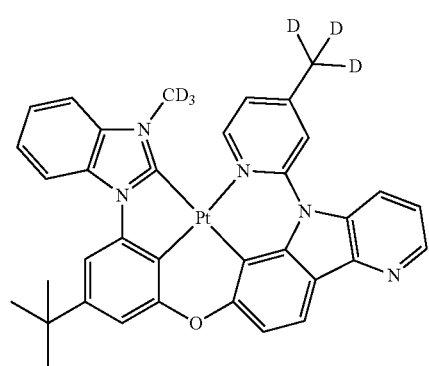
70
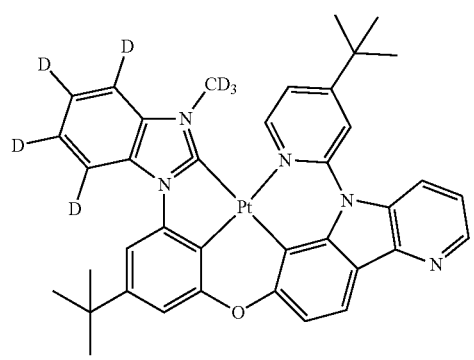
71
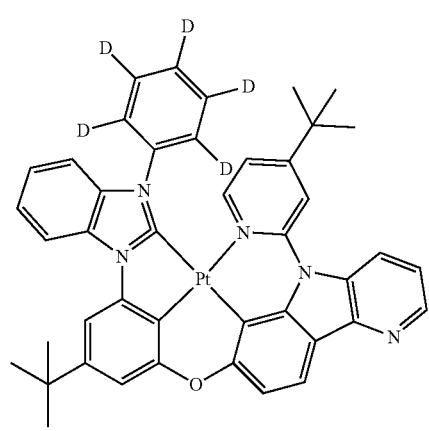
72
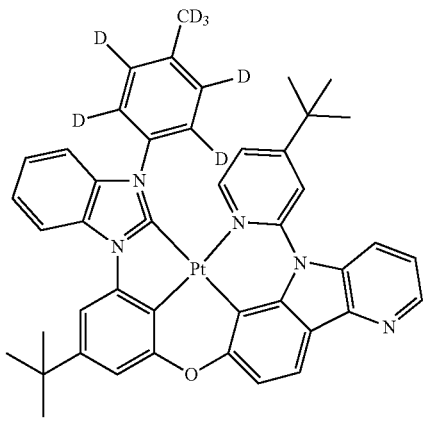
73
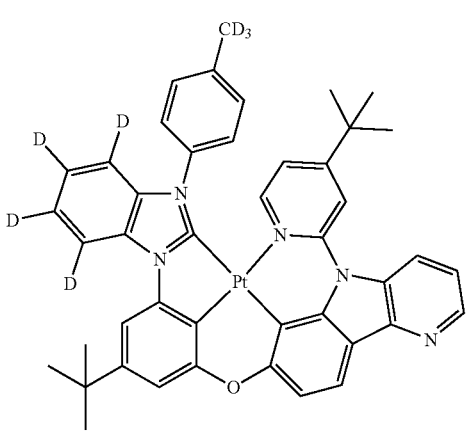
74
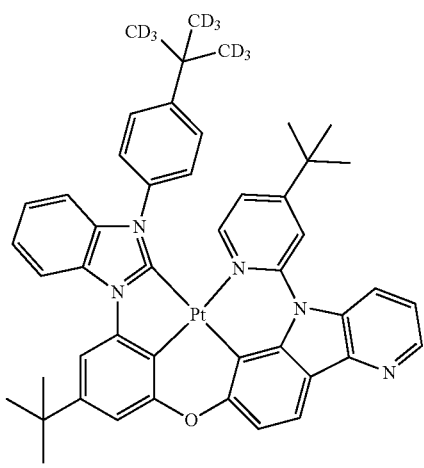

75
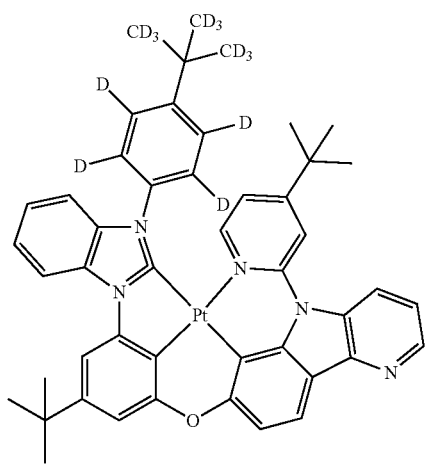
76
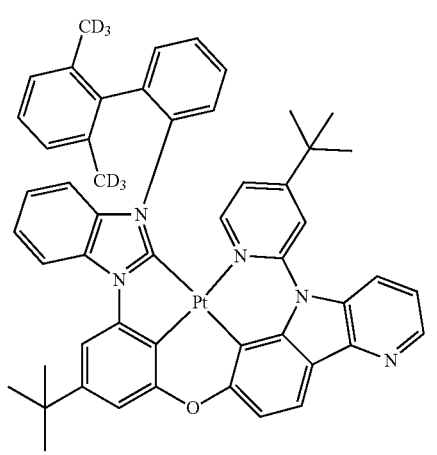
77
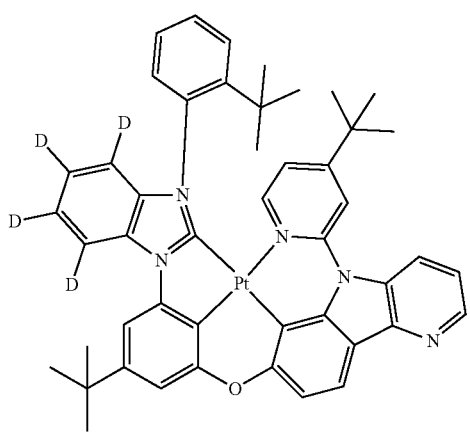
78
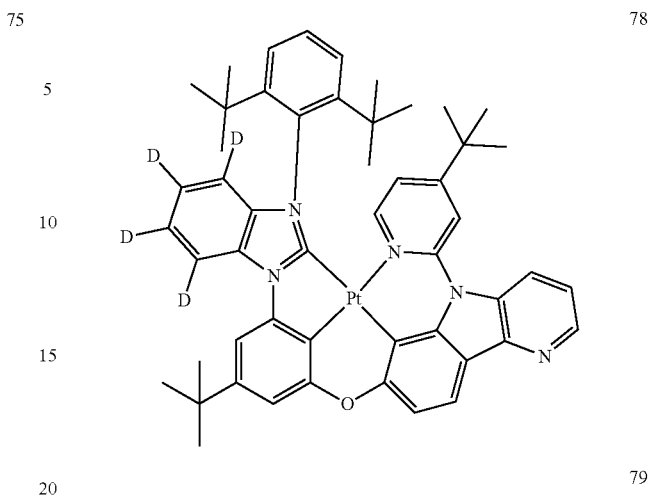
79
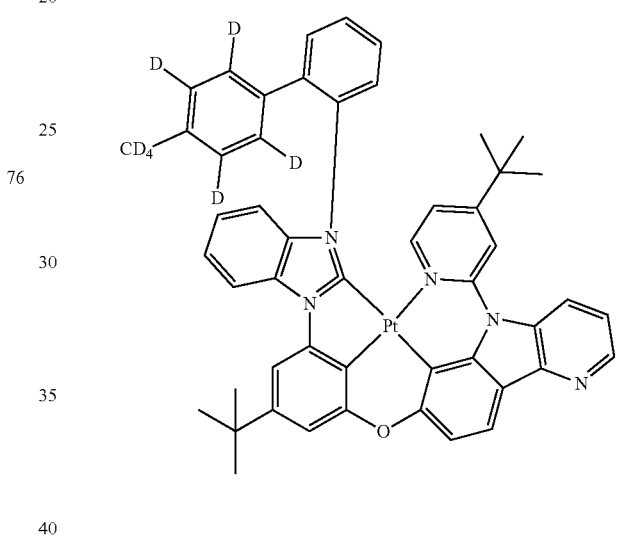
80
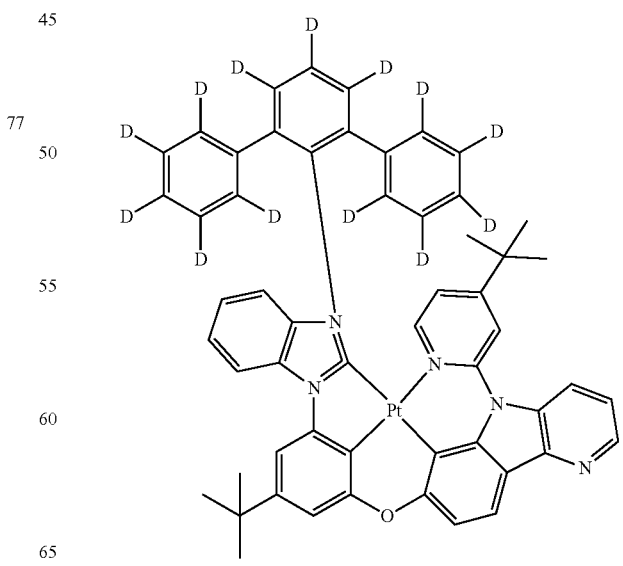

81
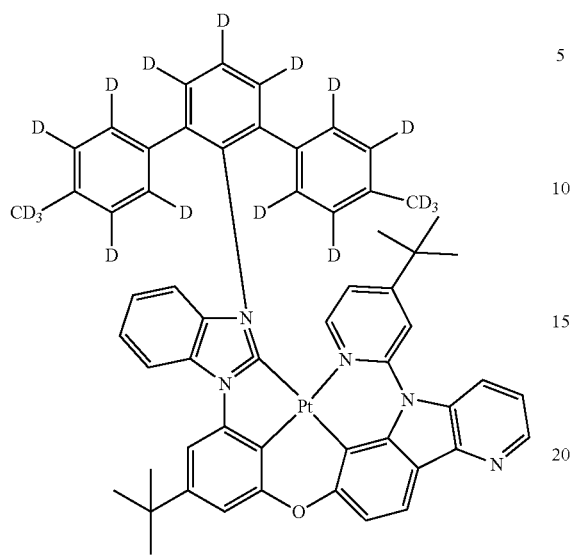
82
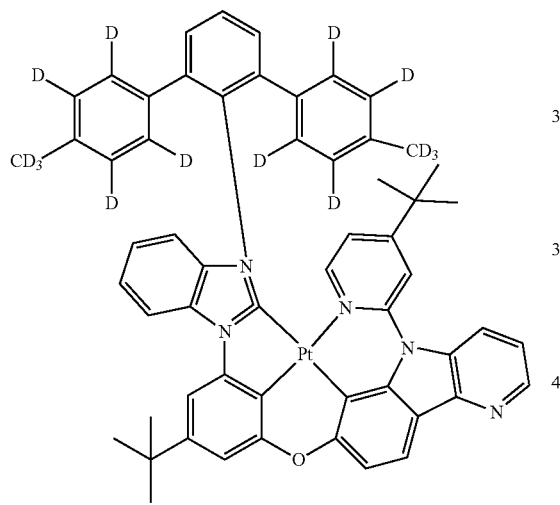
83
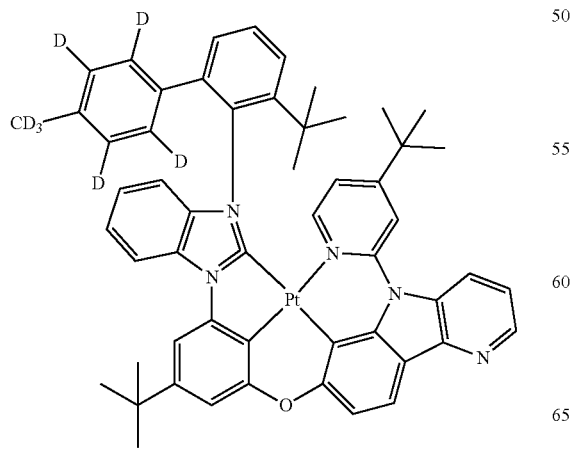
84
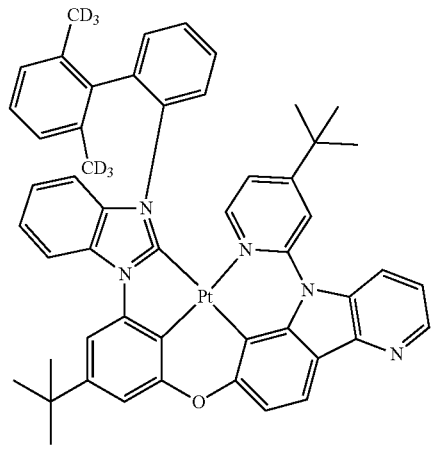
85
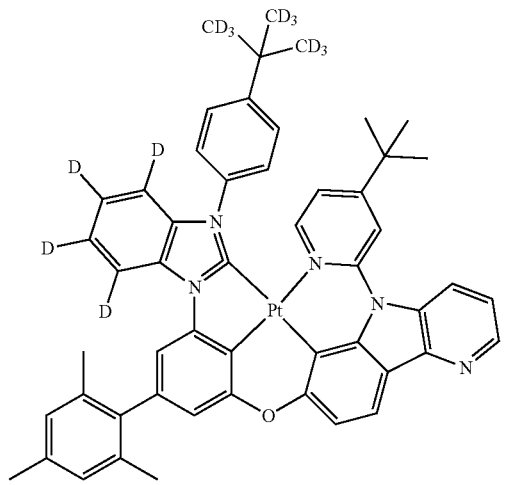
86
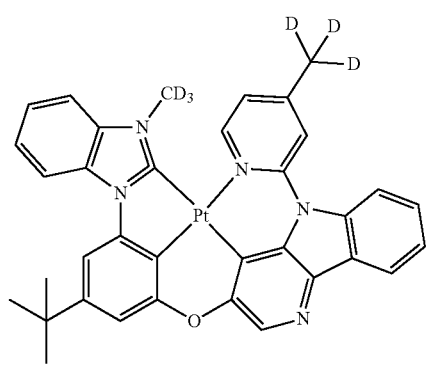

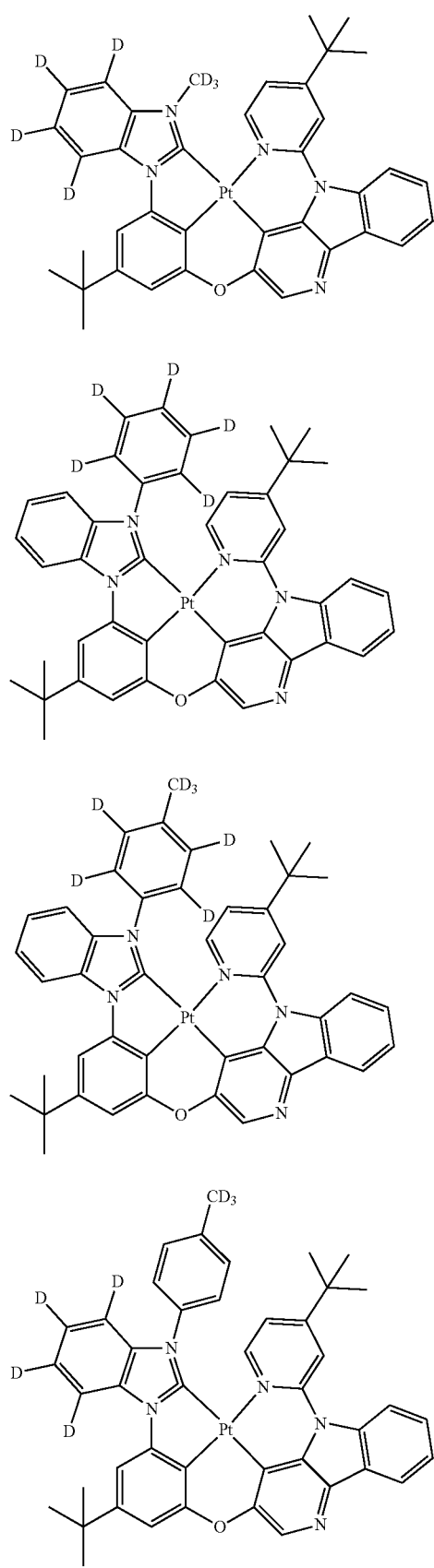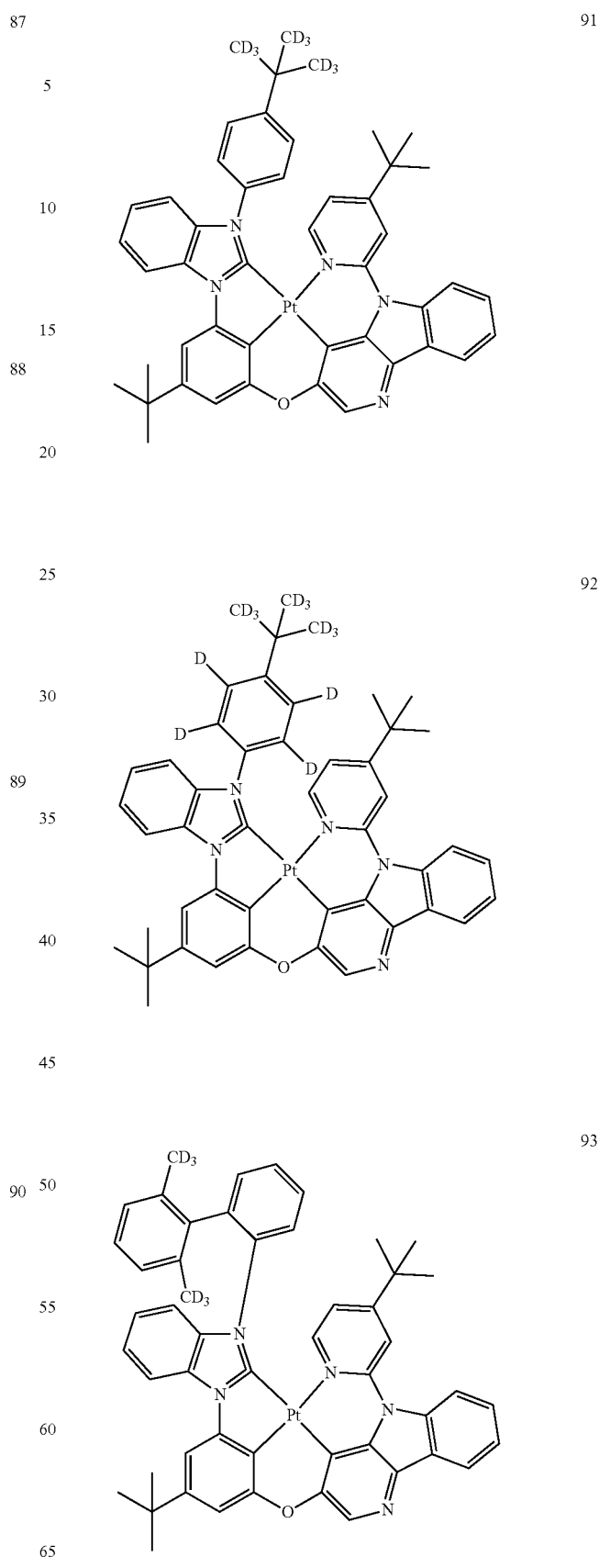

94
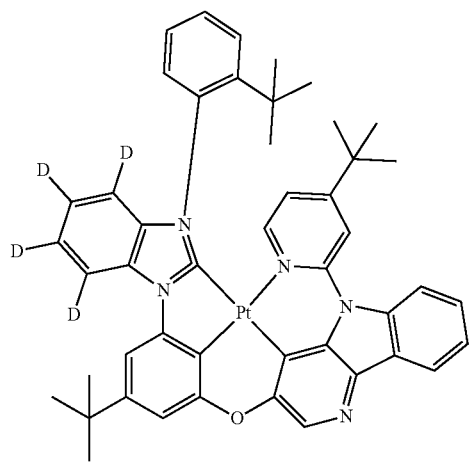
95
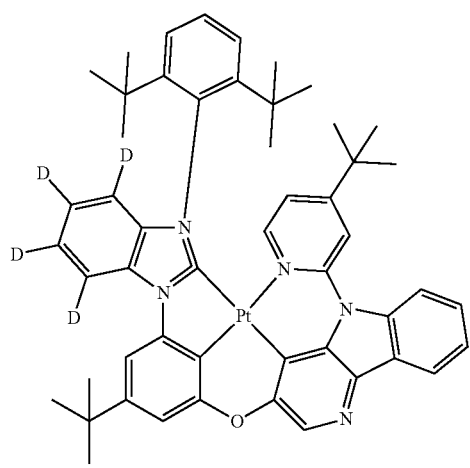
96
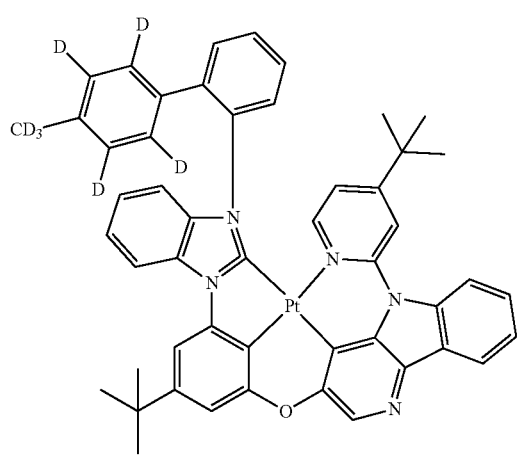
97
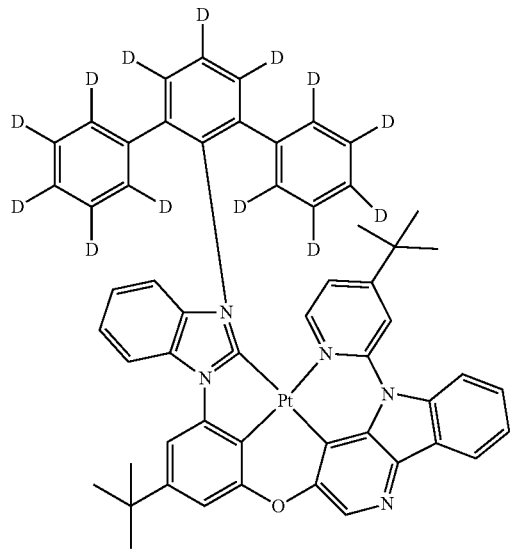
98
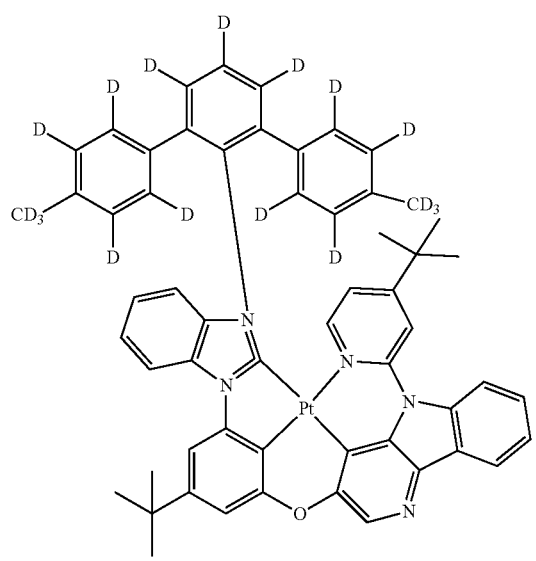
99
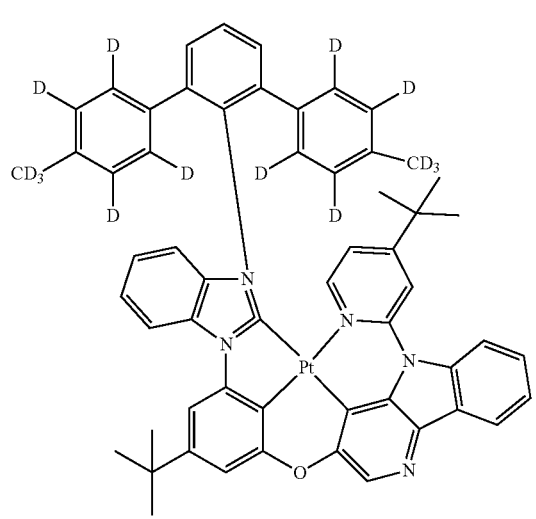

100 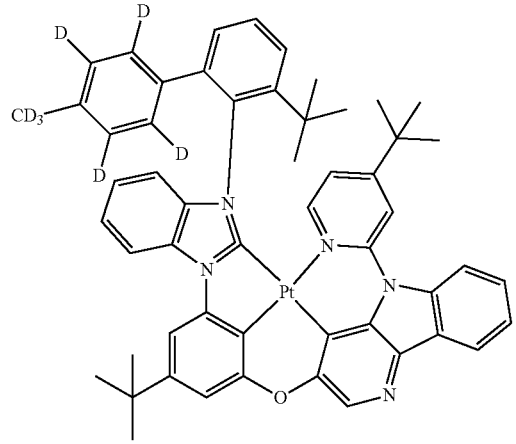
101 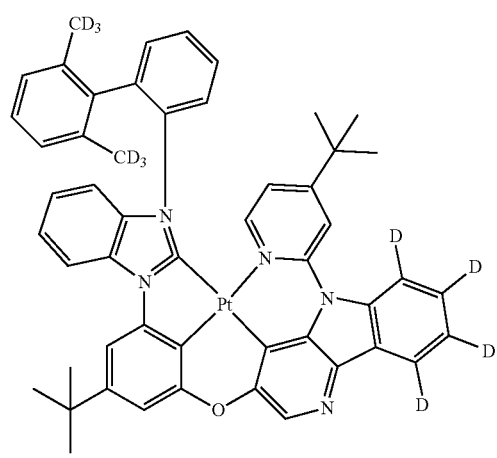
102 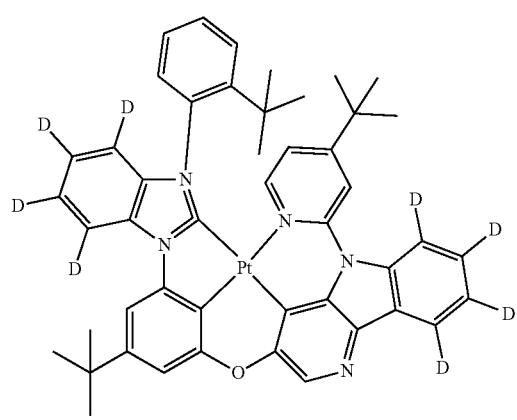
103 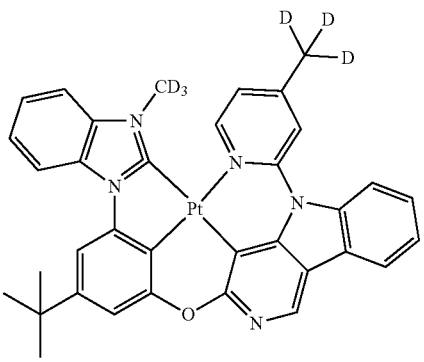
104 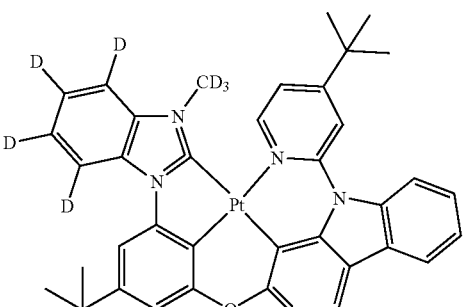
105 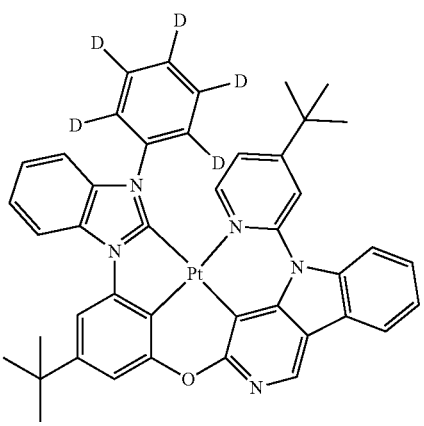
106 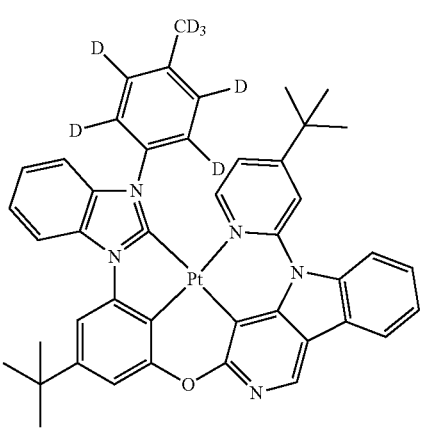

107
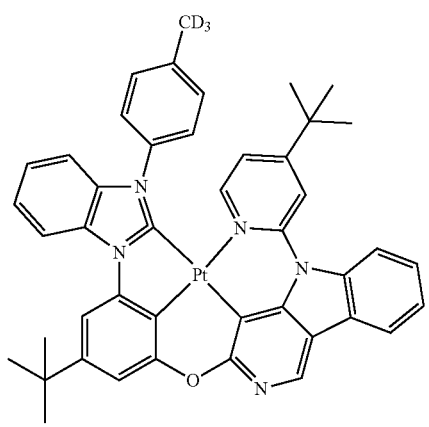
108
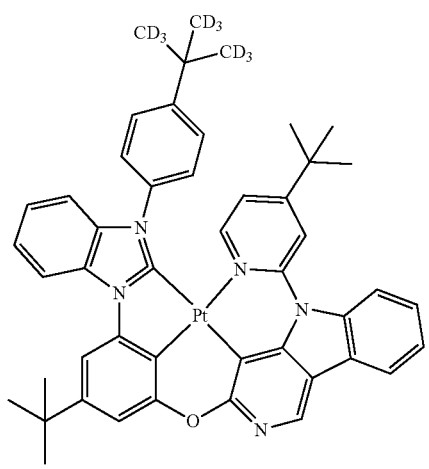
109
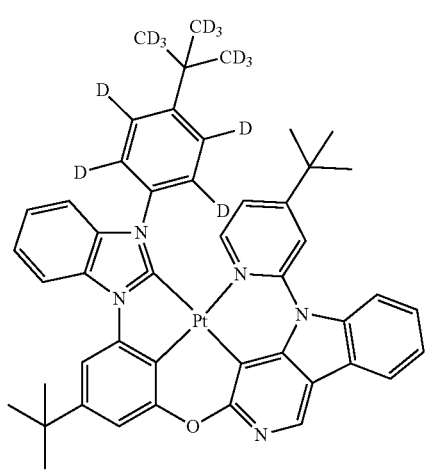
110
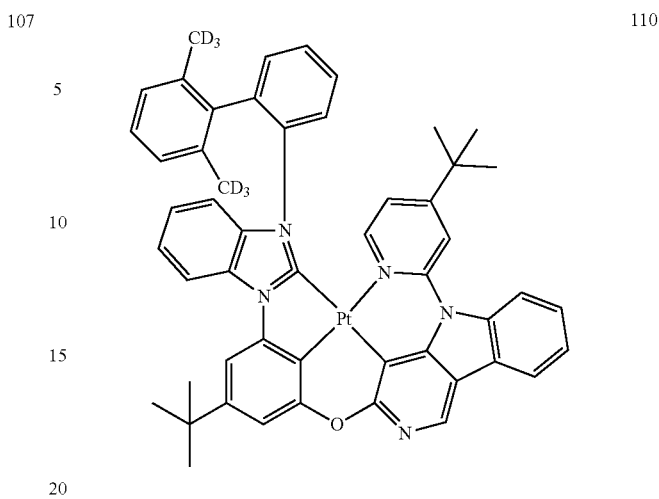
111
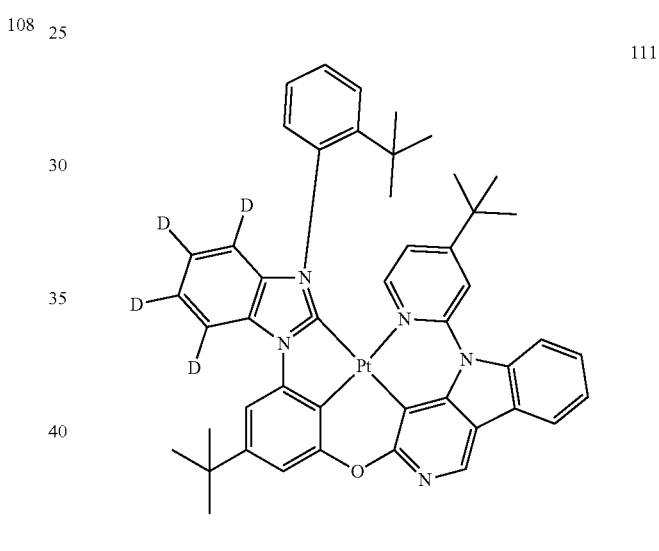
112
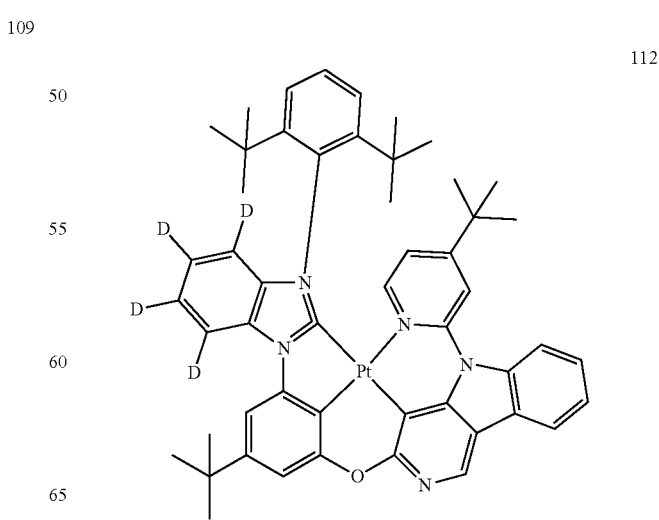

113
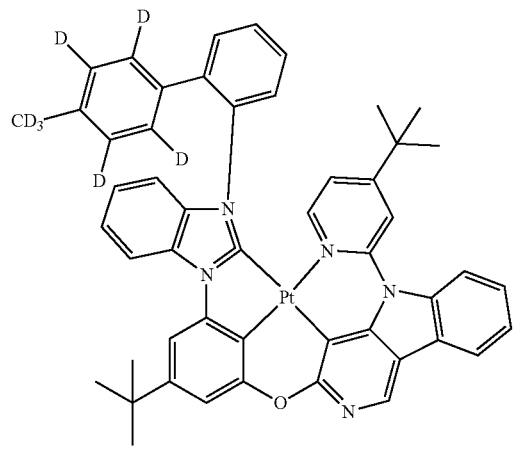
114
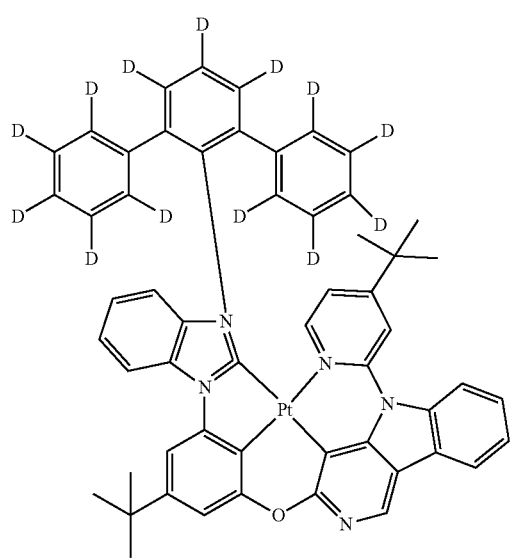
115
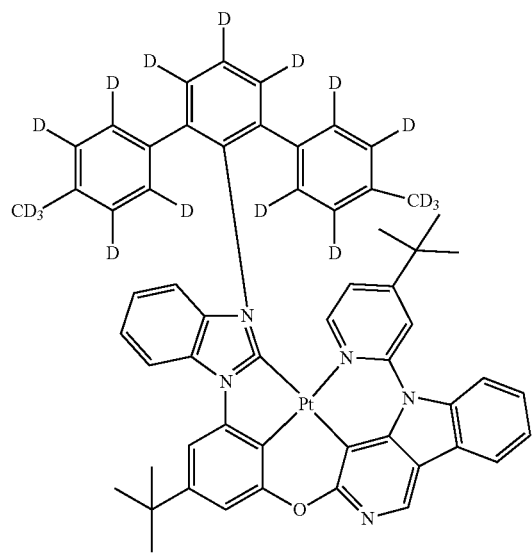
116
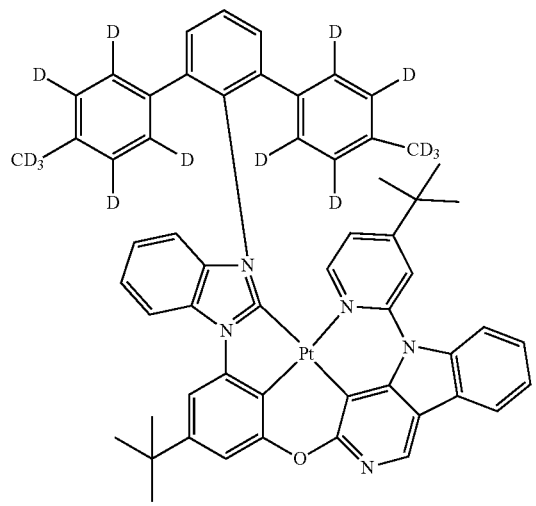
117
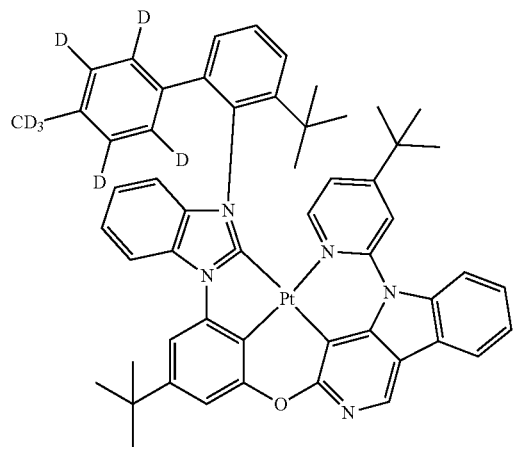
118
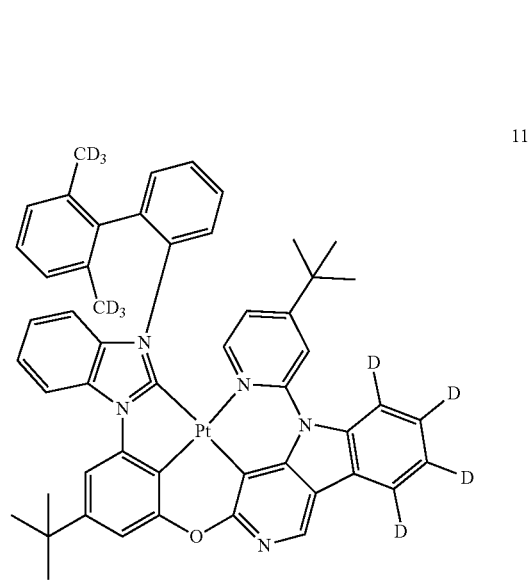

119
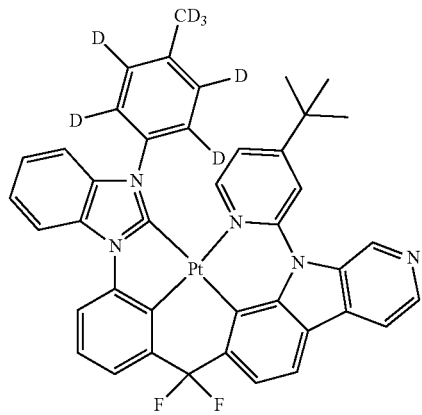
120
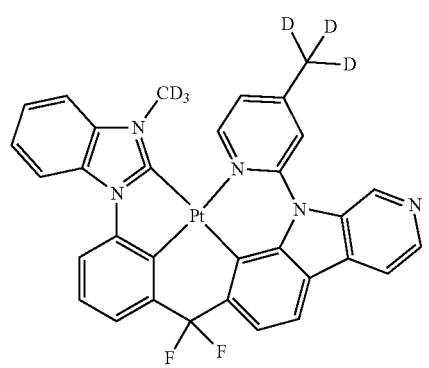
121
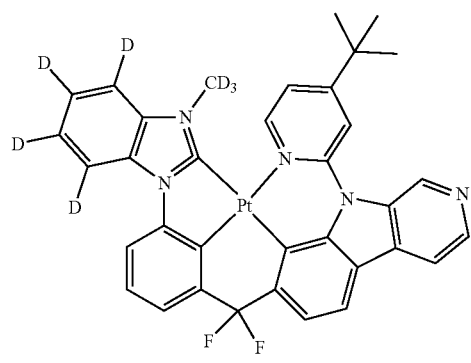
122
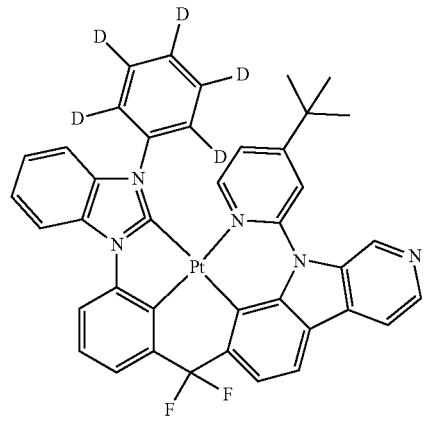
123
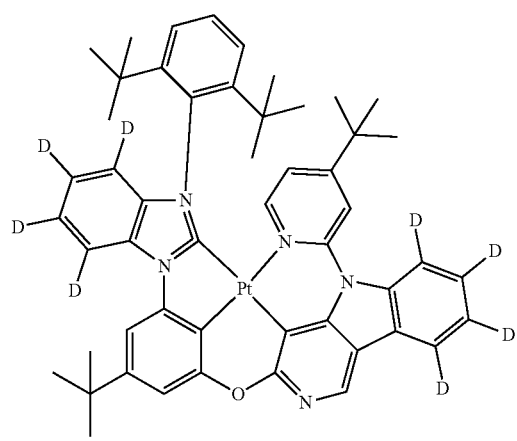
124
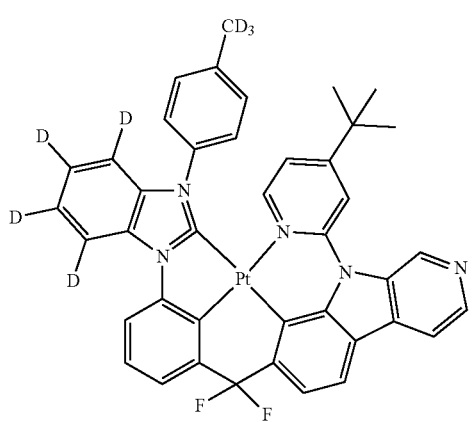
125
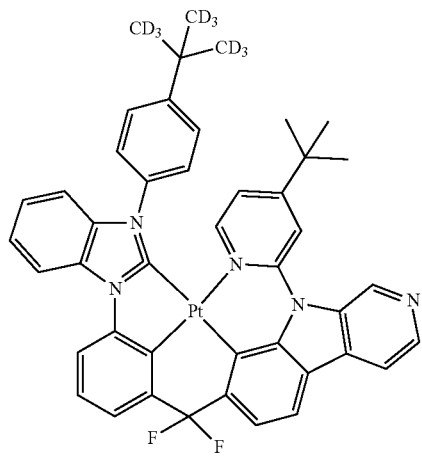

126 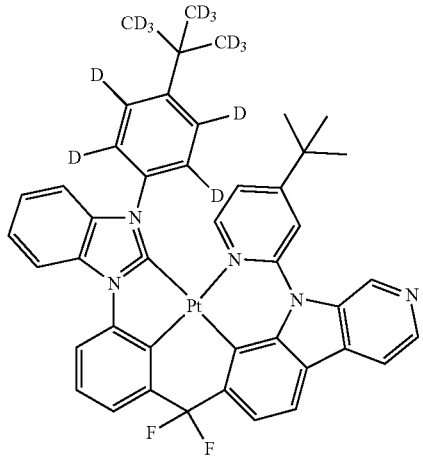
127 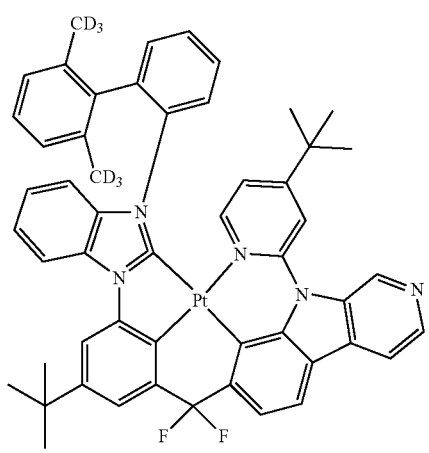
128 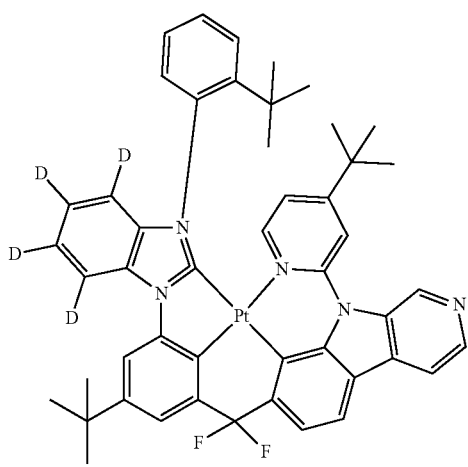
129 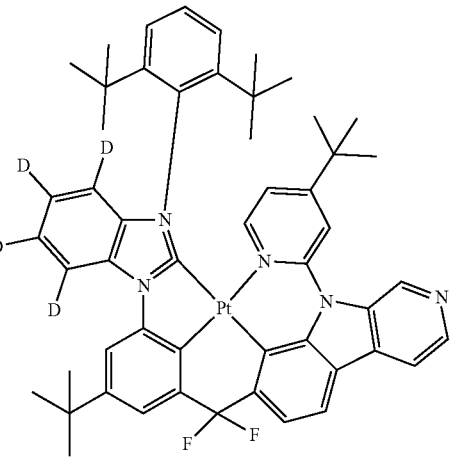
130 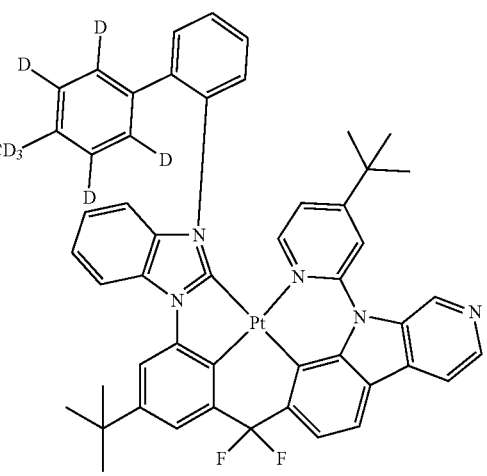
131 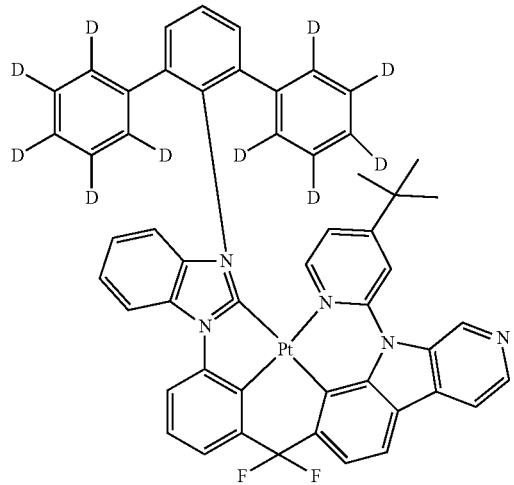

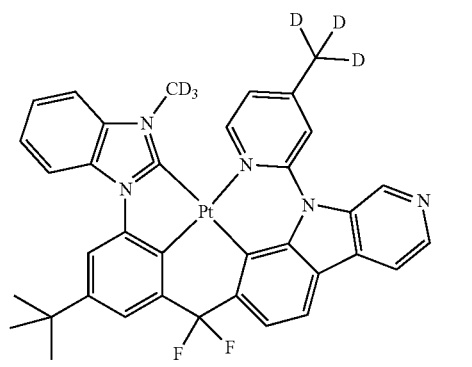
132
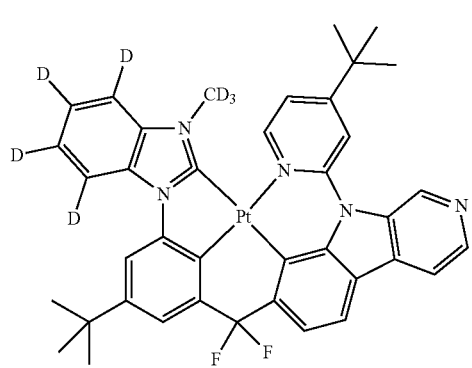
133
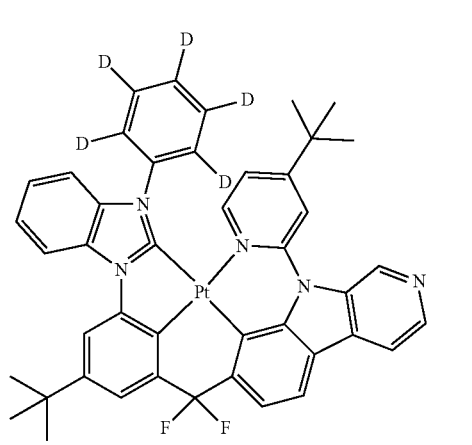
134
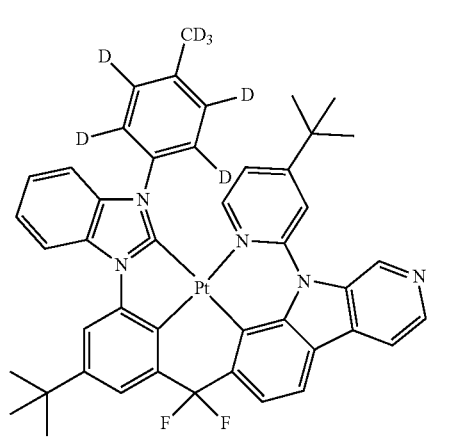
135
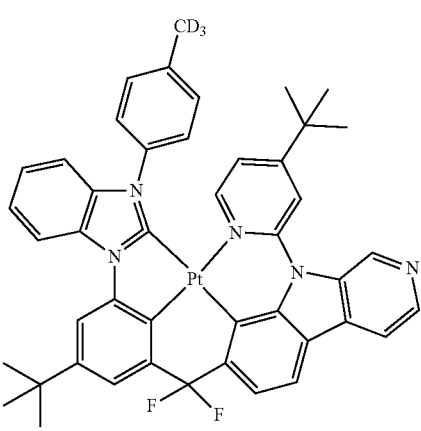
136
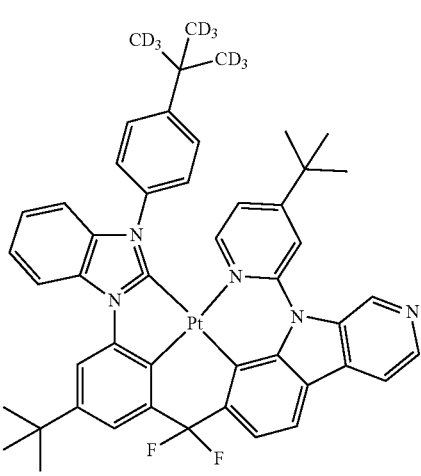
137
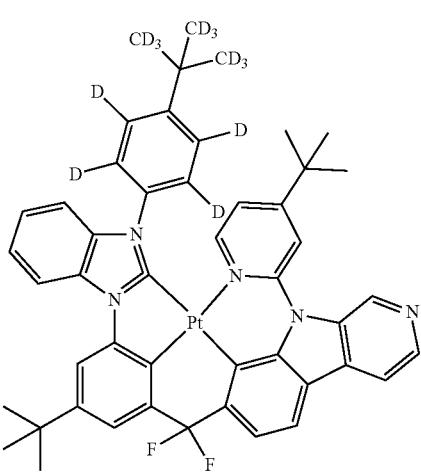
138

139
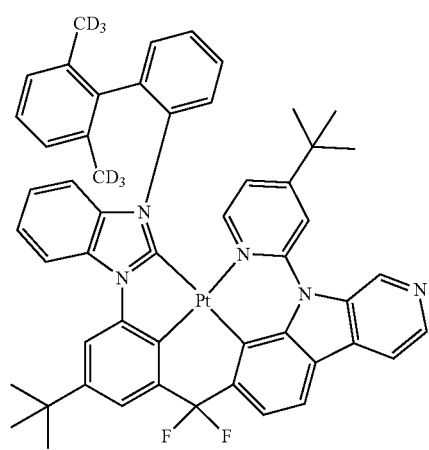
142
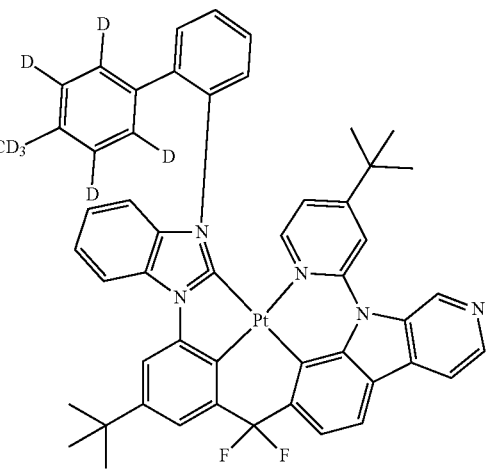
140
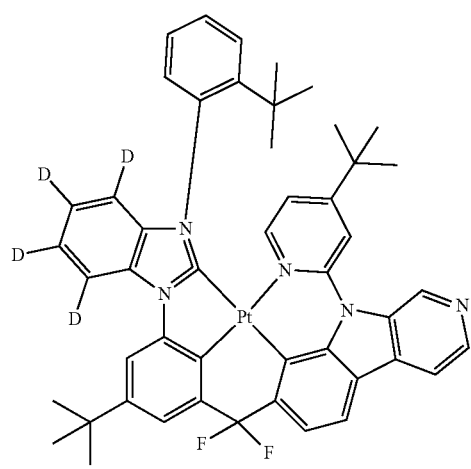
143
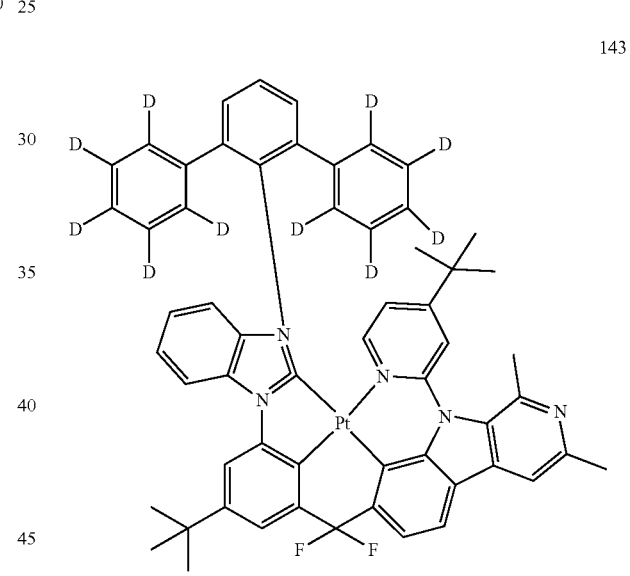
141
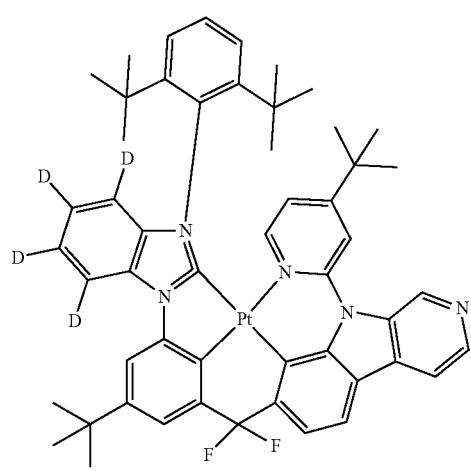
144
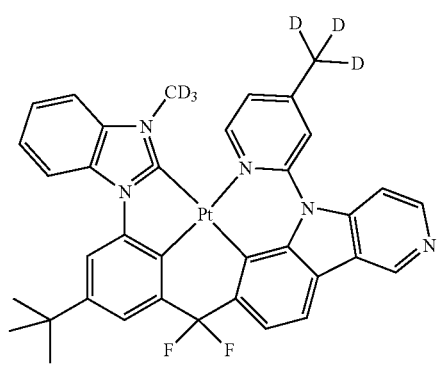

-continued
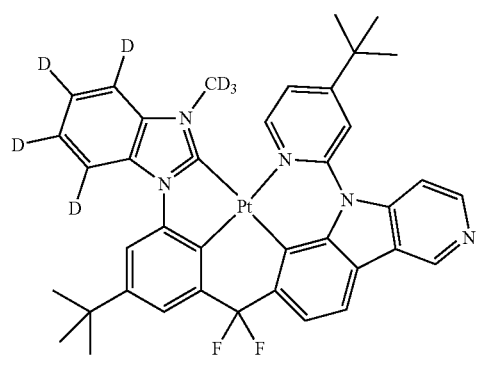
145
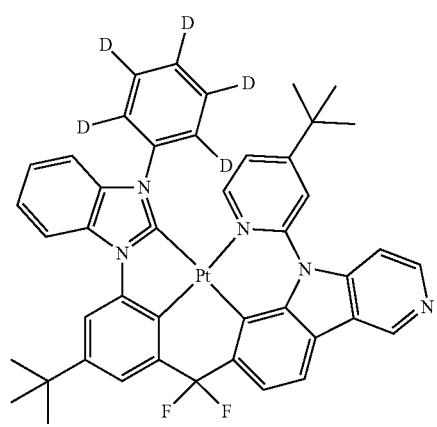
146
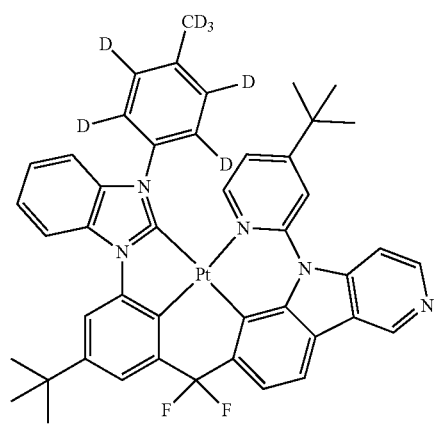
147
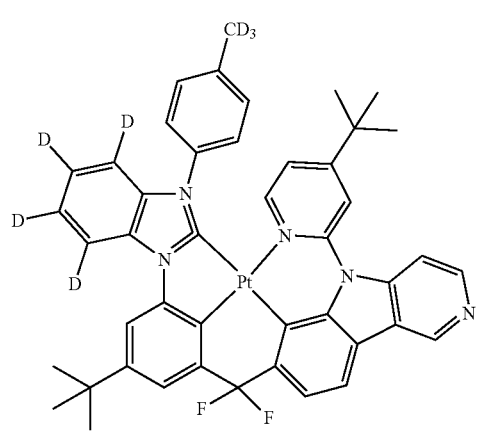
148
-continued
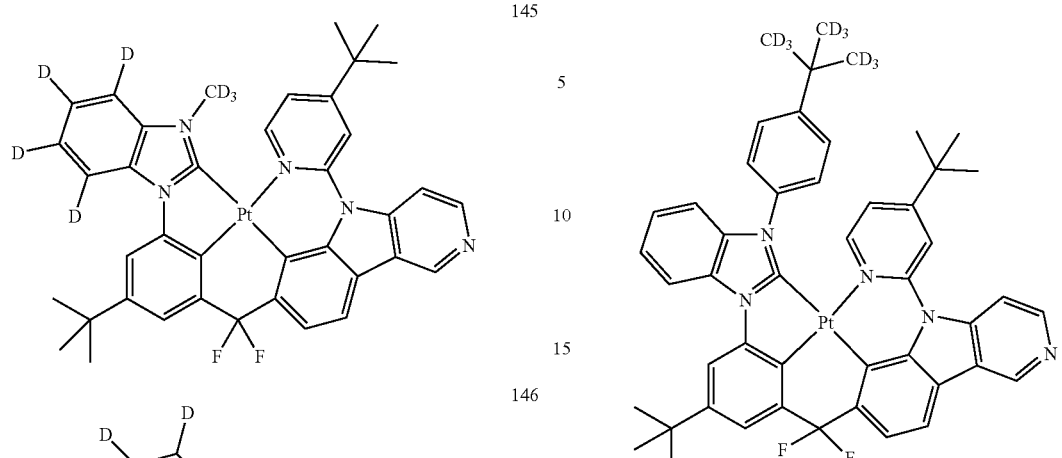
149
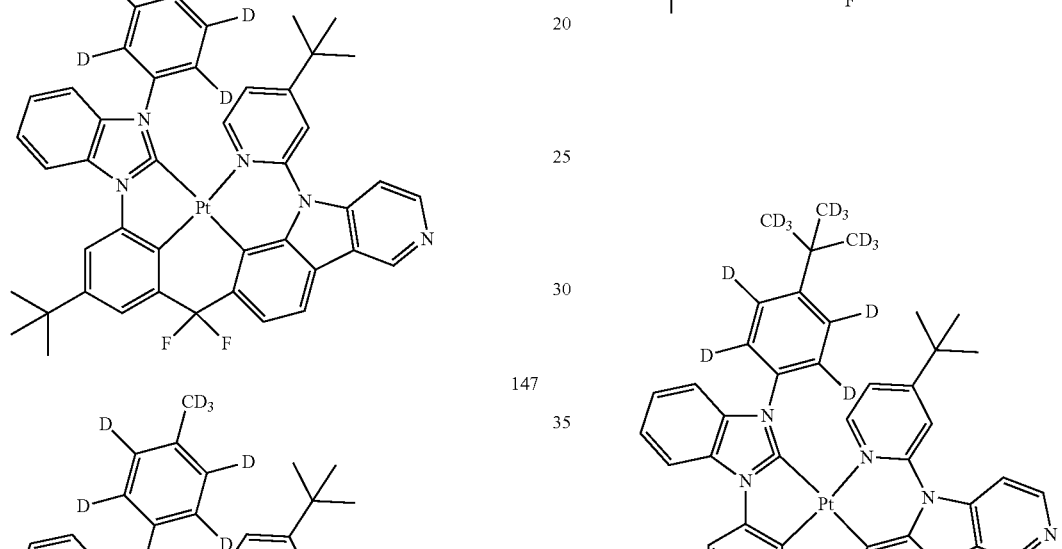
150
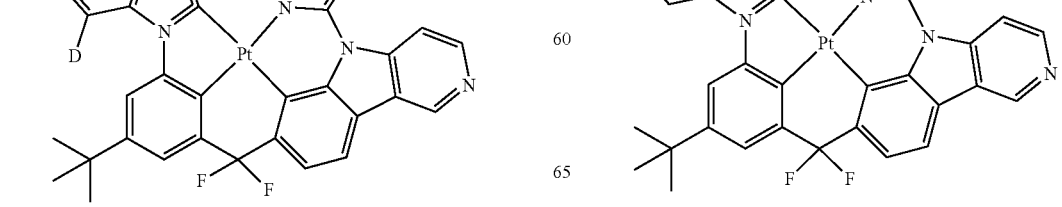
151

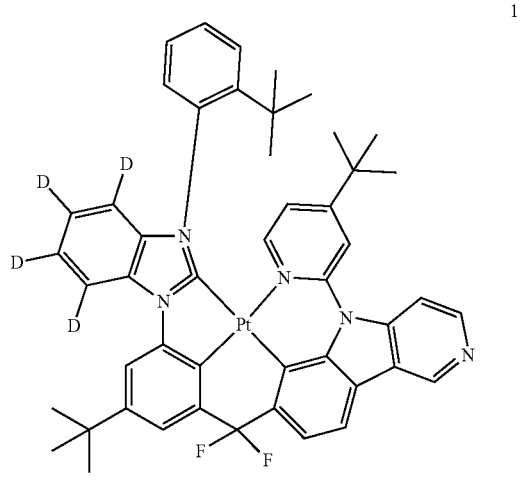
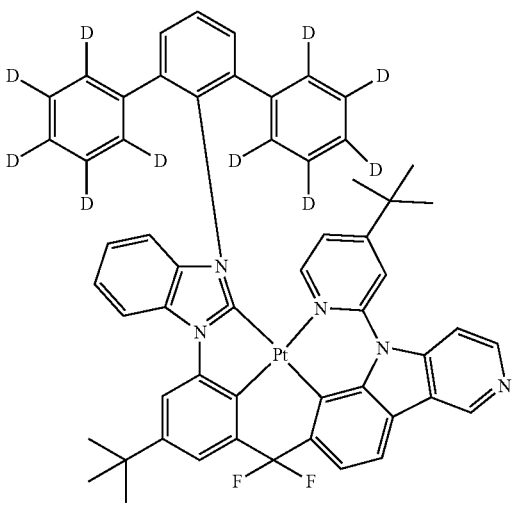
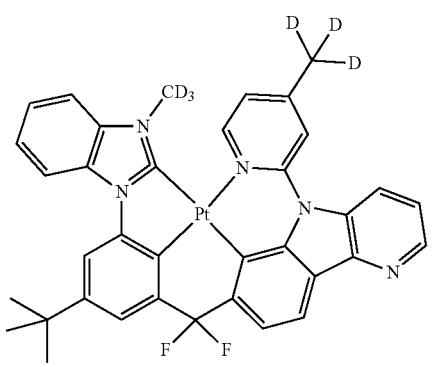
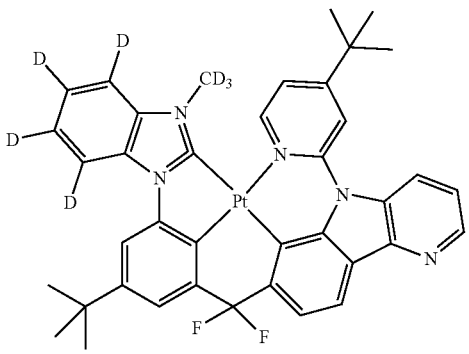
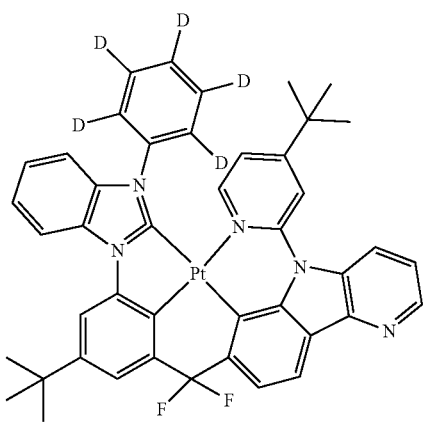

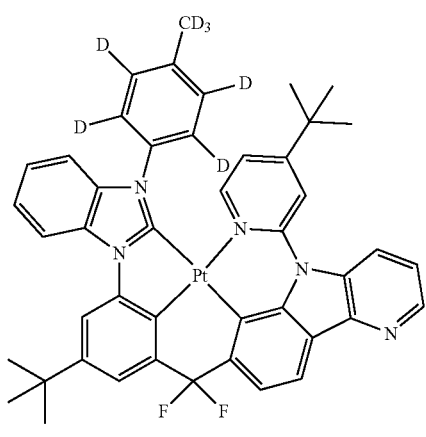
159
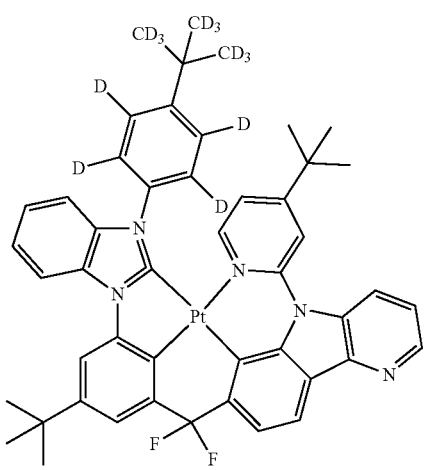
162
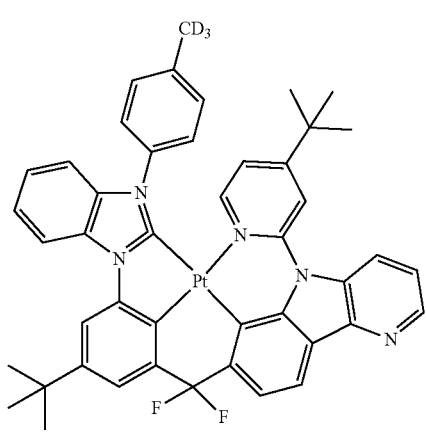
160
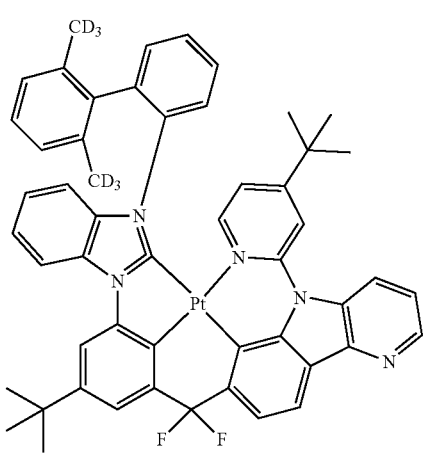
163
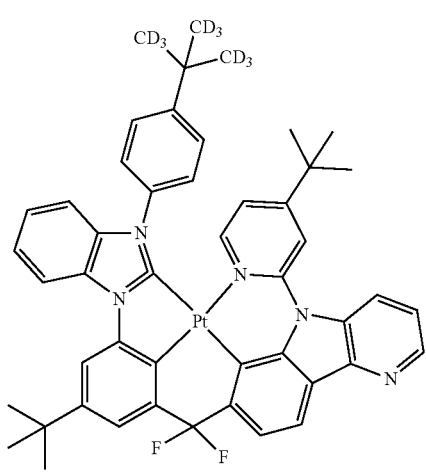
161
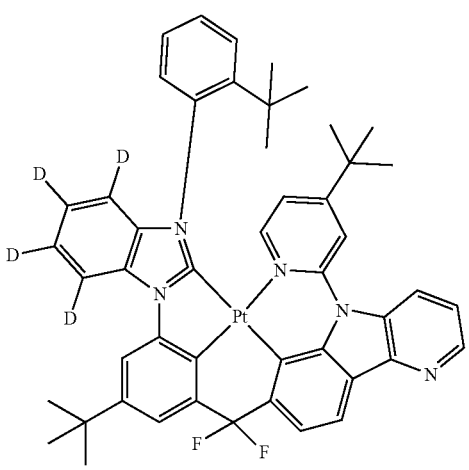
164

165
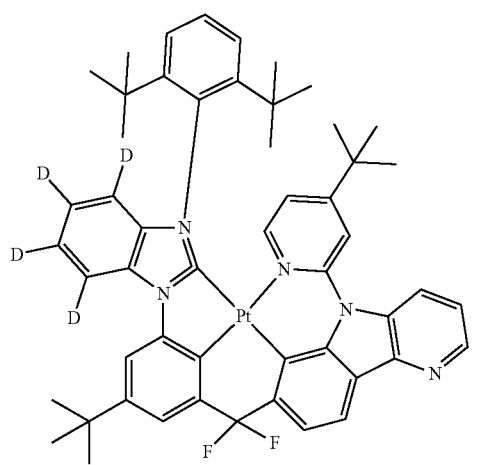
166
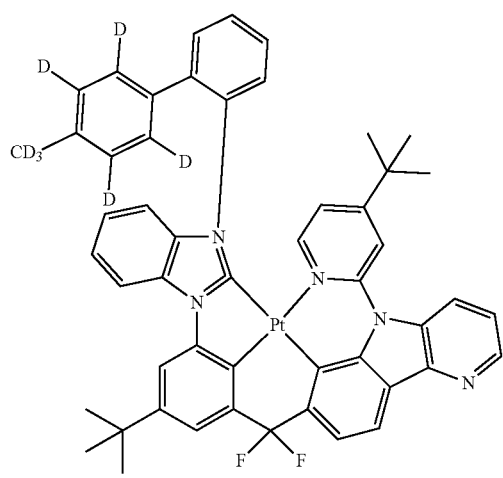
167
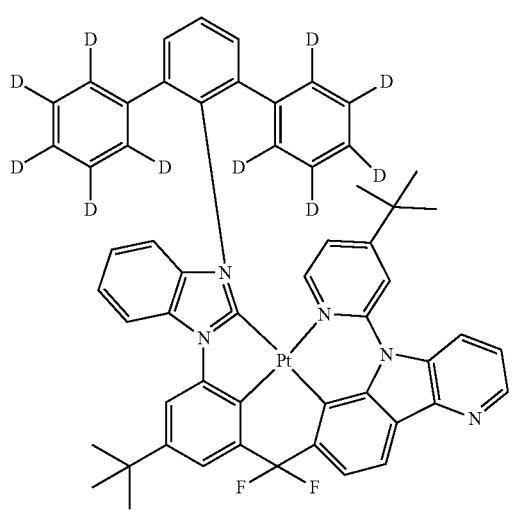
168
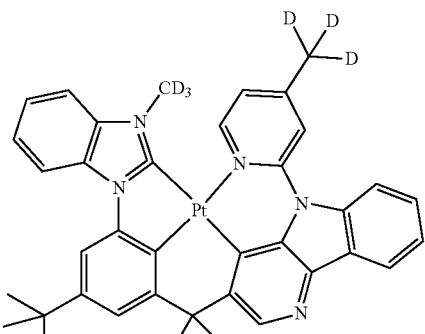
169
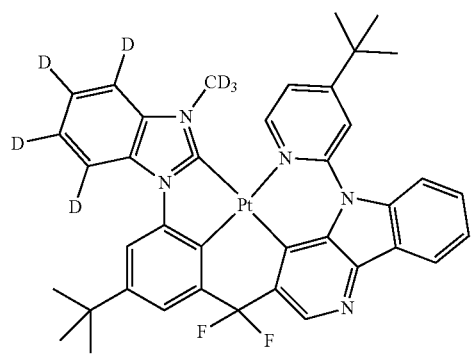
170
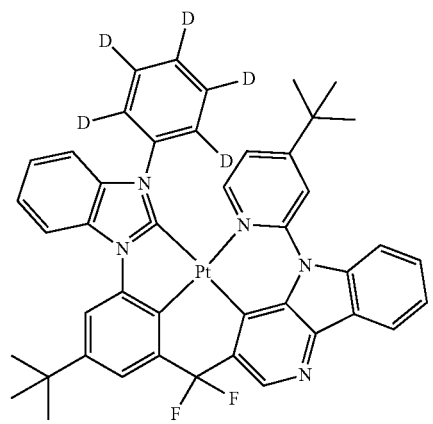
171
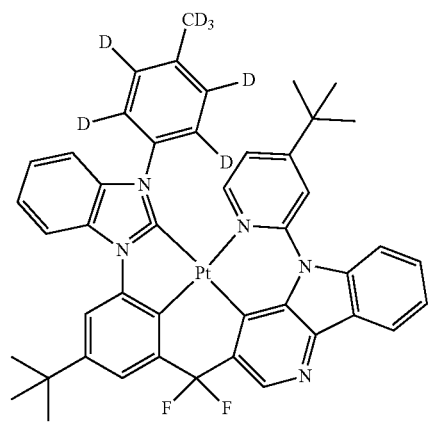

172
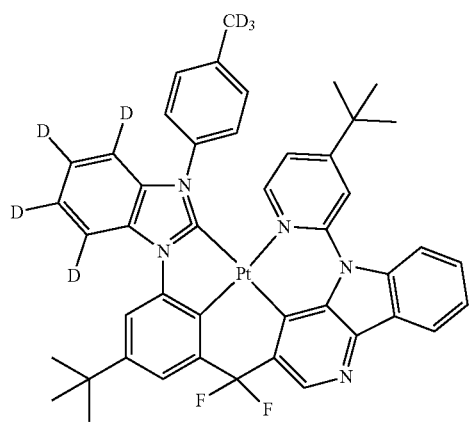
173
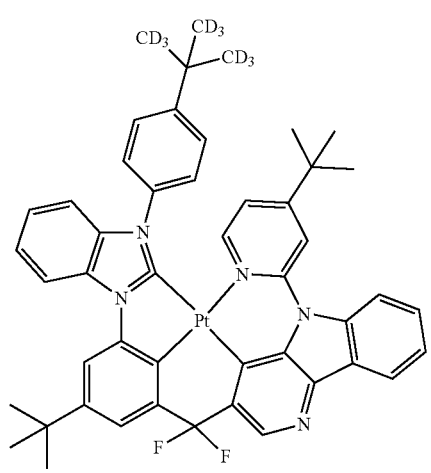
174
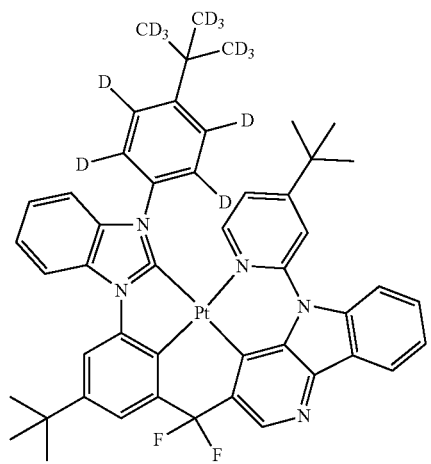
175
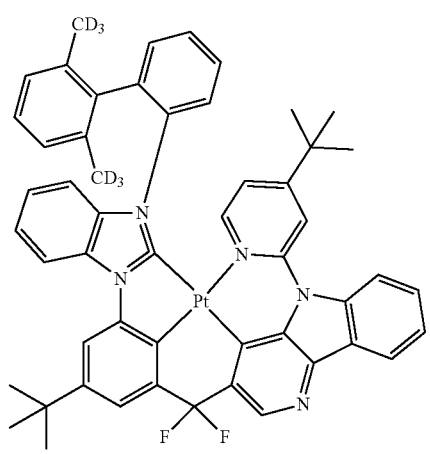
176
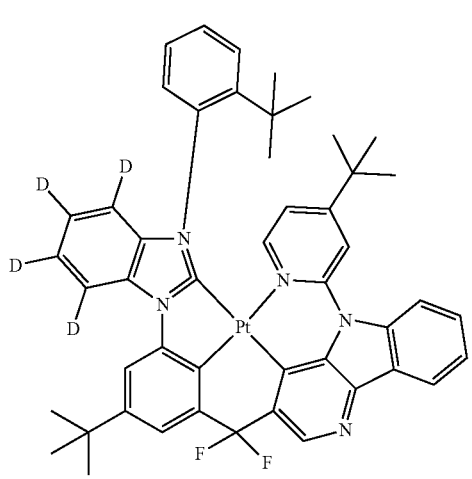
177
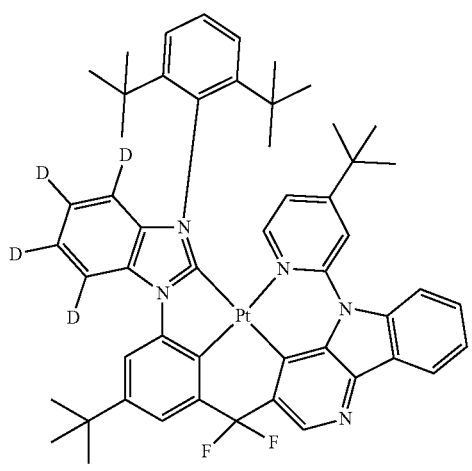

75
-continued
178
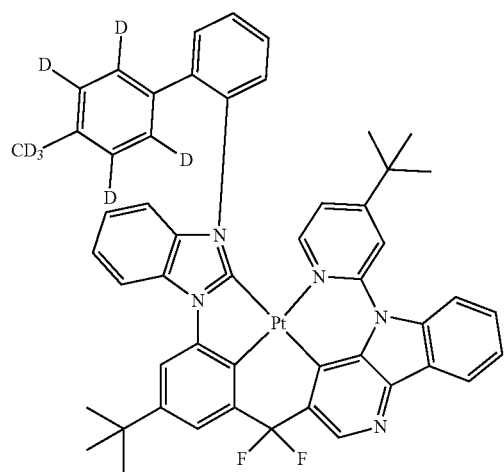
179
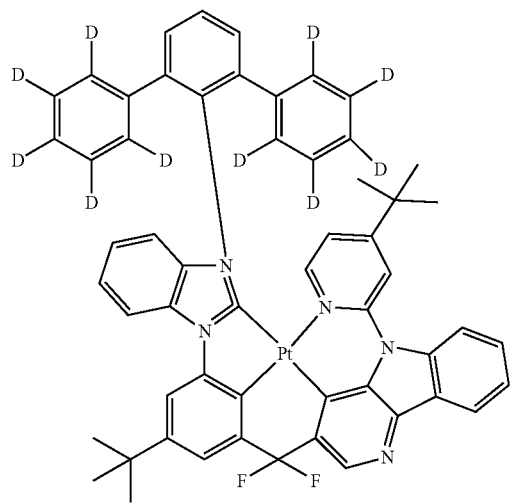
180
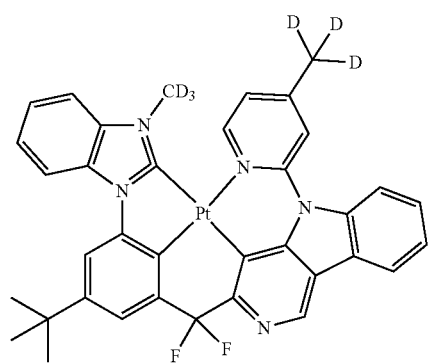
76
-continued
181
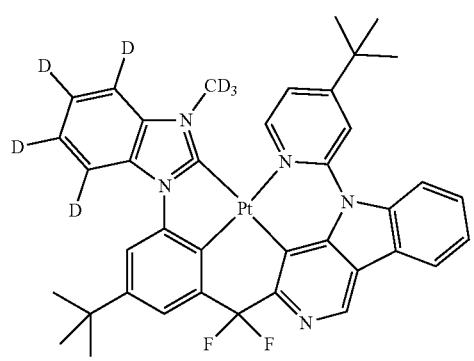
182
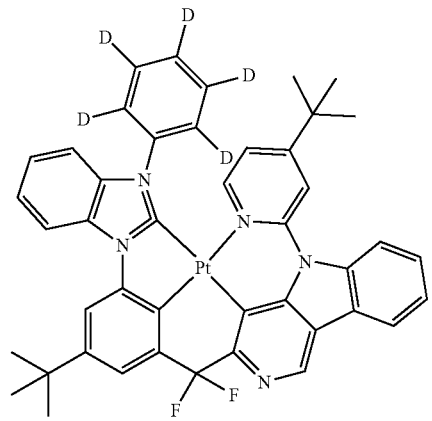
183
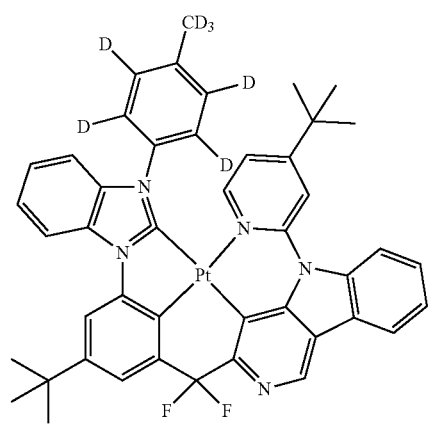
184
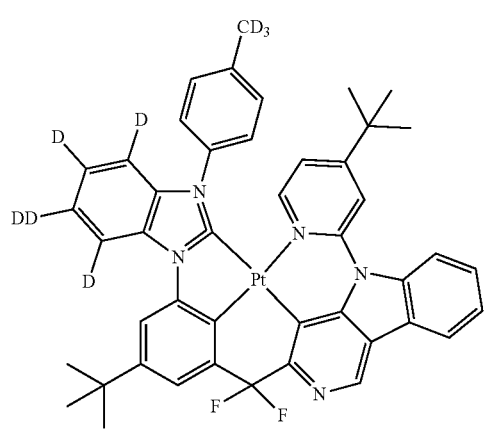

185
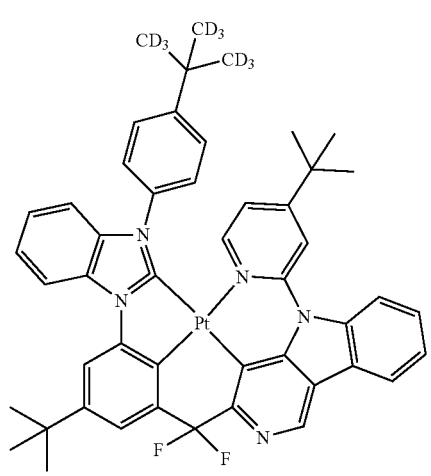
186
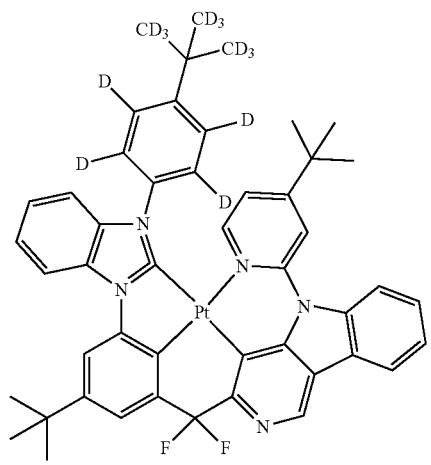
187
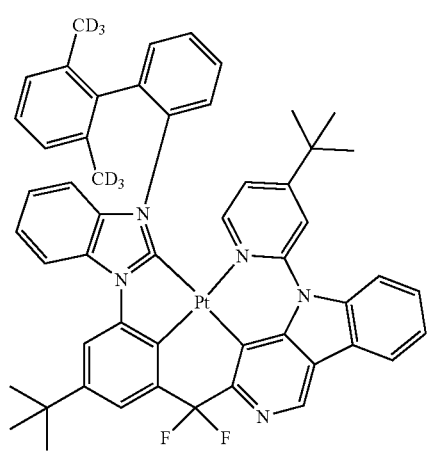
188
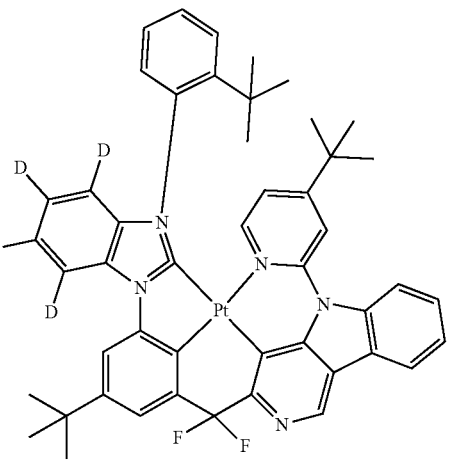
189
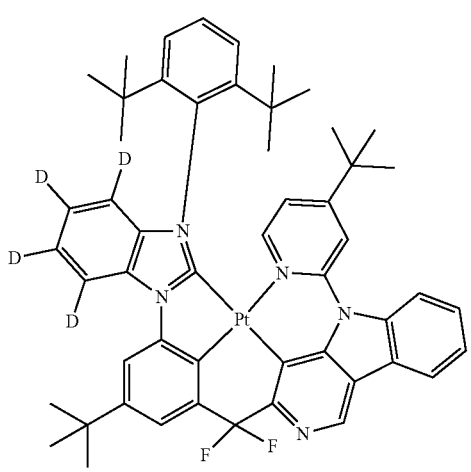
190
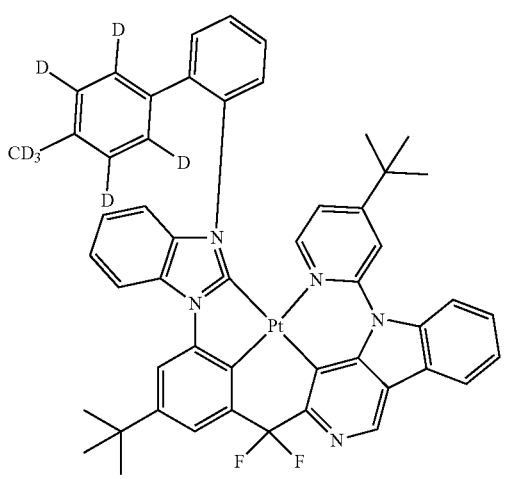

-continued

191

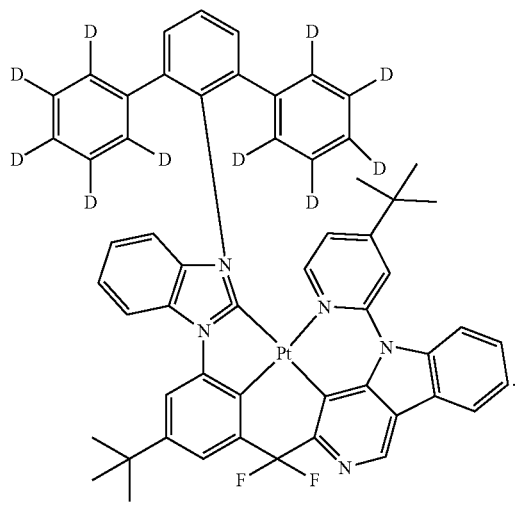

In the compounds provided in Compound Group 1, "D" corresponds to a deuterium atom.

In an organic electroluminescence device 10 of an embodiment, an emission layer EML may include an organometallic compound of an embodiment, which includes a carboline group and a deuterium atom, and may show improved emission efficiency properties. The organometallic compound according to an embodiment may include a carboline group and a deuterium atom, and may show an improved $^3$MLCT ratio.

In the organic electroluminescence devices 10 of embodiments as shown in FIG. 1 to FIG. 4, the emission layer EML may include a host and a dopant, and the emission layer EML may include the organometallic compound represented by Formula 1 as a dopant material.

In an embodiment, the emission layer EML may emit phosphorescence. For example, the organometallic compound according to an embodiment, represented by Formula 1 may be a phosphorescence dopant.

In some embodiments, the emission layer EML may further include a host material in addition to the organometallic compound of an embodiment. In the organic electroluminescence device 10 of an embodiment, the emission layer EML may include any suitable materials generally used in the art as the host material. In some embodiments, at least one selected from among bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris (carbazol-9-yl) triphenylamine (TCTA) or 1,3,5-tris(1-phenyl-1H-benzo[d]imidazol-2-yl)benzene (TPBi) may be included. The present disclosure, however, is not limited thereto. For example, tris(8-hydroxyquinolino)aluminum (Alq$_3$), 4,4'-bis (N-carbazolyl)-1,1'-biphenyl (CBP), poly(n-vinylcarbazole) (PVK), 9,10-di(naphthalene-2-yl)anthracene (ADN), 4,4', 4"-tris)carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), bis(4-(9H-carbazol-9-yl)phenyl)diphenylsilane (BCPDS), 4-(1-(4-(diphenylamino)phenyl)cyclohexyl)phenyl)diphenylphosphine oxide (POPCPA), etc., may be used as the host material.

In some embodiments, the emission layer EML of the organic electroluminescence device 10 may further include any suitable dopant material generally used in the art in addition to the organometallic compound. For example, the emission layer EML may further include any suitable fluorescence dopant material, any suitable delayed fluorescence dopant material, and/or any suitable phosphorescence dopant material generally used in the art.

In some embodiments, the organic electroluminescence device 10 may include a plurality of emission layers. The plurality of emission layers may be provided by stacking in order. For example, an organic electroluminescence device 10 including a plurality of emission layers may emit white light. The organic electroluminescence device including a plurality of emission layers may be an organic electroluminescence device of a tandem structure. In case where an organic electroluminescence device 10 includes a plurality of emission layers, at least one emission layer EML may include the above-described organometallic compound of an embodiment.

In the organic electroluminescence devices 10 of an embodiment, shown in FIG. 1 to FIG. 4, an electron transport region ETR is provided on an emission layer EML. The electron transport region ETR may include at least one of a hole blocking layer HBL, an electron transport layer ETL or an electron injection layer EIL. The present disclosure, however, is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be in a range of, for example, from about 1,000 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum (Alq$_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d] imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5- diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), 1,3-bis[3,5-di(pyridin-3-yl)phenyl]benzene (BmPyPhB), or a mixture thereof, without limitation. The thickness of the electron transport layer ETL may be in a range of from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include, a metal halide such as LiF, NaCl, CsF, RbCl, RbI, and/or CuI, a lanthanide such as Yb, a metal oxide such as $Li_2O$ and/or BaO, and/or lithium quinolate (LiQ). The present disclosure, however, is not limited thereto. The electron injection layer EIL also may be formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates. The thickness of the electron injection layer EIL may be in a range of from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). The present disclosure, however, is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, and/or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be coupled to an auxiliary electrode. If the second electrode EL2 is coupled to the auxiliary electrode, the resistance of the second electrode EL2 may decrease.

A capping layer (CPL) may be further on the second electrode EL2 of the organic electroluminescence device 10 of an embodiment. The capping layer (CPL) may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), N,N'-bis(naphthalene-1-yl), etc.

The organic electroluminescence device 10 according to an embodiment of the present disclosure includes an organometallic compound which includes a carboline group and a deuterium atom in an emission layer as described above, and may show excellent emission efficiency properties.

Hereinafter, the compound according to an embodiment of the present disclosure and the organic electroluminescence device of an embodiment will be further explained by referring to embodiments and comparative embodiments. The following embodiments are only illustrations to assist the understanding of the present disclosure, and the scope of the present disclosure is not limited thereto.

EXAMPLES

1. Syntheses of Organometallic Compounds

The organometallic compound according to an embodiment of the present disclosure may be prepared, for example, as follows. Embodiments of the synthetic method of the organometallic compound of the present disclosure, however, are not limited thereto.

(1) Synthesis of Organometallic Compound 18

Organometallic Compound 18 according to an embodiment may be synthesized, for example, by the acts shown in the following Reaction 1:

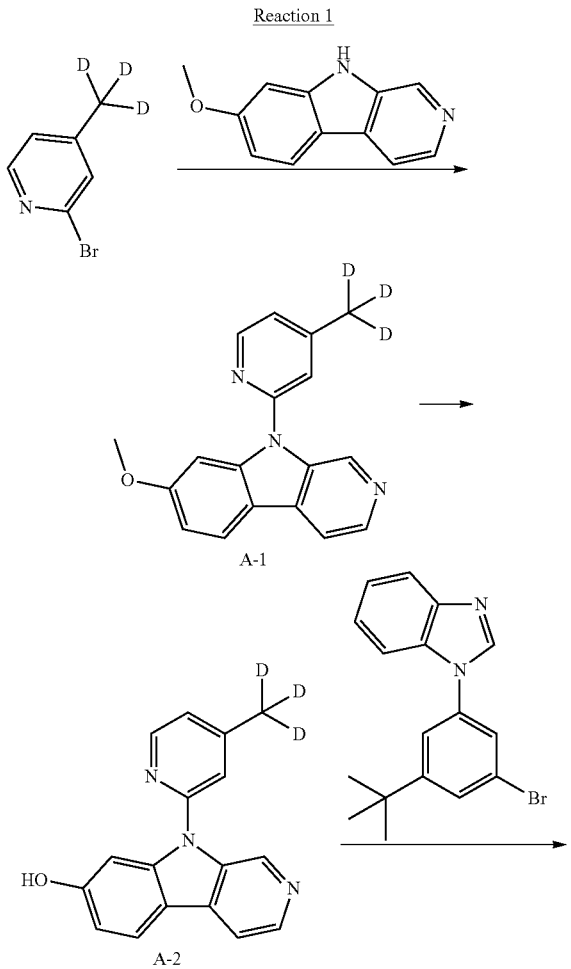

Reaction 1

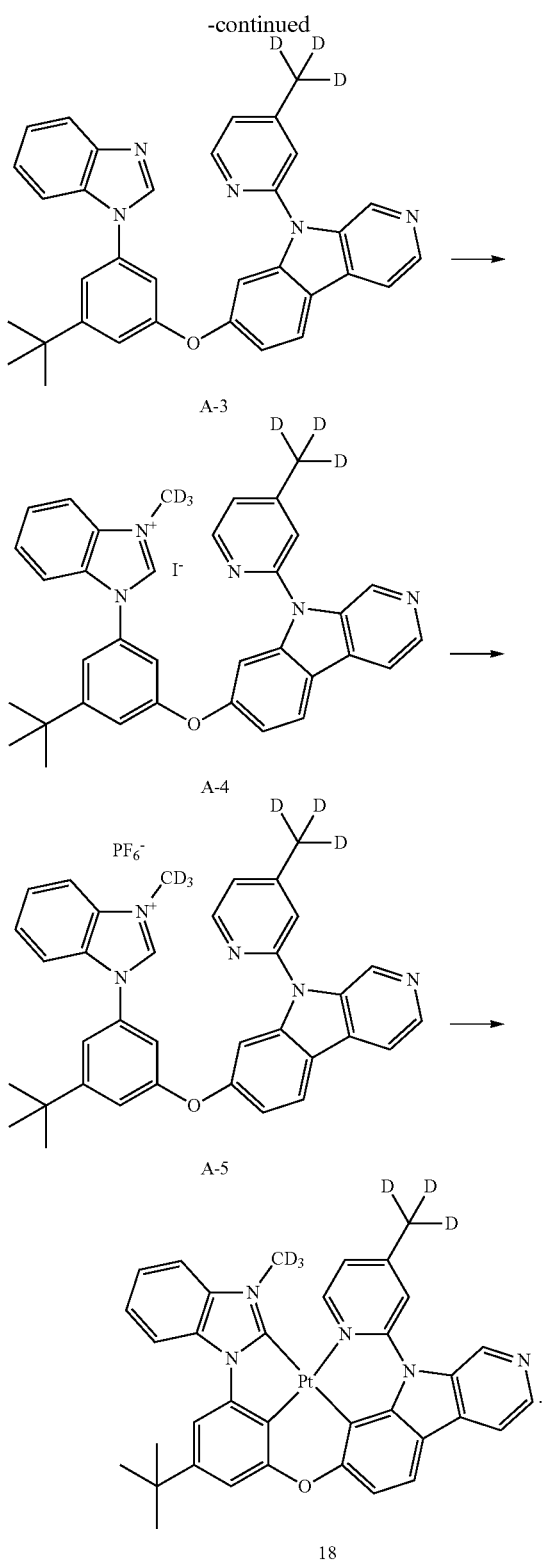

Synthesis of Intermediate A-1

9.91 g (50 mmol) of 7-methoxy-9H-pyrido[3,4-b]indole, 13.1 g (75 mmol) of 2-bromo-4-(methyl-d3)pyridine, 23 g (100 mmol) of potassium triphosphate, 1.83 g (10 mmol) of CuI, and 1.17 g (10 mmol) of picolinic acid were added to a reaction vessel and then suspended in 150 ml of dimethyl sulfoxide. The reaction mixture was heated and stirred at about 160° C. for about 24 hours. After finishing the reaction, the reaction product was cooled to room temperature, 300 ml of distilled water was added thereto, and the reaction product was extracted with ethyl acetate. An organic layer thus extracted was washed with a saturated aqueous sodium chloride solution and dried with sodium sulfate. The residue obtained by removing the solvent was separated using column chromatography to obtain 13.1 g (45 mmol) of a target compound.

Synthesis of Intermediate A-2

13.1 g (45 mmol) of Intermediate [A-1] was suspended in an excessive amount of a bromic acid solution. The reaction mixture was heated and stirred at about 110° C. for about 24 hours. After finishing the reaction, the reaction product was cooled to room temperature, and a suitable amount of sodium bicarbonate was added for neutralization. 300 ml of distilled water was added thereto, and the reaction product was extracted with ethyl acetate. An organic layer thus extracted was washed with a saturated aqueous sodium chloride solution and dried with sodium sulfate. The residue obtained by removing the solvent was separated using column chromatography to obtain 9.56 g (35 mmol) of a target compound.

Synthesis of Intermediate A-3

14.2 g (43 mmol) of 1-(3-bromo-5-t-butyl)phenyl)1H-benzo[d]imidazole, 9.1 g (35 mmol) of Intermediate [A-2], 16.2 g (70 mmol) of potassium triphosphate, 1.3 g (7.0 mmol) of CuI, and 0.8 g (7.0 mmol) of picolinic acid were added to a reaction vessel and then suspended in 100 ml of dimethyl sulfoxide. The reaction mixture was heated and stirred at about 160° C. for about 24 hours. After finishing the reaction, the reaction product was cooled to room temperature, 300 ml of distilled water was added thereto, and the reaction product was extracted with ethyl acetate. An organic layer thus extracted was washed with a saturated aqueous sodium chloride solution and dried with sodium sulfate. The residue obtained by removing the solvent was separated using column chromatography to obtain 13.4 g (26 mmol) of a target compound.

Synthesis of Intermediate A-4

13.4 g (26 mmol) of Intermediate [A-3] was suspended in an excessive amount of methane iodide. The reaction mixture was heated and stirred at about 110° C. for about 24 hours. After finishing the reaction, the reaction product was cooled to room temperature, and the solid thus produced was filtered and washed with ether. The solid thus washed was separated through recrystallization to obtain 14.8 g (22 mol) of a target compound.

Synthesis of Intermediate A-5

14.8 g (22 mmol) of Intermediate [A-4] and 14.6 g (88 mmol) of ammonium hexafluorophosphate were added to a reaction vessel and then suspended in a mixture solution of 240 ml of methyl alcohol and 60 ml of water. The reaction mixture was stirred at room temperature for about 24 hours. After finishing the reaction, the solid thus obtained was filtered and washed with ether. The solid thus washed was dried to obtain 12.4 g (18 mmol) of a target compound.

Synthesis of Compound 18

6.2 g (9 mmol) of Intermediate [A-5], 3.7 g (9.9 mmol) of dichloro(1,5-cyclooctadiene)platinum and 4.4 g (54 mmol) of sodium acetate were suspended in 140 ml of dioxane. The reaction mixture was heated and stirred at about 110° C. for about 72 hours. After finishing the reaction, the reaction product was cooled to room temperature, 100 ml of distilled water was added thereto, and the reaction product was extracted with ethyl acetate. An organic layer thus extracted was washed with a saturated aqueous sodium chloride solution and dried with sodium sulfate. The residue obtained by removing the solvent was separated using column chromatography to obtain 1.77 g (2.4 mmol) of a target compound.
(2) Synthesis of Organometallic Compound 29
Organometallic Compound 29 according to an embodiment may be synthesized, for example, by the acts shown in the following Reaction 2:
Reaction 2
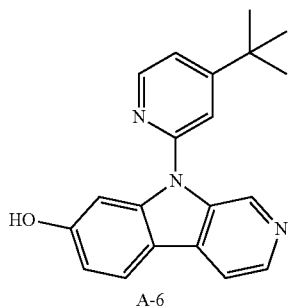
A-6
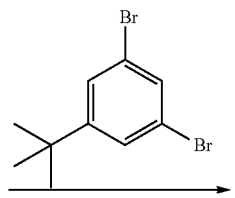
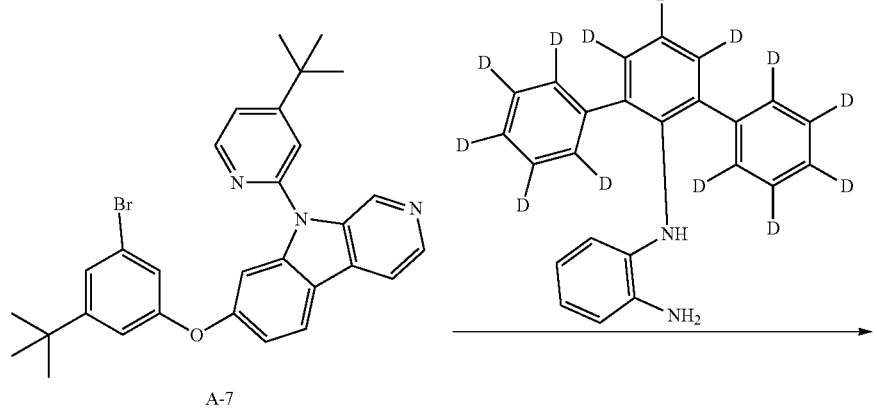
A-7
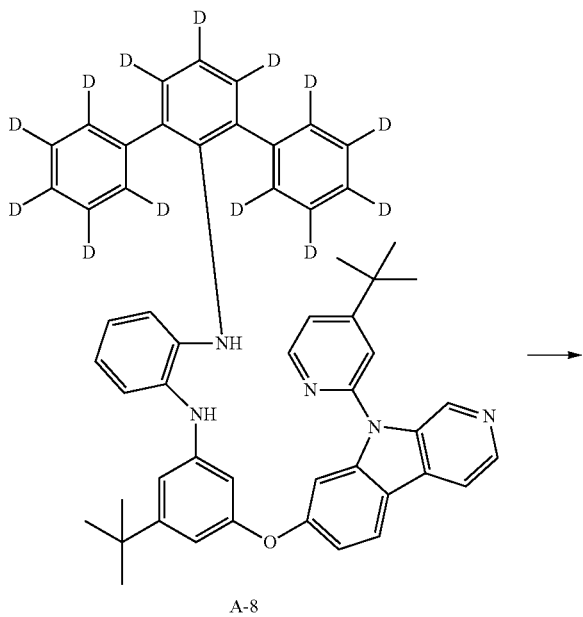
A-8

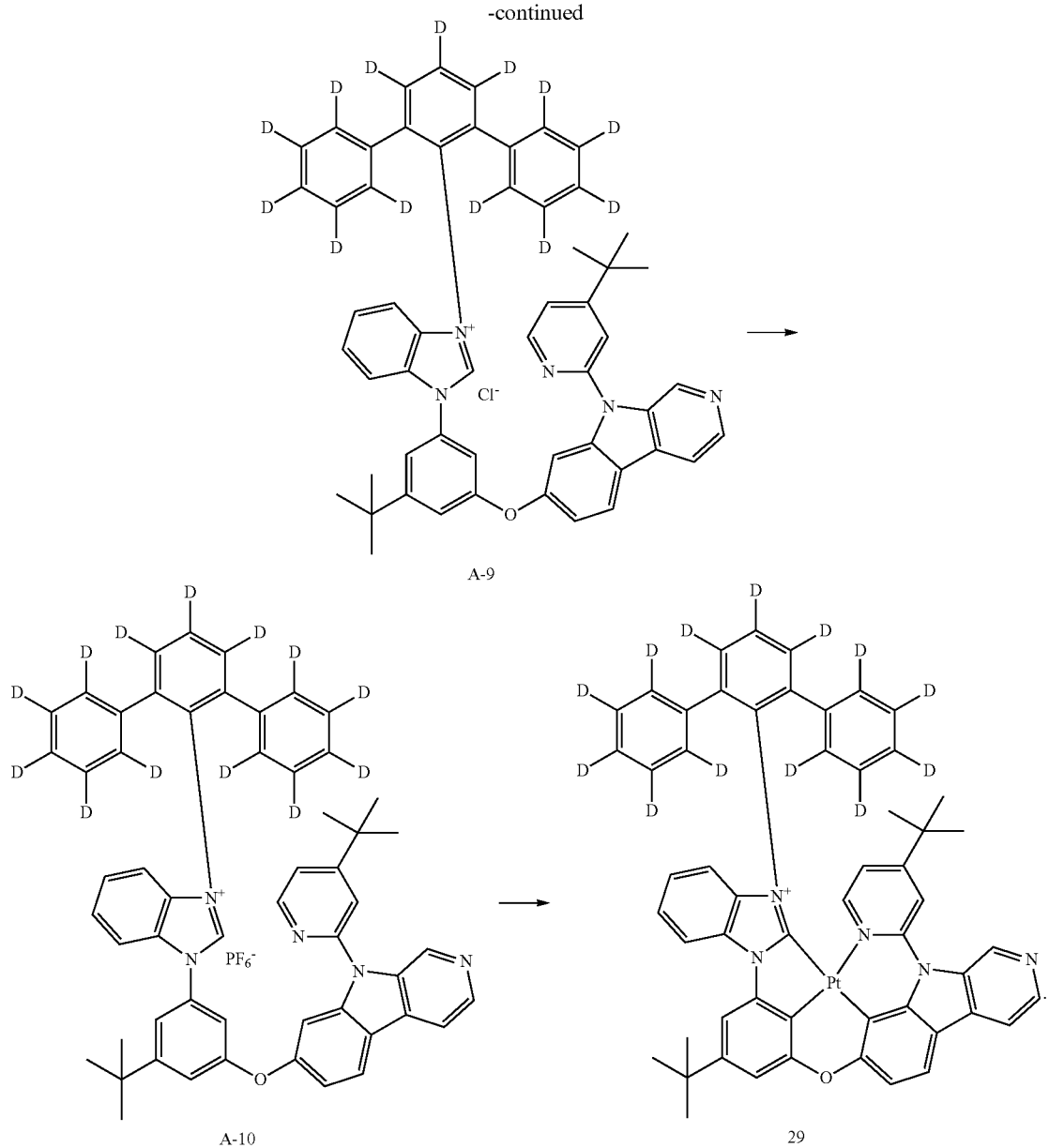

Synthesis of Intermediate A-6

A target compound was obtained by performing substantially the same method for synthesizing Intermediate A-2 of Compound 18 except for using 2-bromo-4-(t-butyl)pyridine instead of 2-bromo-4-(methyl-d3)pyridine.

Synthesis of Intermediate A-7

A target compound was obtained by performing substantially the same method for synthesizing Intermediate A-3 of Compound 18 except for using Intermediate [A-6] instead of Intermediate [A-2], and using 1,3-dibromo-5-(t-butyl)benzene instead of 1-(3-bromo-5-t-butyl)phenyl)1H-benzo[d]imidazole.

Synthesis of Intermediate A-8

5.28 g (10 mmol) of Intermediate [A-7], 3.84 g (11 mmol) of N-{[1,1':3,1"-terphenyl]-2'-nyl-d13}benzene-1,2-diamine, 0.75 mmol of SPhos, 0.5 mmol of $Pd_2(dba)_3$, and 20 mmol of sodium t-butoxide were suspended in 100 ml of a toluene solution. The reaction mixture was heated to about 100° C. and stirred for about 5 hours. After finishing the reaction, the solvent was removed under a reduced pressure, and the resultant product was extracted with methylene chloride and distilled water. An extracted organic layer was washed with a saturated sodium chloride aqueous solution and dried with sodium sulfate. The residue obtained by removing the solvent was separated using column chromatography to obtain 6.06 g (7.6 mmol) of a target compound.

Synthesis of Intermediate A-9

6.06 g (7.6 mmol) of Intermediate [A-8] was dissolved in 380 mmol of triethyl orthoformate, and then, 9.12 mmol of HCl was added thereto dropwise. The temperature was elevated to about 100° C. and stirring was performed for about 20 hours. After finishing the reaction, the solvent was removed under a reduced pressure, and the resultant product was extracted with methylene chloride and distilled water. An extracted organic layer was washed with a saturated sodium chloride aqueous solution and dried with sodium sulfate. The residue obtained by removing the solvent was separated using column chromatography to obtain 4.98 g (5.9 mmol) of a target compound.

Synthesis of Intermediate A-10

A target compound was obtained by performing substantially the same method for synthesizing Intermediate [A-5] of Compound 18 except for using Intermediate [A-9] instead of Intermediate [A-4].

Synthesis of Compound 29

A target compound was obtained by performing substantially the same method for synthesizing Compound 18 except for using Intermediate [A-10] instead of Intermediate [A-5].

(3) Synthesis of Organometallic Compound 50

Organometallic Compound 50 according to an embodiment may be synthesized, for example, by the acts shown in the following Reaction 3:

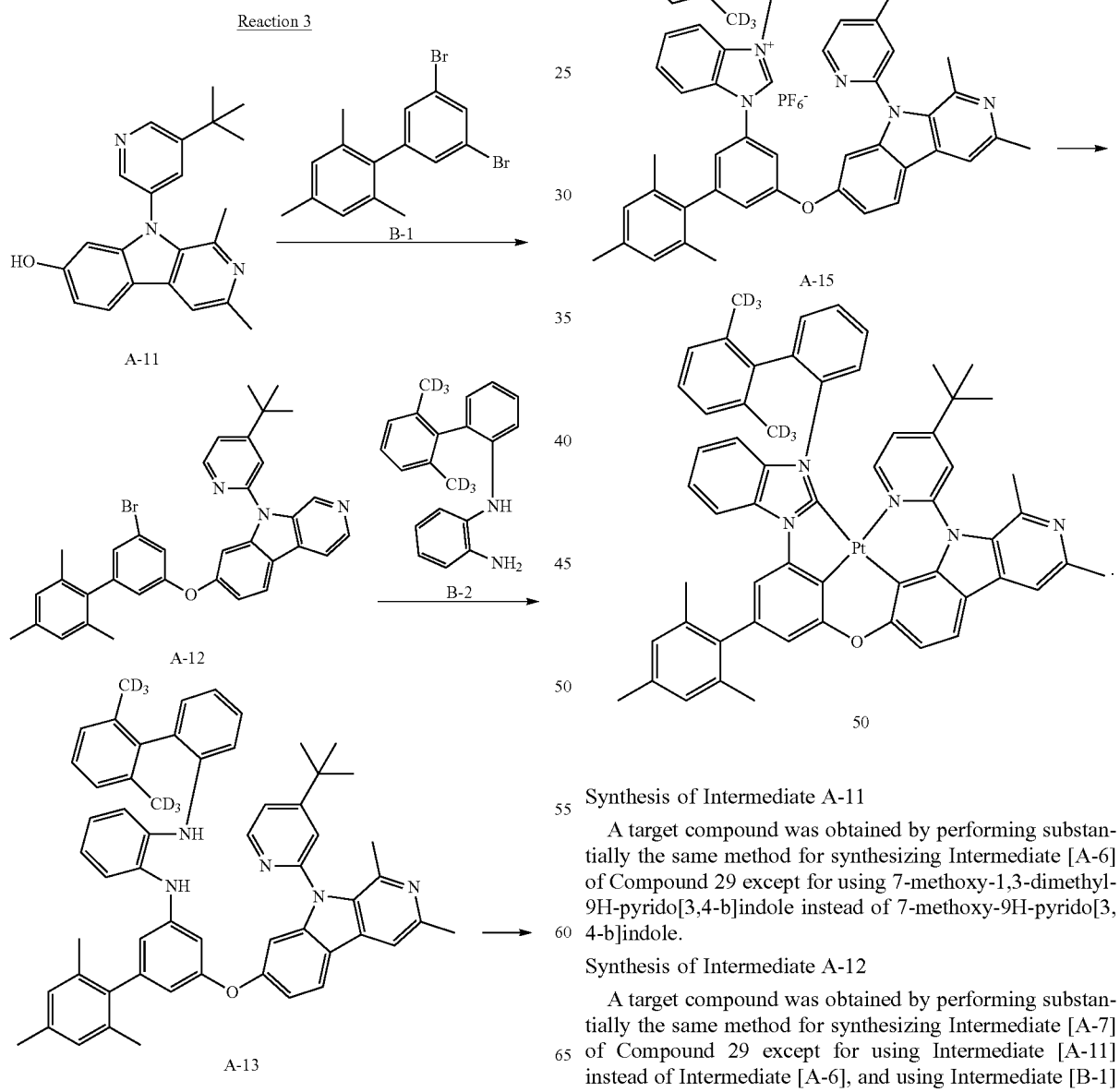

Synthesis of Intermediate A-11

A target compound was obtained by performing substantially the same method for synthesizing Intermediate [A-6] of Compound 29 except for using 7-methoxy-1,3-dimethyl-9H-pyrido[3,4-b]indole instead of 7-methoxy-9H-pyrido[3,4-b]indole.

Synthesis of Intermediate A-12

A target compound was obtained by performing substantially the same method for synthesizing Intermediate [A-7] of Compound 29 except for using Intermediate [A-11] instead of Intermediate [A-6], and using Intermediate [B-1] instead of 1,3-dibromo-5-(t-butyl)benzene.

Synthesis of Intermediate A-13

A target compound was obtained by performing substantially the same method for synthesizing Intermediate [A-8] of Compound 29 except for using Intermediate [A-12] instead of Intermediate [A-7], and using Intermediate [B-2] instead of N-{[1,1':3,1"-terphenyl]-2'-nyl-d13}benzene-1,2-diamine.

Synthesis of Intermediate A-14

A target compound was obtained by performing substantially the same method for synthesizing Intermediate [A-9] of Compound 29 except for using Intermediate [A-13] instead of Intermediate [A-8].

Synthesis of Intermediate A-15

A target compound was obtained by performing substantially the same method for synthesizing Intermediate [A-10] of Compound 29 except for using Intermediate [A-14] instead of Intermediate [A-9].

Synthesis of Compound 50

A target compound, Organometallic Compound 50, was obtained by performing substantially the same method for synthesizing Compound 29 except for using Intermediate [A-15] instead of Intermediate [A-10].

(4) Synthesis of Organometallic Compound 79

A target compound, Organometallic Compound 79, was obtained by performing substantially the same method for synthesizing Compound 29 except for using 7-methoxy-5H-pyrido[3,4-b]indole instead of 7-methoxy-9H-pyrido[3,4-b]indole, and using $N^1$-{4'-.(methyl-$d_3$)-[1,1'[diphenyl]-2-nyl-2',3',5',6'-$d_4$)benzene-1,2-diamine instead of N—{[1,1':3,1"-terphenyl]2'-nyl-$d_{13}$}benzene-1,2-diamine.

(5) Synthesis of Organometallic Compound 119

A target compound, Organometallic Compound 119, was obtained by performing substantially the same method for synthesizing Compound 29 except for using 3-methoxy-5H-pyrido[3,4-b]indole-6,7,8,9-$d_4$ instead of 7-methoxy-9H-pyrido[3,4-b]indole, and using $N^1$-(2,6-di-t-butylphenyl)benzene-$d_3$-1,2-diamine instead of N-{[1,1':3,1"-terphenyl]-2'-nyl-$d_{13}$}benzene-1,2-diamine.

(6) Synthesis of Organometallic Compound 129

Organometallic Compound 129 according to an embodiment may be synthesized, for example, by the acts shown in the following Reaction 4:

Reaction 4

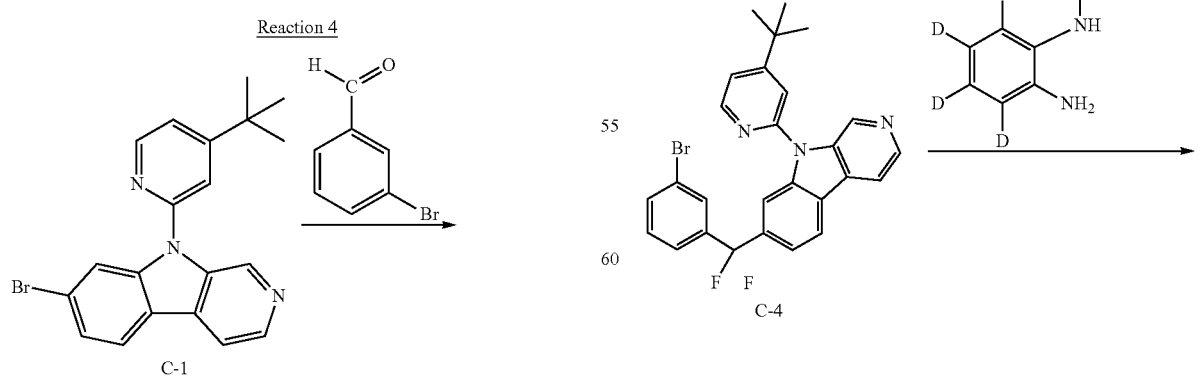

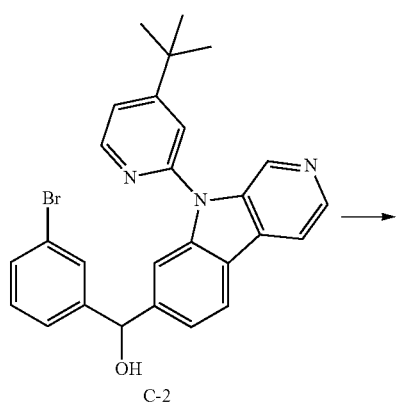

C-2

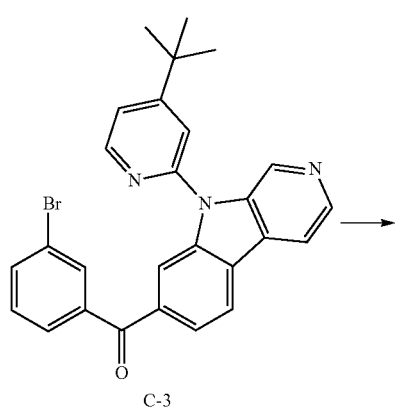

C-3

C-4

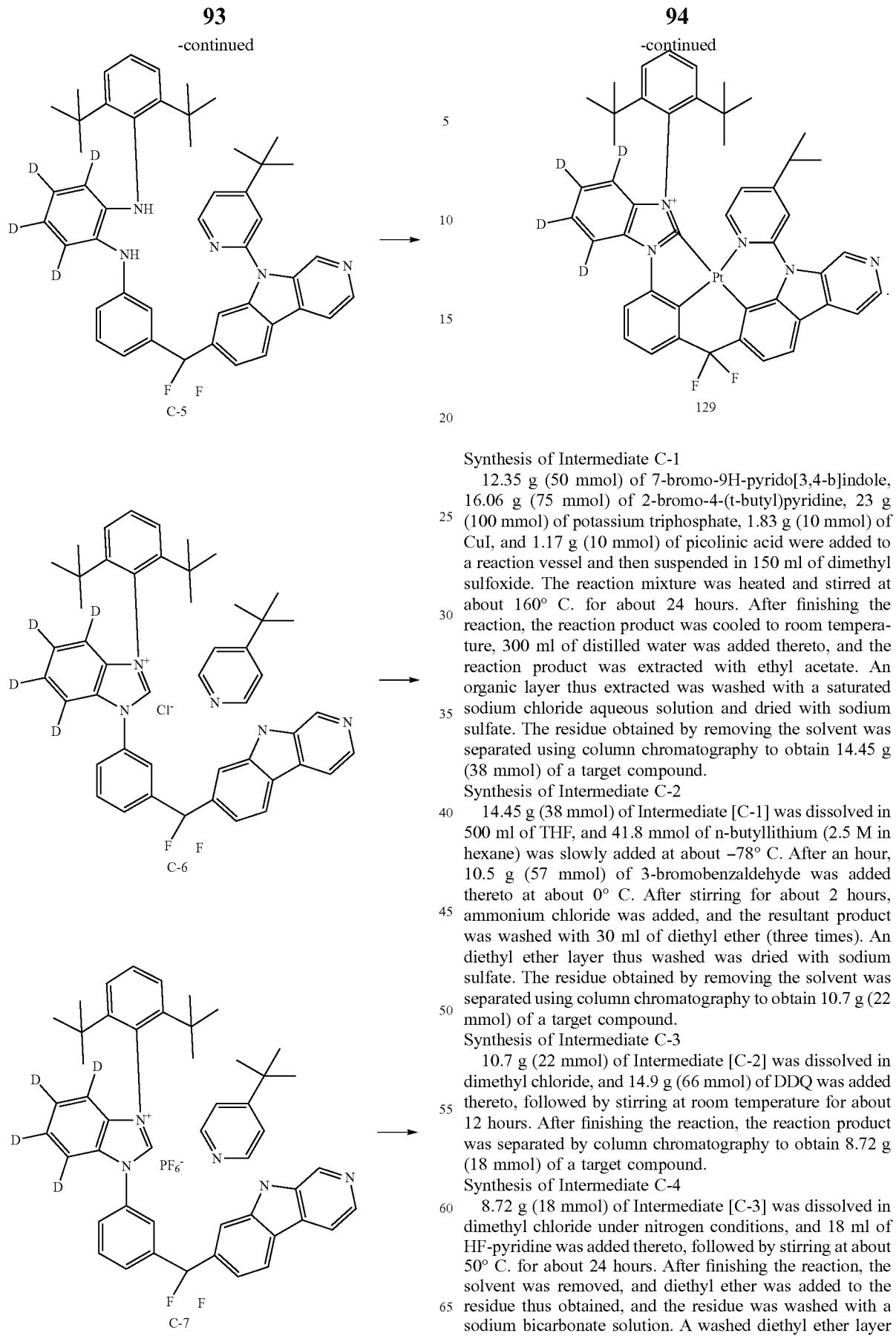

Synthesis of Intermediate C-1

12.35 g (50 mmol) of 7-bromo-9H-pyrido[3,4-b]indole, 16.06 g (75 mmol) of 2-bromo-4-(t-butyl)pyridine, 23 g (100 mmol) of potassium triphosphate, 1.83 g (10 mmol) of CuI, and 1.17 g (10 mmol) of picolinic acid were added to a reaction vessel and then suspended in 150 ml of dimethyl sulfoxide. The reaction mixture was heated and stirred at about 160° C. for about 24 hours. After finishing the reaction, the reaction product was cooled to room temperature, 300 ml of distilled water was added thereto, and the reaction product was extracted with ethyl acetate. An organic layer thus extracted was washed with a saturated sodium chloride aqueous solution and dried with sodium sulfate. The residue obtained by removing the solvent was separated using column chromatography to obtain 14.45 g (38 mmol) of a target compound.

Synthesis of Intermediate C-2

14.45 g (38 mmol) of Intermediate [C-1] was dissolved in 500 ml of THF, and 41.8 mmol of n-butyllithium (2.5 M in hexane) was slowly added at about −78° C. After an hour, 10.5 g (57 mmol) of 3-bromobenzaldehyde was added thereto at about 0° C. After stirring for about 2 hours, ammonium chloride was added, and the resultant product was washed with 30 ml of diethyl ether (three times). An diethyl ether layer thus washed was dried with sodium sulfate. The residue obtained by removing the solvent was separated using column chromatography to obtain 10.7 g (22 mmol) of a target compound.

Synthesis of Intermediate C-3

10.7 g (22 mmol) of Intermediate [C-2] was dissolved in dimethyl chloride, and 14.9 g (66 mmol) of DDQ was added thereto, followed by stirring at room temperature for about 12 hours. After finishing the reaction, the reaction product was separated by column chromatography to obtain 8.72 g (18 mmol) of a target compound.

Synthesis of Intermediate C-4

8.72 g (18 mmol) of Intermediate [C-3] was dissolved in dimethyl chloride under nitrogen conditions, and 18 ml of HF-pyridine was added thereto, followed by stirring at about 50° C. for about 24 hours. After finishing the reaction, the solvent was removed, and diethyl ether was added to the residue thus obtained, and the residue was washed with a sodium bicarbonate solution. A washed diethyl ether layer was dried with sodium sulfate. The residue obtained by removing the solvent was stirred in hexane and recrystallized to obtain 8.6 g (17 mmol) of a target compound.

Synthesis of Intermediate C-5

A target compound was obtained by performing substantially the same method for synthesizing Intermediate [A-8] of Compound 29 except for using Intermediate [C-4] instead of Intermediate [A-7], and using $N^1$-(2,6-di-t-butylphenyl)benzene-$d_4$-1,2-diamine instead of N—{[1,1': 3,1"-terphenyl]-2'-nyl-$d_{13}$}benzene-1,2-diamine.

Synthesis of Intermediate C-6

A target compound was obtained by performing substantially the same method for synthesizing Intermediate [A-9] of Compound 29 except for using Intermediate [C-5] instead of Intermediate [A-8].

Synthesis of Intermediate C-7

A target compound was obtained by performing substantially the same method for synthesizing Intermediate [A-10] of Compound 29 except for using Intermediate [C-6] instead of Intermediate [A-9].

Synthesis of Compound 129

A target compound was obtained by performing substantially the same method for synthesizing Compound 29 except for using Intermediate [C-7] instead of Intermediate [A-10].

(7) Synthesis of Organometallic Compound 146

Organometallic Compound 146 according to an embodiment may be synthesized, for example, by the acts shown in the following Reaction 5:

Reaction 5

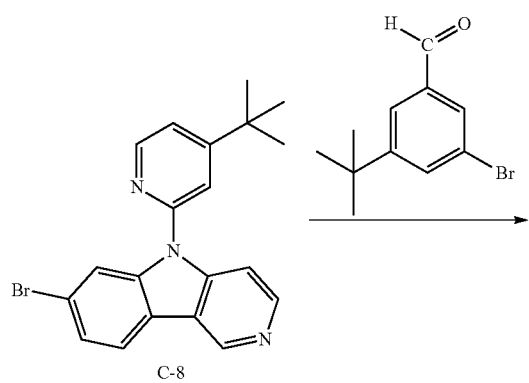

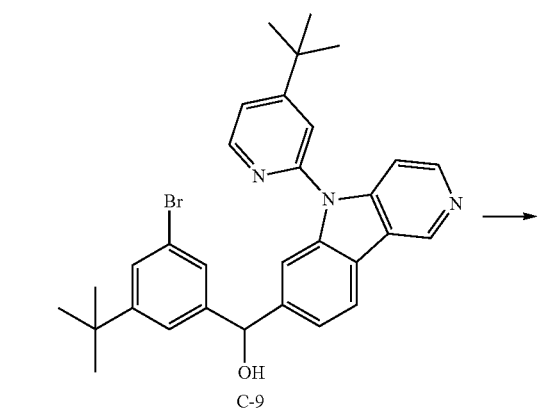

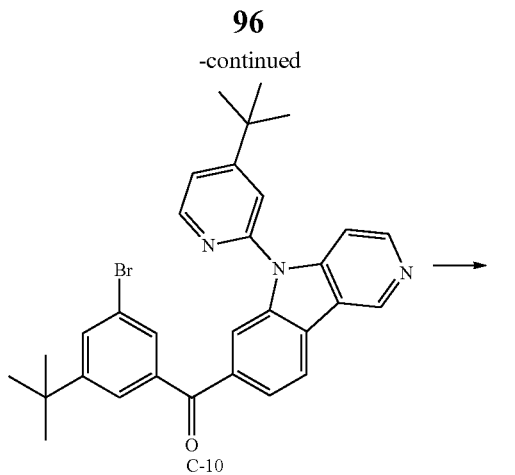

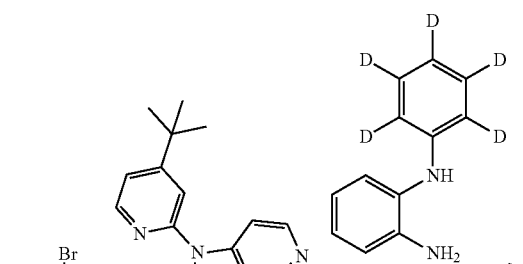

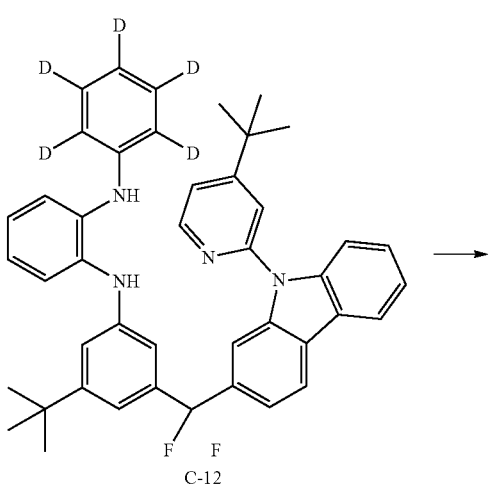

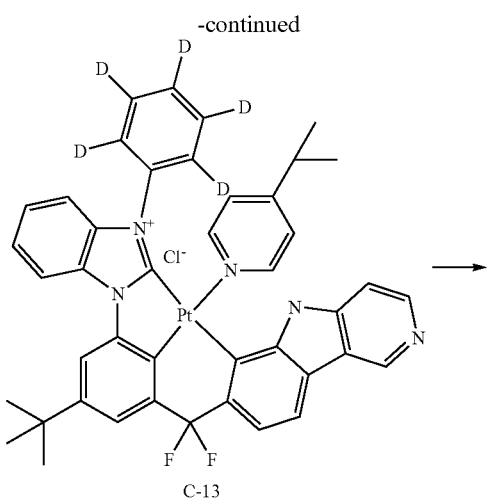

C-13

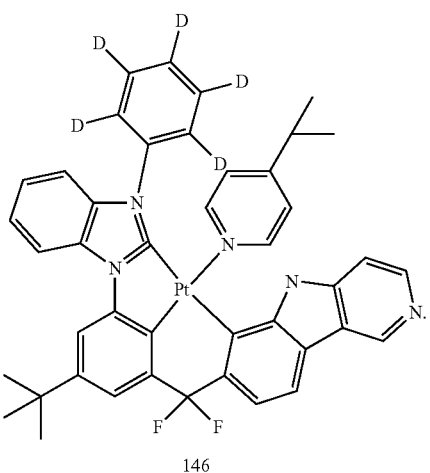

C-14

146

Synthesis of Intermediate C-8

A target compound was obtained by performing substantially the same method for synthesizing Intermediate [C-1] of Compound 129 except for using 7-bromo-5H-pyrido[4,3-b]indole instead of 7-bromo-9H-pyrido[3,4-b]indole and using 3-bromo-5-(t-butyl)benzaldehyde instead of 3-bromobenzaldehyde.

Synthesis of Intermediate C-9

A target compound was obtained by performing substantially the same method for synthesizing Intermediate [C-2] of Compound 129 except for using Intermediate [C-8] instead of Intermediate [C-1].

Synthesis of Intermediate C-10

A target compound was obtained by performing substantially the same method for synthesizing Intermediate [C-3] of Compound 129 except for using Intermediate [C-9] instead of Intermediate [C-2].

Synthesis of Intermediate C-11

A target compound was obtained by performing substantially the same method for synthesizing Intermediate [C-4] of Compound 129 except for using Intermediate [C-10] instead of Intermediate [C-3].

Synthesis of Intermediate C-12

A target compound was obtained by performing substantially the same method for synthesizing Intermediate [A-8] of Compound 29 except for using Intermediate [C-11] instead of Intermediate [A-7], and using $N^1$-(phenyl-d5)benzene-1,2-diamine instead of N—{[1,1': 3,1"-terphenyl]-2'-nyl-d13}benzene-1,2-diamine.

Synthesis of Intermediate C-13

A target compound was obtained by performing substantially the same method for synthesizing Intermediate [A-9] of Compound 29 except for using Intermediate [C-12] instead of Intermediate [A-9].

Synthesis of Compound 146

A target compound was obtained by performing substantially the same method for synthesizing Compound 29 except for using Intermediate [C-14] instead of Intermediate [A-10].

(8) Synthesis of Organometallic Compound 155

A target compound, Organometallic Compound 155, was obtained by performing substantially the same method for synthesizing Compound 146 except for using $N^1$-{[1,1': 3,1"-terphenyl]-2'-nyl-2,2",3,3",4,4",5,5",6,6"-d10}benzene-1,2-diamine instead of $N^1$-(phenyl-d5)benzene-1,2-diamine.

(9) Synthesis of Organometallic Compound 167

A target compound, Organometallic Compound 167, was obtained by performing substantially the same method for synthesizing Compound 155 except for using 7-bromo-5H-pyrido[3,2-b]indole instead of 7-bromo-5H-pyrido[4,3-b]indole.

(10) Synthesis of Organometallic Compound 191

A target compound, Organometallic Compound 191, was obtained by performing substantially the same method for synthesizing Compound 155 except for using 3-bromo-5H-pyrido[4,3-b]indole instead of 7-bromo-5H-pyrido[4,3-b]indole.

The $^1$H NMR and MS/FAB of the compounds synthesized by the aforementioned synthetic examples are shown in Table 1 below. The synthetic methods of the compounds other than the compounds shown in Table 1 may be readily recognized referring to the aforementioned processes and raw materials by a person skilled in the art.

TABLE 1

| Division | $^1$H NMR (CDCl$_3$, 400 MHz) | MS/FAB found | MS/FAB calc. |
|---|---|---|---|
| Compound 18 | δ 8.87(s, 1H), 8.74(d, 1H), 8.39(m, 2H), 7.43~7.38(m, 5H), 7.12-7.08(m, 2H), 6.71~6.69(m, 3H), 1.32(s, 9H) | 736.2397 | 736.2396 |
| Compound 29 | δ 8.87(s, 1H), 8.73(d, 1H), 8.42~8.39(m, 2H), 7.41~7.38(m, 3H), 7.14-7.12(m, 3H), 6.95~6.94(m, 2H), 6.70~6.68(m, 2H), 1.35(s, 9H), 1.32(s, 9H) | 999.4086 | 999.4088 |
| Compound 50 | δ 8.74(d, 1H), 8.39(d, 1H), 8.10(m, 1H), 7.53(m, 1H), 7.39-7.33(m, 7H), 7.15-7.13(m, 3H), 7.01~6.99(m, 6H), 6.69(d, 1H), 2.92(s, 6H), 2.89(s, 3H), 2.51(s, 3H), 2.48(s, 3H), 1.32(s, 9H) | 1034.4117 | 1034.4118 |
| Compound 79 | δ 8.74(d, 1H), 8.42~8.39(m, 2H), 8.10(d, 1H), 7.97(d, 1H), 7.41-7.39(m, 4H), 7.22-7.13(m, 5H), 6.98~6.96(m, 2H), 6.70(s, 1H), 6.68(d, 1H), 1.35(s, 9H), 1.33(s, 9H) | 931.3556 | 931.3555 |
| Compound 119 | δ 8.74(d, 1H), 7.46-7.44(m, 3H), 7.11-7.09(m, 3H), 6.987(d, 1H), 6.51(d, 1H), 1.37(s, 9H), 1.35(s, 9H), 1.32(s, 9H), 1.30(s, 9H) | 954.4402 | 954.4400 |
| Compound 129 | δ 8.87(s, 1H), 8.74(d, 1H), 8.46-8.43(m, 2H), 7.46~7.38(m, 4H), 7.23-7.21(m, 2H), 7.01~6.99(m, 4H), 1.37(s, 18H), 1.32(s, 9H) | 928.3540 | 928.3542 |
| Compound 146 | δ 9.32(s, 1H), 8.74(d, 1H), 8.46(d, 1H), 8.34(d, 1H), 7.51~7.41(m, 5H), 7.14-7.12(m, 2H), 7.05(s, 1H), 6.95~6.94(m, 2H), 1.41(s, 9H), 1.33(s, 9H) | 873.2980 | 873.2979 |
| Compound 155 | δ 9.34(s, 1H), 8.74(d, 1H), 8.46(d, 1H), 8.35(m, 1H), 8.20(d, 2H), 7.51~7.43(m, 6H), 7.14-7.12(m, 2H), 7.06(s, 1H), 6.96~6.95(m, 2H), 1.42(s, 9H), 1.33(s, 9H) | 1030.3916 | 1030.3918 |
| Compound 167 | δ 8.73(d, 1H), 8.46-8.44(m, 2H), 8.20(d, 2H), 7.97(d, 1H), 7.46~7.38(m, 5H), 7.21-7.14(m, 3H), 7.05(s, 1H), 6.96~6.95(m, 2H), 1.40(s, 9H), 1.32(s, 9H) | 1030.3917 | 1030.3918 |
| Compound 191 | δ 8.74(d, 1H), 8.54(d, 1H), 8.38(s, 1H), 8.20(d, 2H), 7.94(d, 1H), 7.43~7.35(m, 5H), 7.17-7.14(m, 3H), 7.05(s, 1H), 6.96~6.95(m, 2H), 1.41(s, 9H), 1.32(s, 9H) | 1030.3919 | 1030.3918 |

2. Evaluation of Properties of Organometallic Compounds

The light-emitting properties of organometallic compounds of Example Compounds 18, 29, 50, 79, 119, 129, 146, 155, 167 and 191 and Comparative Compounds C1 to C3 were evaluated and are shown in Table 2 below.

The Example Compounds and Comparative Compounds are as follows.

Example Compounds

18

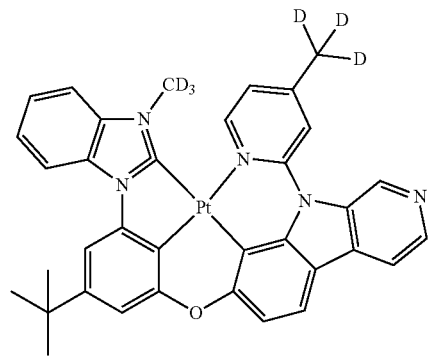

-continued

29

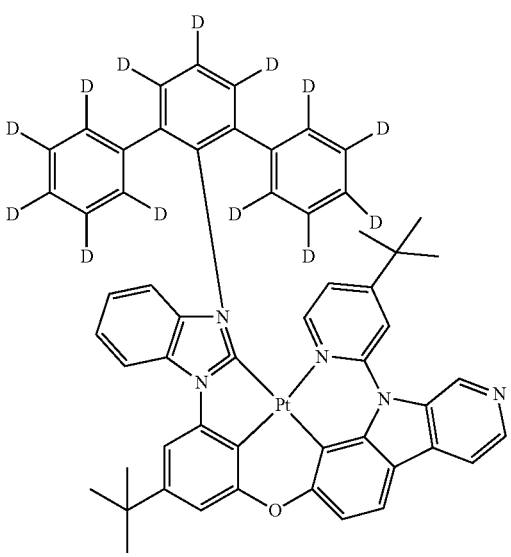

101
-continued
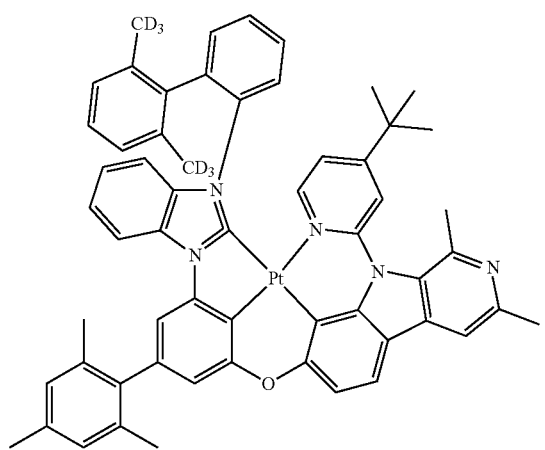
50
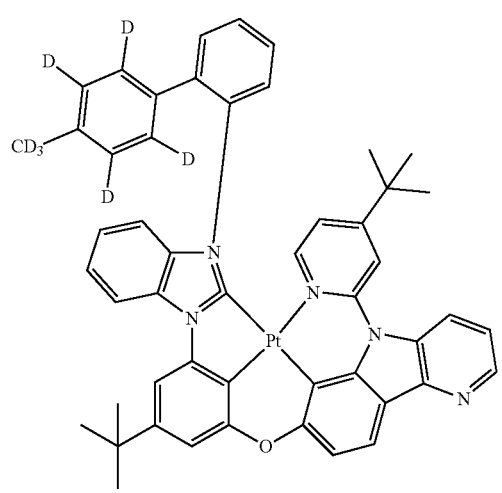
79
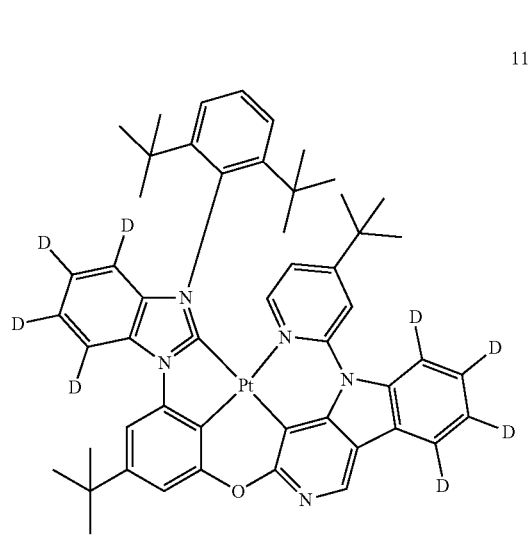
119
102
-continued
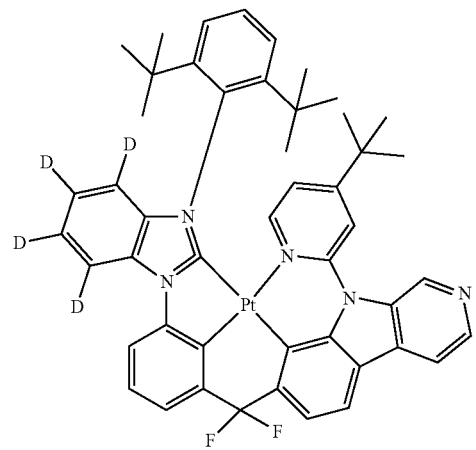
129
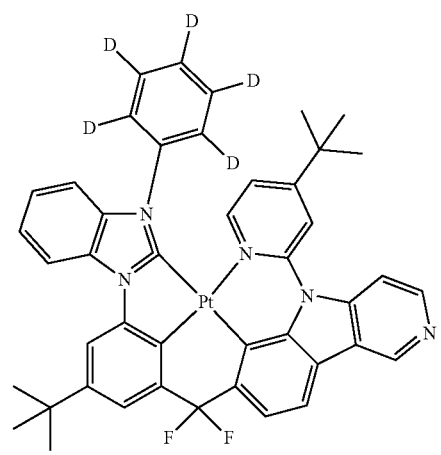
146
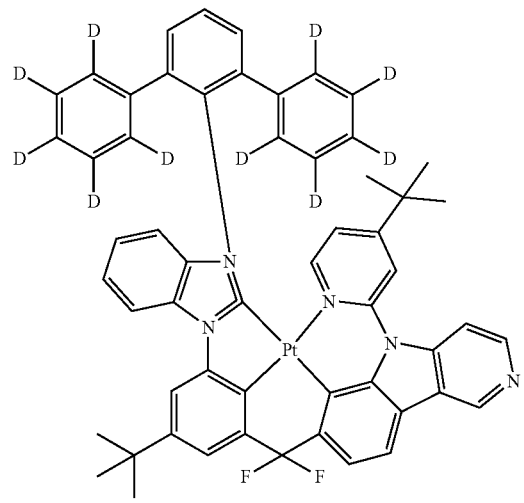
155

167

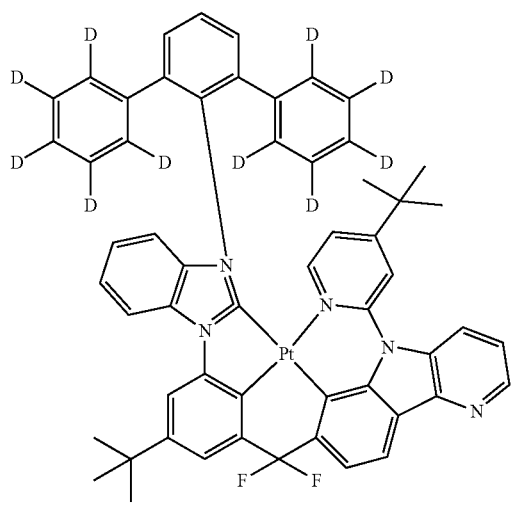

191

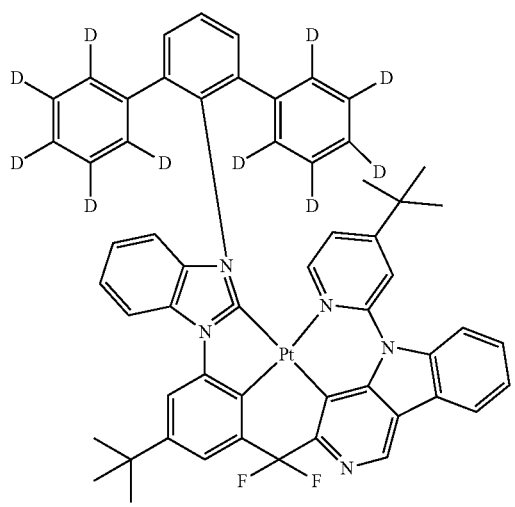

Comparative Compounds

C1

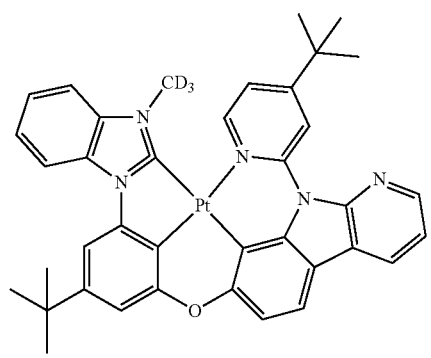

C2

C3

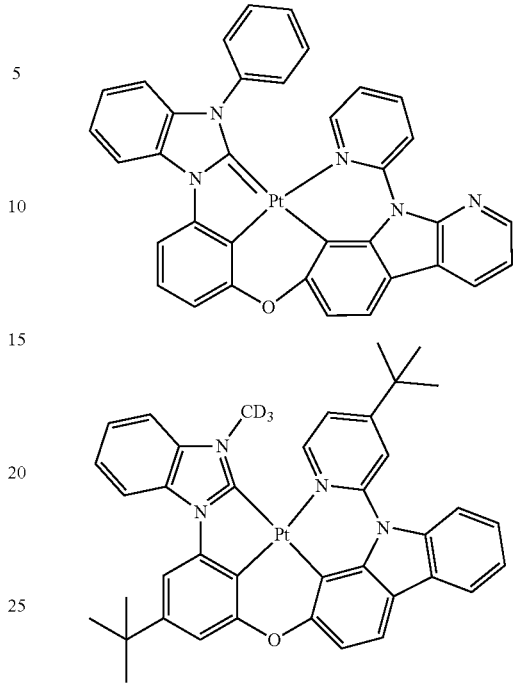

TABLE 2

| Division | T1 (nm) | T1 level (eV) | $^3$MLCT (%) | $^3$MC (eV) |
|---|---|---|---|---|
| Organometallic Compound 18 | 459 | 2.70 | 13.4 | 0.56 |
| Organometallic Compound 29 | 453 | 2.73 | 14.6 | 0.81 |
| Organometallic Compound 50 | 456 | 2.72 | 13.3 | 0.68 |
| Organometallic Compound 79 | 460 | 2.70 | 15.0 | 0.66 |
| Organometallic Compound 119 | 455 | 2.72 | 13.2 | 0.75 |
| Organometallic Compound 129 | 459 | 2.70 | 17.4 | 0.78 |
| Organometallic Compound 146 | 448 | 2.82 | 18.5 | 0.75 |
| Organometallic Compound 155 | 447 | 2.83 | 21.0 | 0.86 |
| Organometallic Compound 167 | 463 | 2.68 | 17.5 | 0.71 |
| Organometallic Compound 191 | 450 | 2.80 | 19.4 | 0.82 |
| Comparative Compound C1 | 467 | 2.65 | 11.9 | 0.54 |
| Comparative Compound C2 | 466 | 2.65 | 12.3 | 0.55 |
| Comparative Compound C3 | 470 | 2.64 | 8.8 | 0.41 |

Table 2 shows the results on the lowest triplet excitation energy level (T1 level), the metal to ligand charge transfer ($^3$MLCT) and the 3 metal centered state ($^3$MC) energy of each compound, obtained by quantum simulation according to a density functional theory (DFT) calculation method utilizing a B3LYP functional.

Referring to the results of Table 2, it can be seen that Organometallic Compounds 18, 29, 50, 79, 119, 129, 146, 155, 167, and 191, which are the Example Compounds, showed increased metal to ligand charge transfer ($^3$MLCT)

ratio values when compared with Comparative Compounds C1 to C3, which are the comparative compounds. In addition, it can be seen that the organometallic compounds of the Examples showed similar degree or increased 3 metal centered state ($^3$MC) values when compared with Comparative Compounds C1 to C3. Accordingly, improved device life and emission efficiency properties may be achieved if the organometallic compounds of the Examples are applied when compared with the cases of applying the Comparative Compounds.

In addition, it can be seen that Organometallic Compounds 18, 29, 50, 79, 119, 129, 146, 155, 167, and 191, which are the Example Compounds, showed shorter wavelengths of emitted light when compared with Comparative Compounds C1 to C3. It is considered that Comparative Compound C1 in which only $X_1$ of a carboline group is a nitrogen atom, that is, a nitrogen atom is included only at the alpha (α) position of a carboline group, shows a longer wavelength value of emitted light than the Example Compounds. It is considered that because Comparative Compound C3 does not include a carboline group, a longer wavelength value of emitted light is shown when compared with the Example Compounds and Comparative Compound C1.

It can be seen that, when compared with Comparative Compound C1, because Example Compounds 29 and 119 include a plurality of deuterium atom substituents, a high 3 metal centered state ($^3$MC) value is shown.

3. Manufacture and Evaluation of Organic Electroluminescence Device

Manufacture of Organic Electroluminescence Device

The organic electroluminescence device of an embodiment, including the organometallic compound of an embodiment was manufactured as follows. Organic electroluminescence devices of Example 1 to Example 10 were manufactured respectively using Compounds 18, 29, 50, 79, 119, 129, 146, 155, 167, and 191 as the dopant materials of an emission layer. Organic electroluminescence devices of Comparative Example 1 and Comparative Example 2 were manufactured respectively using Comparative Compounds C1 and C3 as the dopant materials of an emission layer.

A glass substrate on which ITO with 15 Ω/cm$^2$ (1200 Å) of Corning Co. was formed as an anode was cut into a size of 50 mm×50 mm×0.7 mm, washed by ultrasonic waves using isopropyl alcohol and pure water for 5 minutes, respectively, exposed to ultraviolet rays and ozone for about 30 minutes for washing, and the glass substrate was installed in a vacuum deposition apparatus.

On the ITO anode formed on the glass substrate, 2-TNATA was vacuum deposited to form a hole injection layer with a thickness of about 600 Å, and NPB was vacuum deposited on the hole injection layer to form a hole transport layer with a thickness of about 300 Å.

On the hole transport layer, BCPDS and POPCPA (the weight ratio of BCPDS and POPCPA were 1:1) as a co-host, and each of Example Compounds or Comparative Compounds as a dopant were co-deposited such that the weight ratio of the co-host and the dopant became 90:10 to form an emission layer with a thickness of about 300 Å.

On the emission layer, TSPO1 was deposited to form a hole blocking layer with a thickness of about 50 Å, on the hole blocking layer, Alq$_3$ was deposited to form an electron transport layer with a thickness of about 300 Å, and on the electron transport layer, LiF was deposited to form an electron injection layer with a thickness of about 10 Å. Then, Al was vacuum deposited on the electron injection layer to form a cathode with a thickness of about 3,000 Å, and an organic electroluminescence device was manufactured.

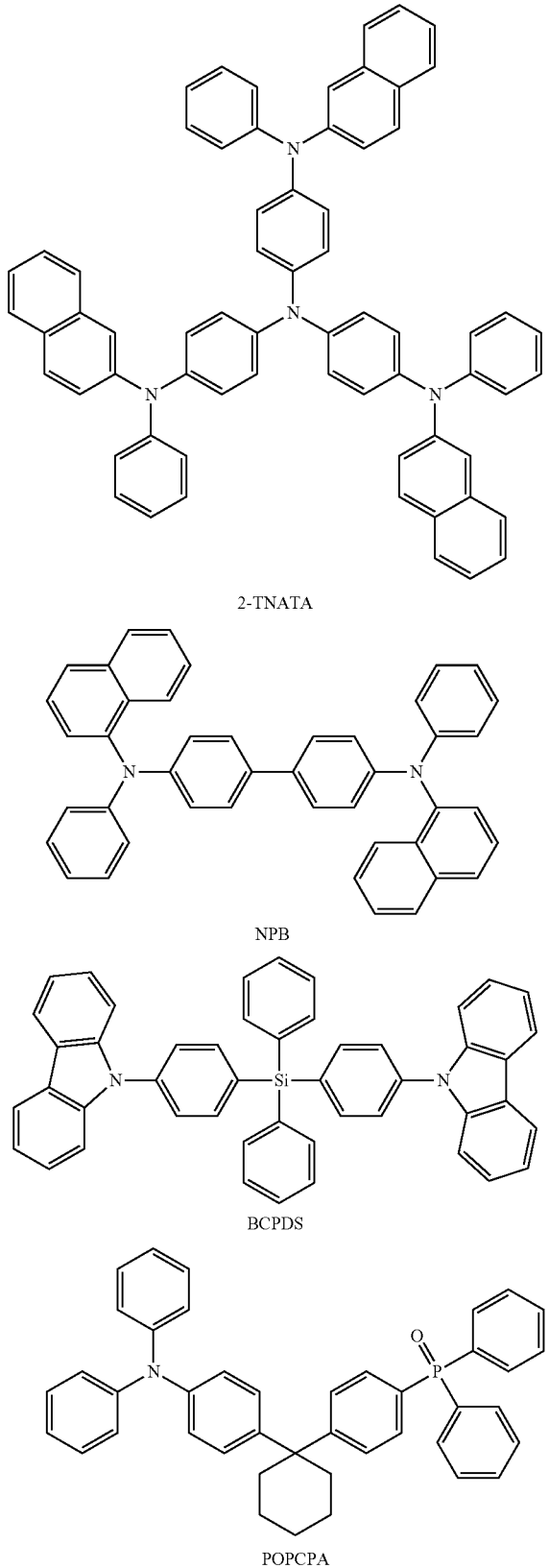

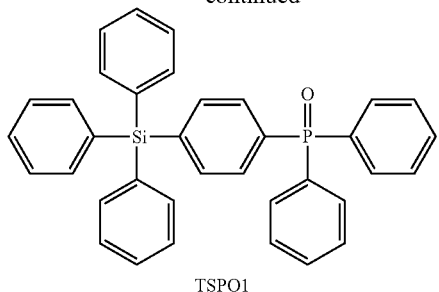

TSPO1 included only at the alpha (α) position of a carboline group, and accordingly, Comparative Compound C1 showed lower emission efficiency than the Example Compounds.

The organometallic compound of an embodiment includes a carboline group and a deuterium atom, and has an improved MLCT ratio, and thus, may show improved emission efficiency. In addition, the organic electroluminescence device of an embodiment includes an organometallic compound including a carboline group and a deuterium atom in an emission layer, and may show excellent emission efficiency and improved life characteristics.

The organometallic compound of an embodiment includes a carboline group and a deuterium atom, and may

TABLE 3

| Division | Dopant material | Driving voltage (V) | Current density (mA/cm²) | Luminance (cd/m²) | Emission efficiency (cd/A) | Maximum emission wavelength (nm) | Half life (hr) |
|---|---|---|---|---|---|---|---|
| Example 1 | Compound 18 | 4.35 | 50 | 3750 | 11.35 | 450 | 125 |
| Example 2 | Compound 29 | 4.51 | 50 | 3985 | 13.50 | 455 | 175 |
| Example 3 | Compound 50 | 4.42 | 50 | 4115 | 14.75 | 453 | 157 |
| Example 4 | Compound 79 | 4.38 | 50 | 3945 | 13.18 | 458 | 128 |
| Example 5 | Compound 119 | 4.45 | 50 | 4450 | 16.69 | 452 | 186 |
| Example 6 | Compound 129 | 4.21 | 50 | 4325 | 15.16 | 451 | 102 |
| Example 7 | Compound 146 | 4.24 | 50 | 4100 | 14.16 | 457 | 83 |
| Example 8 | Compound 155 | 4.55 | 50 | 4310 | 16.57 | 450 | 117 |
| Example 9 | Compound 167 | 4.53 | 50 | 4355 | 15.87 | 459 | 115 |
| Example 10 | Compound 191 | 4.62 | 50 | 4300 | 16.40 | 453 | 106 |
| Comparative Example 1 | Comparative Compound C1 | 5.13 | 50 | 2110 | 6.52 | 461 | 45 |
| Comparative Example 2 | Comparative Compound C3 | 5.08 | 50 | 2405 | 8.45 | 460 | 15 |

In Table 3, the evaluation results of the organic electroluminescence devices of Example 1 to Example 10, Comparative Example 1 and Comparative Example 2 are shown. In Table 3, the driving voltage, luminance, emission efficiency, emission wavelength and life of the organic electroluminescence devices thus manufacture are compared and shown. The emission efficiency represents a current efficiency value with respect to a current density of 50 mA/cm².

Referring to the results of Table 3, it can be seen that the organic electroluminescence devices of Example 1 to Example 10 showed better luminance and emission efficiency when compared with the organic electroluminescence devices of Comparative Example 1 and Comparative Example 2. In addition, the organic electroluminescence devices of Example 1 to Example 10 showed decreased driving voltages and increased life when compared with the organic electroluminescence devices of Comparative Example 1 and Comparative Example 2.

It can be seen above that Comparative Compound C1 is a compound in which only $X_1$ of a carboline group is a nitrogen atom, e.g., a compound in which a nitrogen atom is contribute to the increase of the efficiency and life of an organic electroluminescence device.

The organic electroluminescence device of an embodiment includes an organometallic compound including a carboline group and a deuterium atom, and may show device properties of high efficiency and long life.

Although exemplary embodiments of the present disclosure have been described, it is understood that the present disclosure should not be limited to these exemplary embodiments, but various changes and modifications can be made by one ordinary skilled in the art within the spirit and scope of the present disclosure as hereinafter claimed.

What is claimed is:
1. An organic electroluminescence device, comprising:
a first electrode;
a second electrode disposed on the first electrode; and
an emission layer disposed between the first electrode and the second electrode,
wherein the emission layer comprises an organometallic compound represented by the following Formula 1:

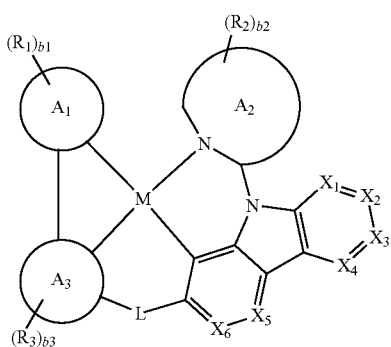

Formula 1 in Formula 1,

M is a transition metal, one or two selected from $X_1$ to $X_6$ are N, and the remainder are $CR_4$, if $X_1$ is N, any one selected from among $X_2$ to $X_6$ is N, $R_4$ is a hydrogen atom, a deuterium atom, or a substituted or unsubstituted alkyl group having 1 to 10 carbon atoms, $A_1$ to $A_3$ are each independently a substituted or unsubstituted hydrocarbon ring of 5 to 60 carbon atoms for forming a ring, or a substituted or unsubstituted heterocycle of 1 to 60 carbon atoms for forming a ring, b1 to b3 are each independently an integer of 1 to 4, $R_1$ to $R_3$ are each independently a hydrogen atom, a deuterium atom, a halogen atom, a hydroxyl group, a cyano group, a nitro group, a substituted or unsubstituted silyl group, a substituted or unsubstituted amine group, a substituted or unsubstituted oxy group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 carbon atoms for forming a ring, or a substituted or unsubstituted heterocyclic group having 1 to 10 carbon atoms for forming a ring, at least one selected from among $R_1$ to $R_3$ is a deuterium atom or $CD_3$, or at least one selected from among $R_1$ to $R_3$ is substituted with a deuterium atom or $CD_3$, L is a direct linkage, O, S, $-CR_{11}R_{12}-$, $-CR_{13}=CR_{14}-$, $-C\equiv C-$, $-C(=O)-$, $-C(=S)-$, $-BR_{15}-$, $-NR_{16}-$, $-PR_{17}R_{18}-$, or $-GeR_{19}R_{20}-$, and $R_{11}$ to $R_{20}$ are each independently a hydrogen atom, a deuterium atom, a halogen atom, a substituted or unsubstituted alkyl group having 1 to 30 carbon atoms, or a substituted or unsubstituted aryl group having 6 to 30 carbon atoms for forming a ring.

2. The organic electroluminescence device of claim 1, wherein M is Pt, Pd, Cu, or Os.

3. The organic electroluminescence device of claim 1, wherein the emission layer emits phosphorescence.

4. The organic electroluminescence device of claim 1, wherein the emission layer comprises a host and a dopant, and
the dopant comprises the organometallic compound represented by Formula 1.

5. The organic electroluminescence device of claim 1, wherein Formula 1 is represented by the following Formula 2-1 or Formula 2-2:

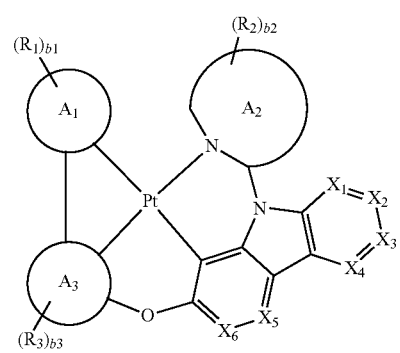

Formula 2-1

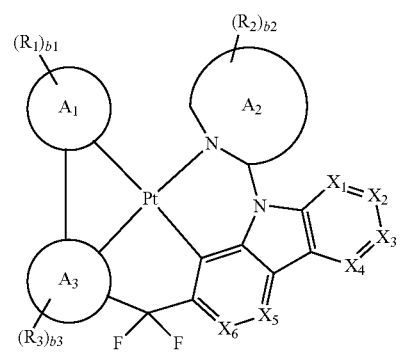

Formula 2-2 in Formula 2-1 and Formula 2-2, $A_1$ to $A_3$, $X_1$ to $X_6$, $R_1$ to $R_3$, and $b_1$ to $b_3$ are the same as defined with respect to Formula 1.

6. The organic electroluminescence device of claim 1, wherein Formula 1 is represented by the following Formula 3:

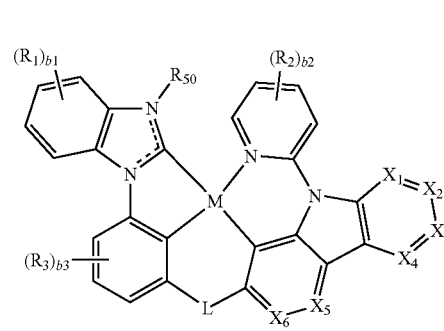

Formula 3 in Formula 3, $R_{50}$ is a hydrogen atom, a deuterium atom, a halogen atom, a substituted or unsubstituted alkyl group having 1 to 30 carbon atoms, or a substituted or unsubstituted aryl group having 6 to 30 carbon atoms, and M, L, $X_1$ to $X_6$, $R_1$ to $R_3$, and $b_1$ to $b_3$ are the same as defined with respect to Formula 1.

7. The organic electroluminescence device of claim 6, wherein Formula 3 is represented by the following Formula 3-1:

Formula 3-1

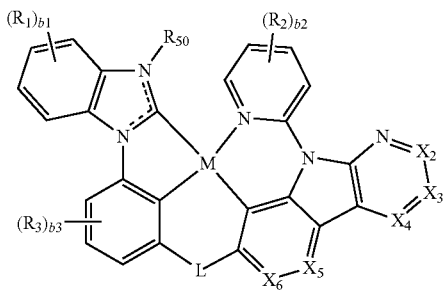

in Formula 3-1,
any one selected from among $X_2$ to $X_6$ is N, and the remainder are $CR_4$, and
M, L, $R_1$ to $R_4$, $R_{50}$ and $b_1$ to $b_3$ are the same as defined with respect to Formula 3.

8. The organic electroluminescence device of claim 6, wherein Formula 3 is represented by the following Formula 3-2 or Formula 3-3:

Formula 3-2

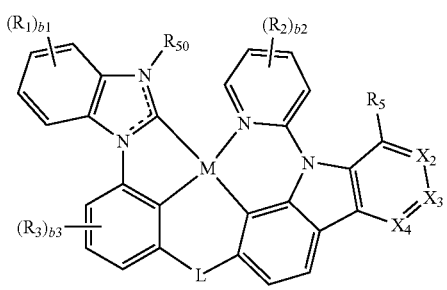

Formula 3-3

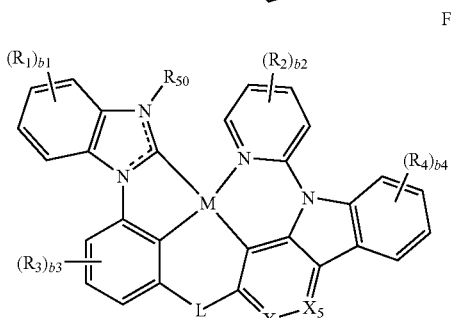

in Formula 3-2,
any one selected from among $X_2$ to $X_4$ is N, and the remainder are $CR_4$, and
$R_5$ is a hydrogen atom, a deuterium atom, or a substituted or unsubstituted alkyl group having 1 to 10 carbon atoms, and
in Formula 3-3,
any one selected from among $X_5$ and $X_6$ is N, and the remainder is $CR_6$,
$b_4$ is an integer of 1 to 4,
$R_6$ is a hydrogen atom, a deuterium atom, or a substituted or unsubstituted alkyl group having 1 to 10 carbon atoms, and
M, L, $R_1$ to $R_4$, $b_1$ to $b_3$, and $R_{50}$ are the same as defined with respect to Formula 3.

9. The organic electroluminescence device of claim 6, wherein $R_{50}$ is represented by any one selected from among compounds represented in the following Compound Group R:

Compound Group R

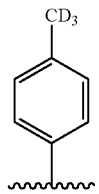

R-1

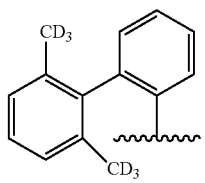

R-2

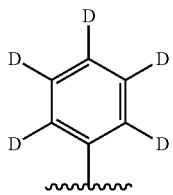

R-3

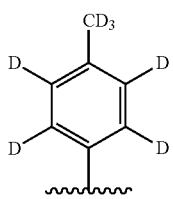

R-4

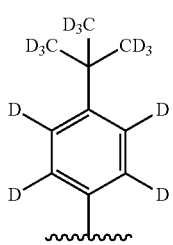

R-5

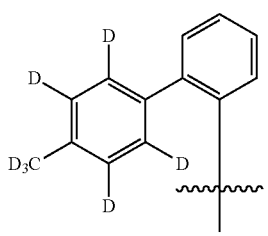

R-6

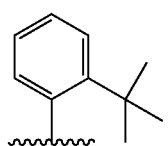

R-7

-continued
R-8
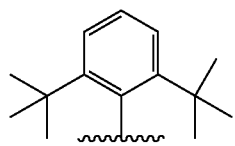
R-9
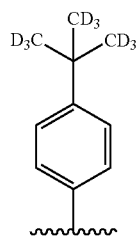
R-10
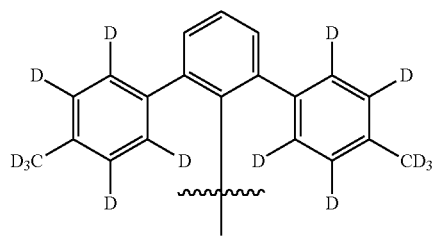
R-11
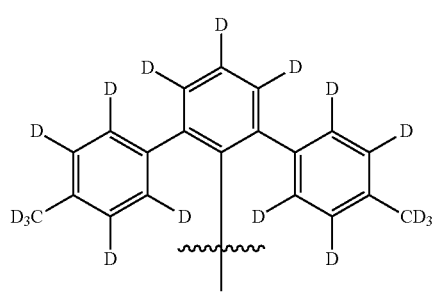
R-12
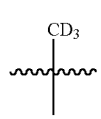
R-13
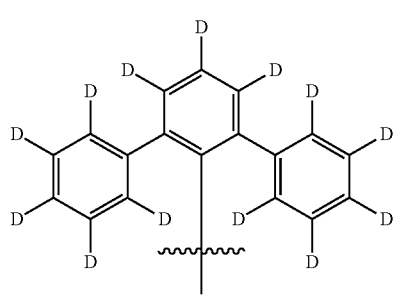
R-14
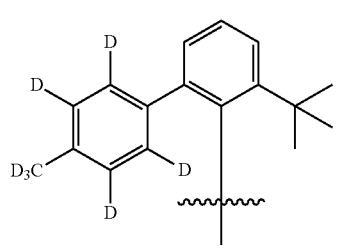
-continued
R-15
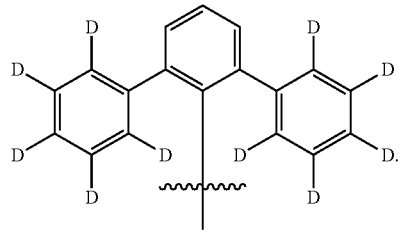
10. The organic electroluminescence device of claim 9, wherein, if $R_{50}$ is Compound R-7 or R-8, $R_1$ comprises at least one deuterium atom.
11. The organic electroluminescence device of claim 1, wherein the emission layer comprises at least one selected from among compounds represented in the following Compound Group 1:
Compound Group 1
1
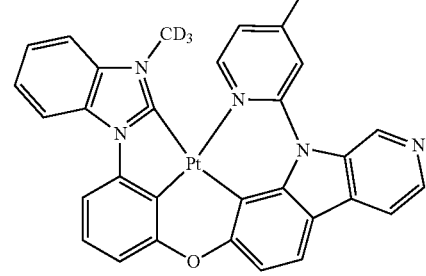
2
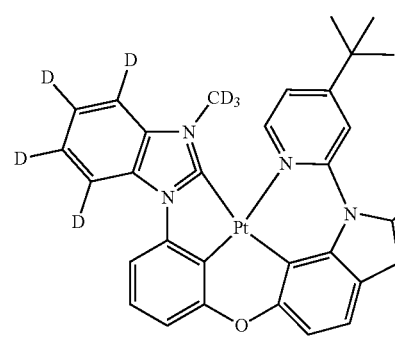
3
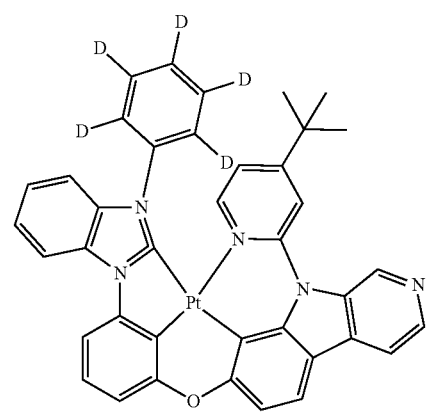
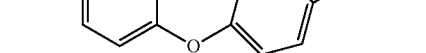

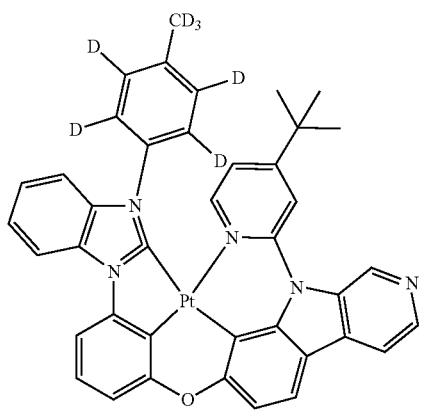
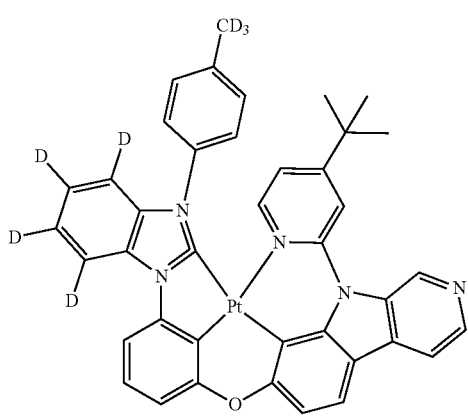
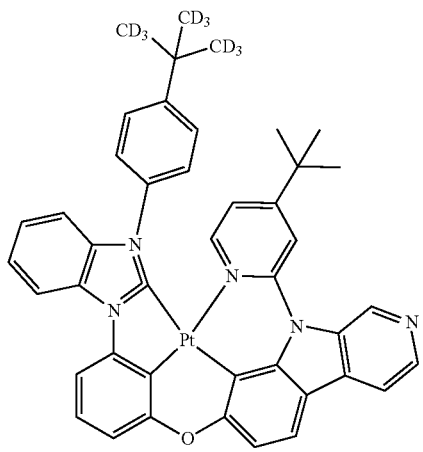
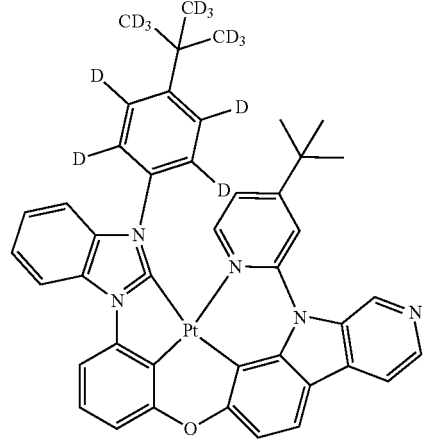
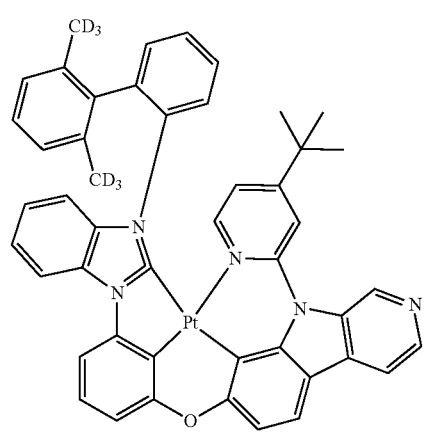
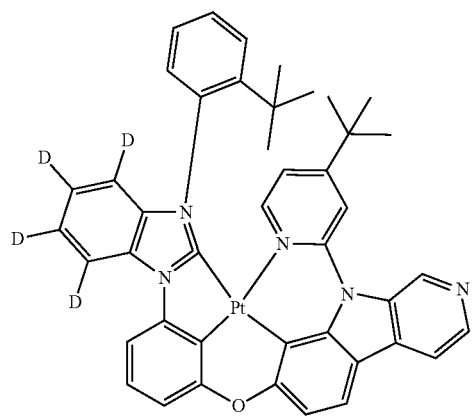

10
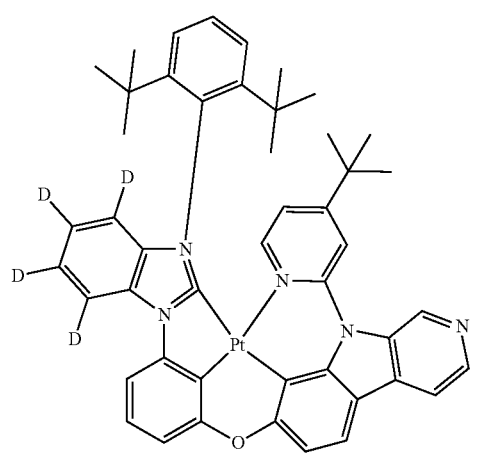
11
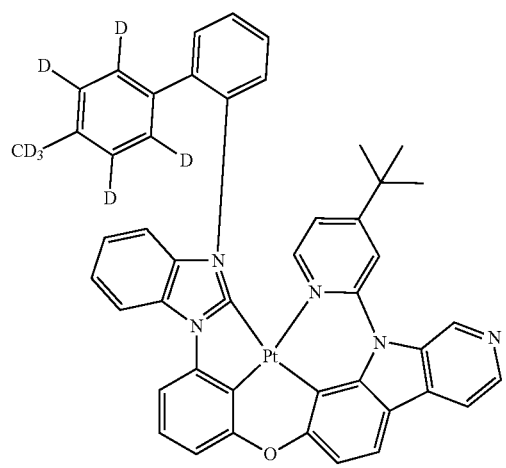
12
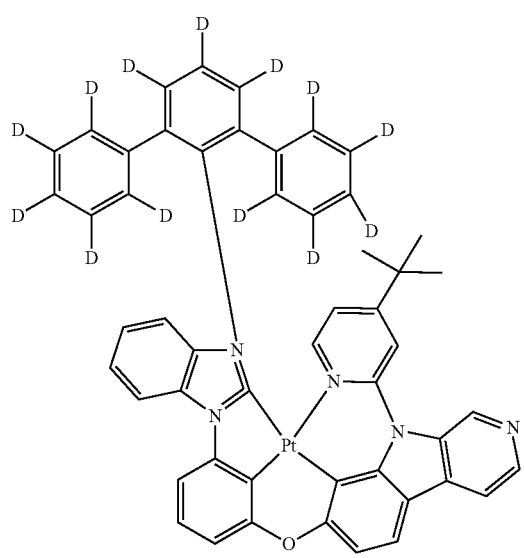
13
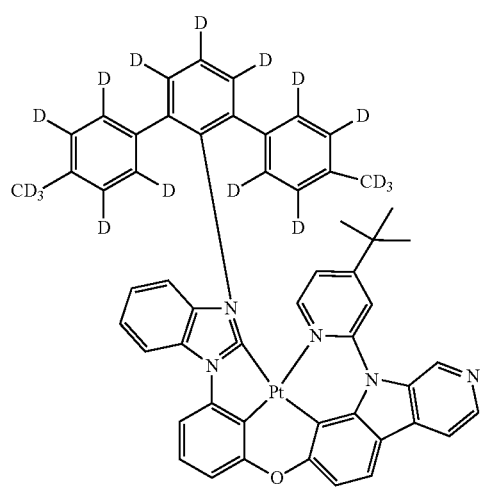
14
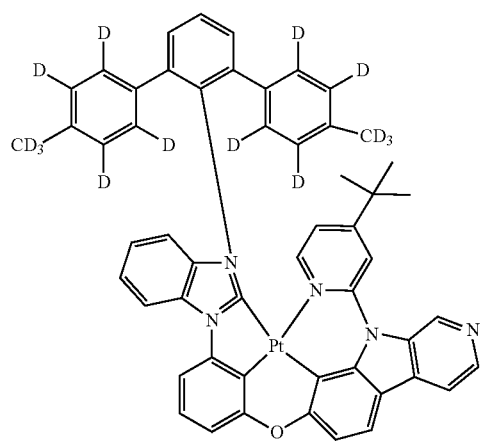
15
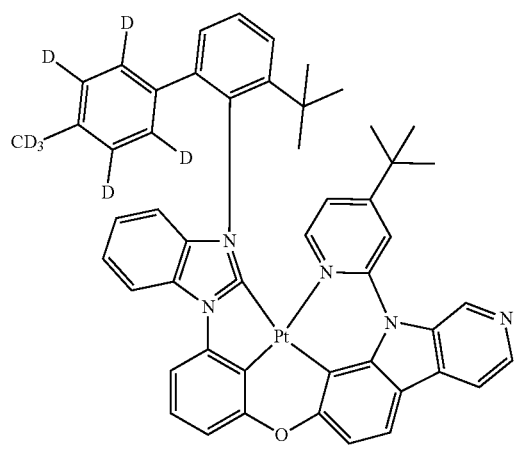

16
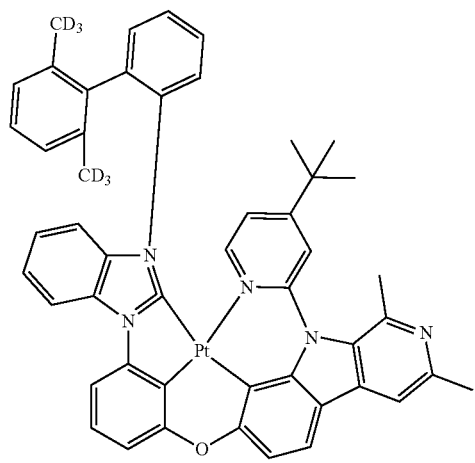
17
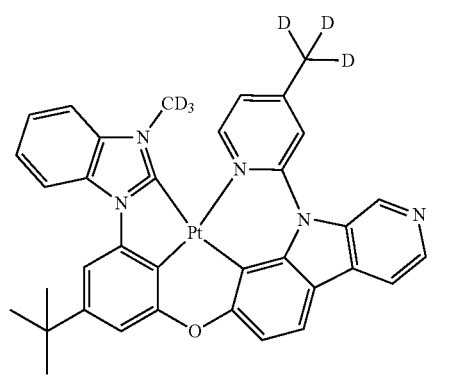
18
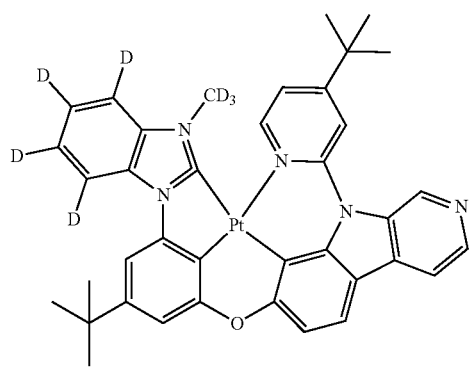
19
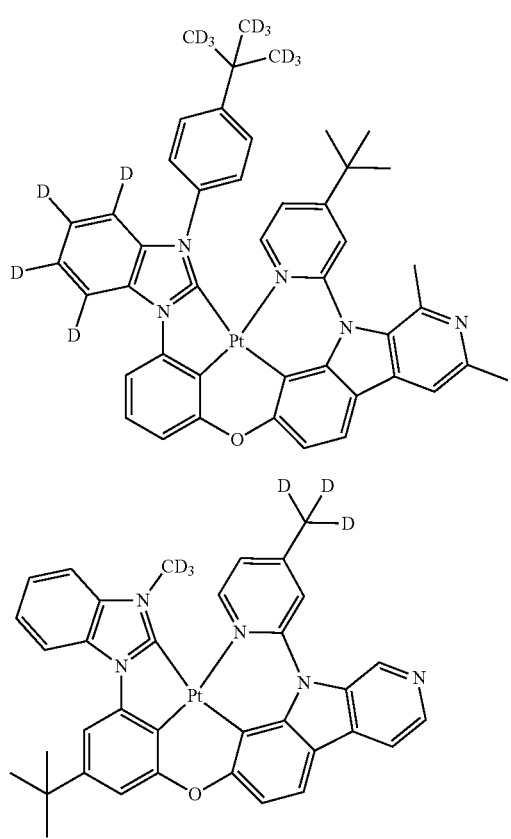
20
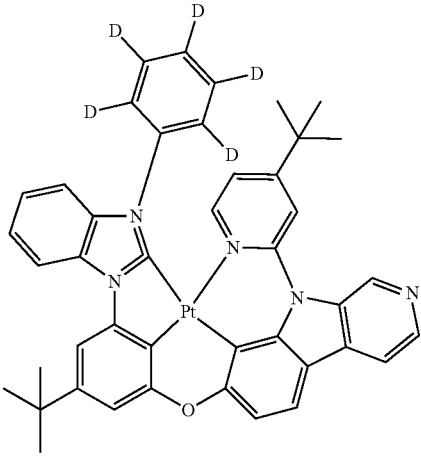
21
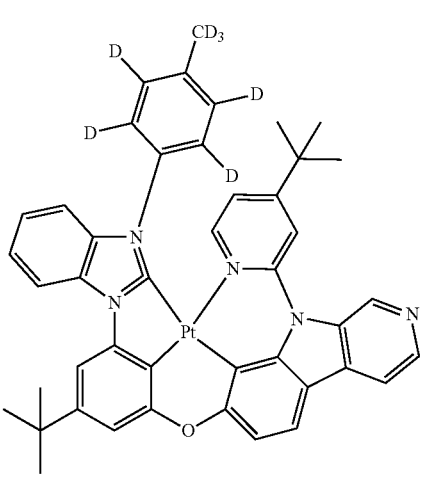
22
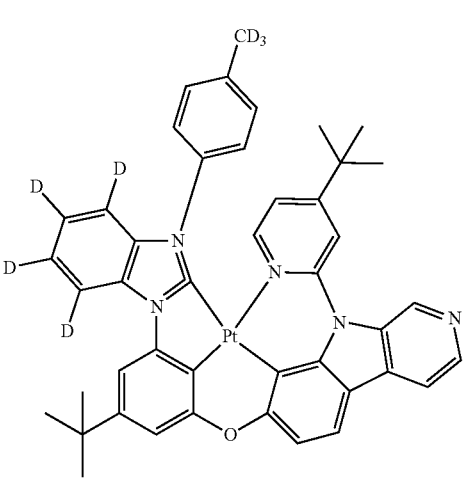

121
-continued
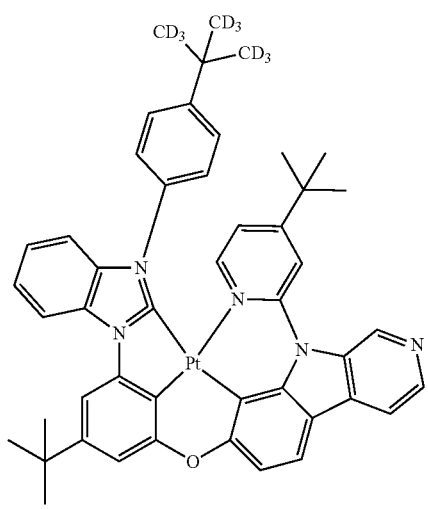
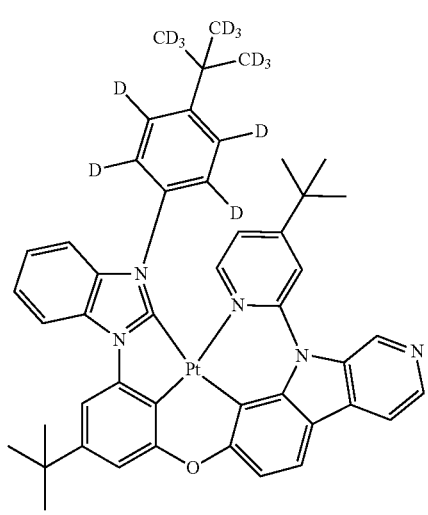
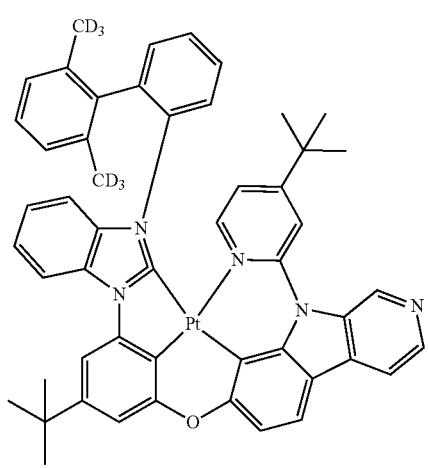
122
-continued
23
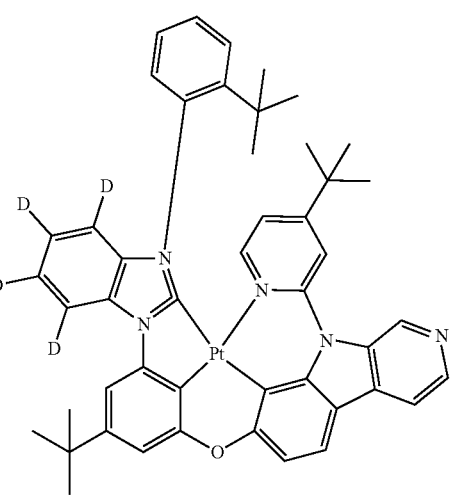
24
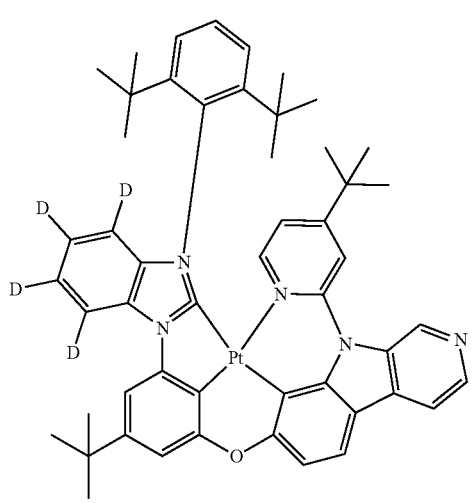
25
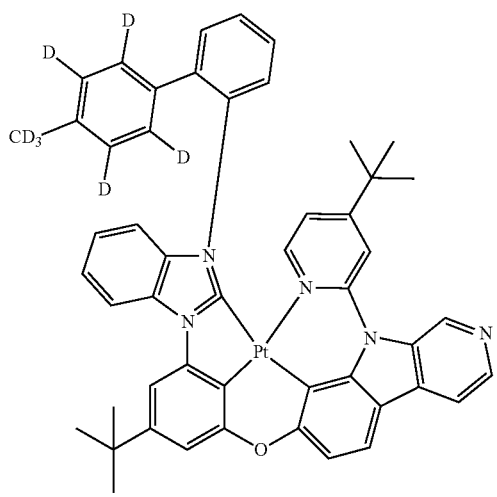

29
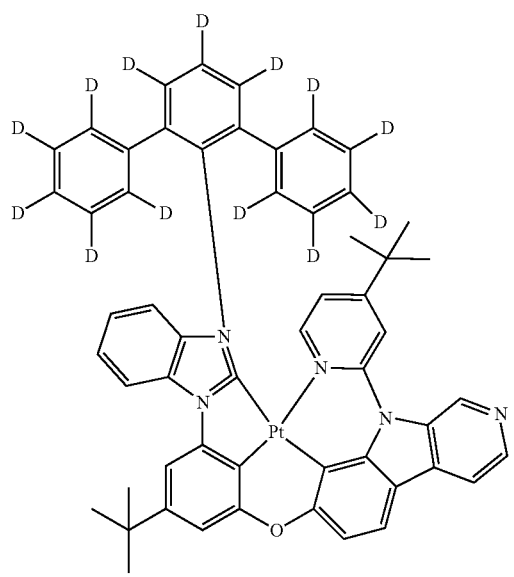
30
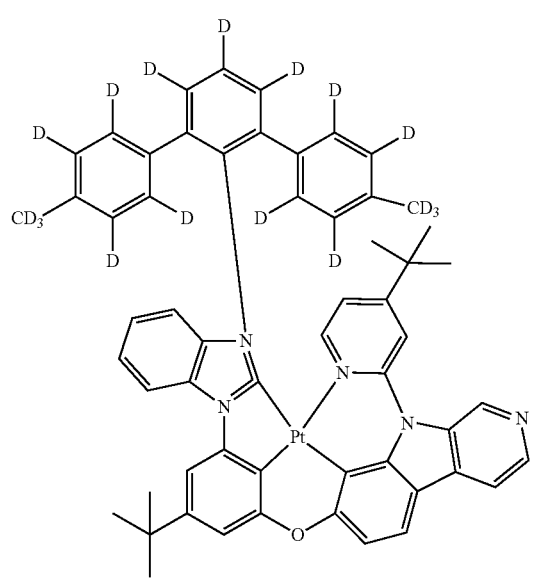
31
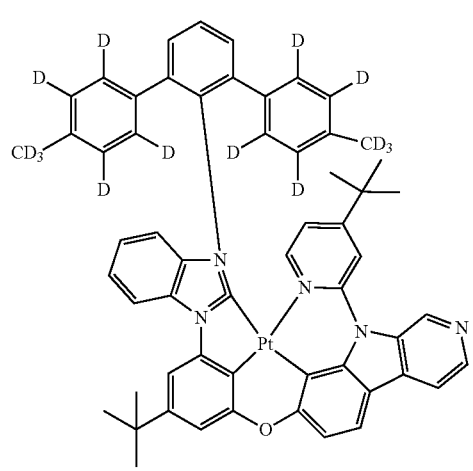
32
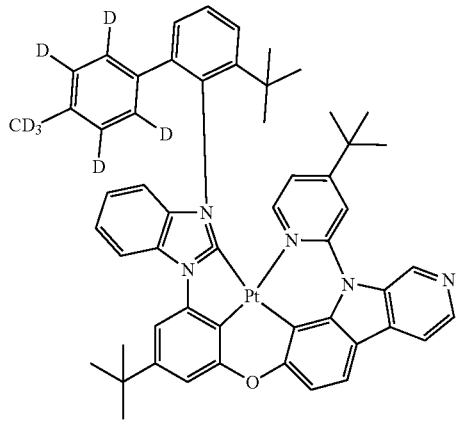
33
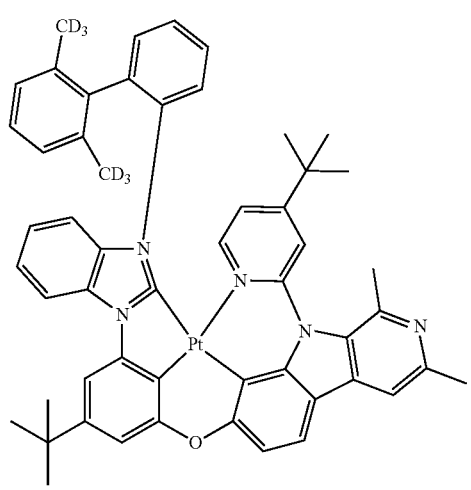
34
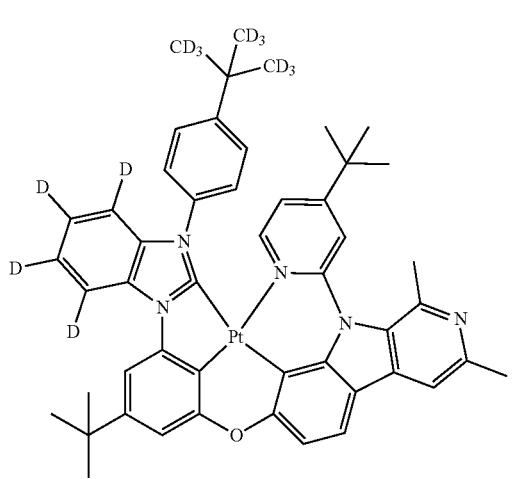

35
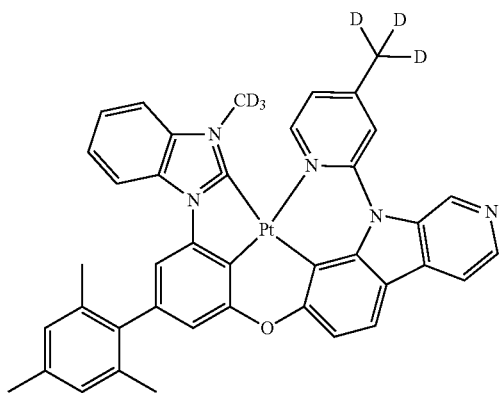
36
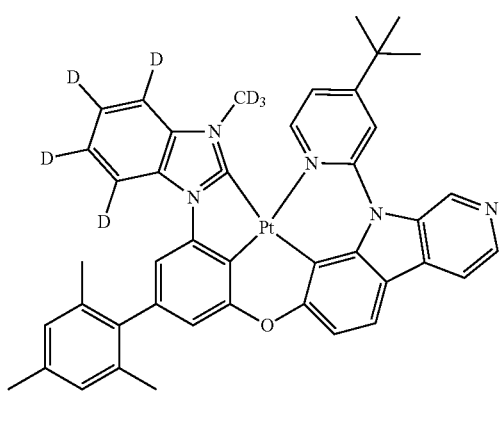
37
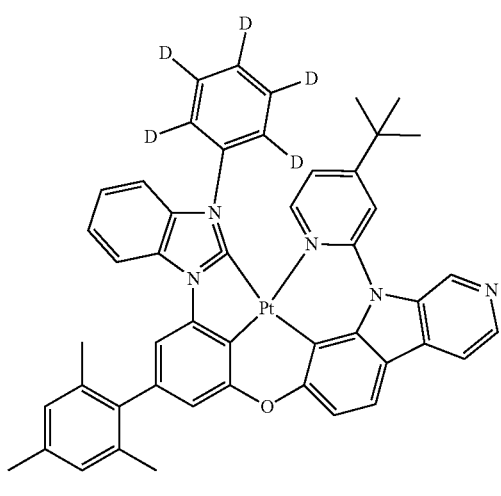
38
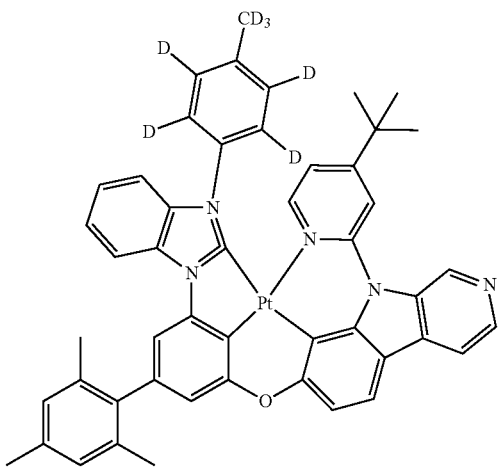
39
40
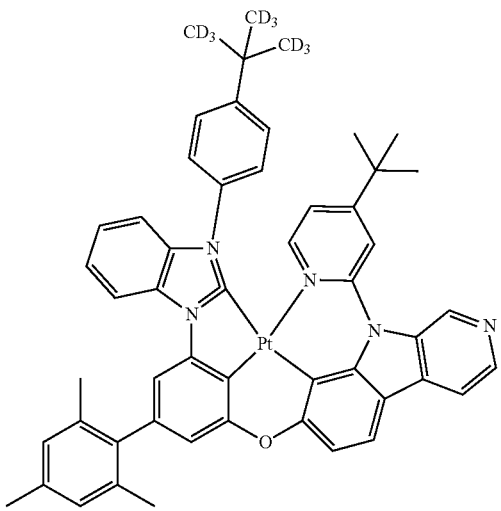

41
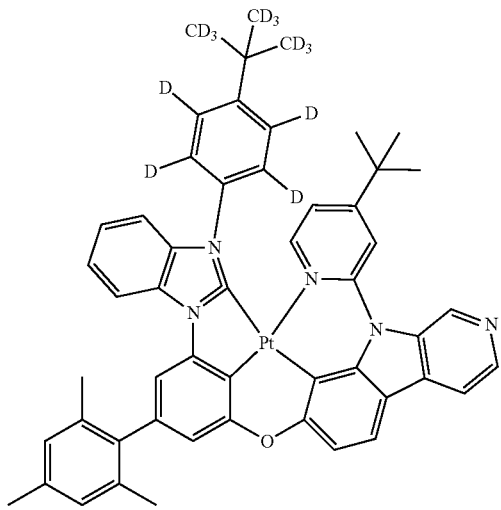
42
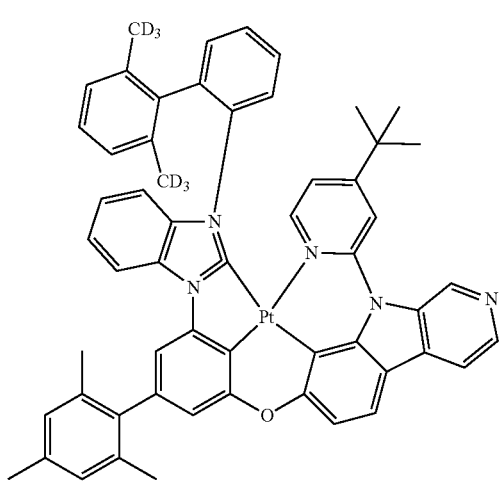
43
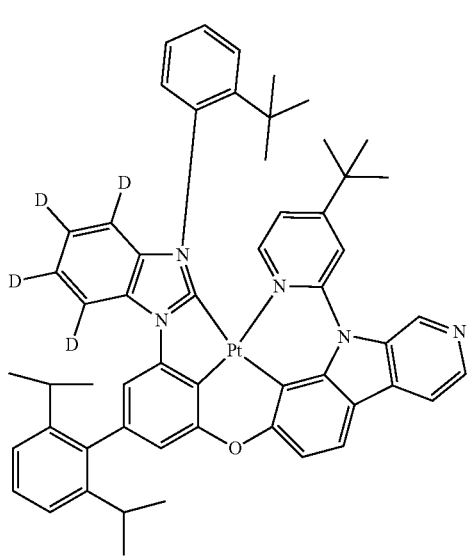
44
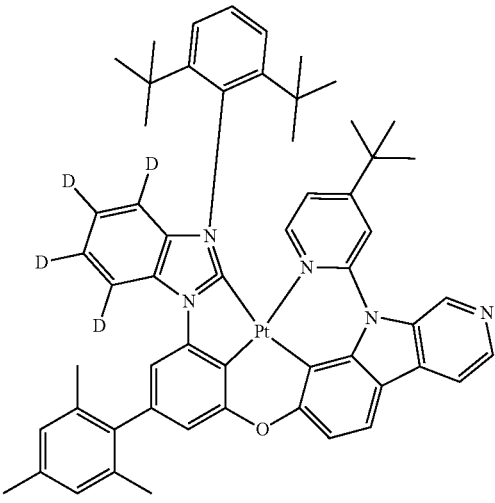
45
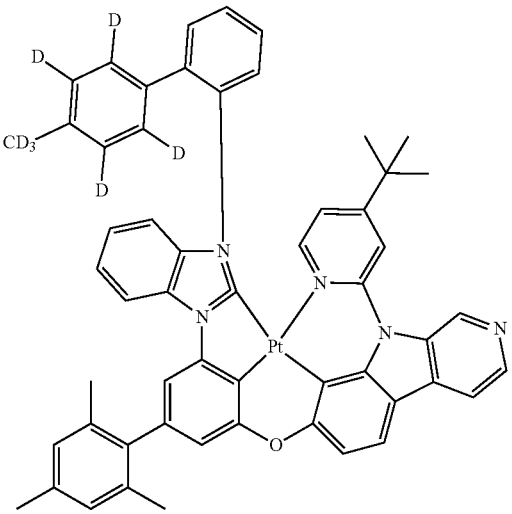
46
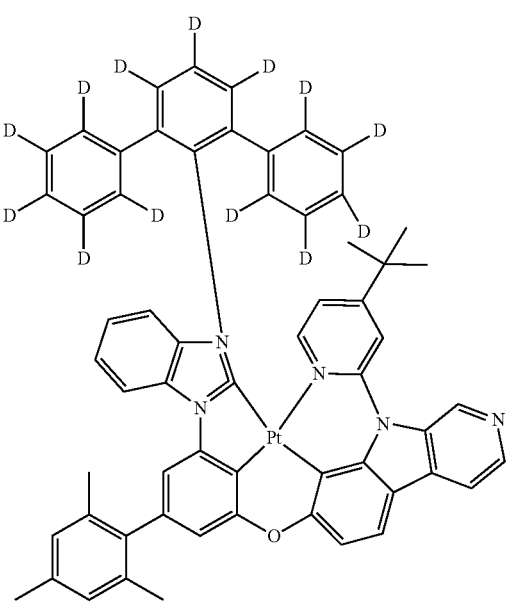

47
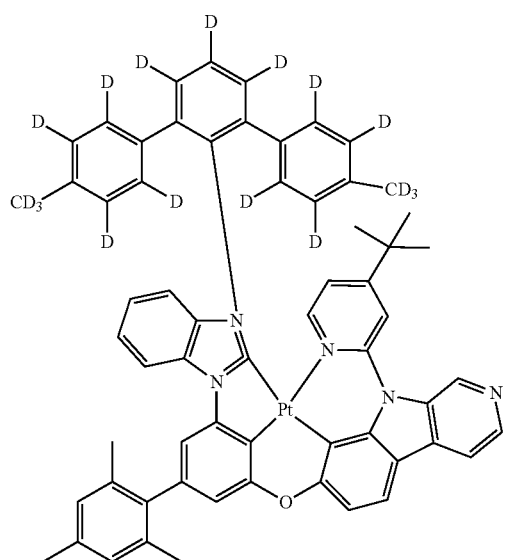
48
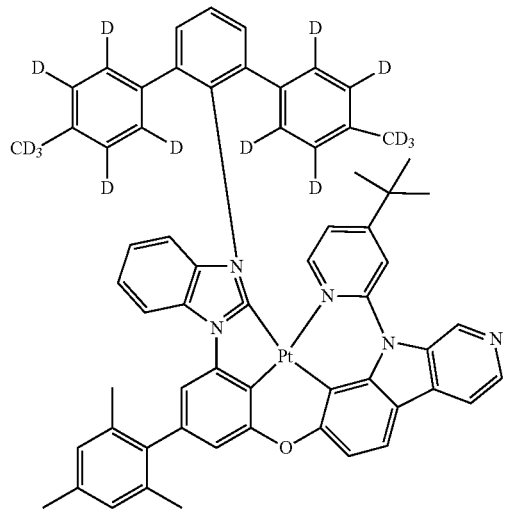
49
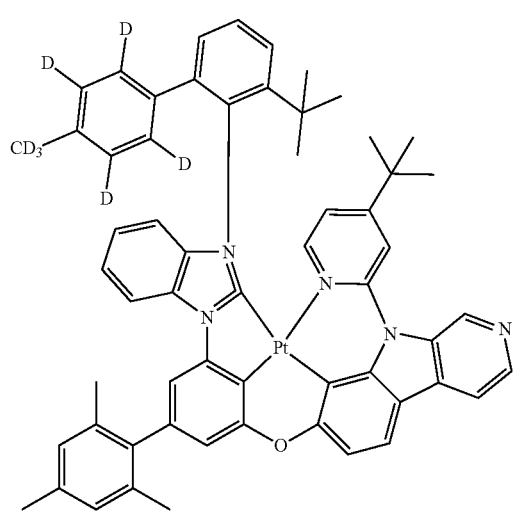
50
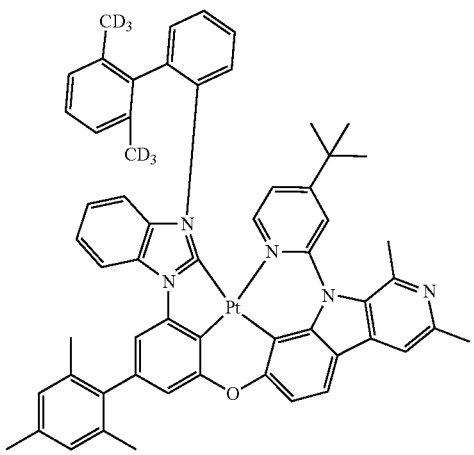
51
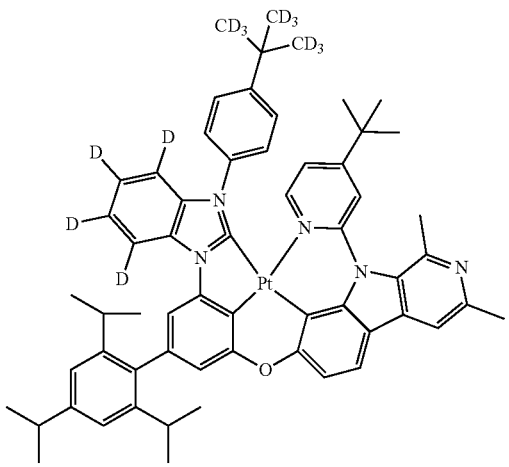
52
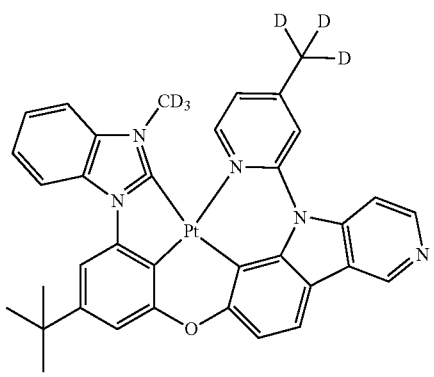

-continued
53
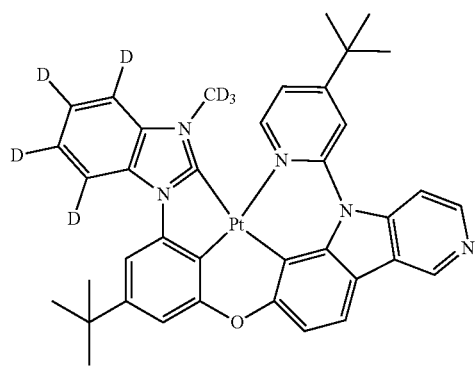
54
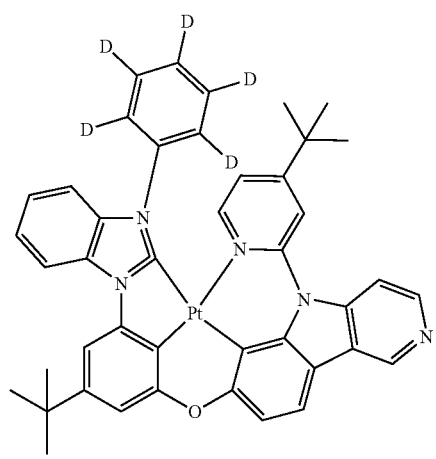
55
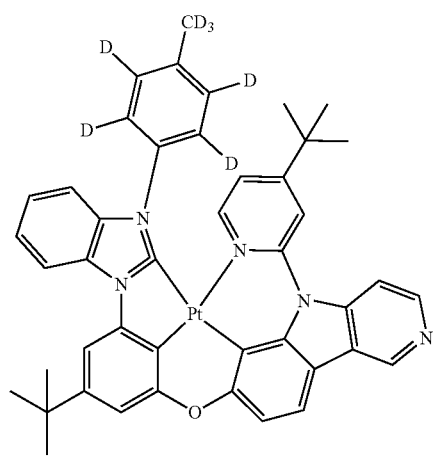
-continued
56
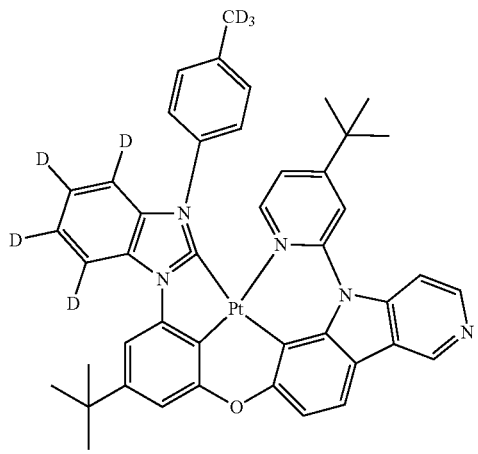
57
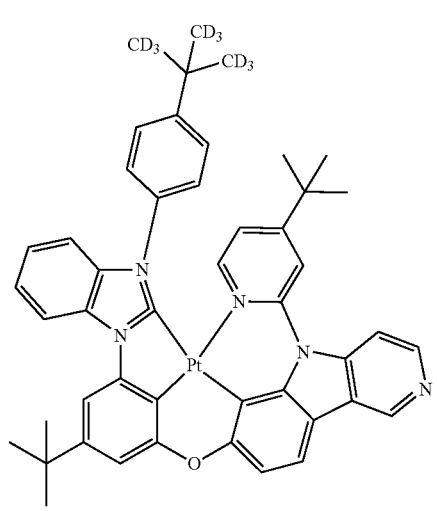
58
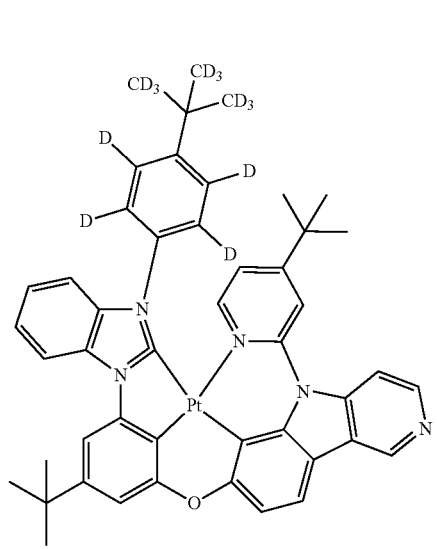

59
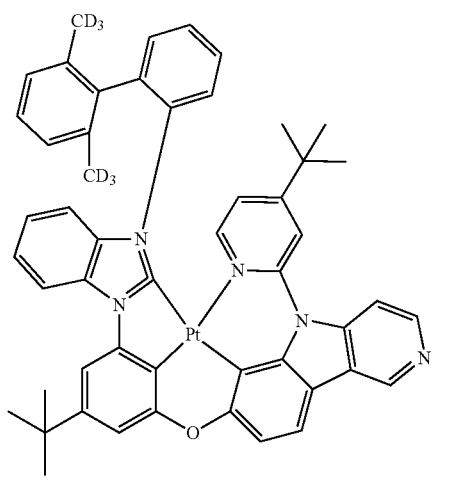
60
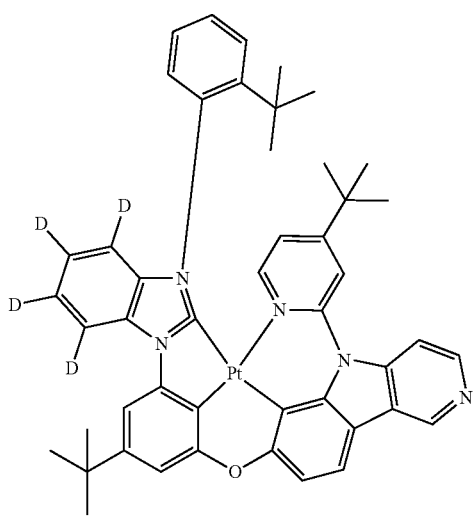
61
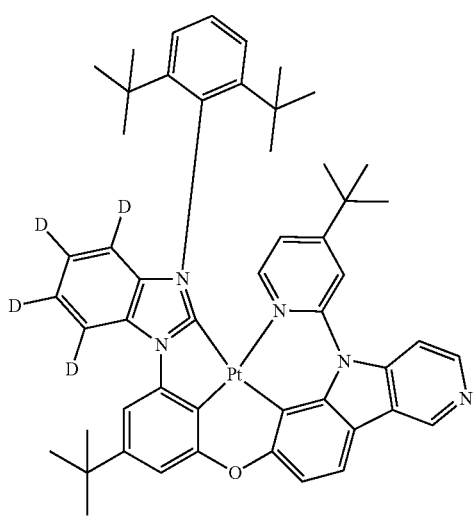
62
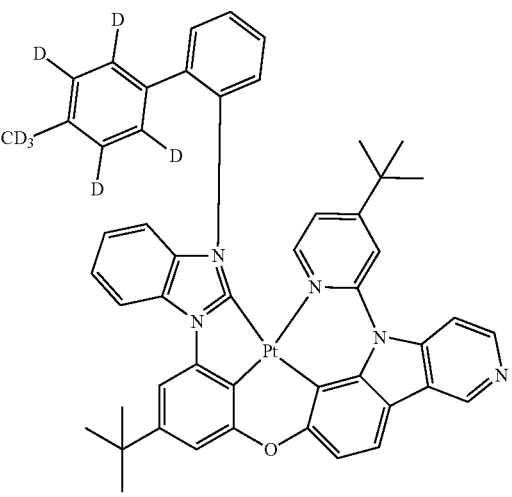
63
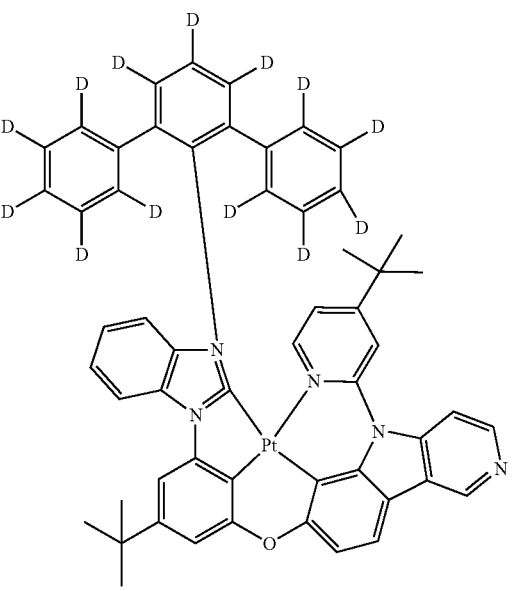

-continued
64
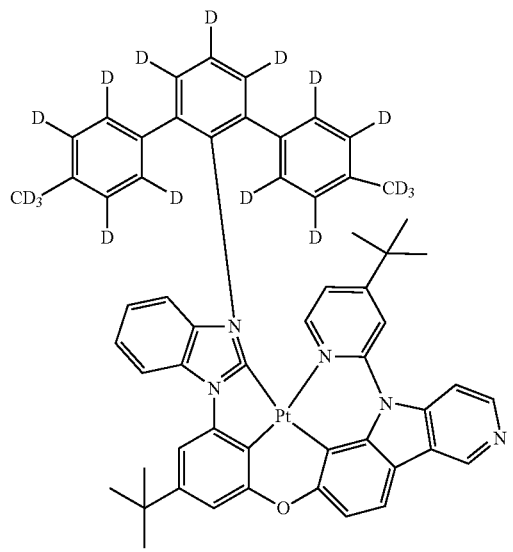
65
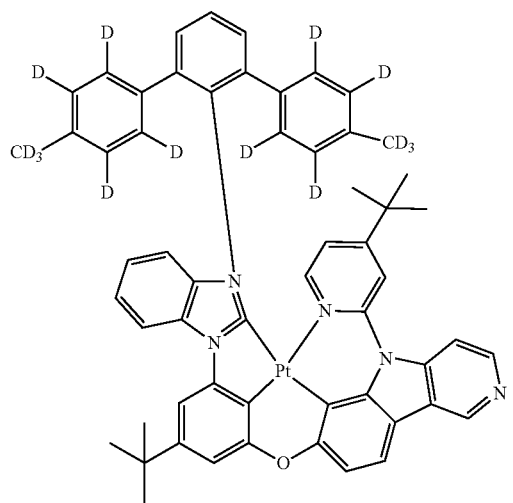
66
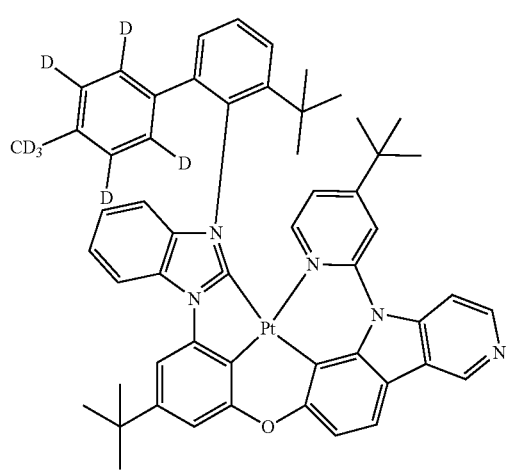
-continued
67
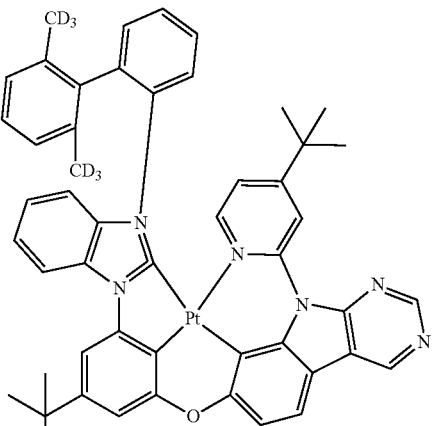
68
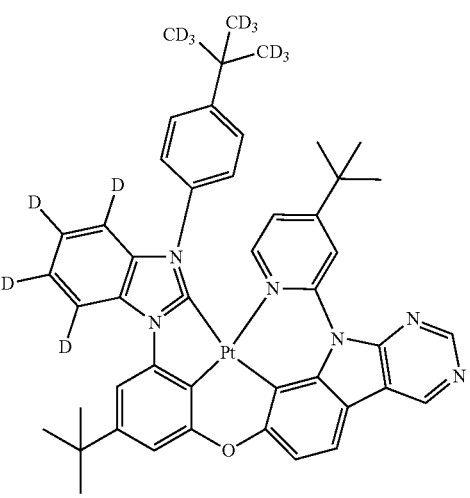
69
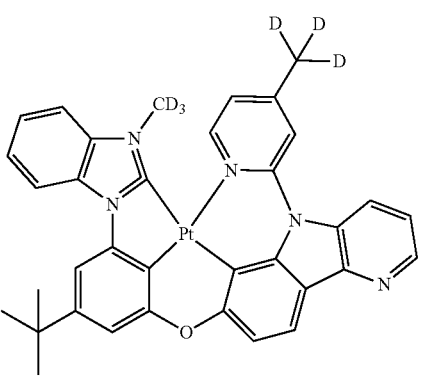

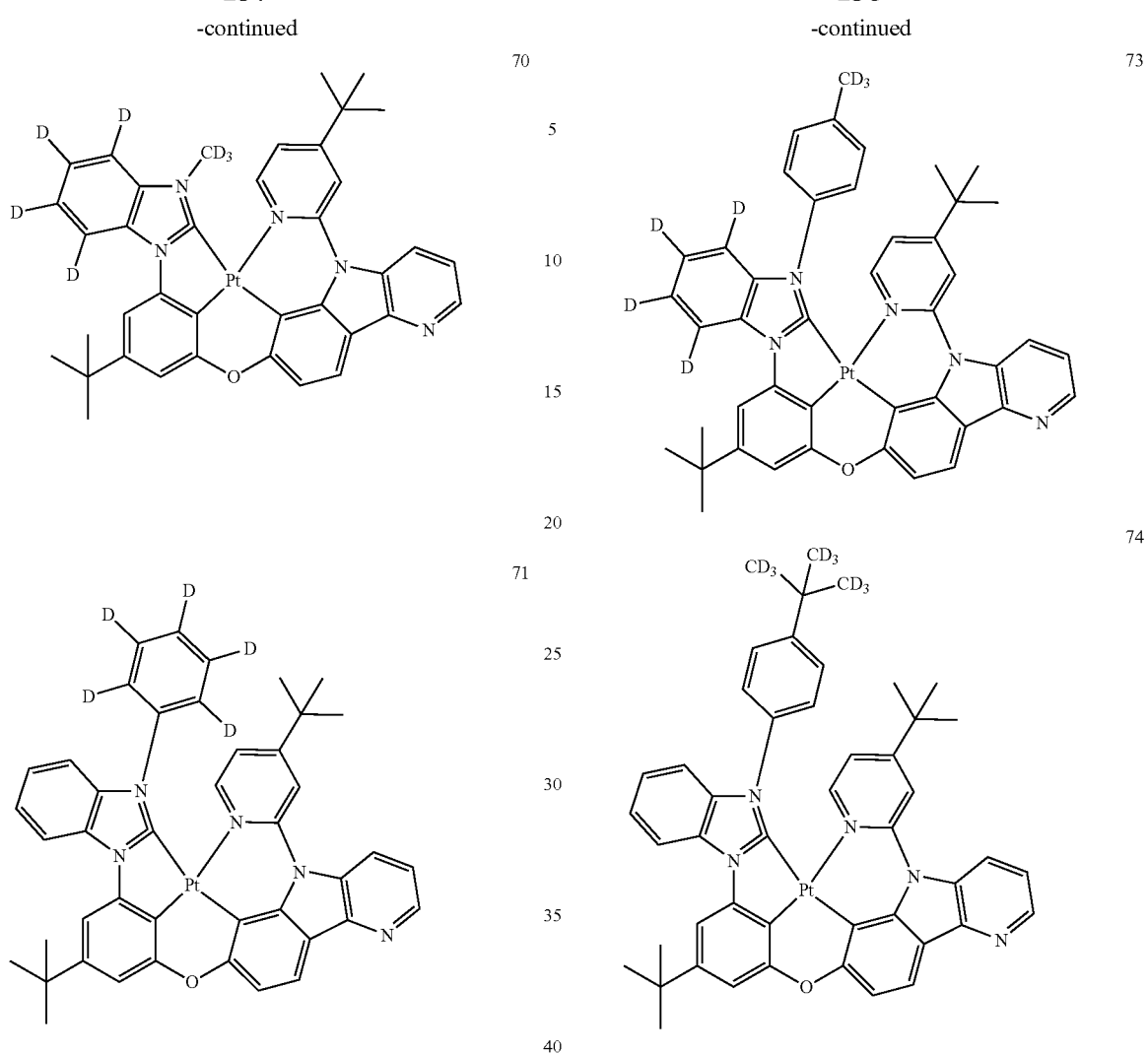

139
-continued
76
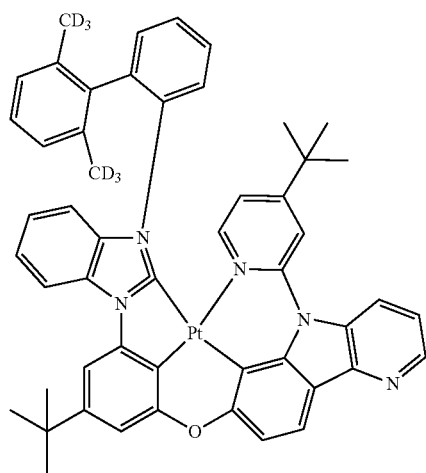
77
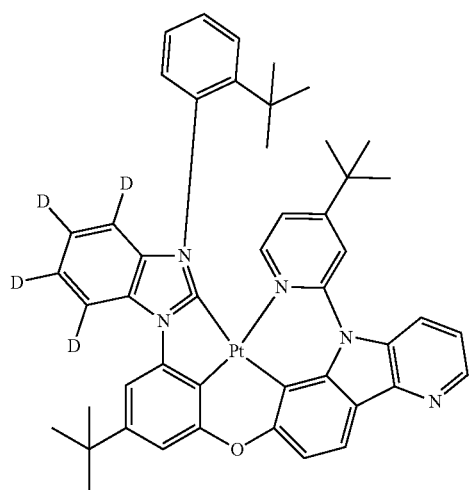
78
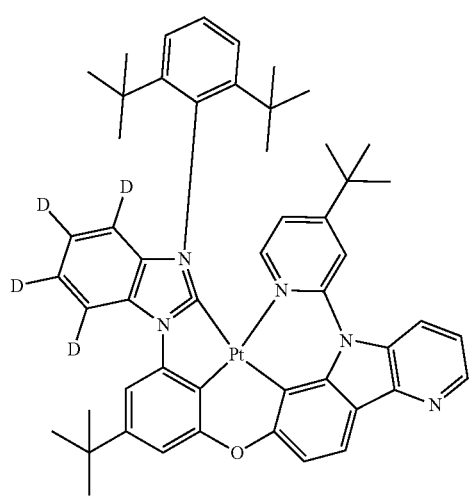
140
-continued
79
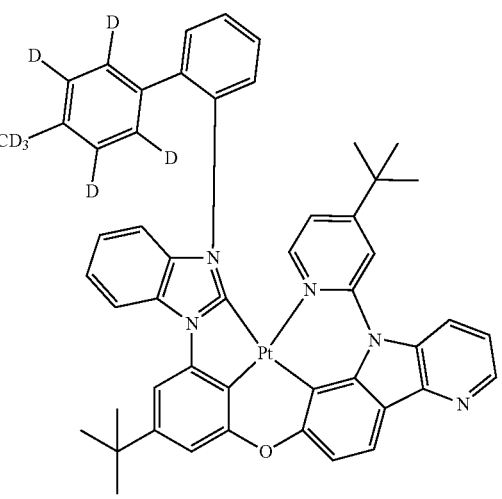
80
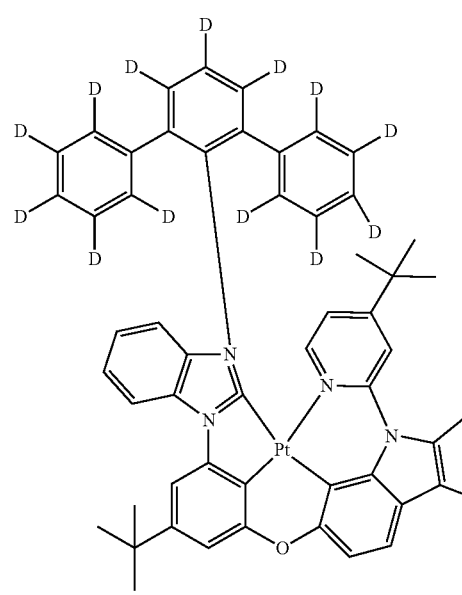

81
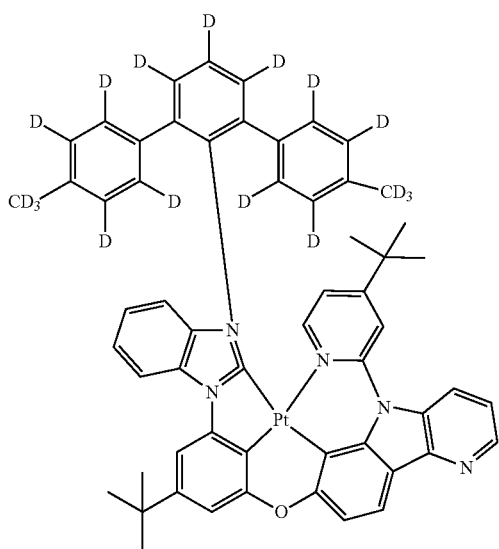
82
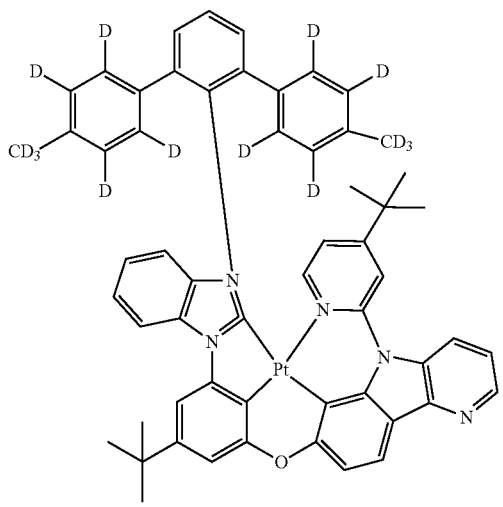
83
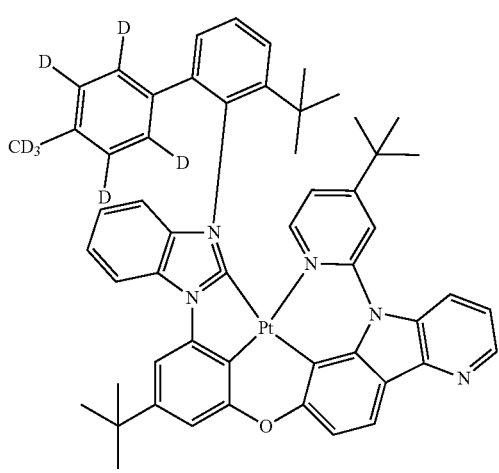
84
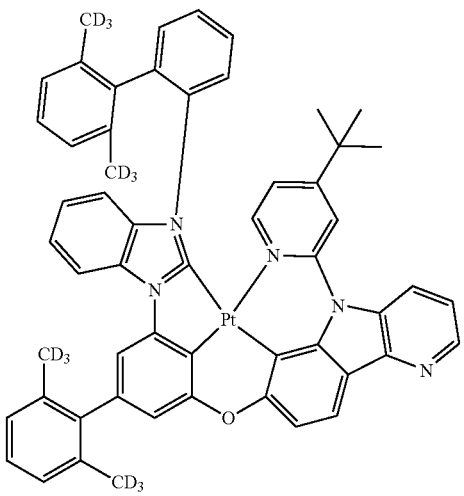
85
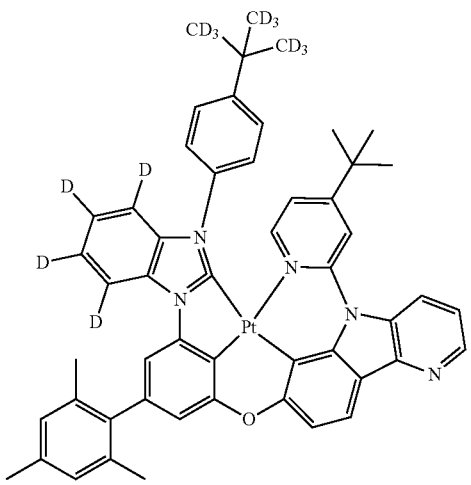
86
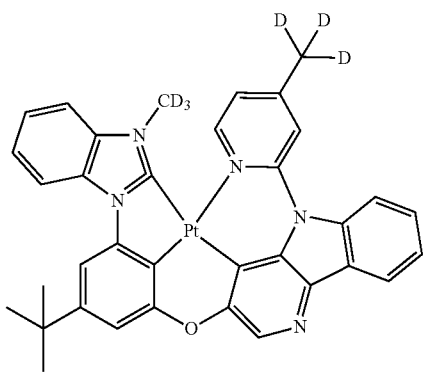

87
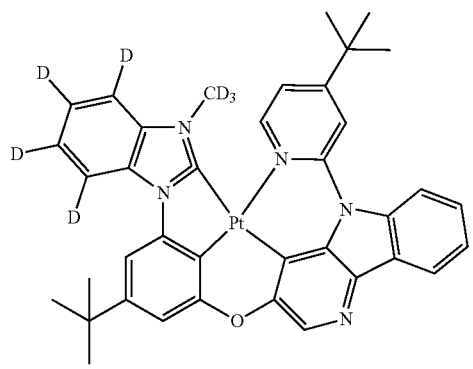
88
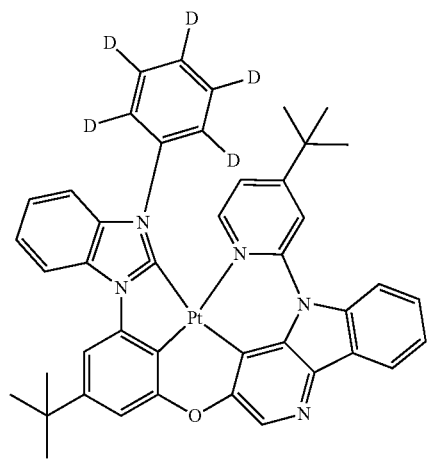
89
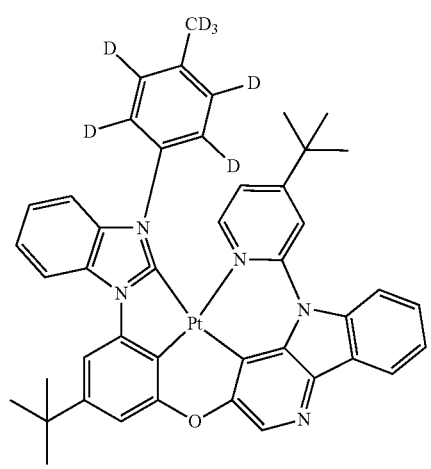
90
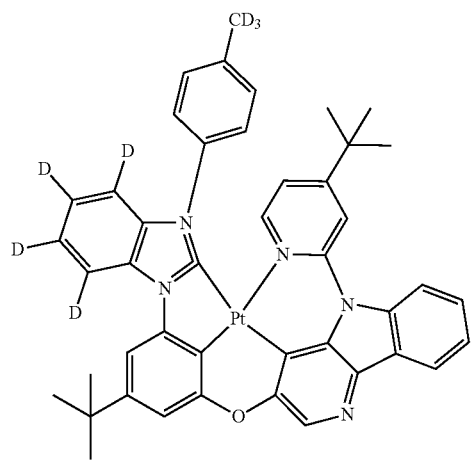
91
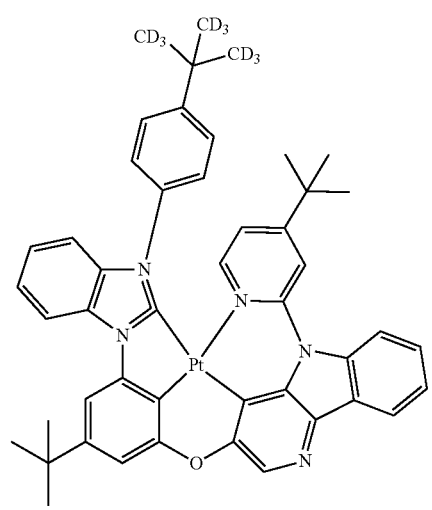
92
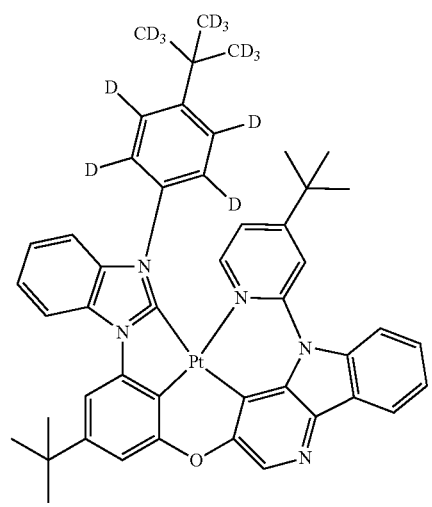

145
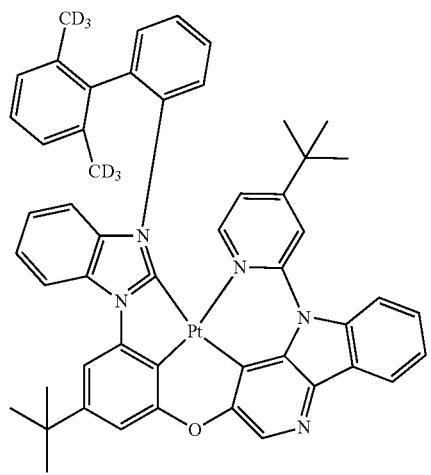
93
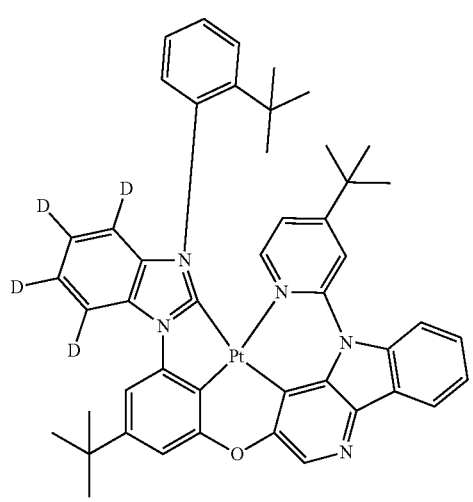
94
95
146
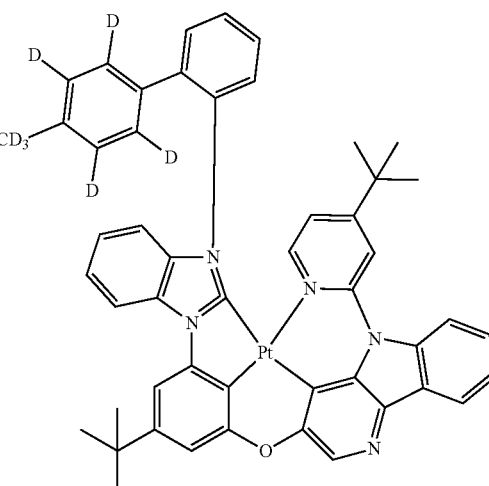
96
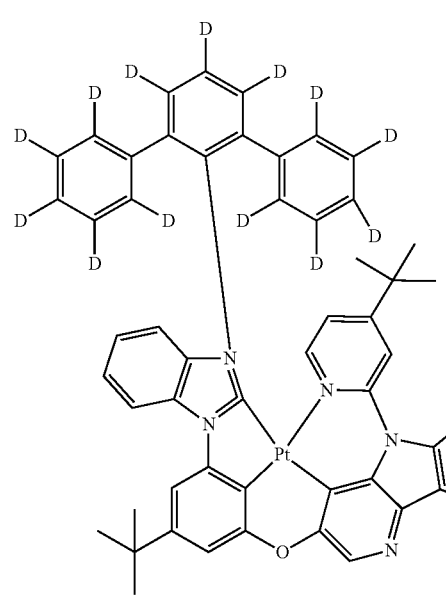
97

98
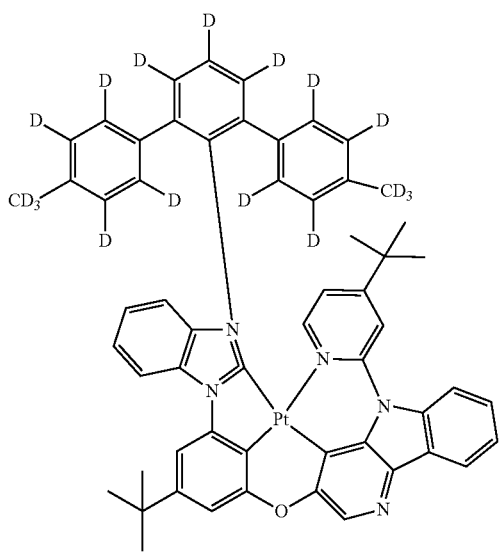
99
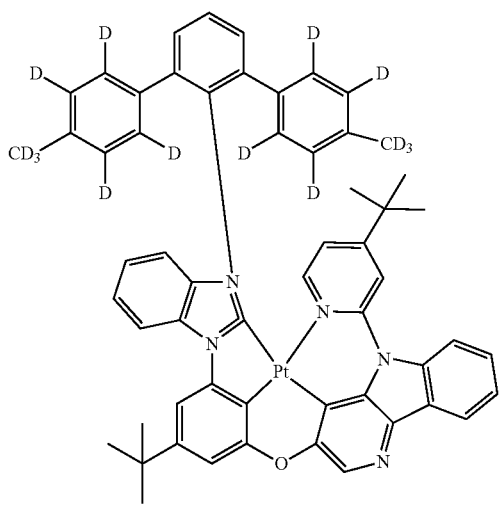
100
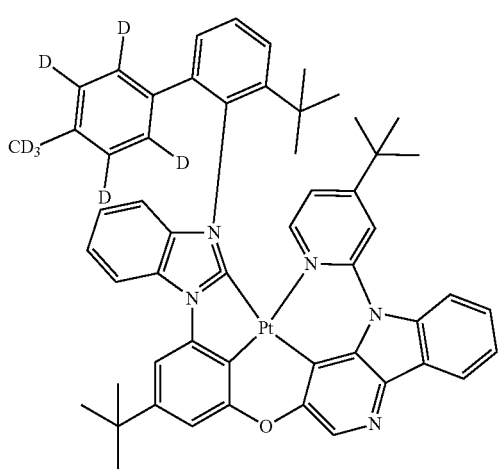
101
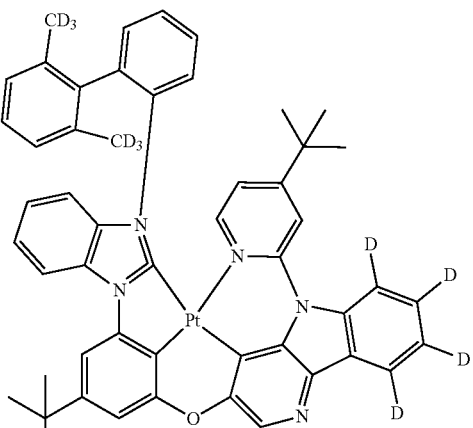
102
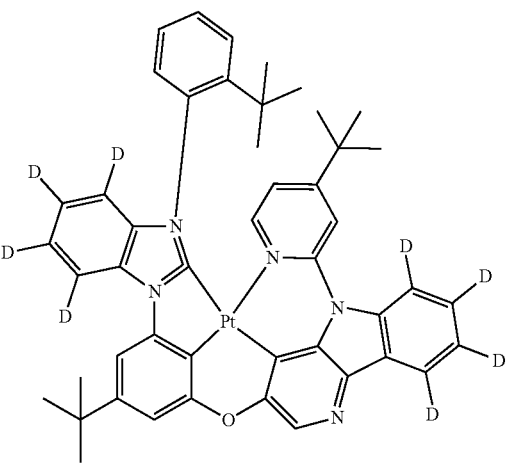
103
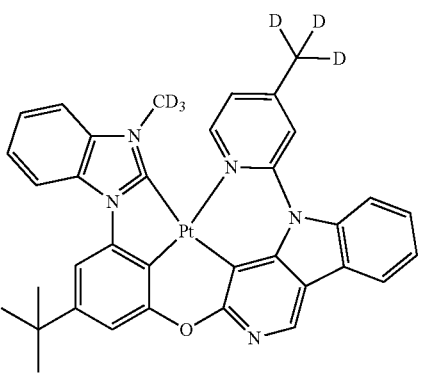

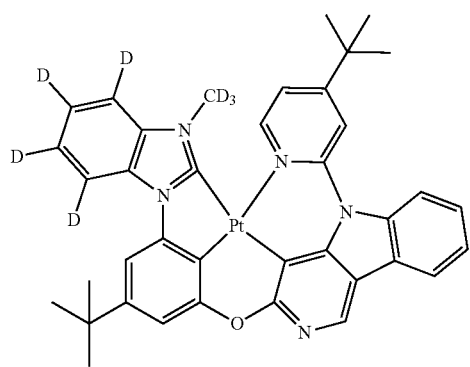
104
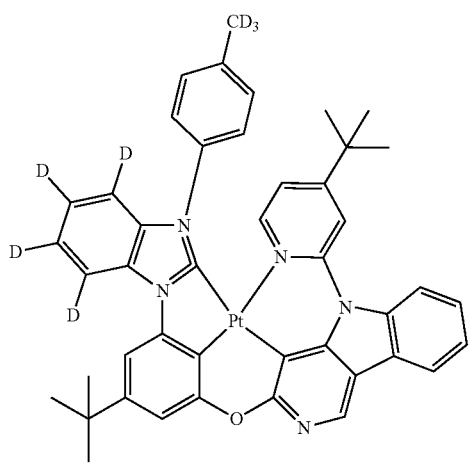
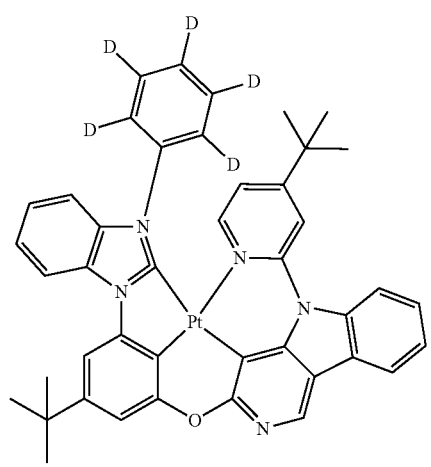
105
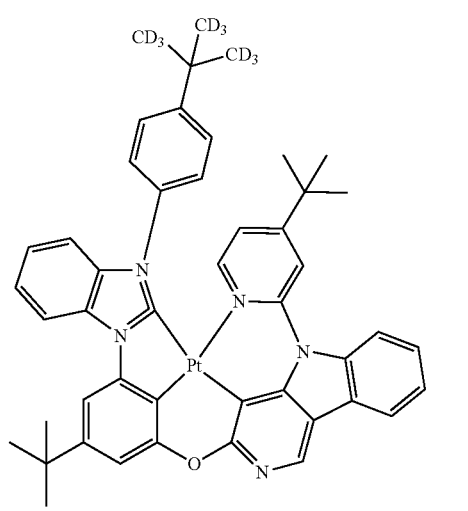
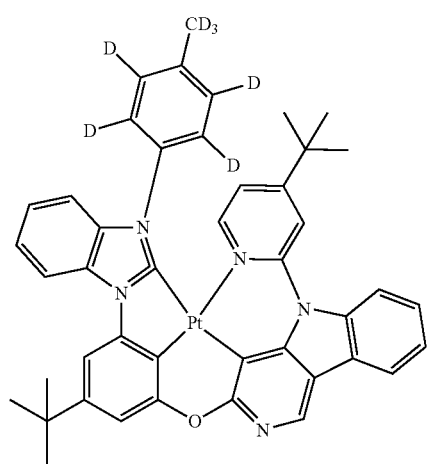
106
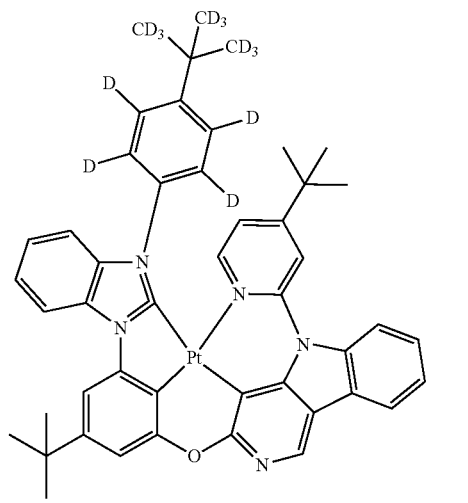
107
108
109

151 -continued
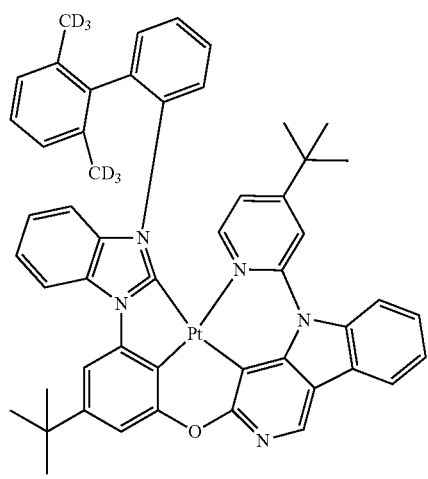
110
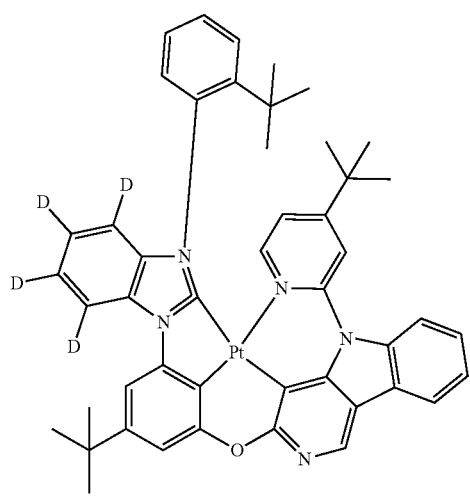
111
112
152 -continued
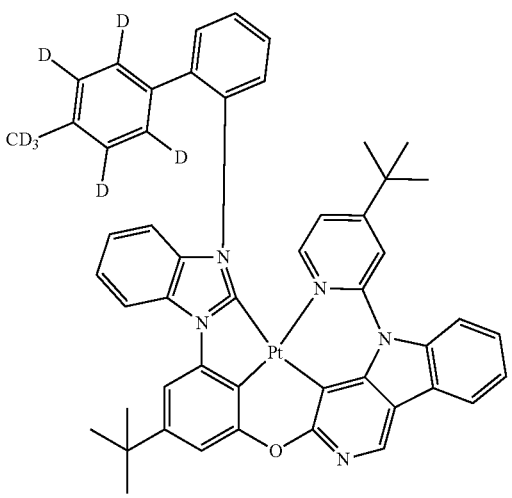
113
114
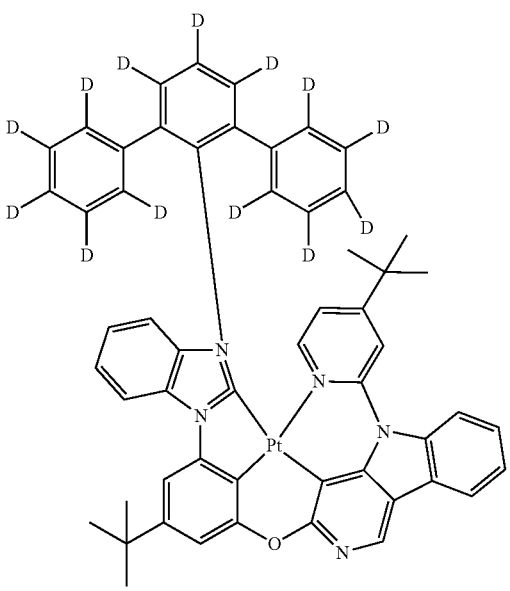

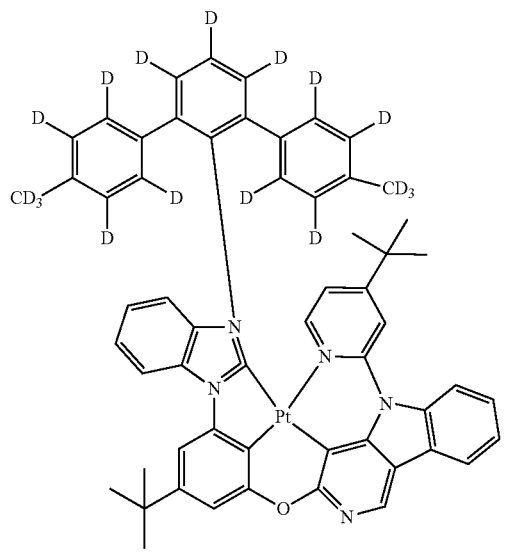
115
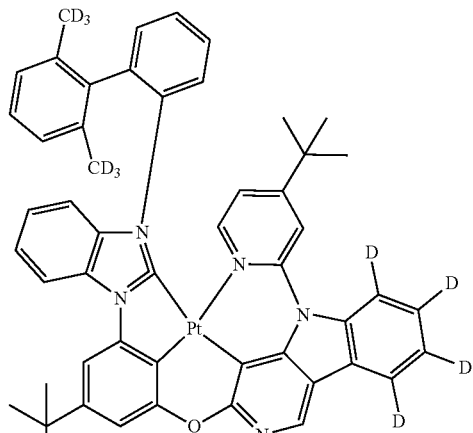
118
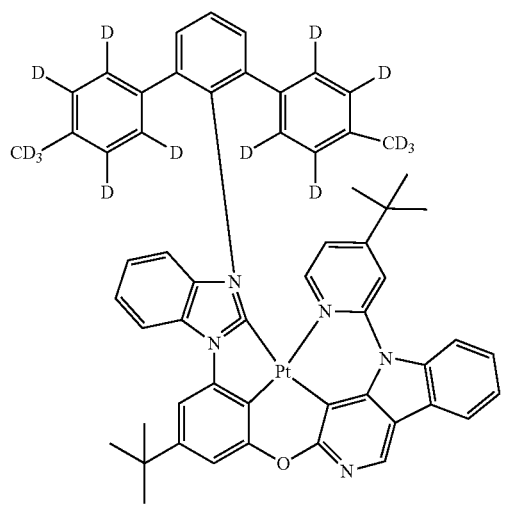
116
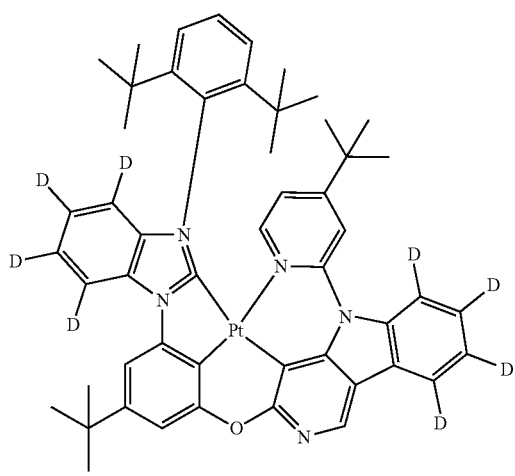
119
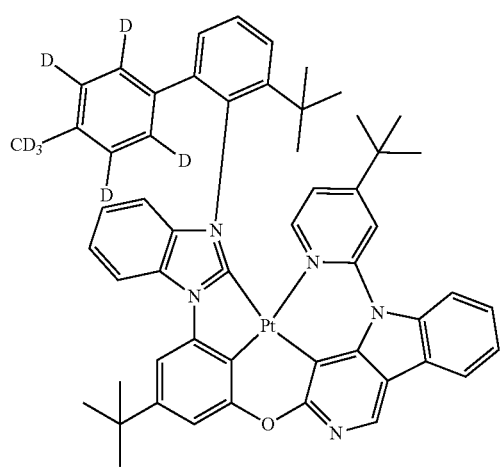
117
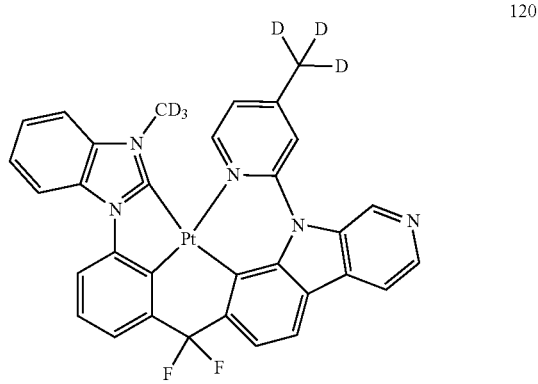
120

121 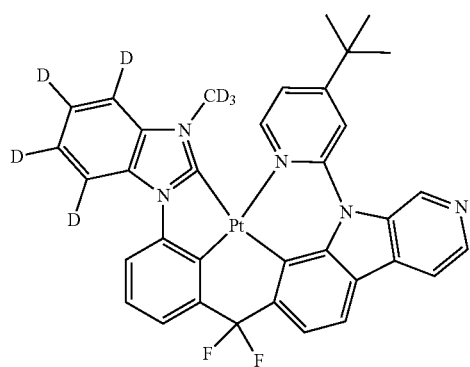
122 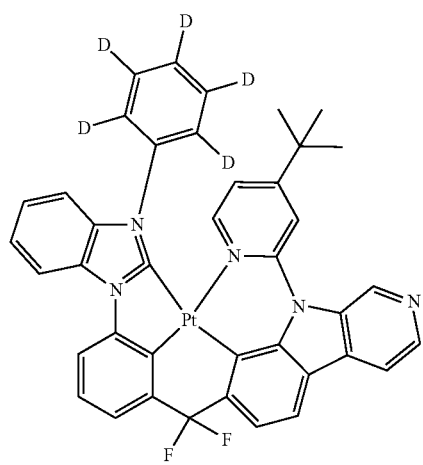
123 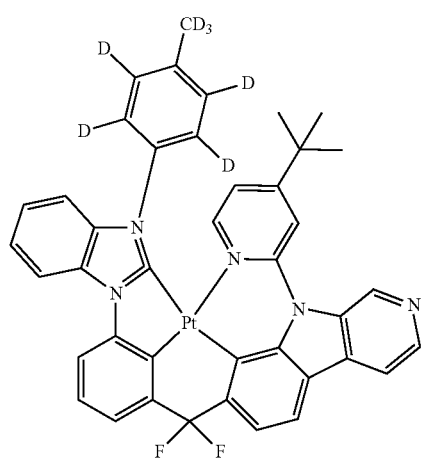
124 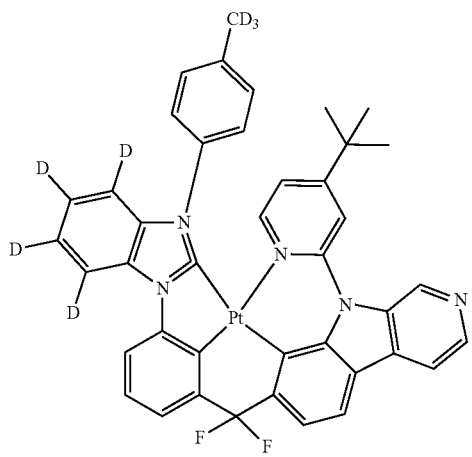
125 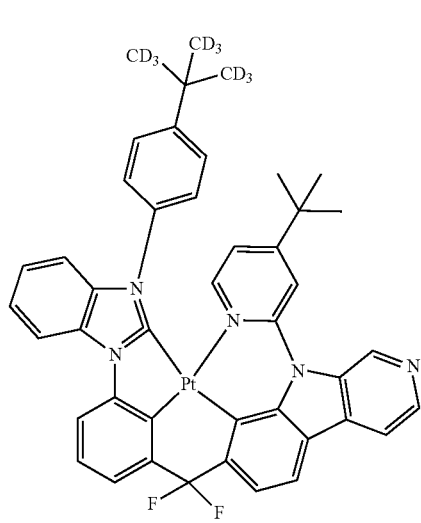
126 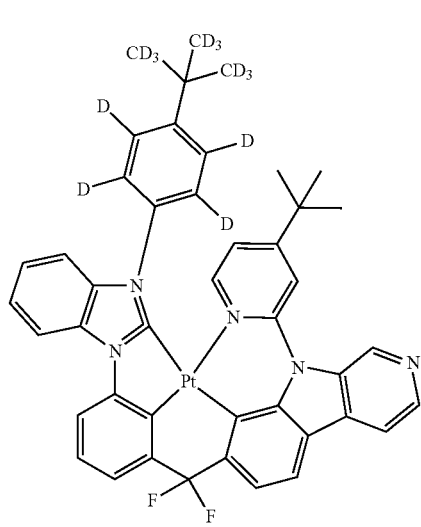

157
-continued
127
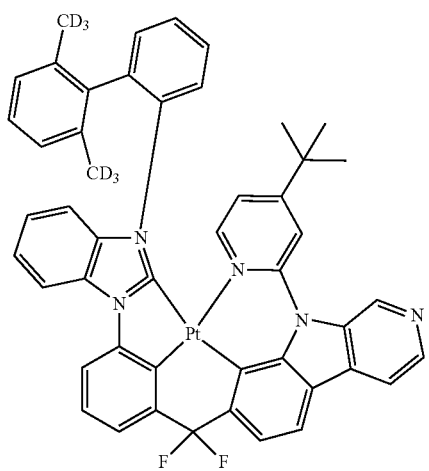
128
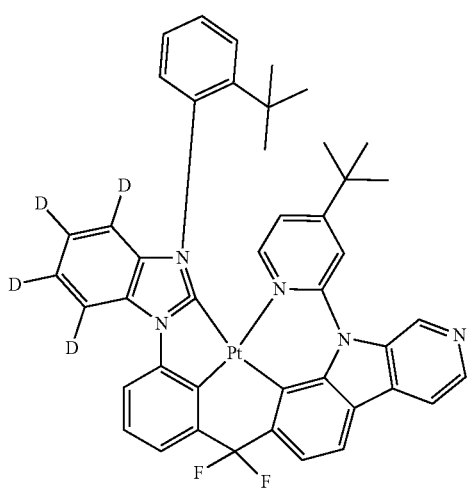
129
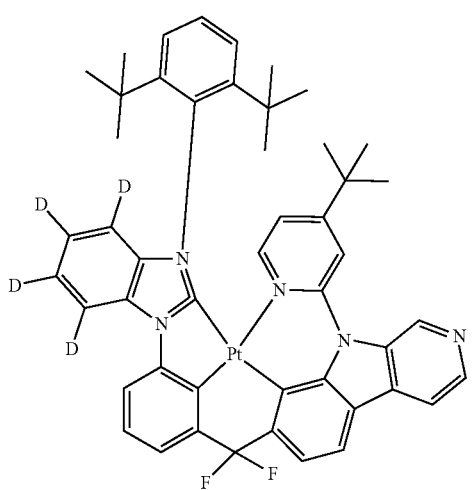
158
-continued
130
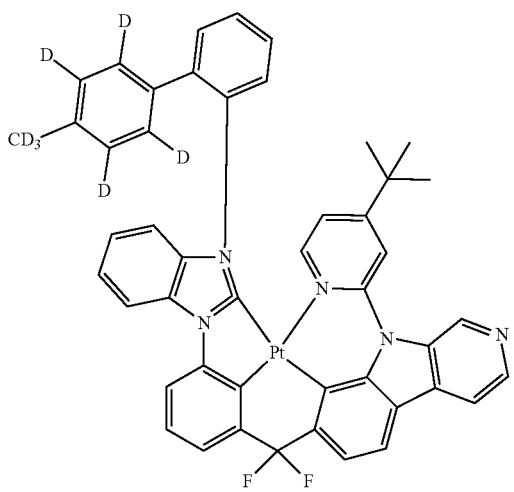
131
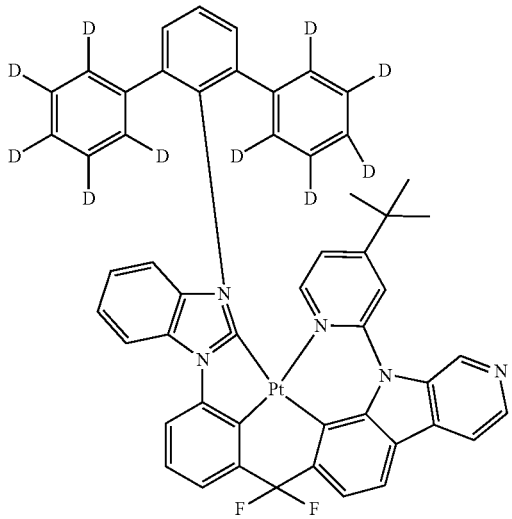
132
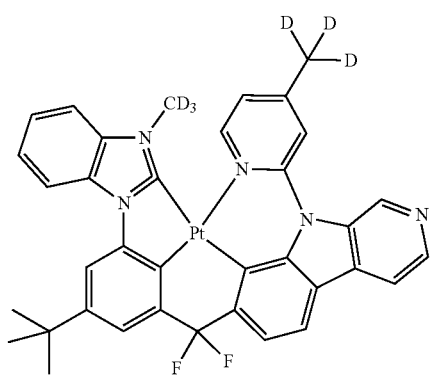

133
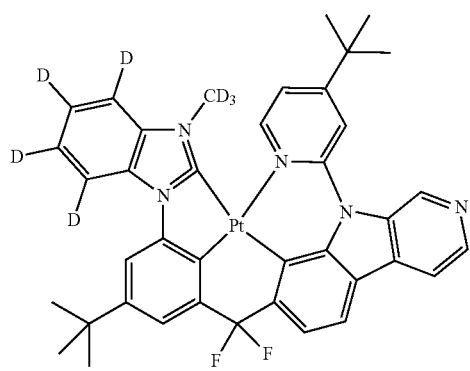
134
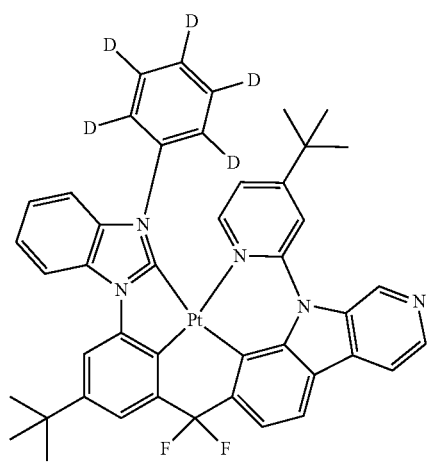
135
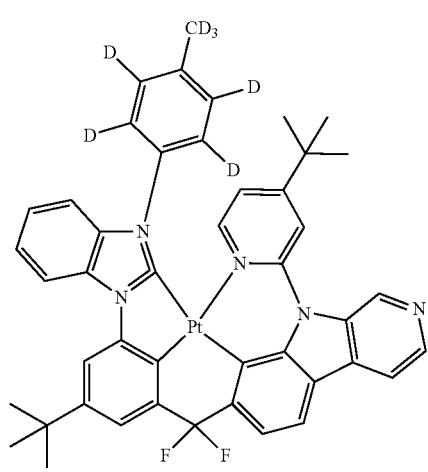
136
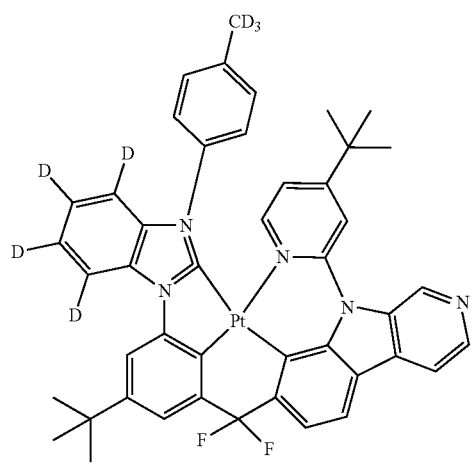
137
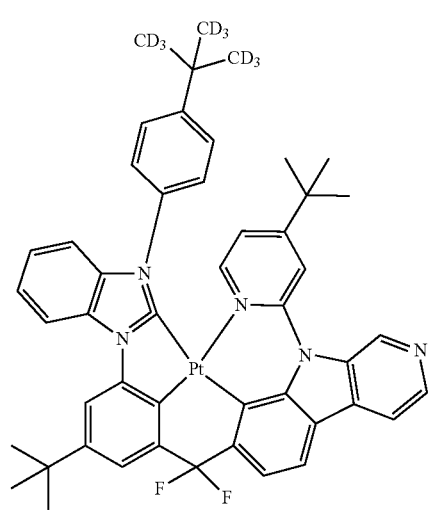
138
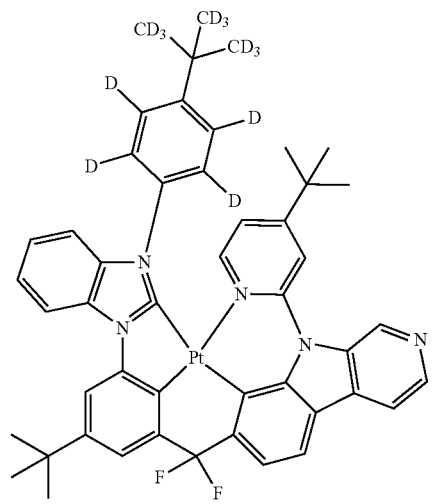

139
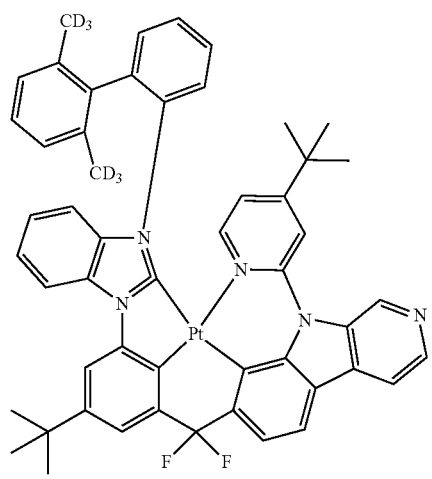
140
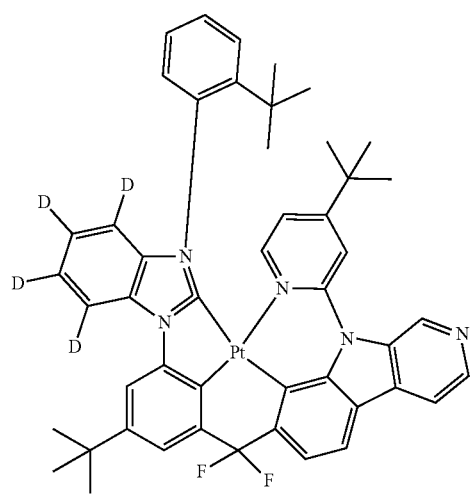
141
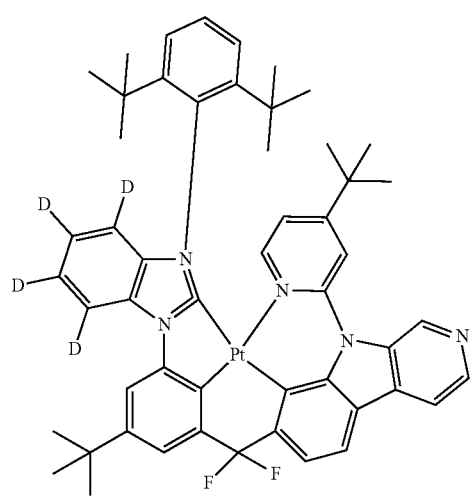
142
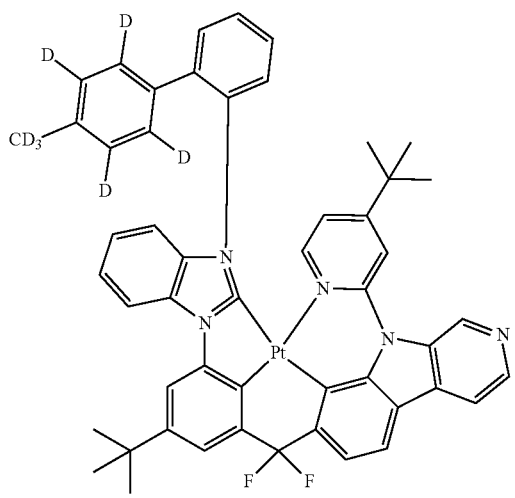
143
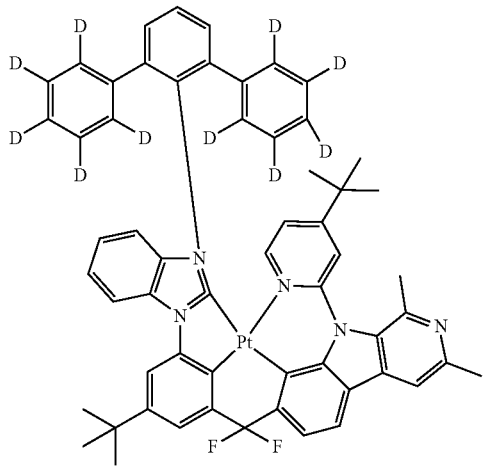
144
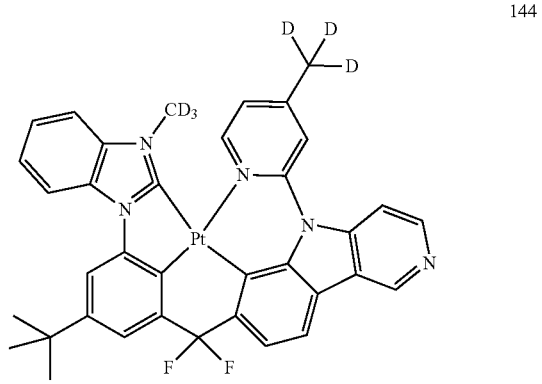

145
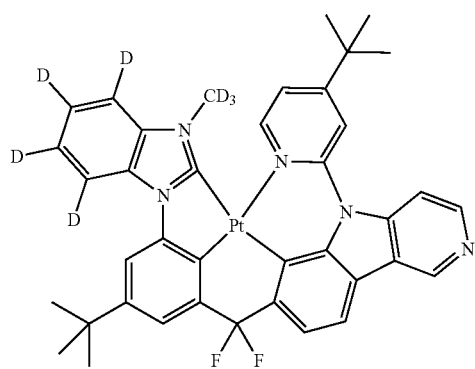
146
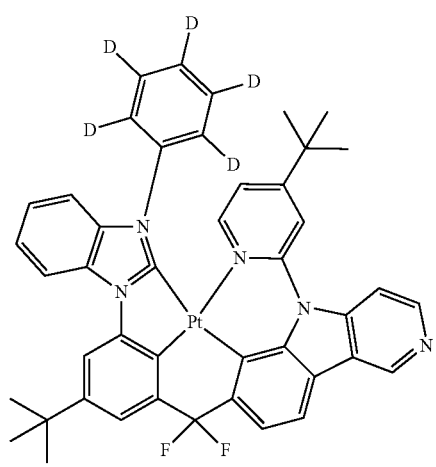
147
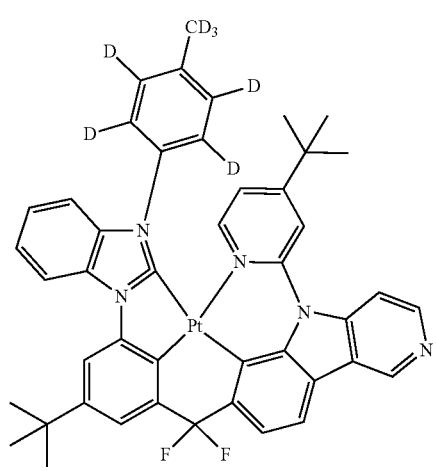
148
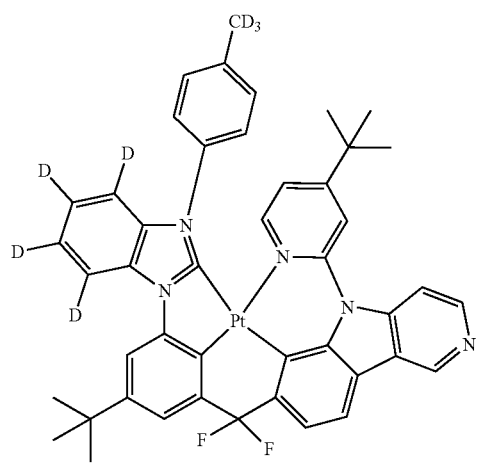
149
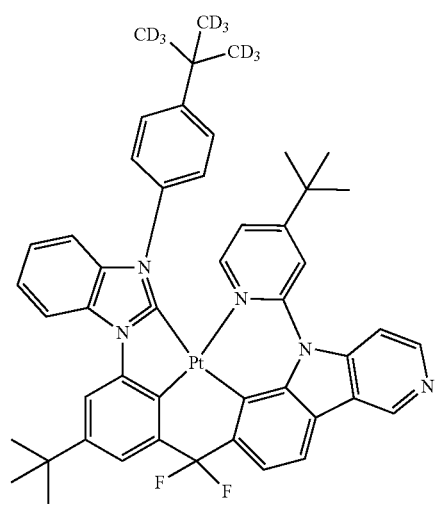
150
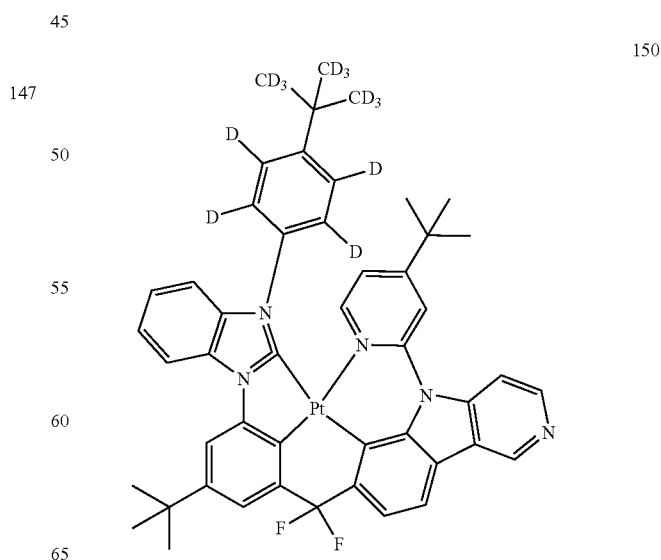

165
-continued
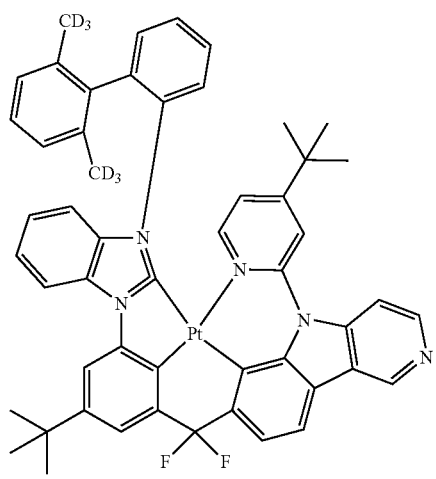
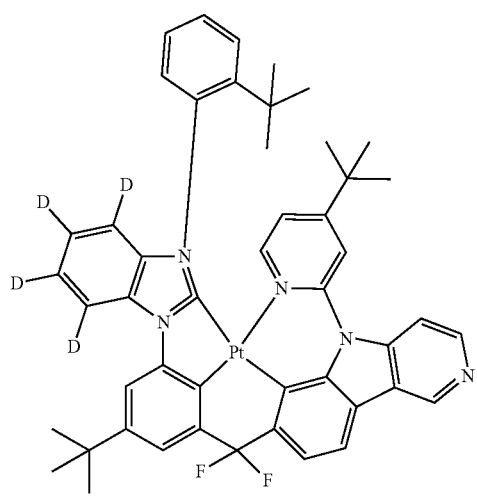
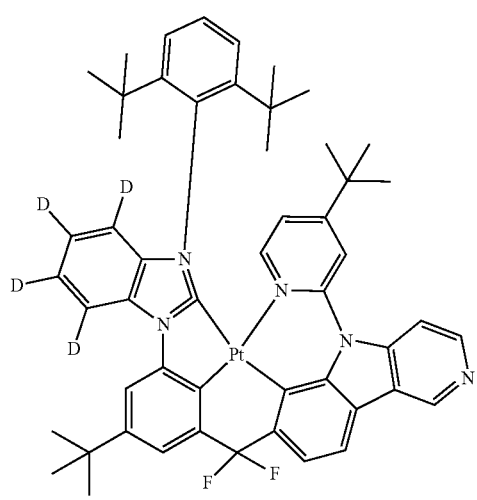
166
-continued
151
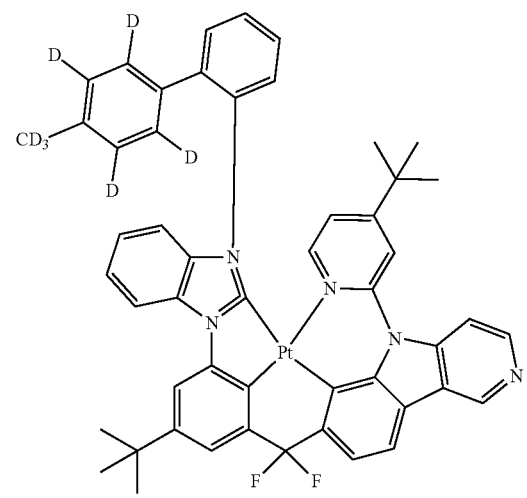
154
152
155
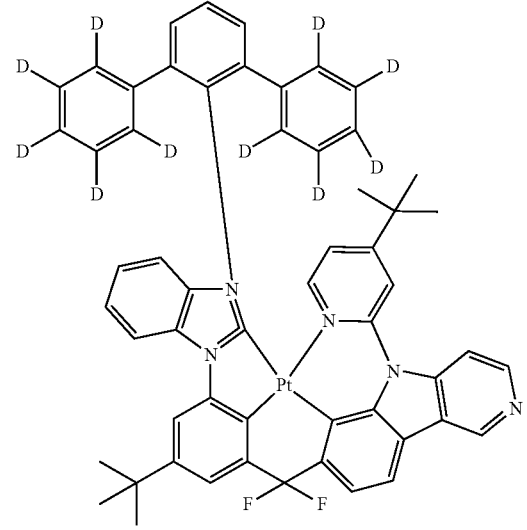
153
156
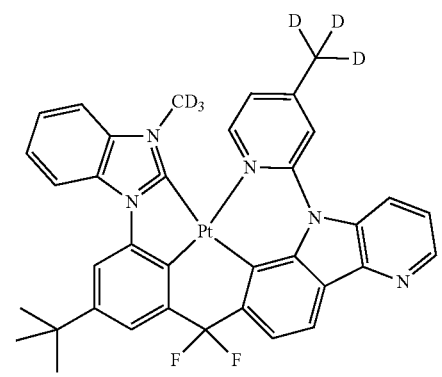

167
-continued
157
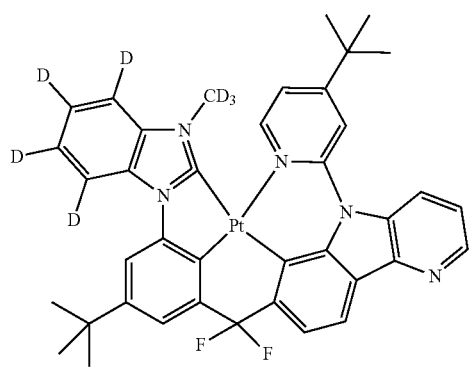
158
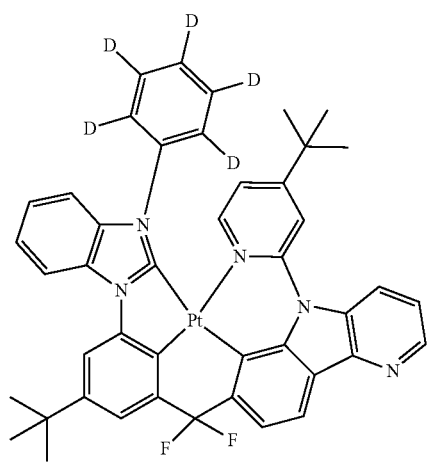
159
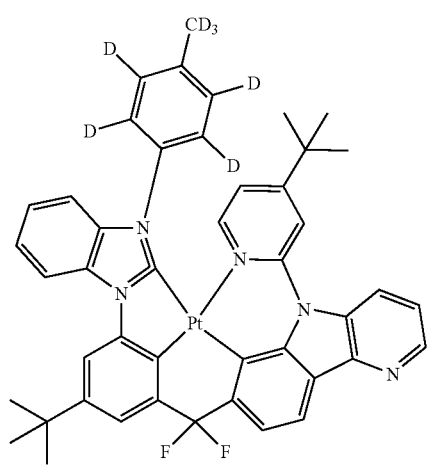
168
-continued
160
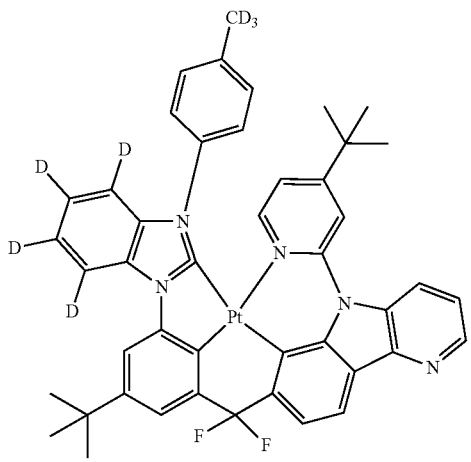
161
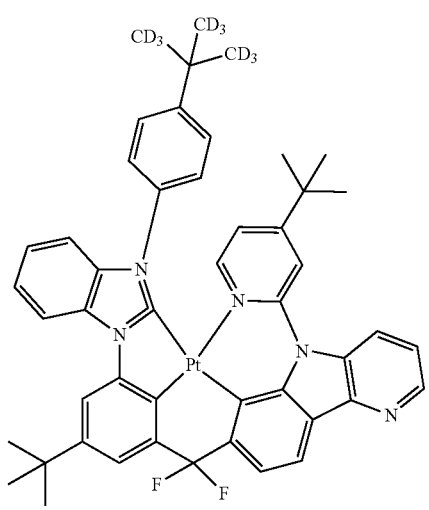
162
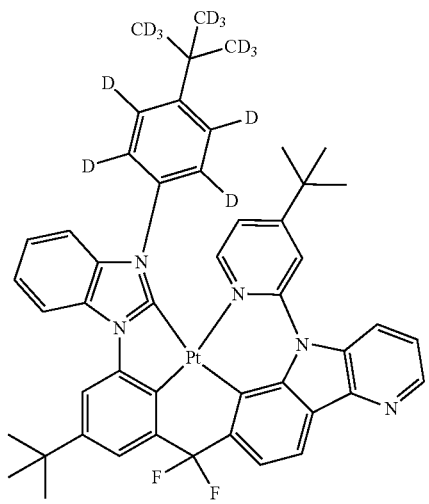

169
-continued
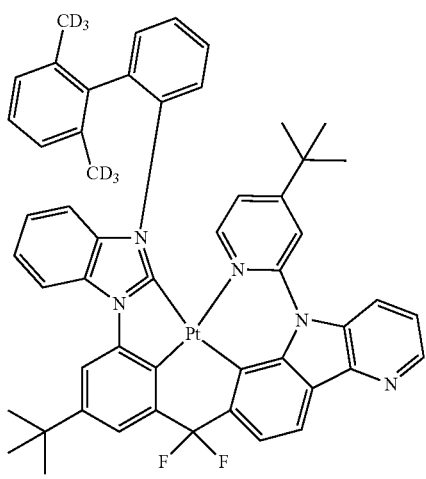
163
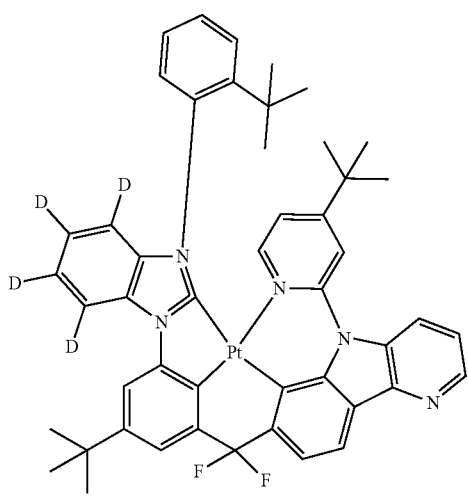
164
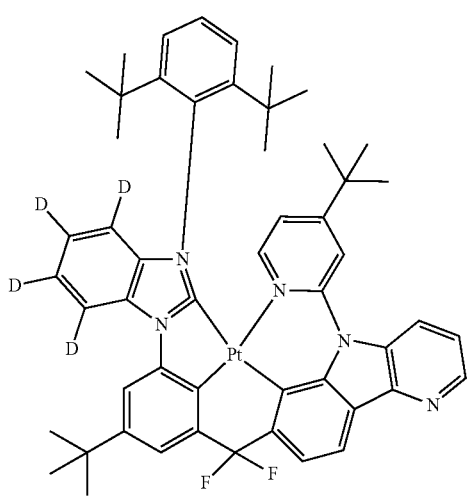
165
170
-continued
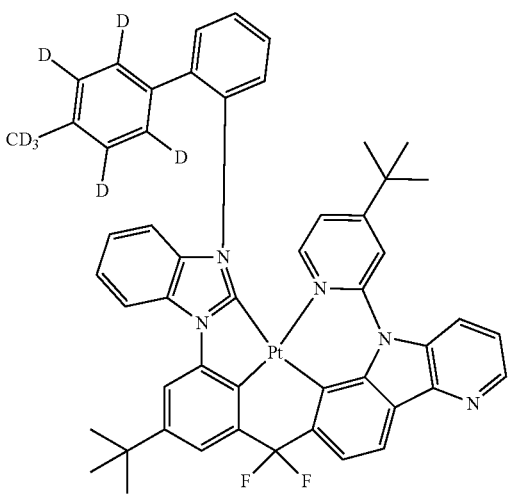
166
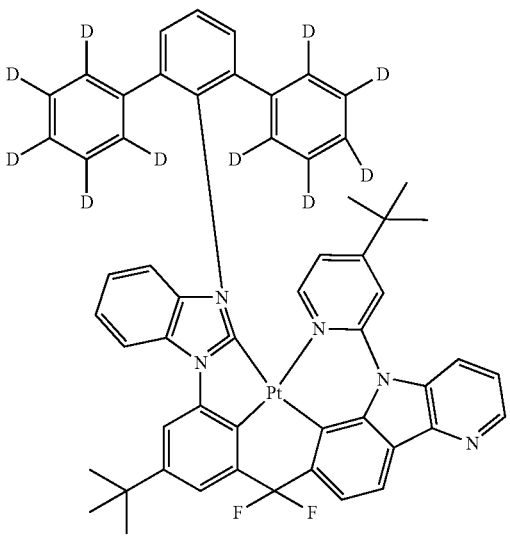
167
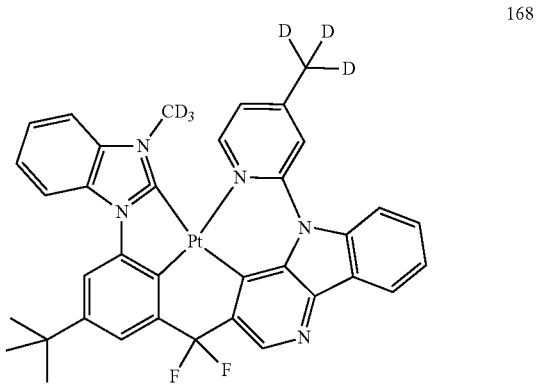
168

169
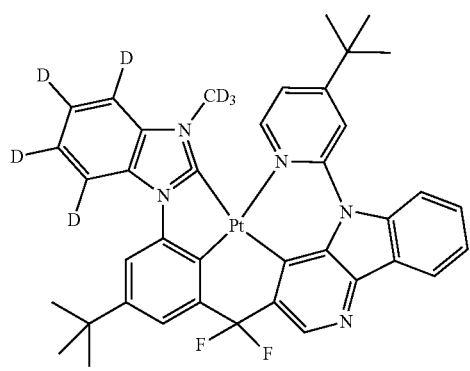
170
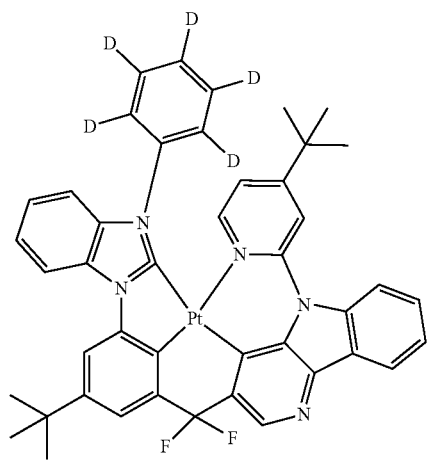
171
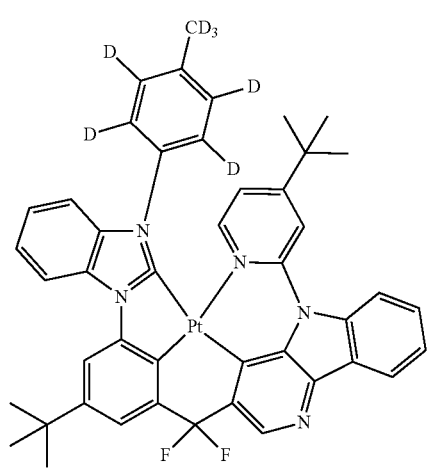
172
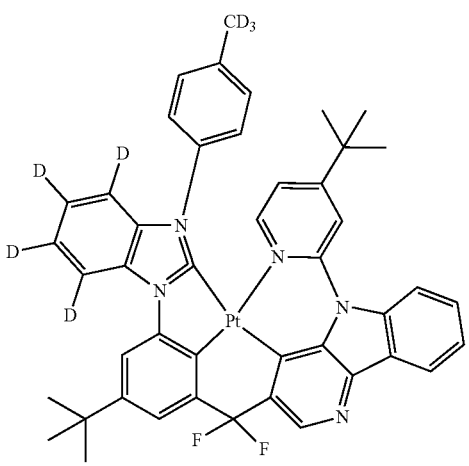
173
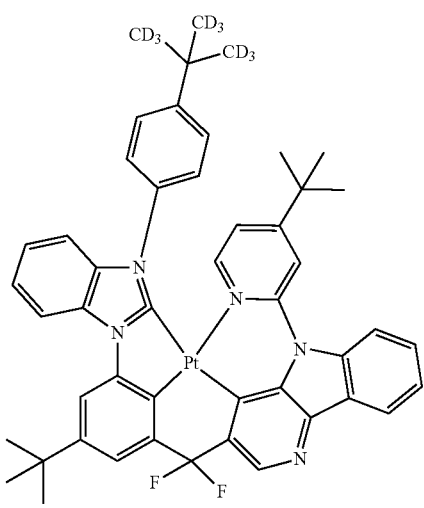
174
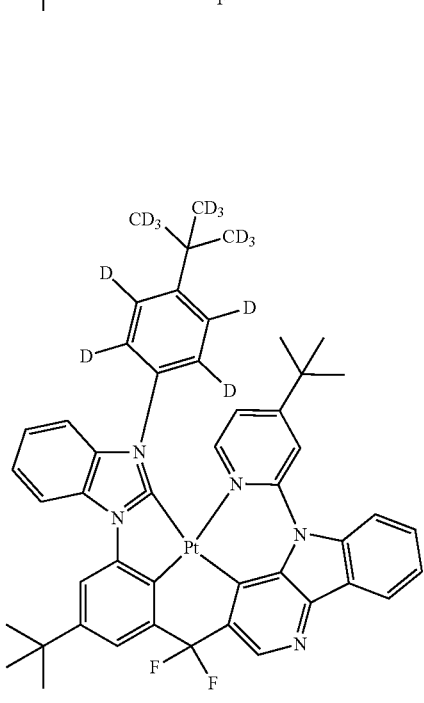

175
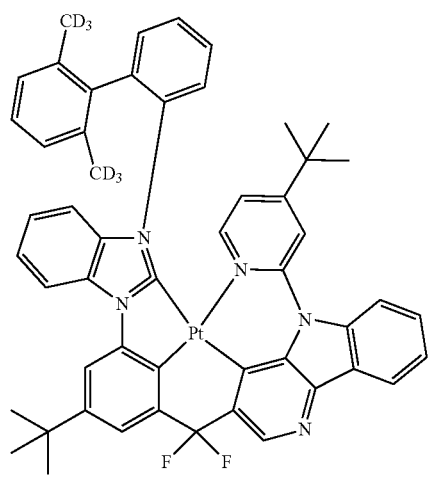
176
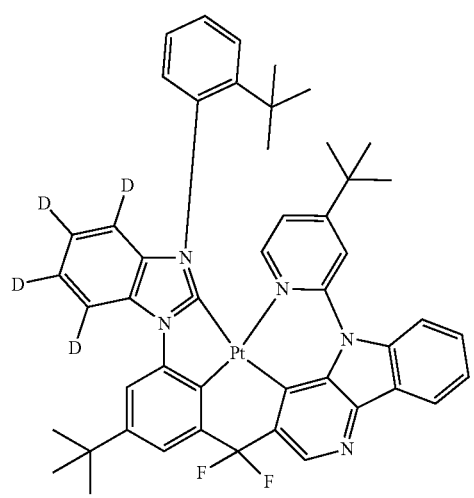
177
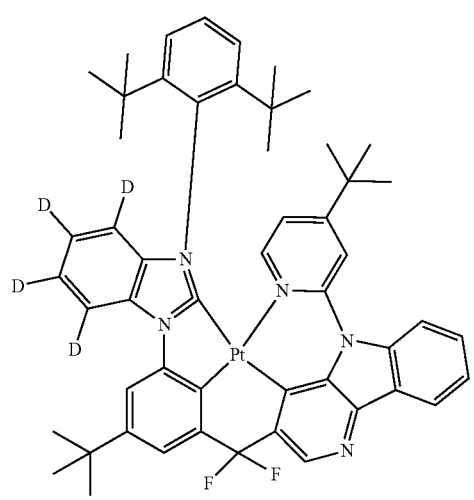
178
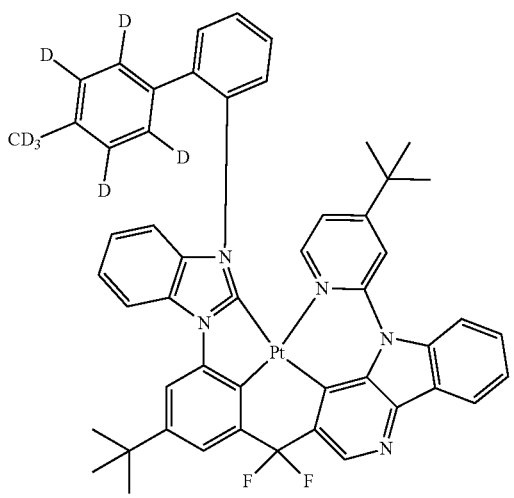
179
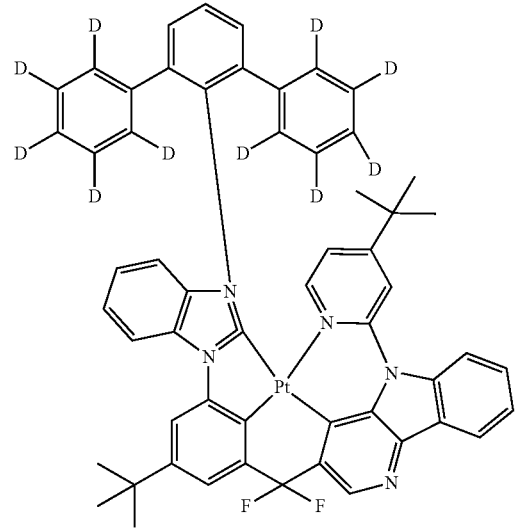
180
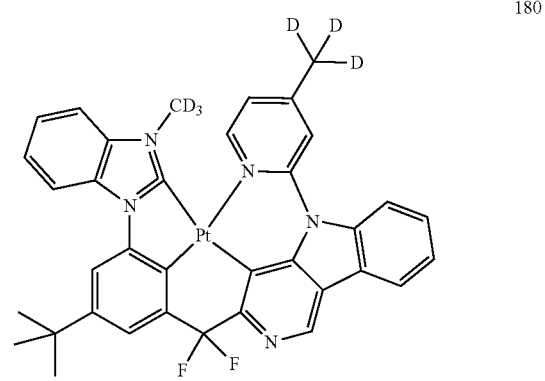

181
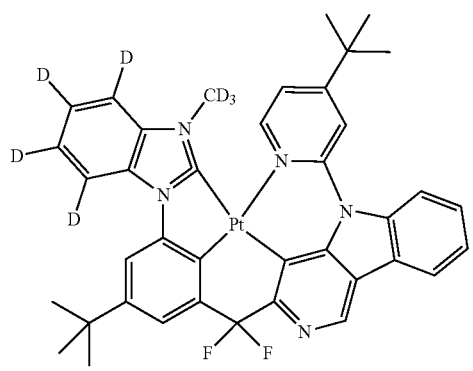
182
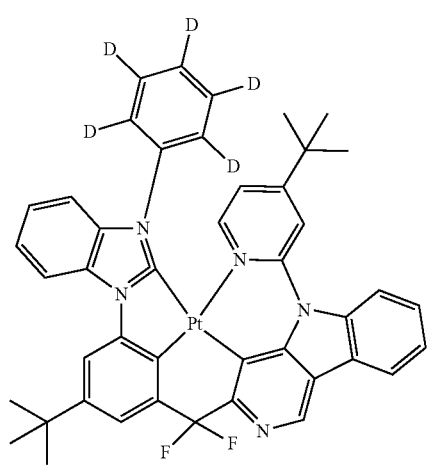
183
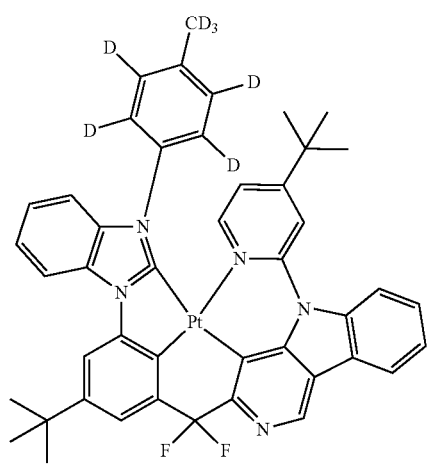
184
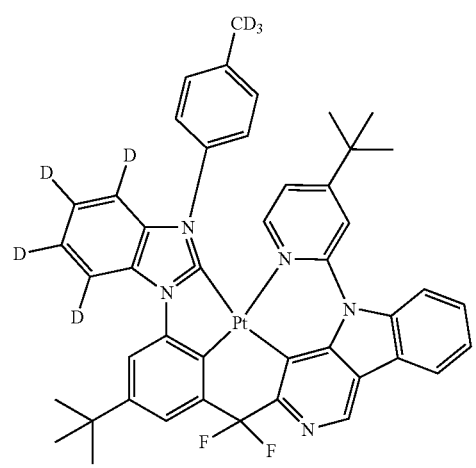
185
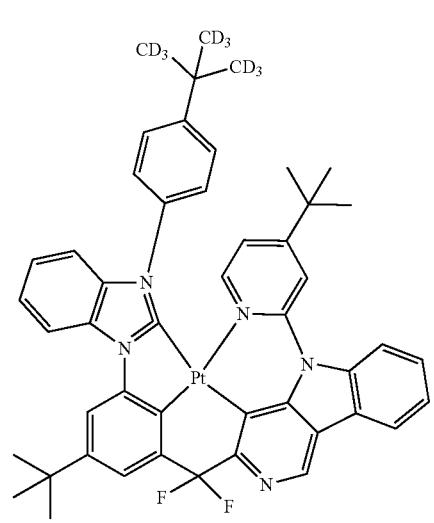
186
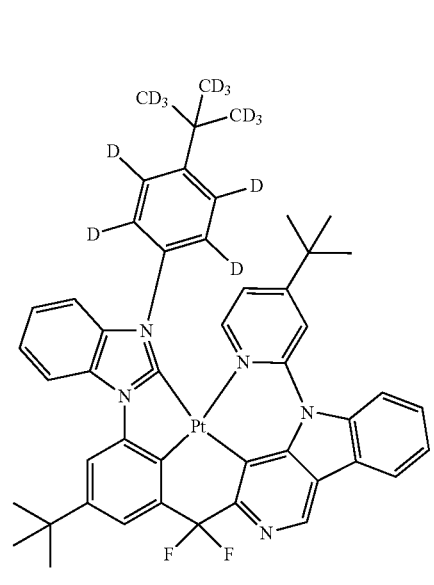

177
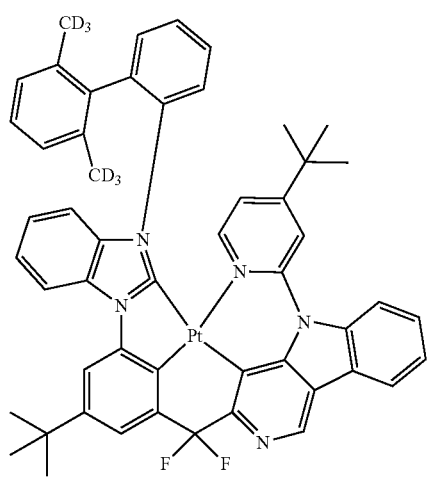
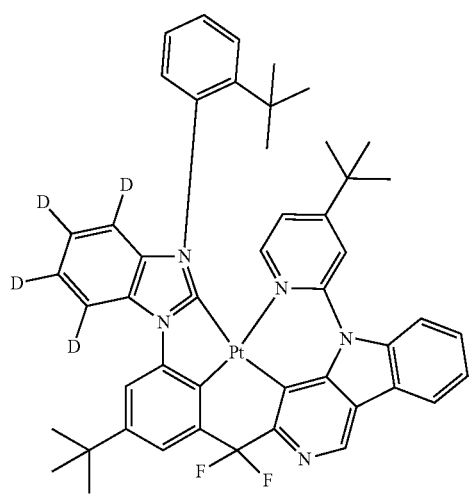
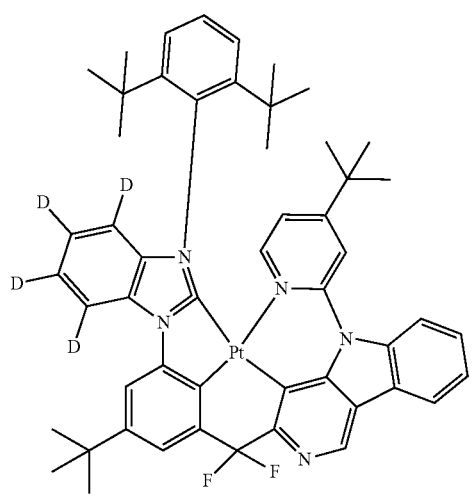
178
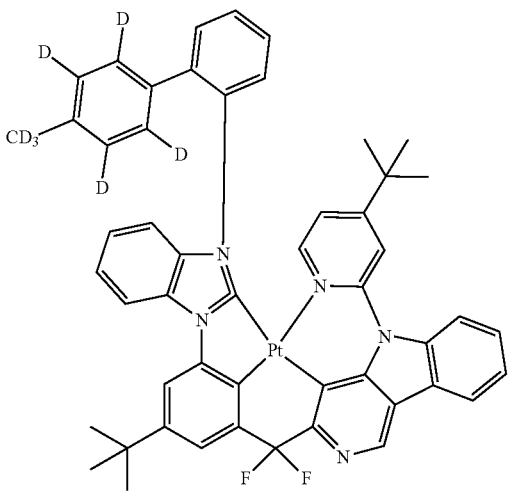
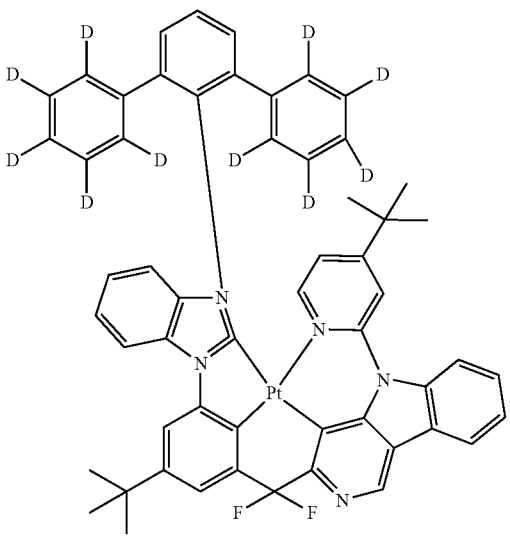
12. An organometallic compound represented by the following Formula 1:
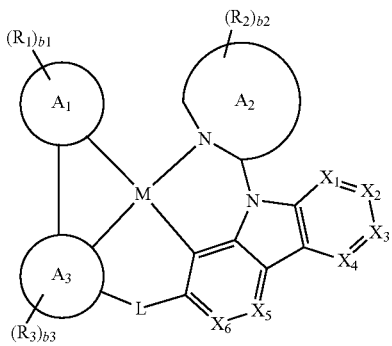
Formula 1
in Formula 1,
M is a transition metal,
one or two selected from among $X_1$ to $X_6$ are N, and the remainder are $CR_4$, if $X_1$ is N, any one selected from among $X_2$ to $X_6$ is N,
$R_4$ is a hydrogen atom, a deuterium atom, or a substituted or unsubstituted alkyl group having 1 to 10 carbon atoms, $A_1$ to $A_3$ are each independently a substituted or unsubstituted hydrocarbon ring of 5 to 60 carbon atoms for forming a ring, or a substituted or unsubstituted heterocycle of 1 to 60 carbon atoms for forming a ring, $b_1$ to $b_3$ are each independently an integer of 1 to 4, at least one selected from among $R_1$ to $R_3$ comprises a deuterium atom, and the remainder are each independently a hydrogen atom, a deuterium atom, a halogen atom, a hydroxyl group, a cyano group, a nitro group, a substituted or unsubstituted silyl group, a substituted or unsubstituted amine group, a substituted or unsubstituted oxy group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 carbon atoms for forming a ring, or a substituted or unsubstituted heterocyclic group having 1 to 10 carbon atoms for forming a ring, L is a direct linkage, O, S, —$CR_{11}R_{12}$—, —$CR_{13}$=$CR_{14}$—, —C≡C—, —C(=O)—, —C(=S)—, —BRAS—, —$NR_{16}$—, —$PR_{17}R_{18}$—, or —$GeR_{19}R_{20}$—, and $R_{11}$ to $R_{20}$ are each independently a hydrogen atom, a deuterium atom, a halogen atom, a substituted or unsubstituted alkyl group having 1 to 30 carbon atoms, or a substituted or unsubstituted aryl group having 6 to 30 carbon atoms for forming a ring.

13. The organometallic compound of claim 12, wherein M is Pt, Pd, Cu, or Os.

14. The organometallic compound of claim 12, wherein Formula 1 is represented by the following Formula 2-1 or Formula 2-2:

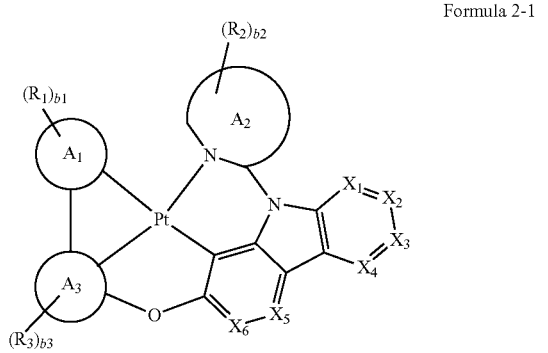

Formula 2-1

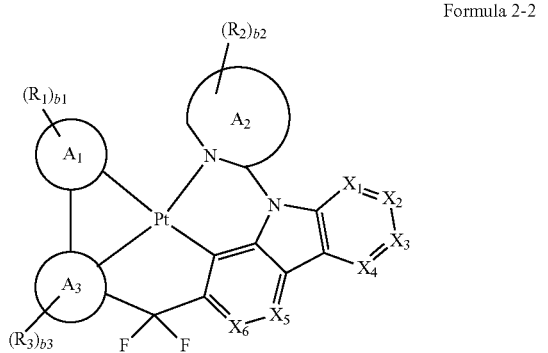

Formula 2-2 in Formula 2-1 and Formula 2-2, $A_1$ to $A_3$, $X_1$ to $X_6$, $R_1$ to $R_3$, and $b_1$ to $b_3$ are the same as defined with respect to Formula 1.

15. The organometallic compound of claim 12, wherein Formula 1 is represented by the following Formula 3:

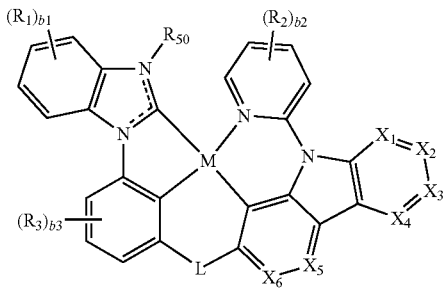

Formula 3 in Formula 3, $R_{50}$ is a hydrogen atom, a deuterium atom, a halogen atom, a substituted or unsubstituted alkyl group having 1 to 30 carbon atoms, or a substituted or unsubstituted aryl group having 6 to 30 carbon atoms, and M, L, $X_1$ to $X_6$, $R_1$ to $R_3$, and $b_1$ to $b_3$ are the same as defined with respect to Formula 1.

16. The organometallic compound of claim 15, wherein Formula 3 is represented by the following Formula 3-1:

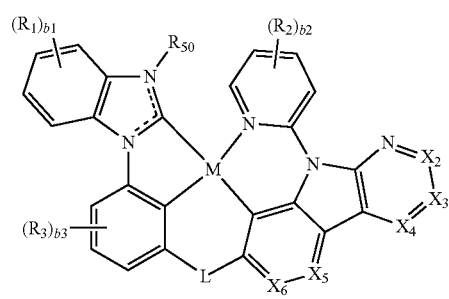

Formula 3-1 in Formula 3-1, any one selected from among $X_2$ to $X_6$ is N, and the remainder are $CR_4$, and M, L, $R_1$ to $R_4$, $R_{50}$ and $b_1$ to $b_3$ are the same as defined with respect to Formula 3.

17. The organometallic compound of claim 15, wherein Formula 3 is represented by the following Formula 3-2 or Formula 3-3:

Formula 3-2

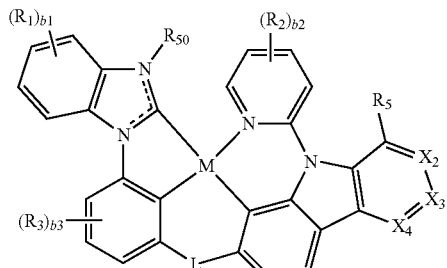

Formula 3-3

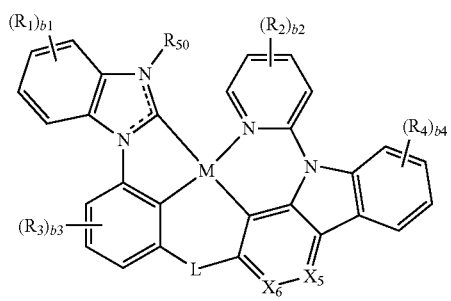

in Formula 3-2,
any one selected from among $X_2$ to $X_4$ is N, and the remainder are $CR_4$, and
$R_5$ is a hydrogen atom, a deuterium atom, or a substituted or unsubstituted alkyl group having 1 to 10 carbon atoms, and in Formula 3-3,
any one selected from among $X_5$ and $X_6$ is N, and the remainder is $CR_5$,
b4 is an integer of 1 to 4,
$R_5$ is a hydrogen atom, a deuterium atom, or a substituted or unsubstituted alkyl group having 1 to 10 carbon atoms, and
M, L, $R_1$ to $R_4$, $b_1$ to $b_3$, and $R_{50}$ are the same as defined with respect to Formula 3.

18. The organometallic compound of claim 15, wherein $R_{50}$ is represented by any one selected from among compounds represented in the following Compound Group R:

Compound Group R

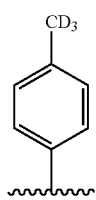

R-1

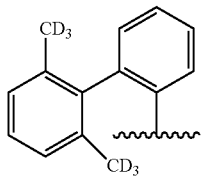

R-2

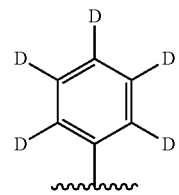

R-3

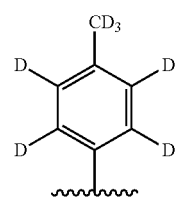

R-4

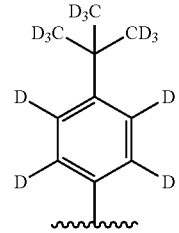

R-5

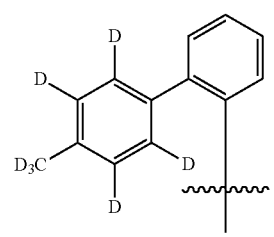

R-6

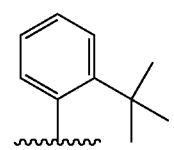

R-7

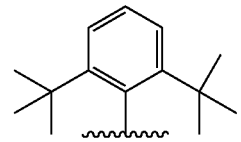

R-8

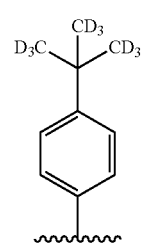

R-9

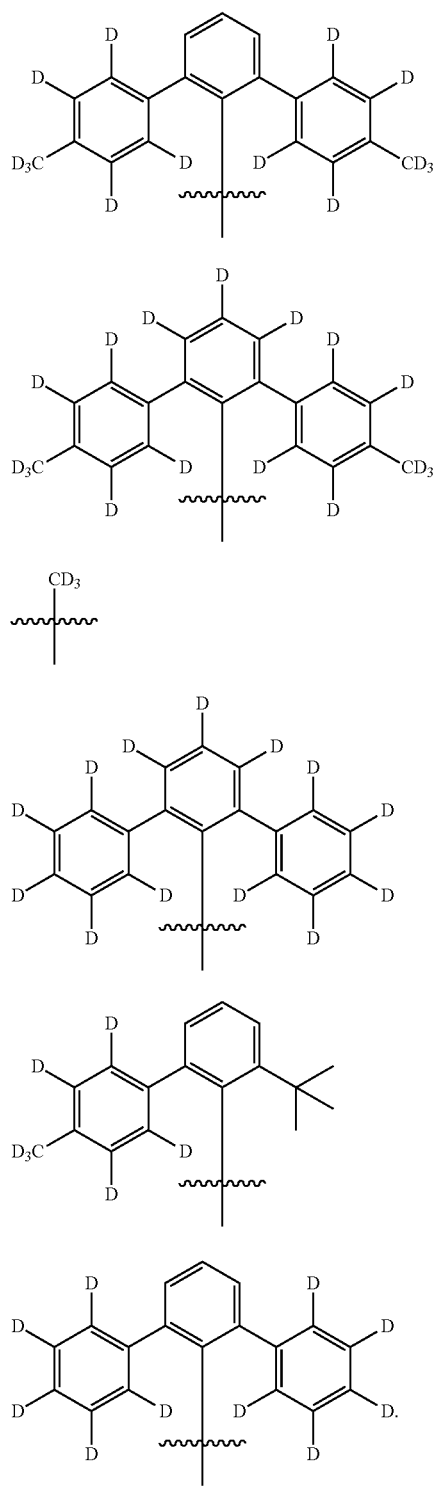
19. The organometallic compound of claim 18, wherein, if $R_{50}$ is Compound R-7 or R-8, $R_1$ comprises at least one deuterium atom.
20. The organometallic compound of claim 12, wherein Formula 1 is represented by any one selected from among compounds represented in the following Compound Group 1:
Compound Group 1
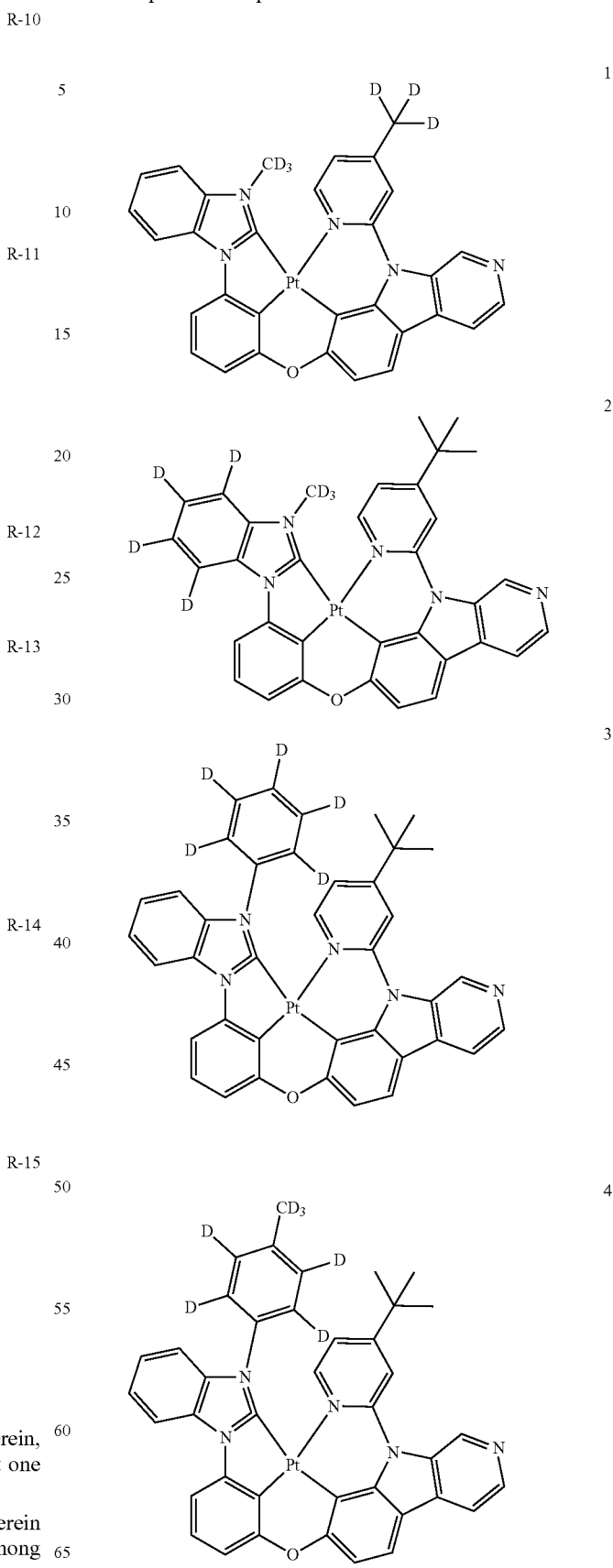

185
-continued
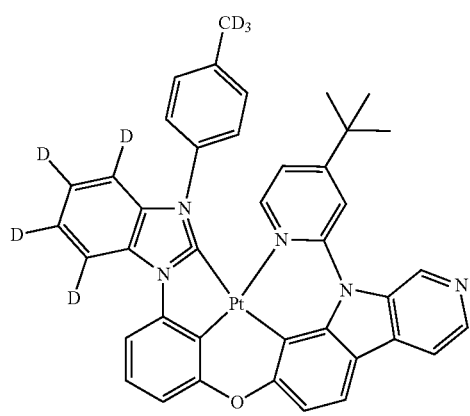
5
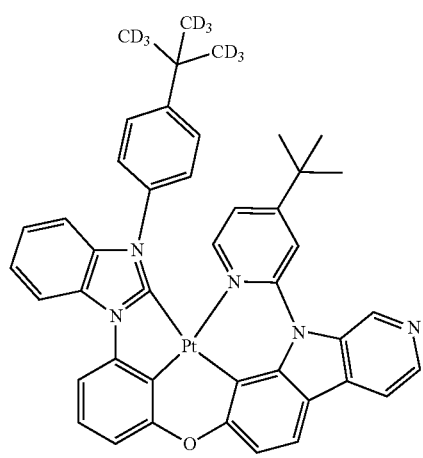
6
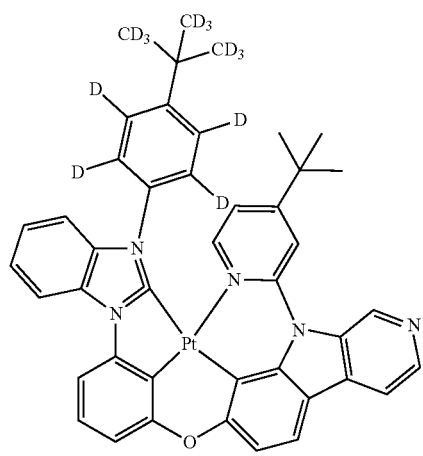
7
186
-continued
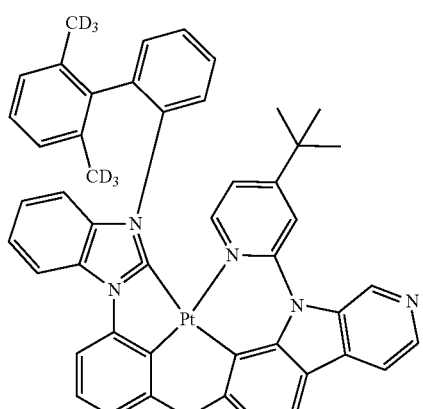
8
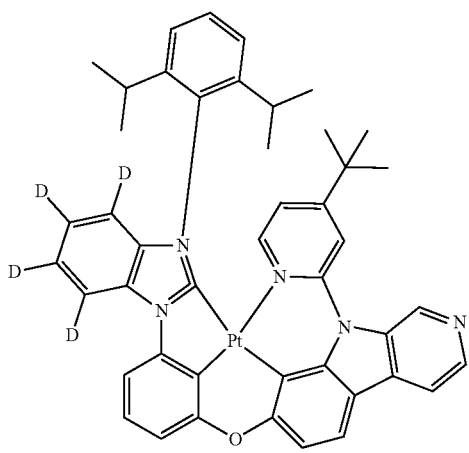
9
10

11
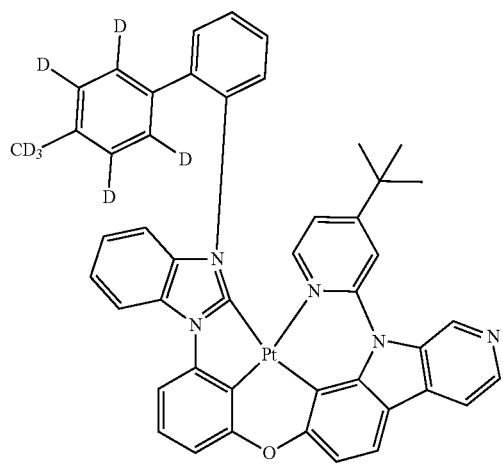
12
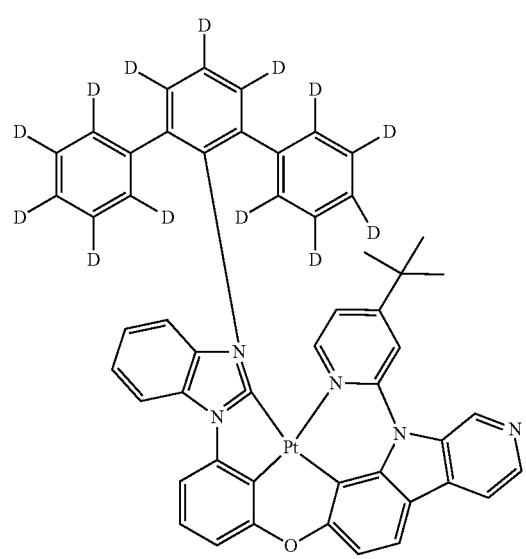
13
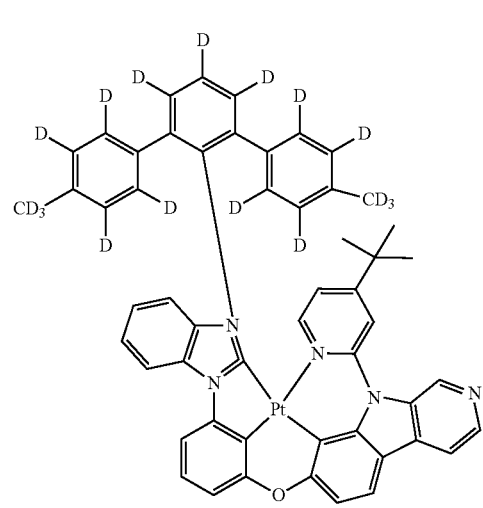
14
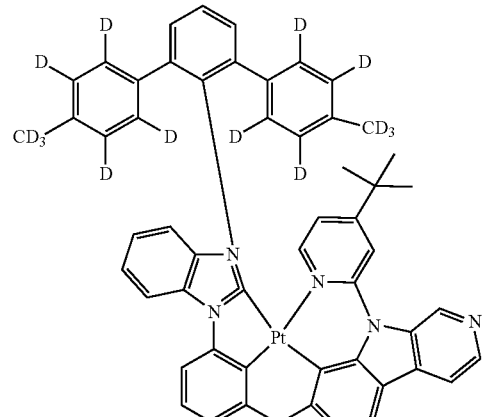
15
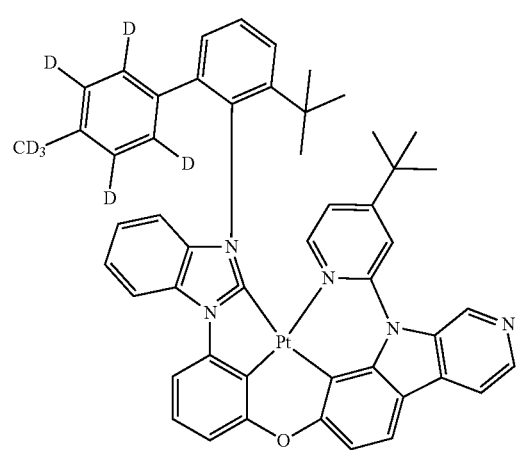
16
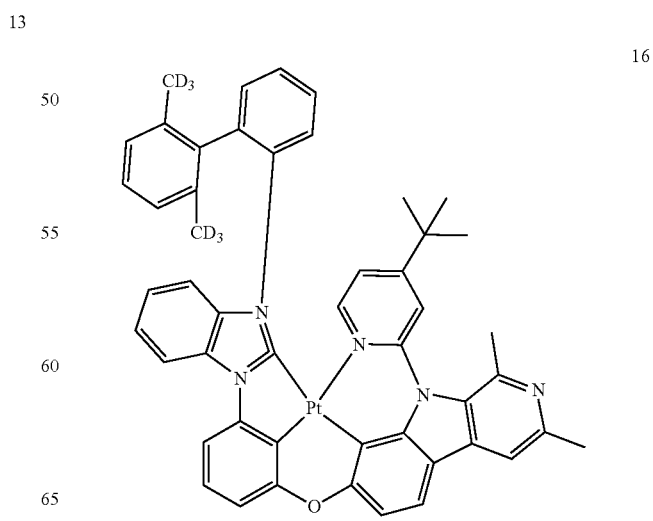

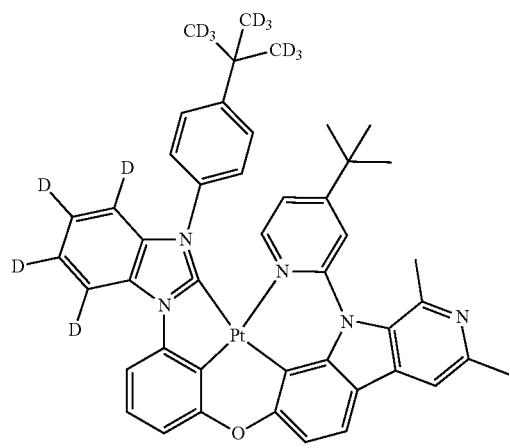
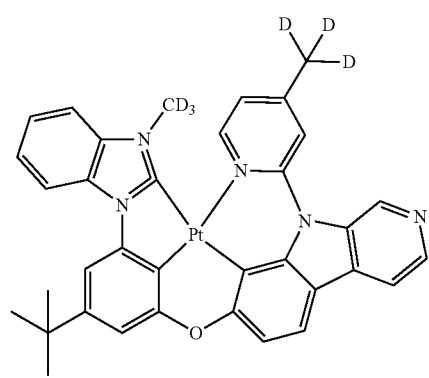
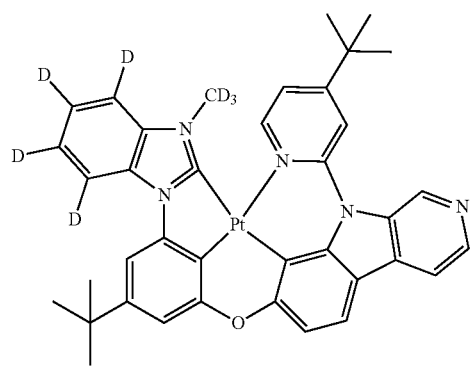
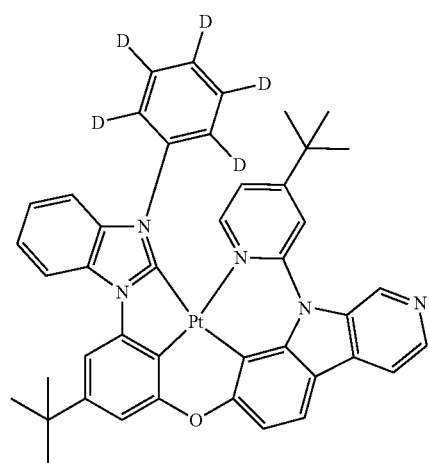
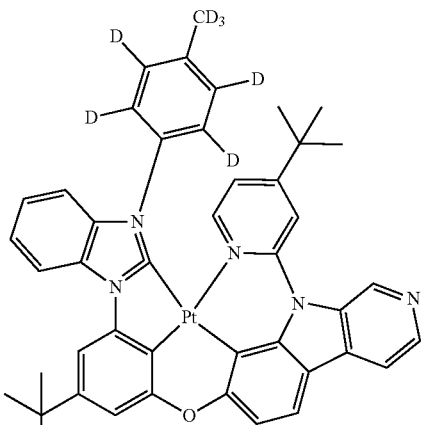
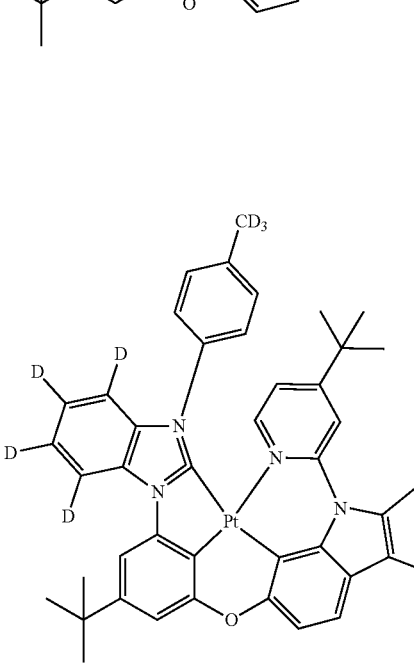

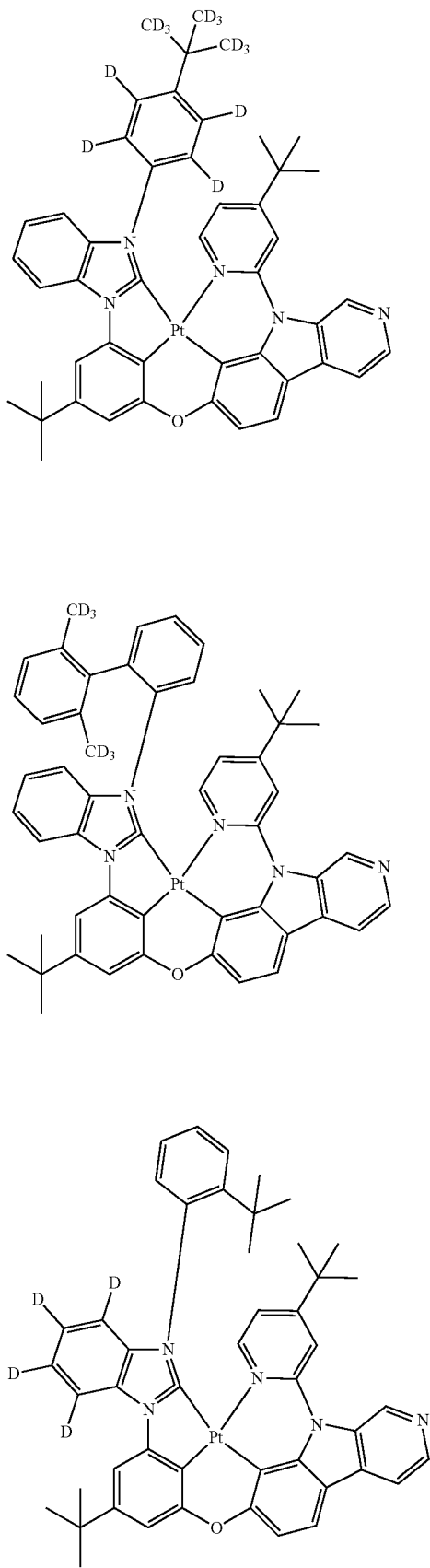
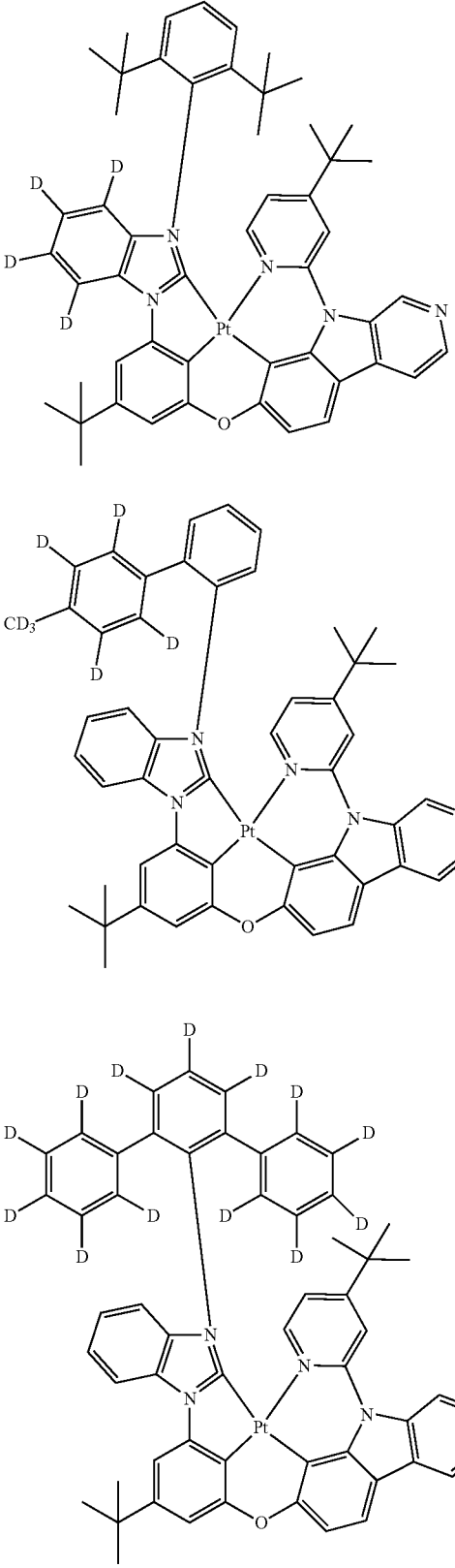

30
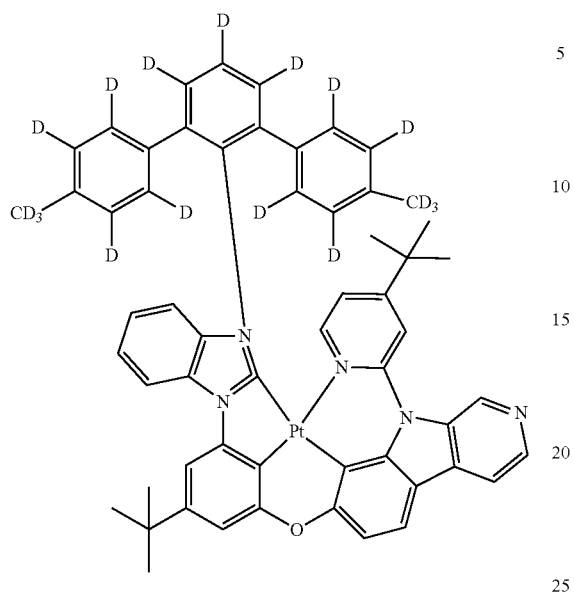
31
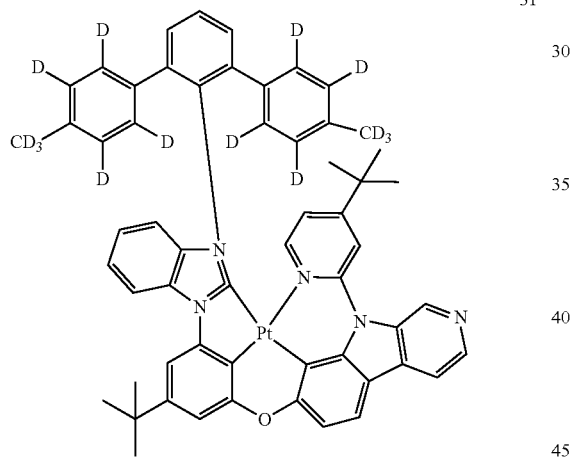
32
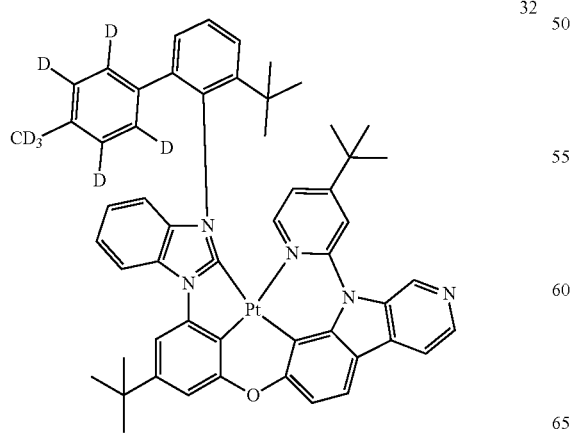
33
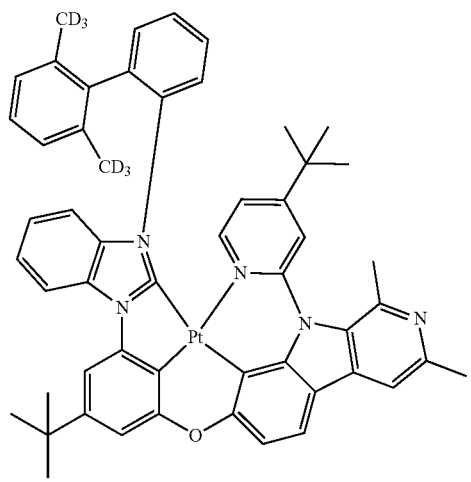
34
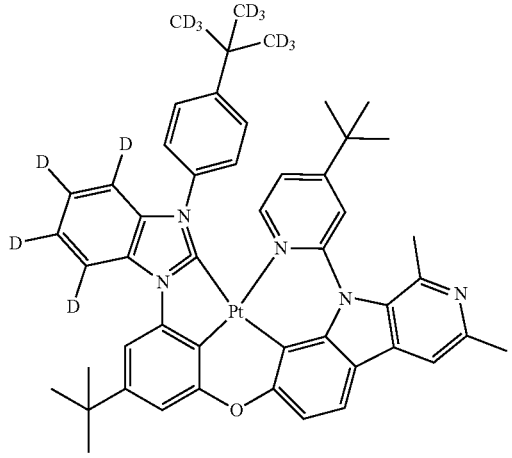
35
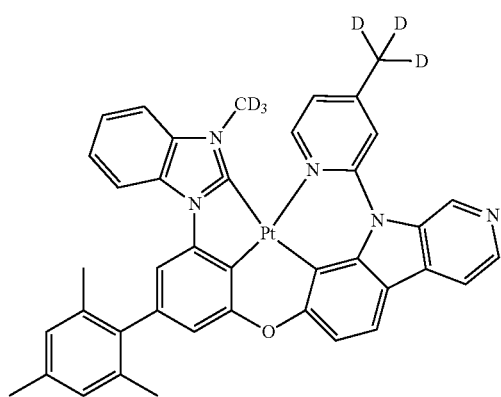

36
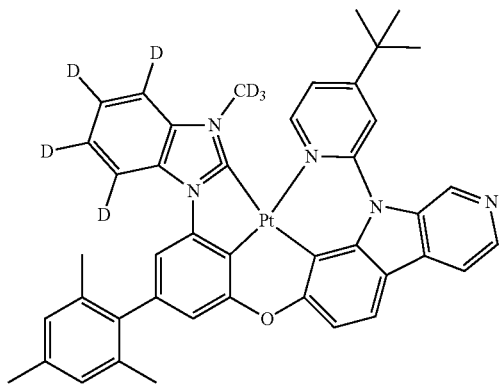
37
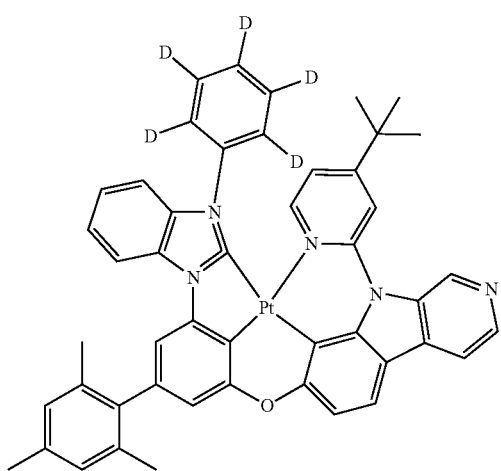
38
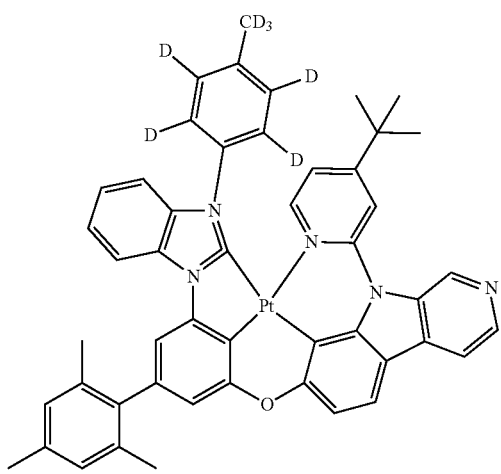
39
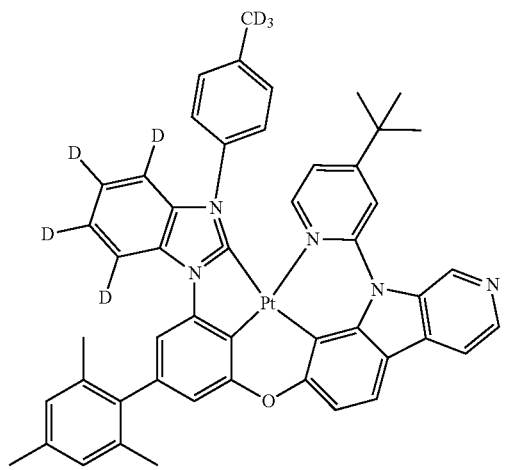
40
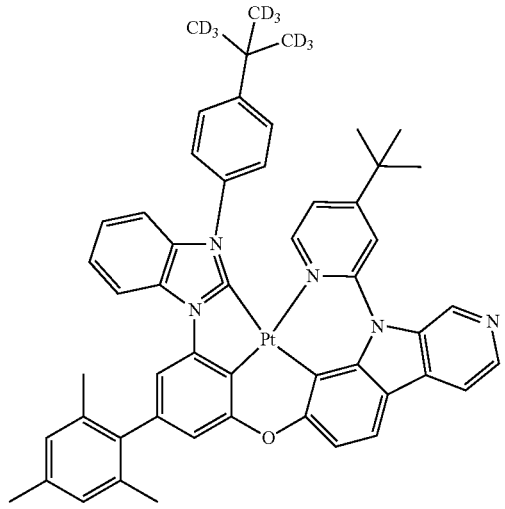
41
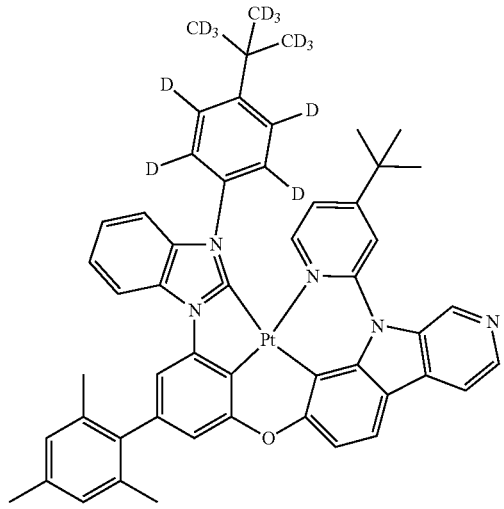

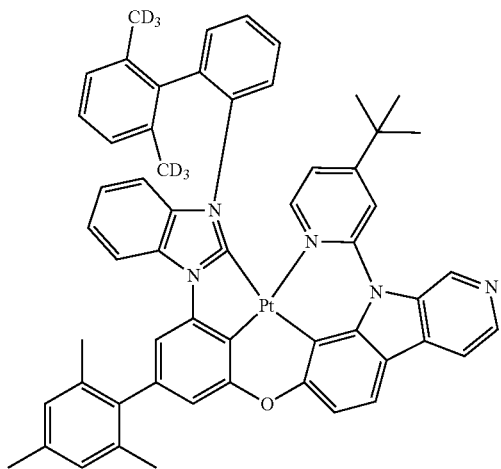
42
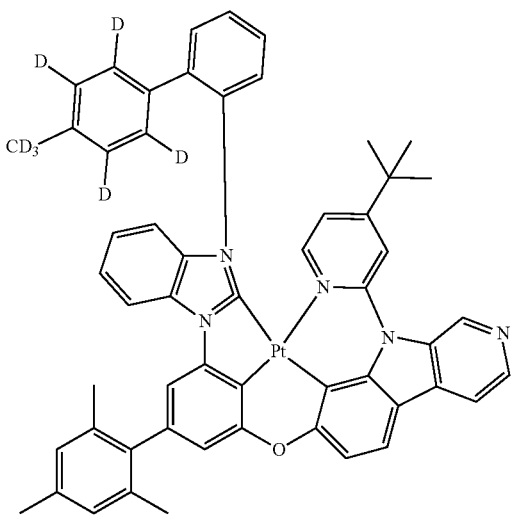
43
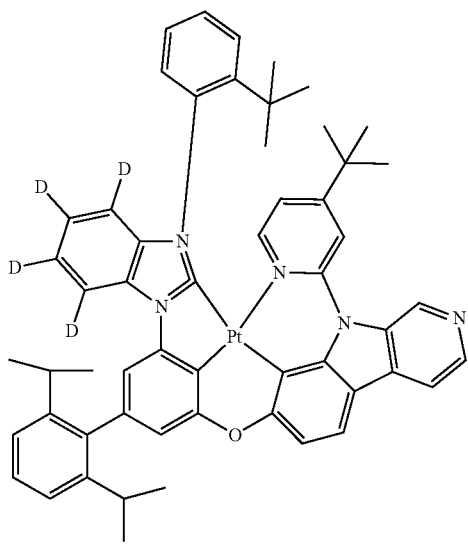
44
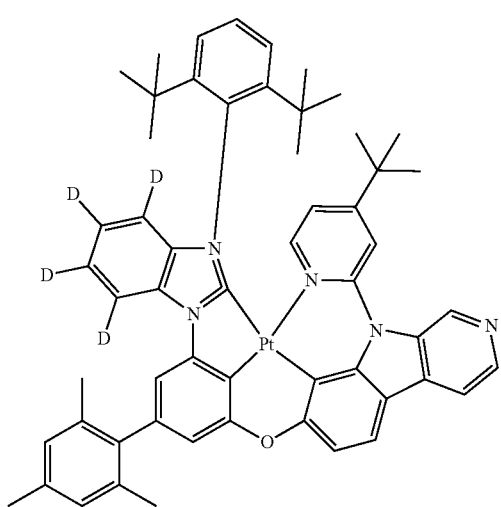
45
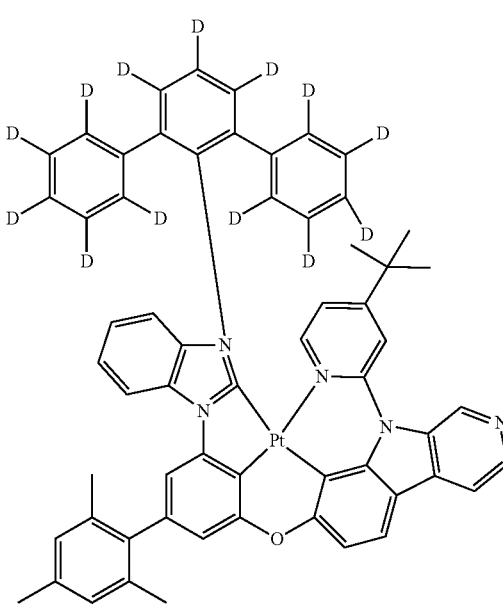
46

47
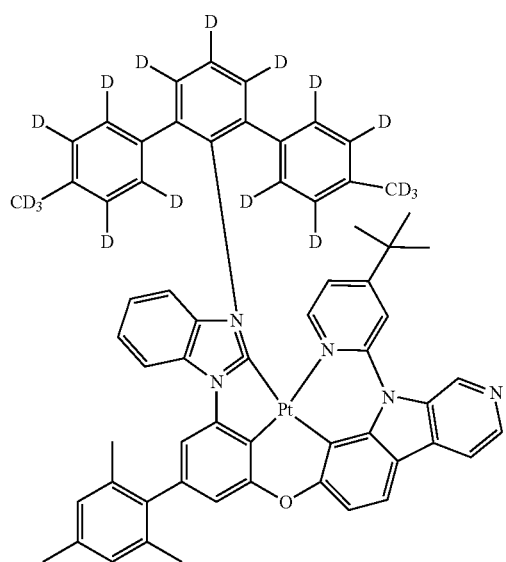
48
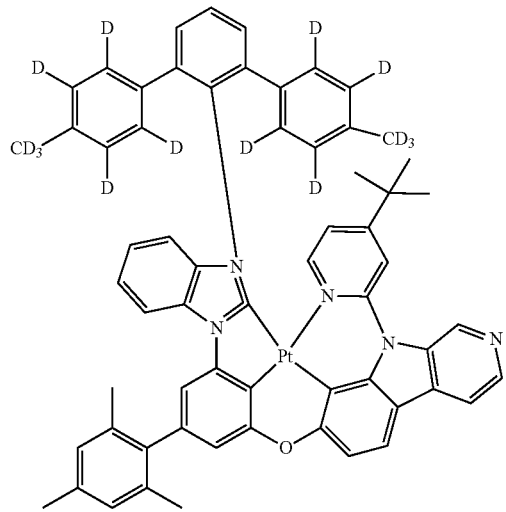
49
50
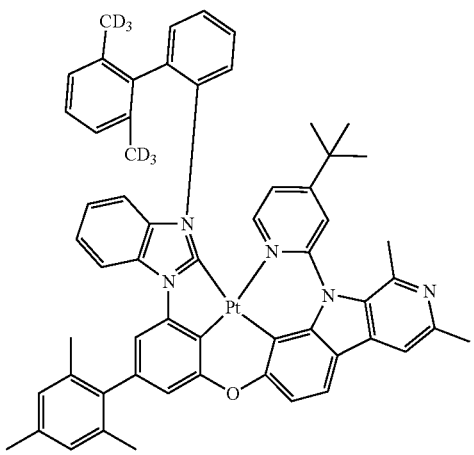
51
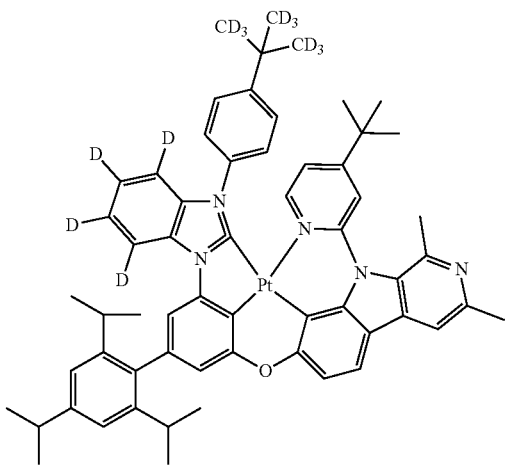
52
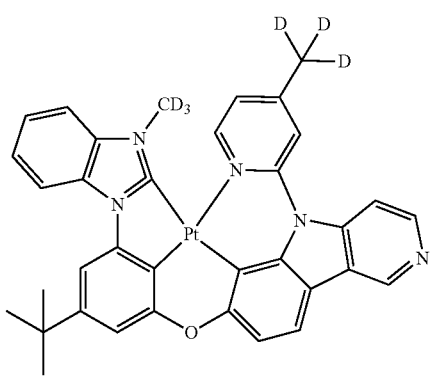

201
-continued
53
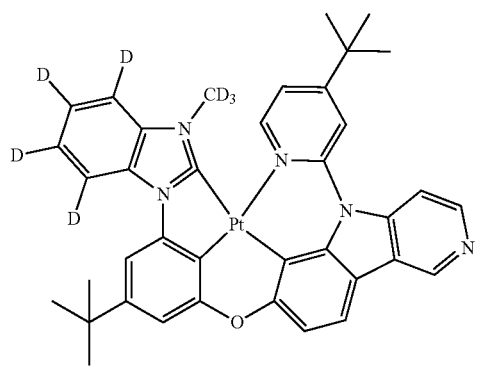
54
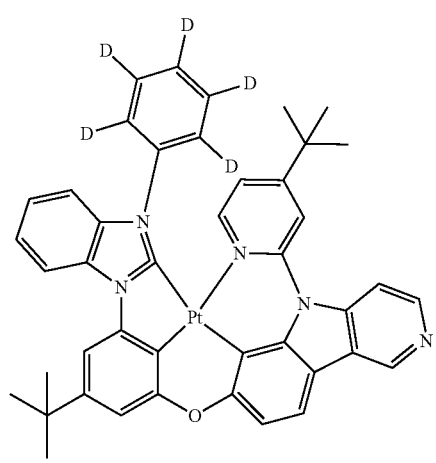
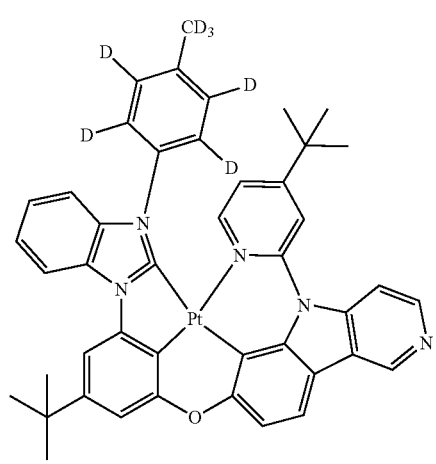
202
-continued
56
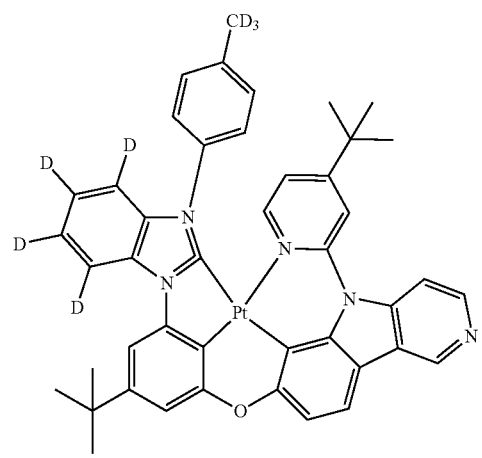
57
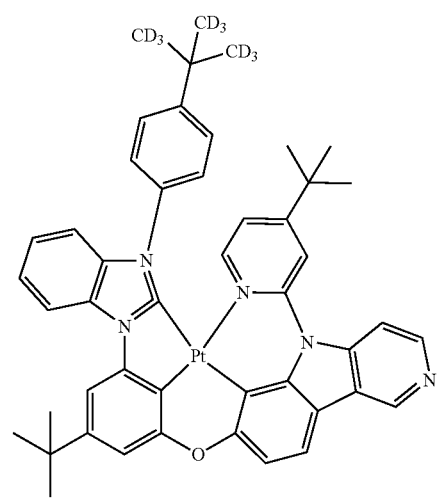
58
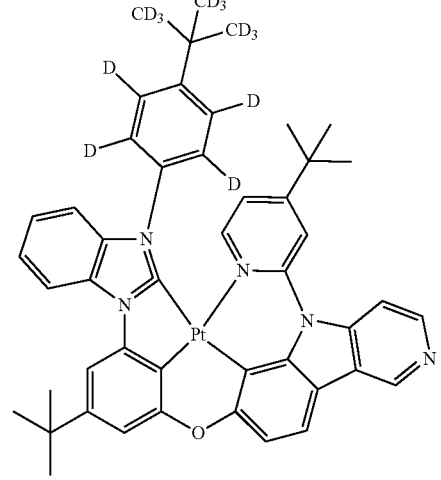

203
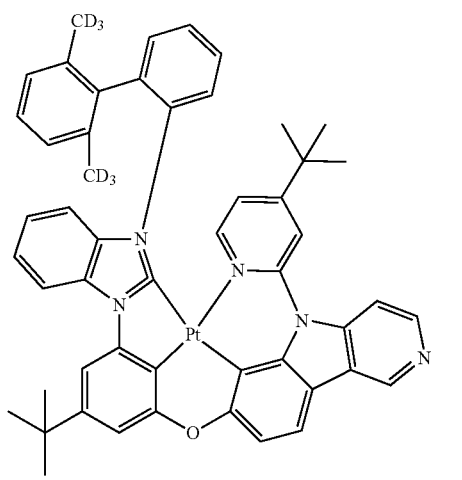
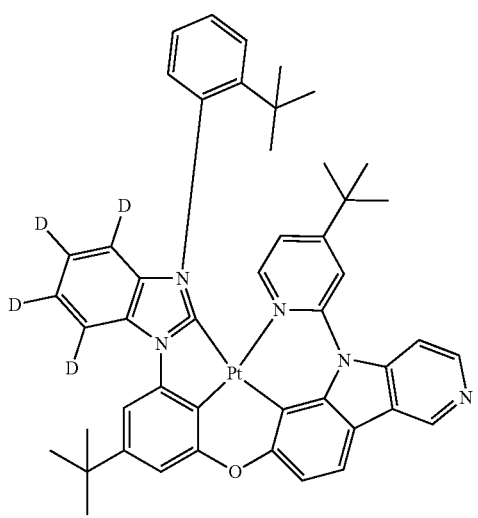
204
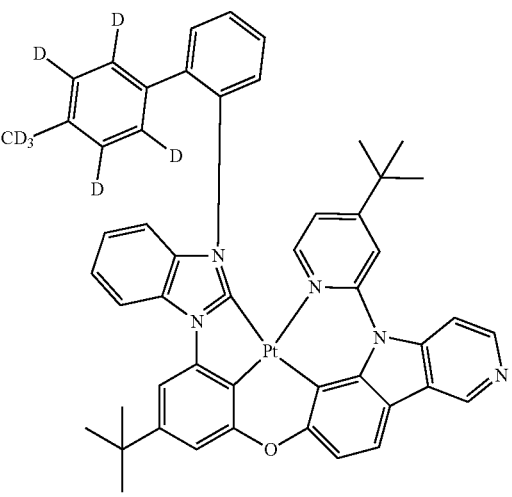
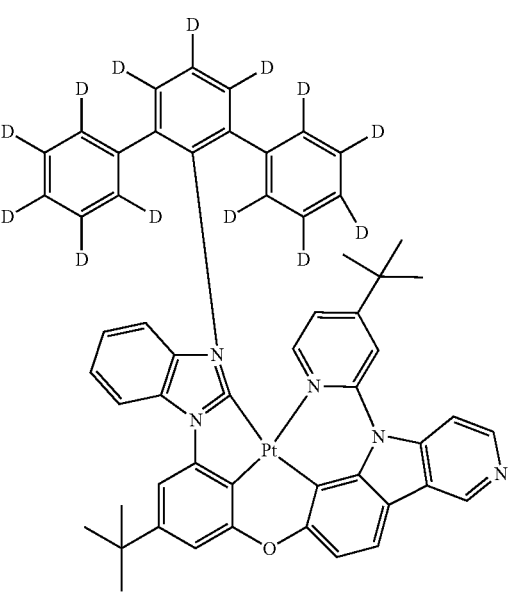

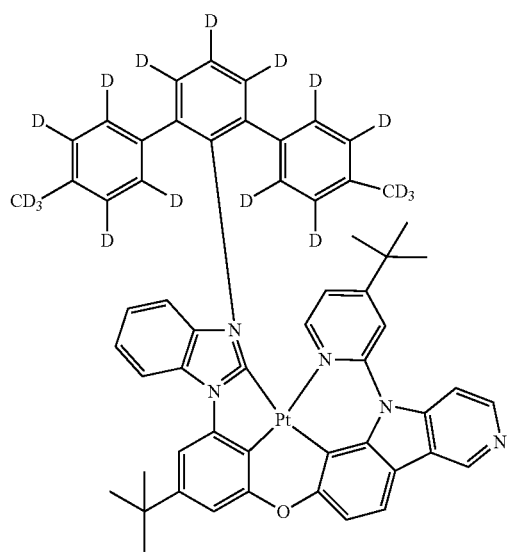
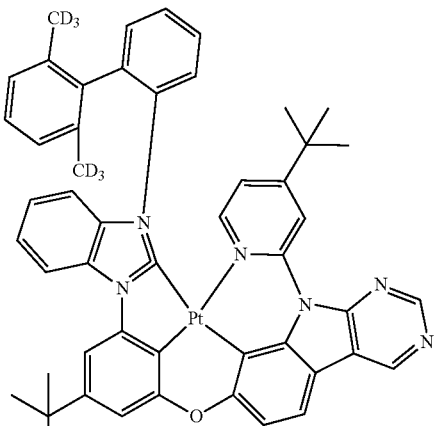
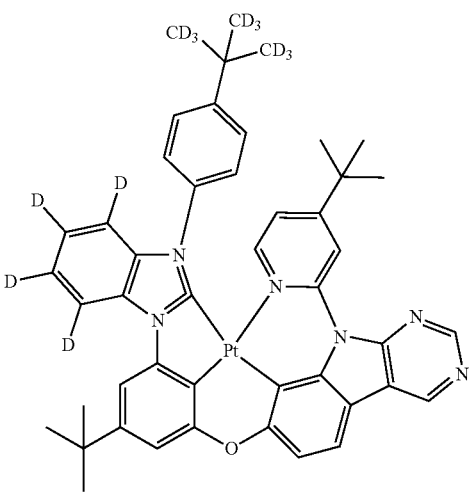
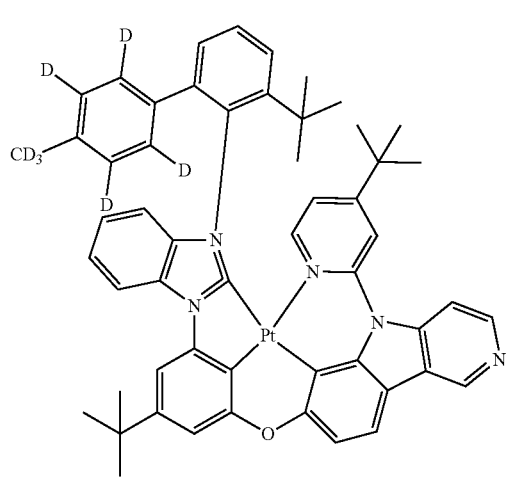
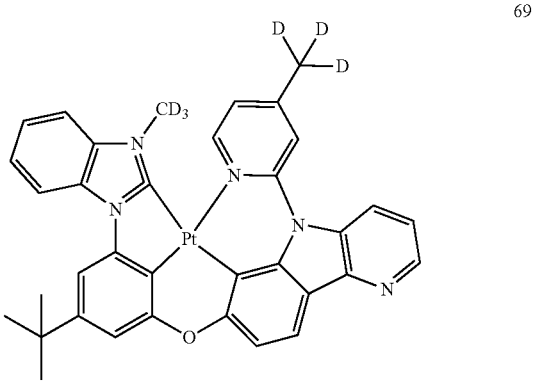

207
-continued
70
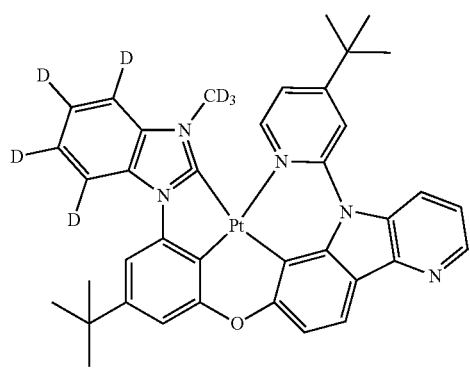
71
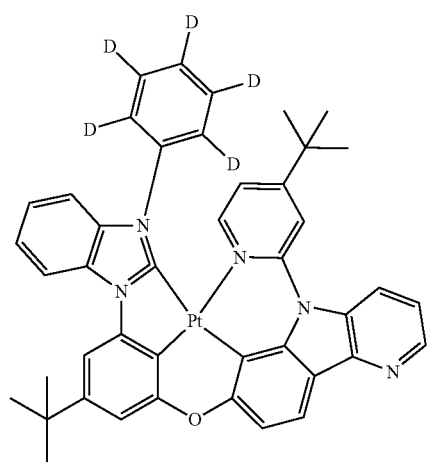
72
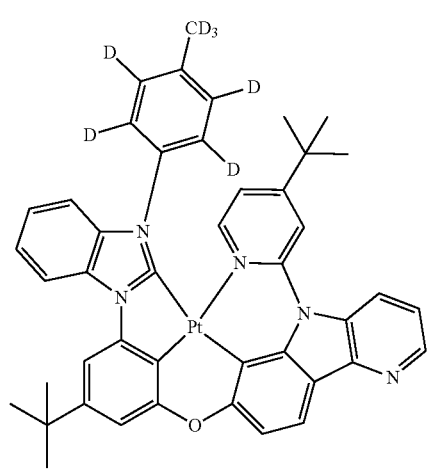
208
-continued
73
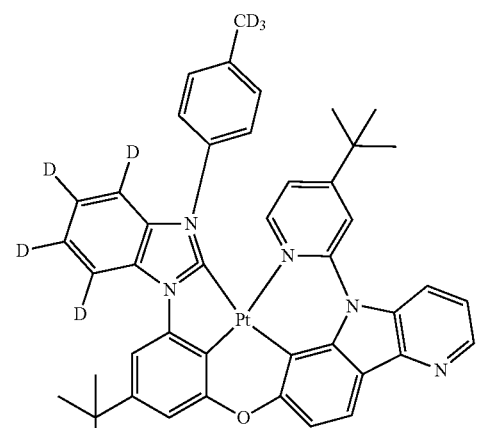
74
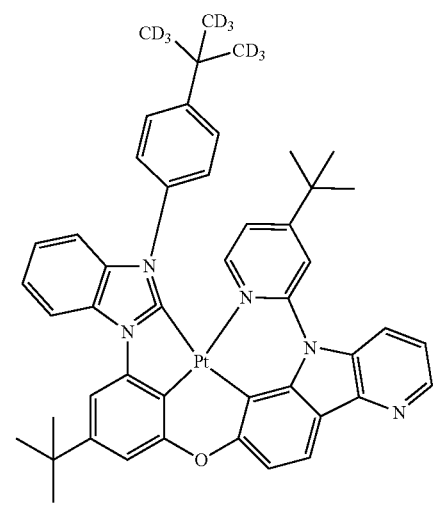
75
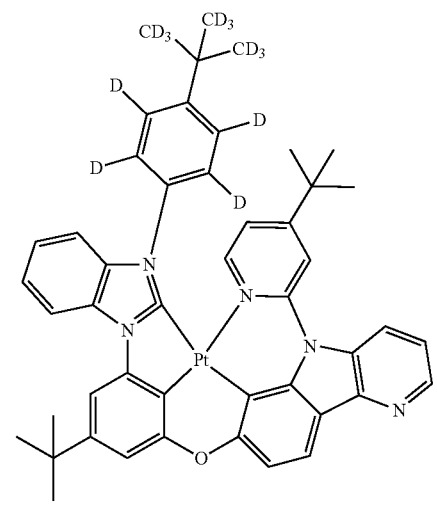

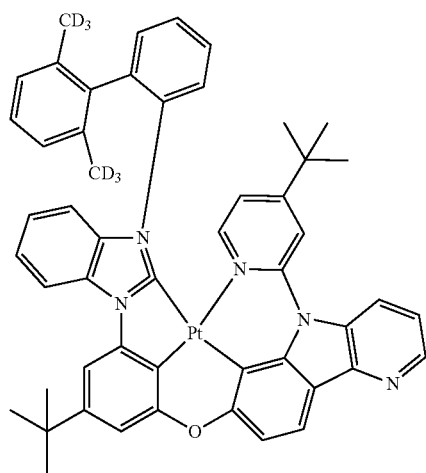
76
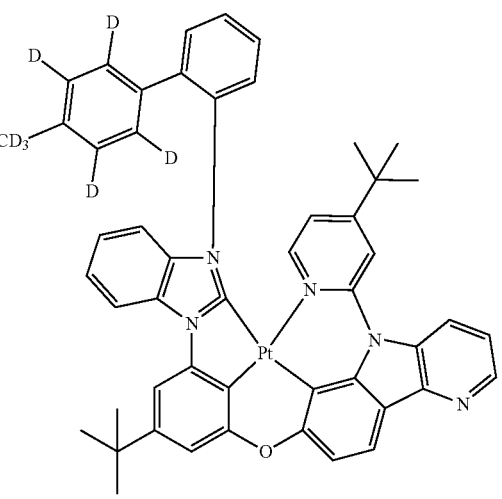
77
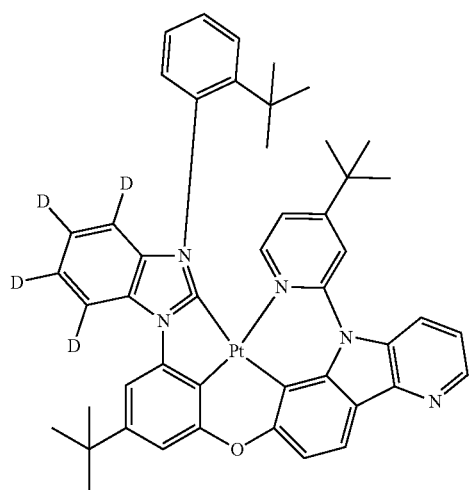
78
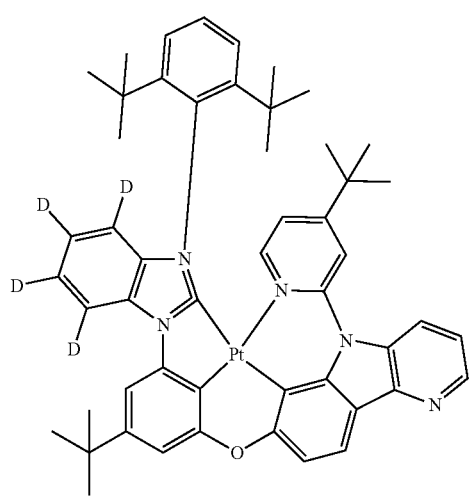
79
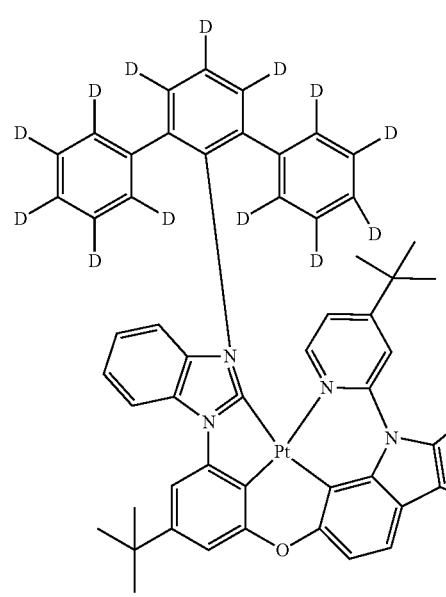
80

211
-continued
81
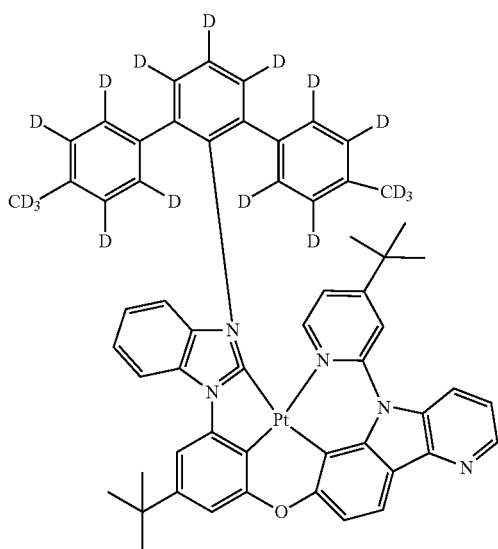
82
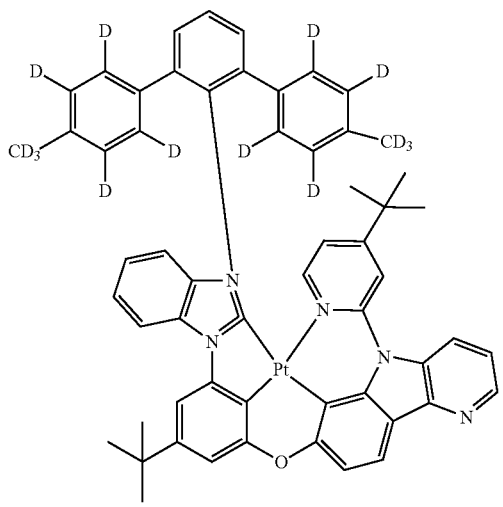
83
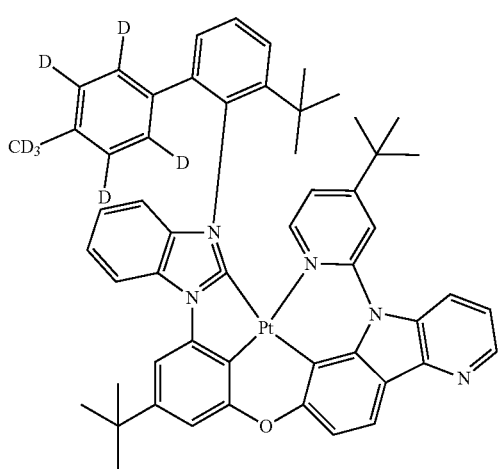
212
-continued
84
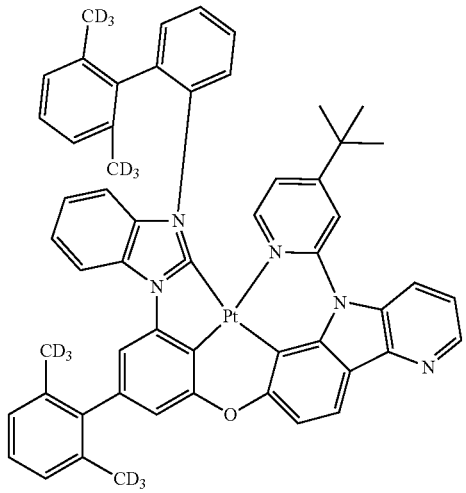
85
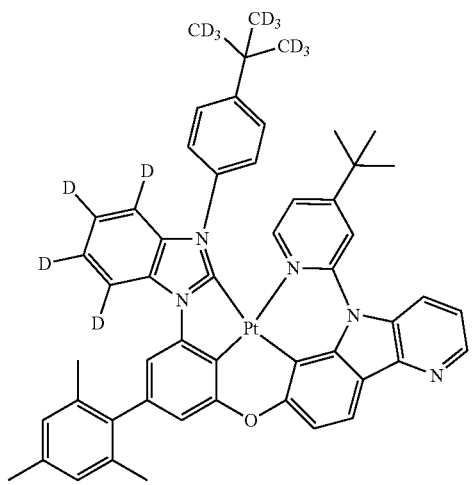
86
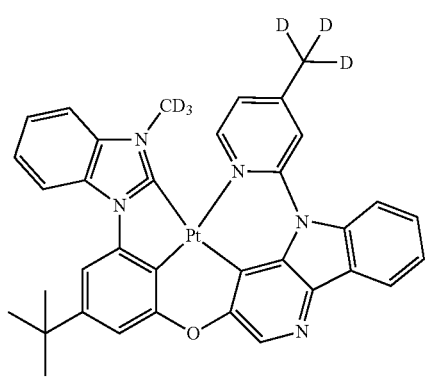

-continued
87
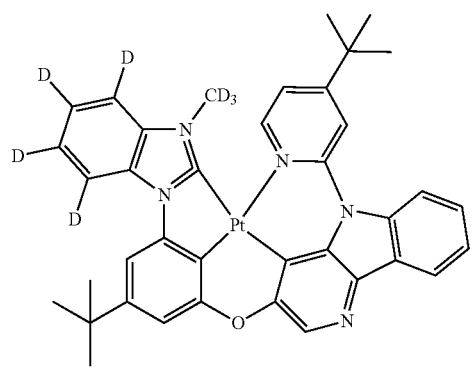
88
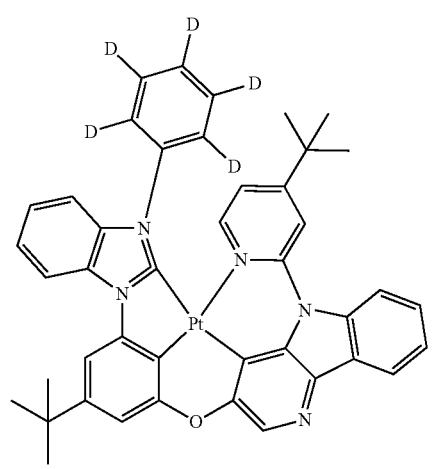
89
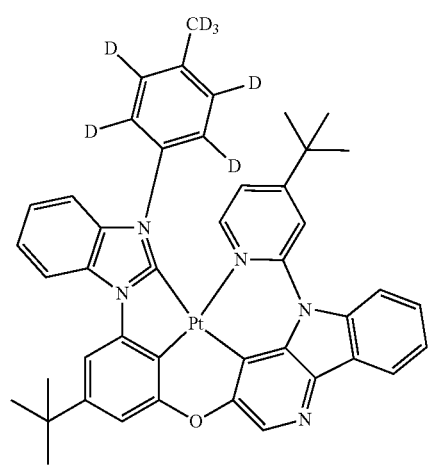
-continued
90
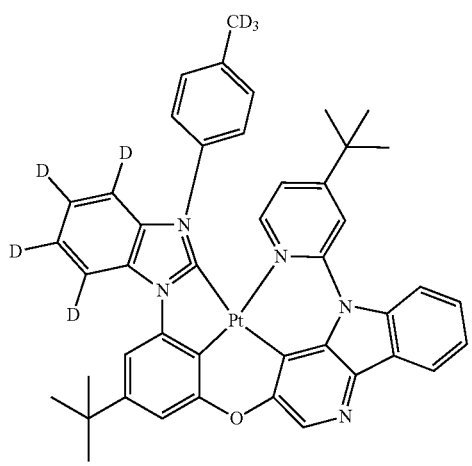
91
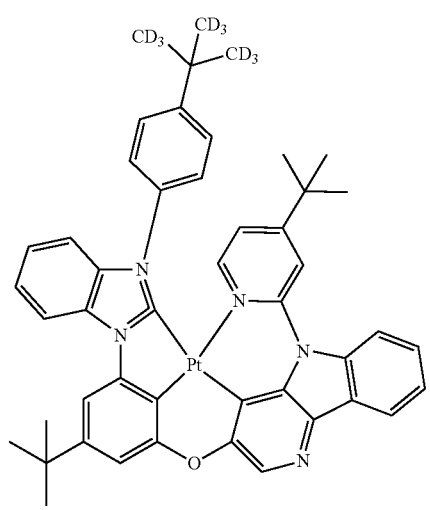
92
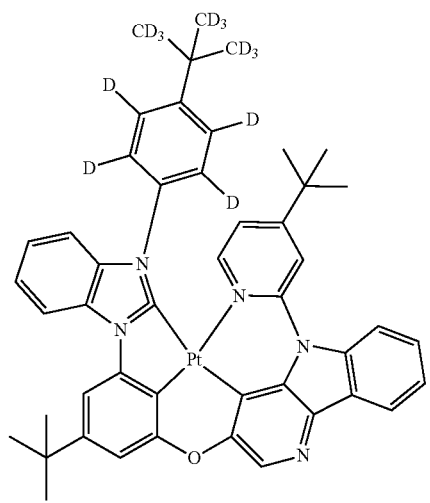

215
-continued
93
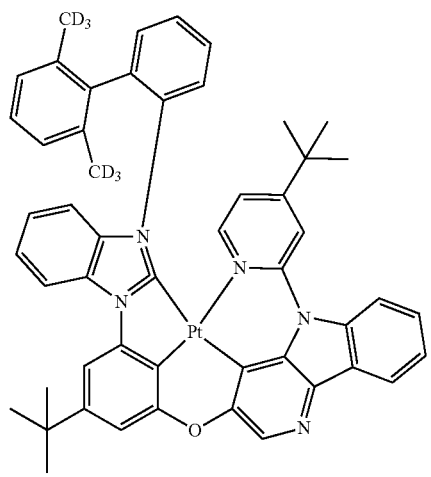
94
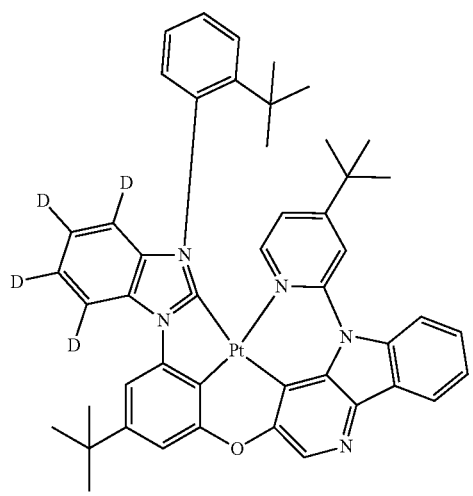
95
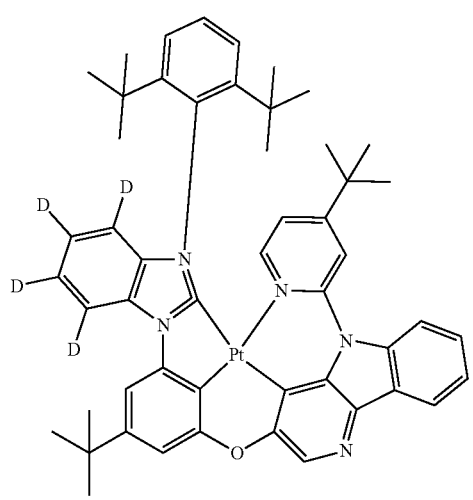
216
-continued
96
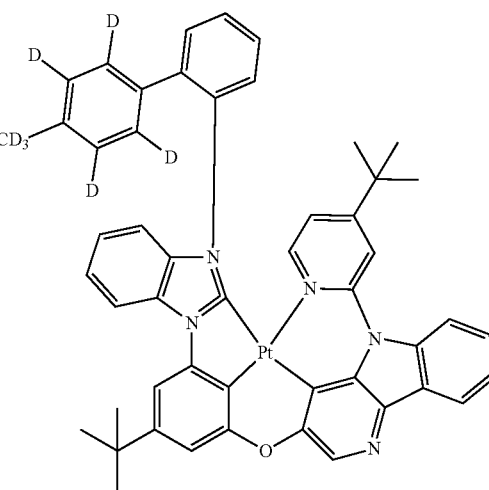
97
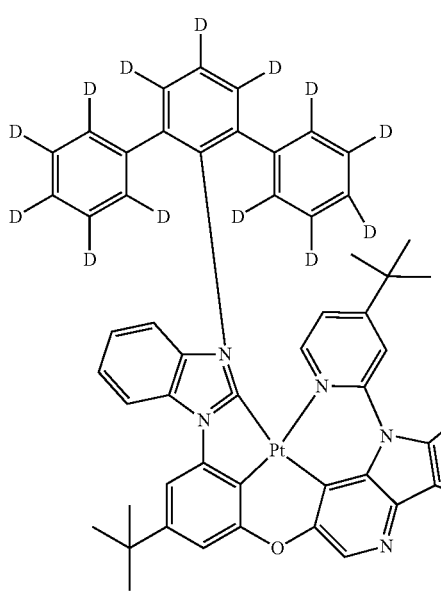

98
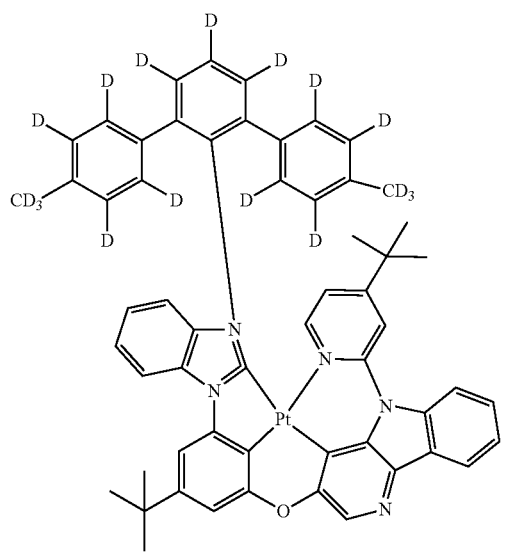
99
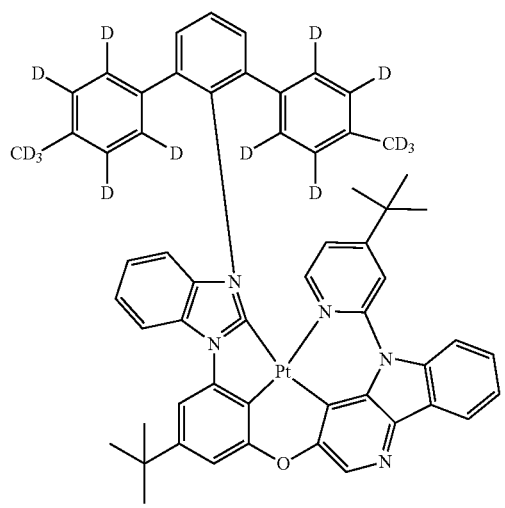
100
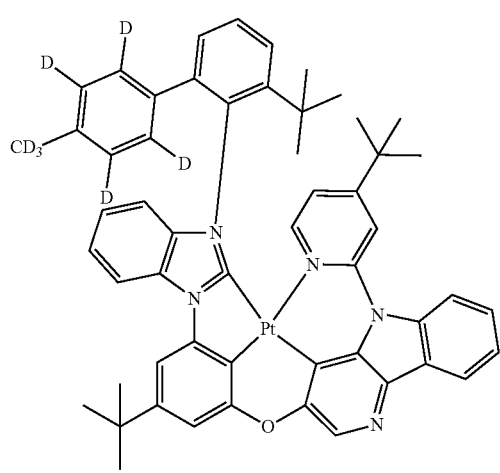
101
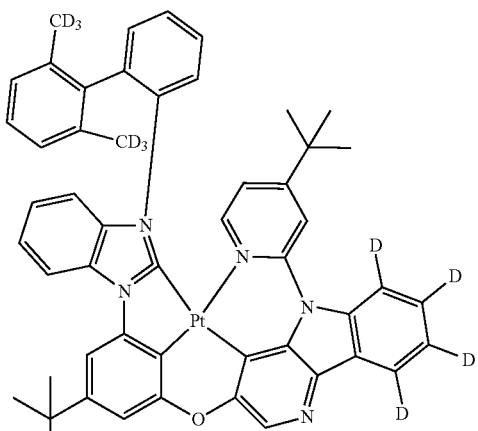
102
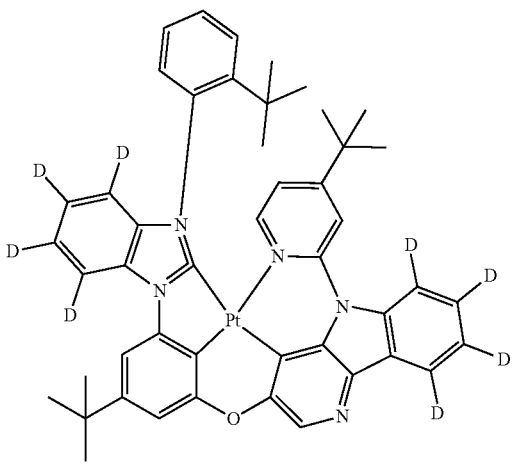
103
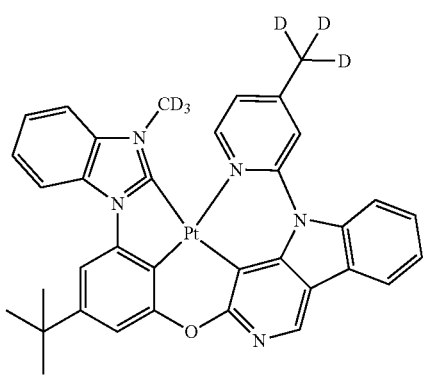

-continued
104
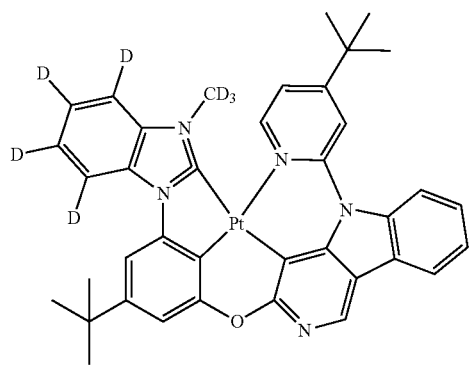
105
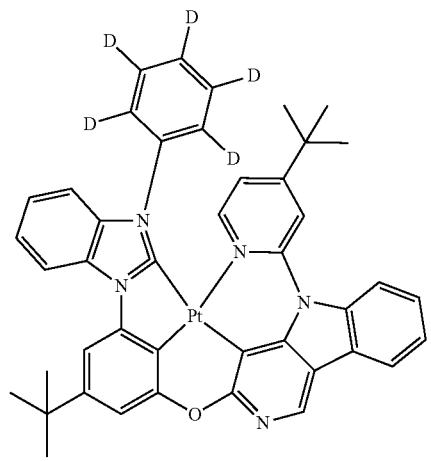
106
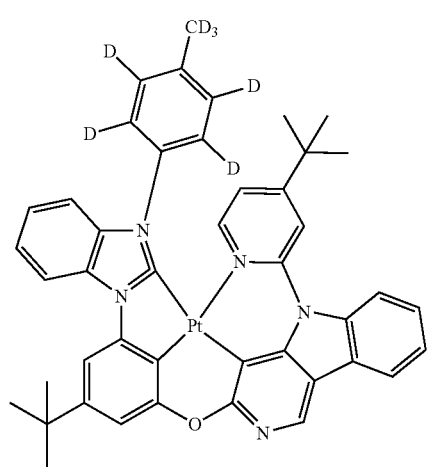
-continued
107
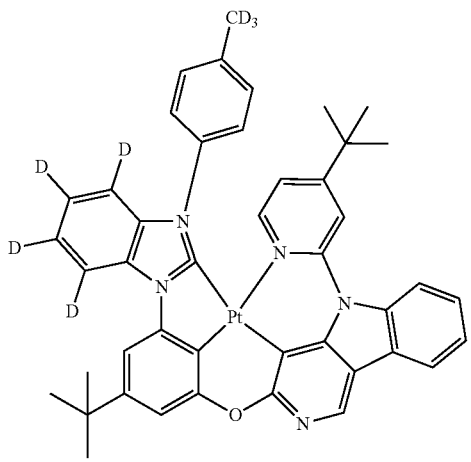
108
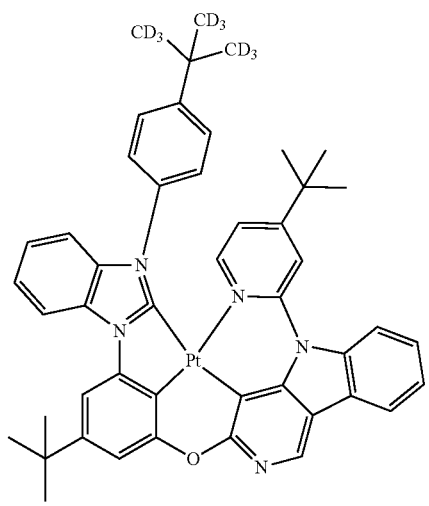
109
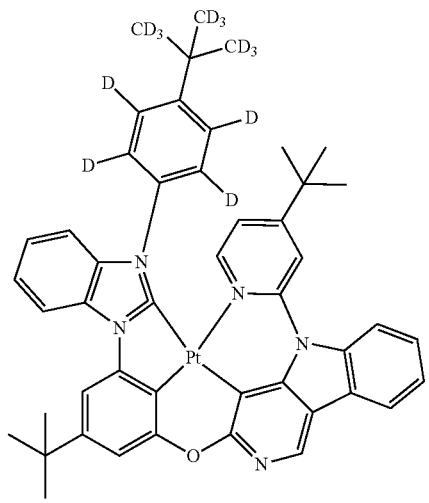

-continued
110
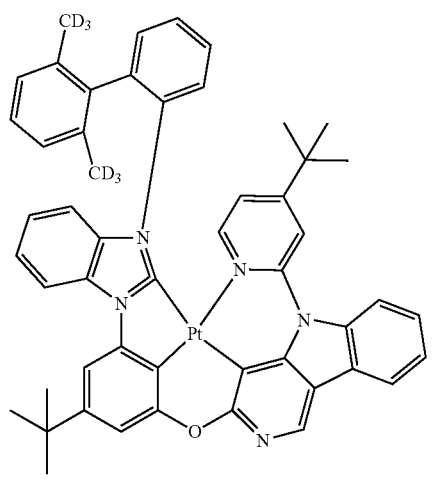
111
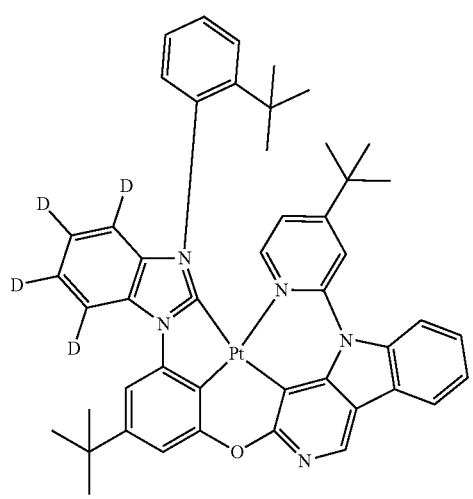
112
-continued
113
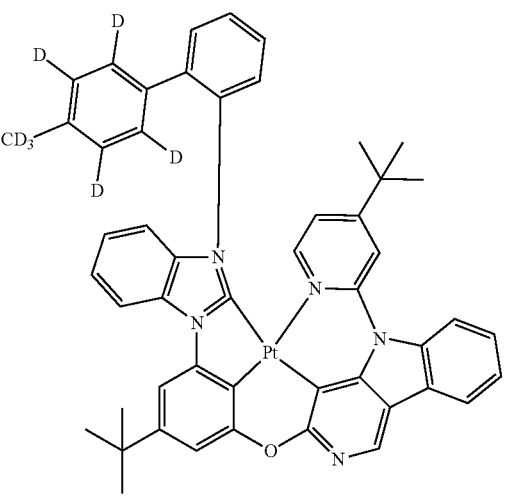
114
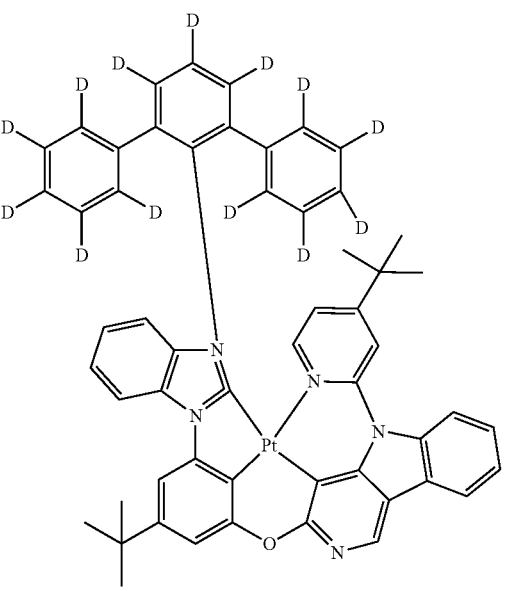

115
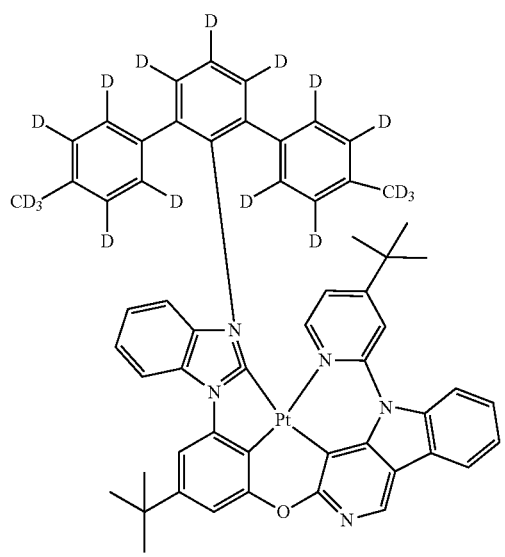
116
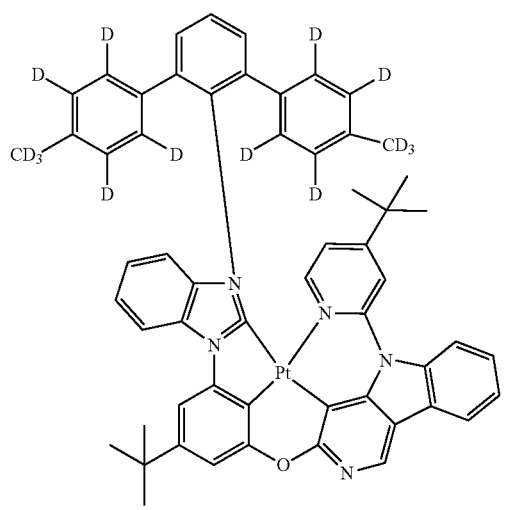
117
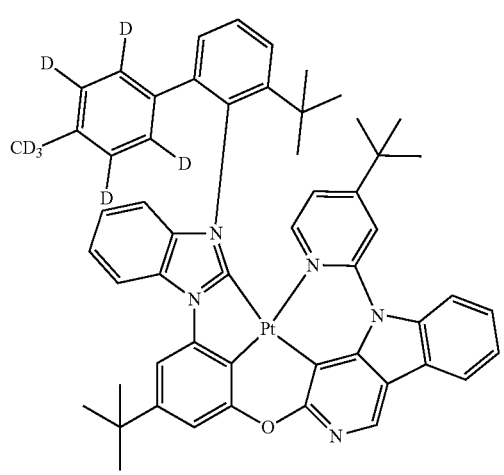
118
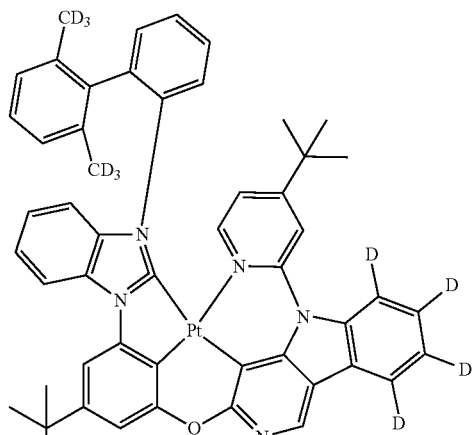
119
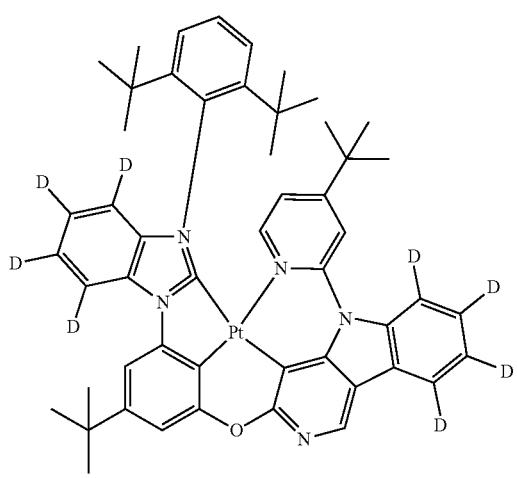
120
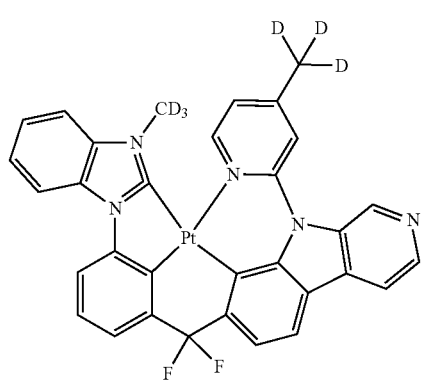

-continued
121
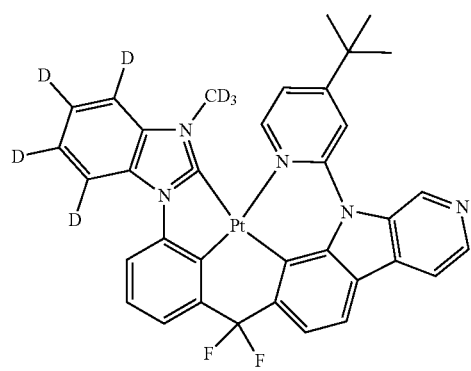
122
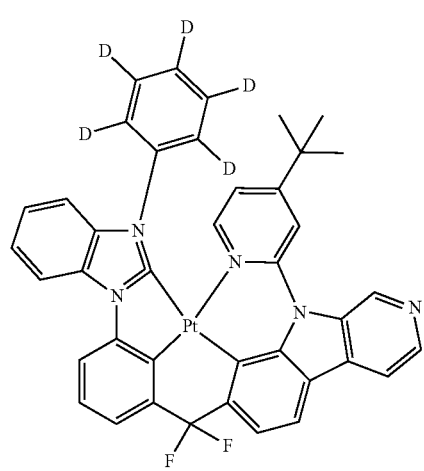
123
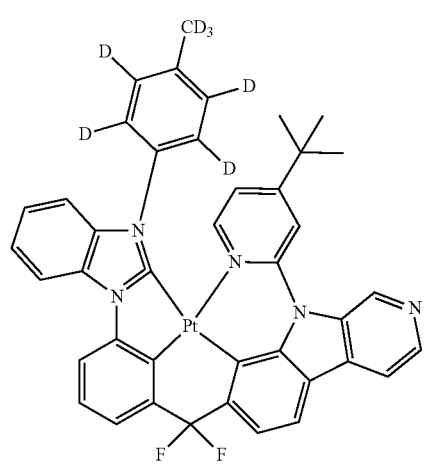
-continued
124
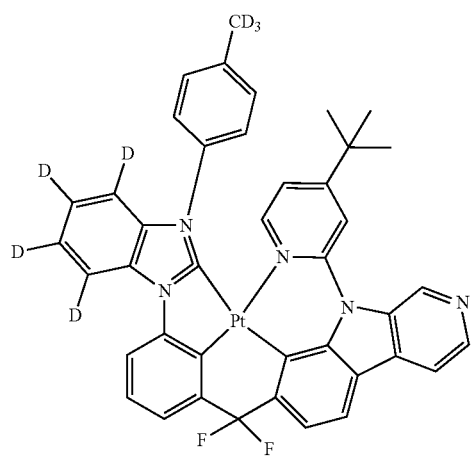
125
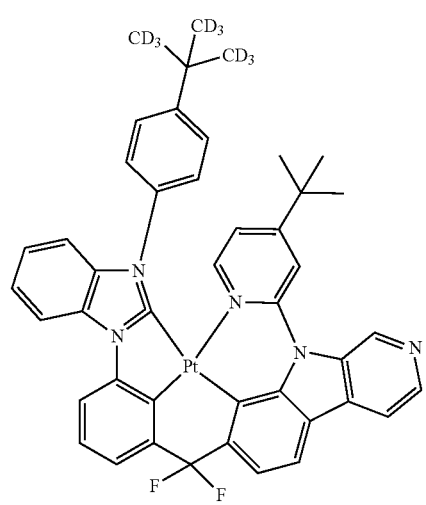
126
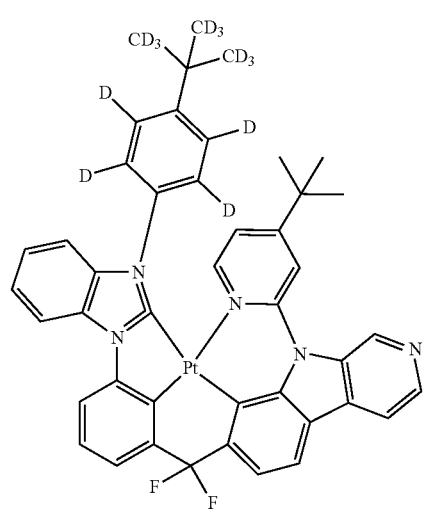

227
-continued
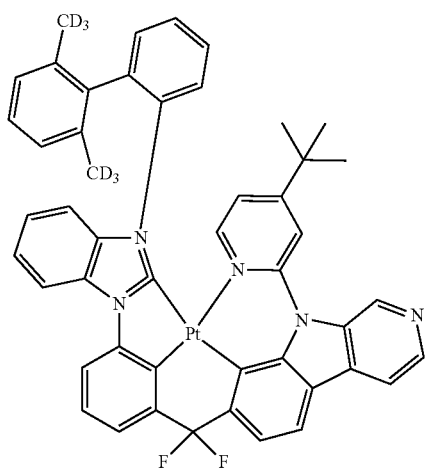
127
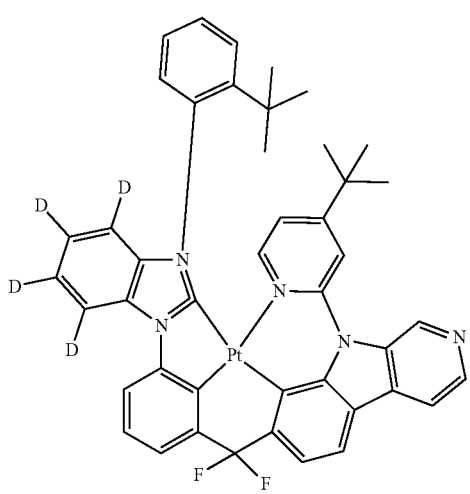
128
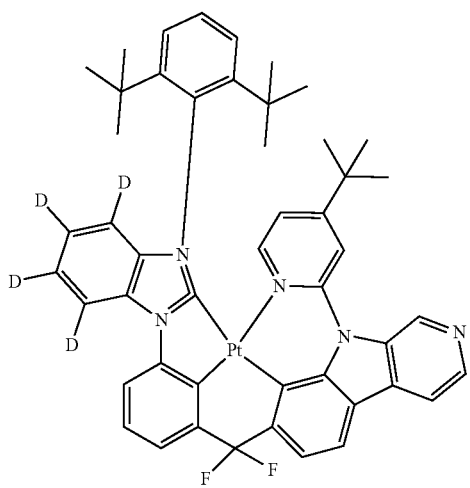
129
228
-continued
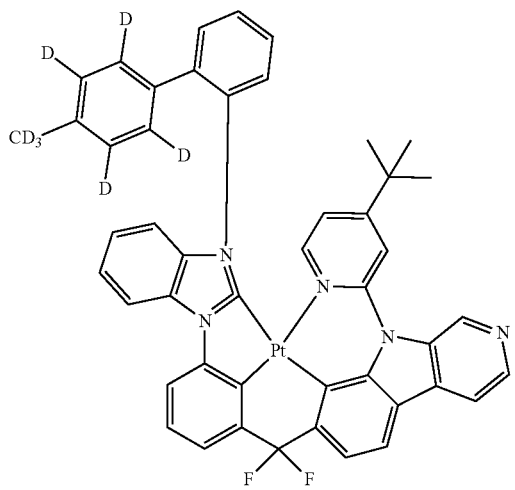
130
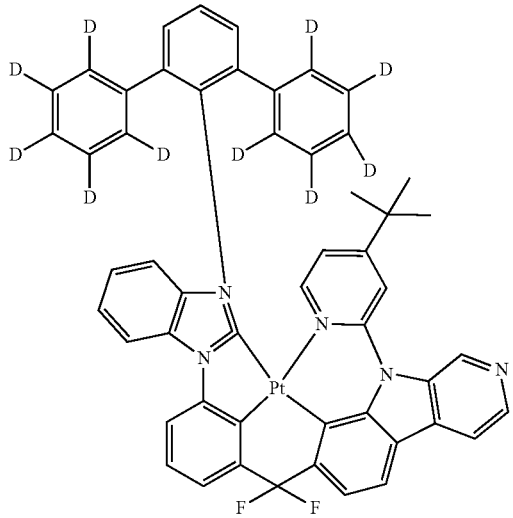
131
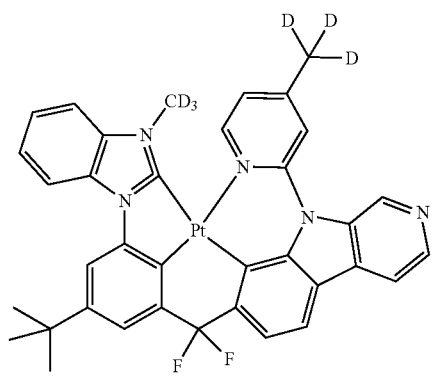
132

-continued
133
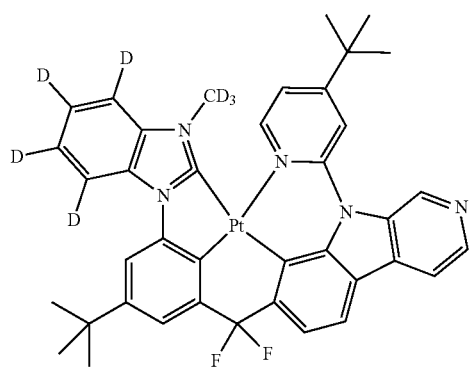
134
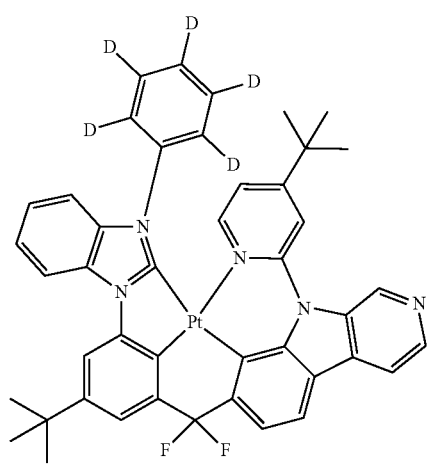
135
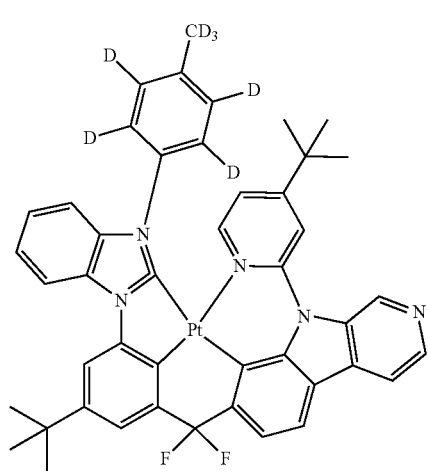
-continued
136
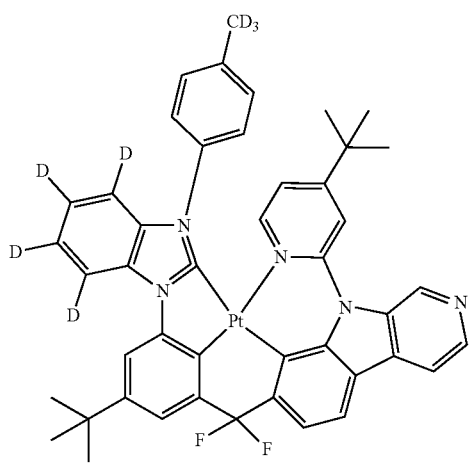
137
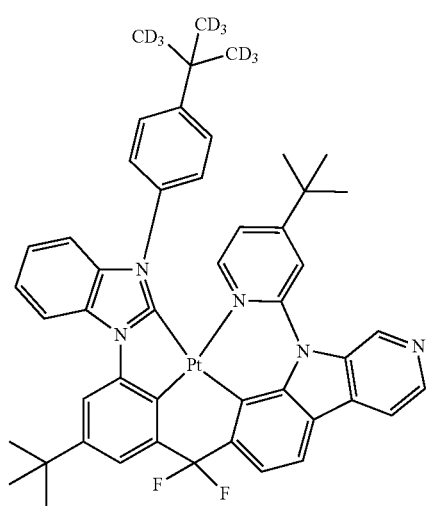
138
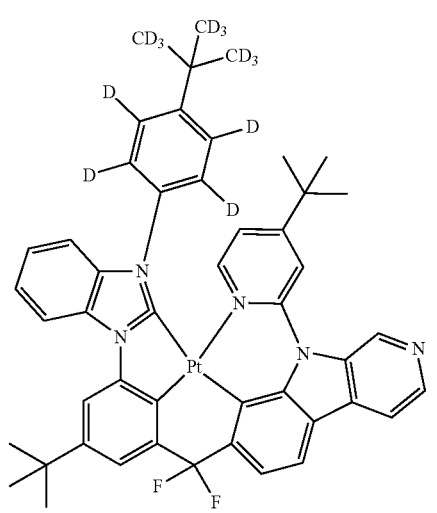

231
-continued
139
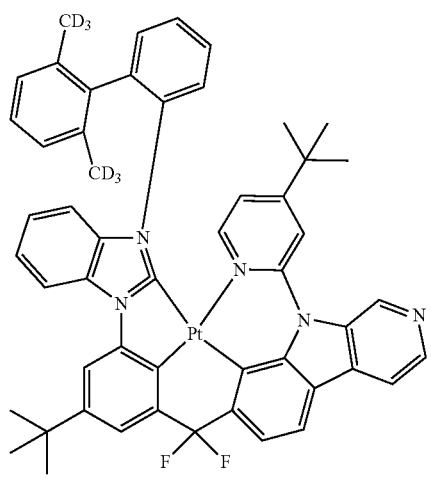
140
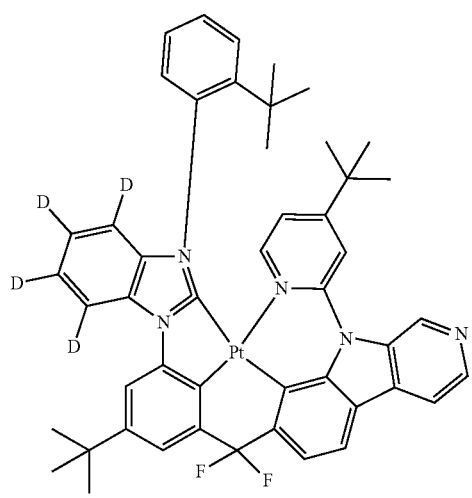
141
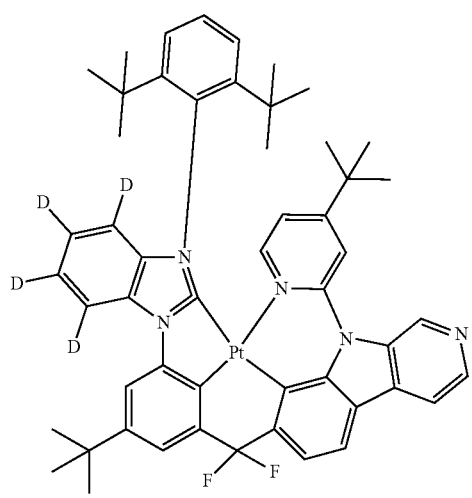
232
-continued
142
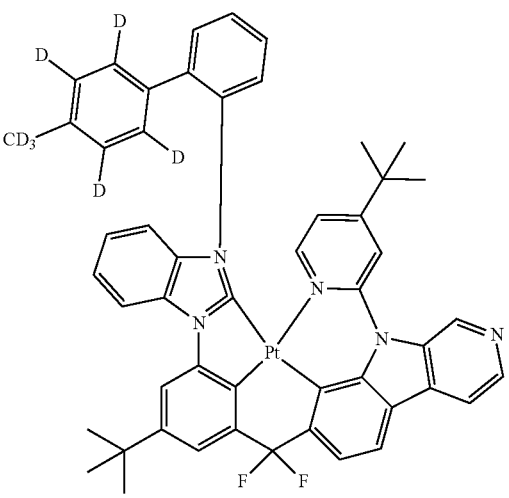
143
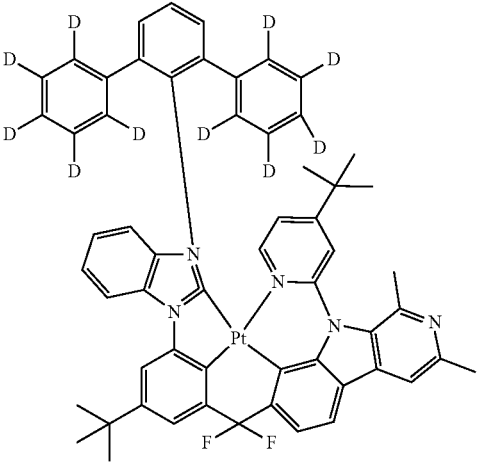
144
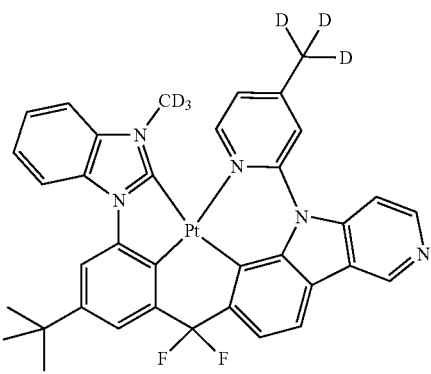

233
-continued
145
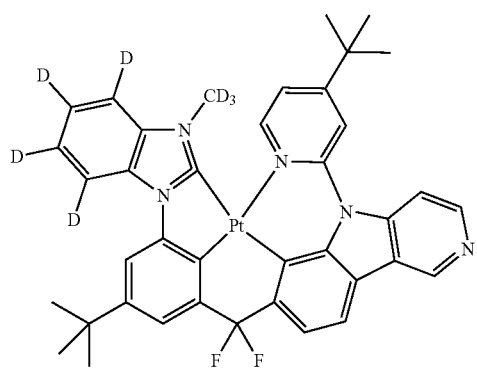
146
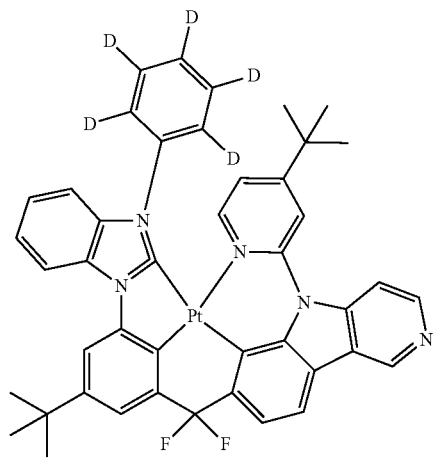
147
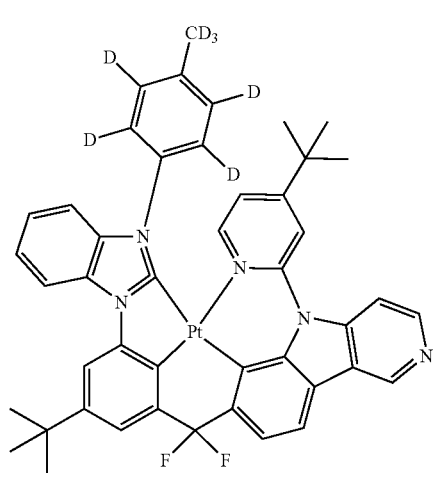
234
-continued
148
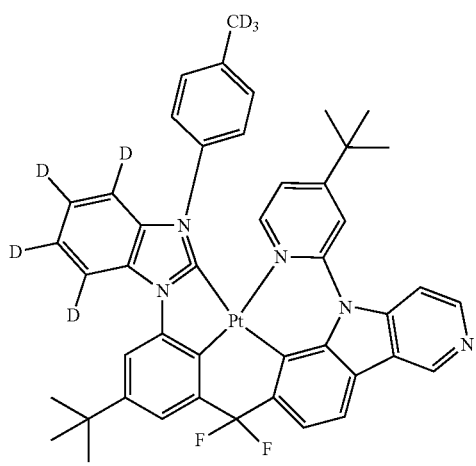
149
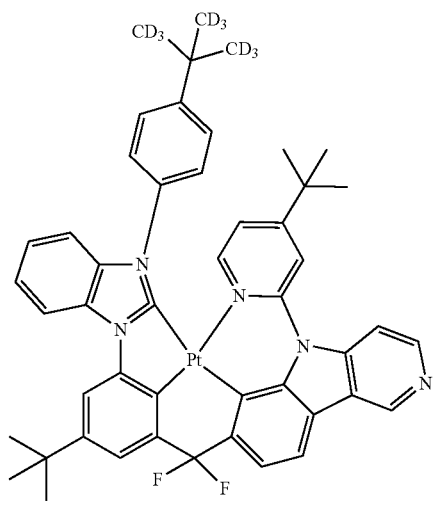
150
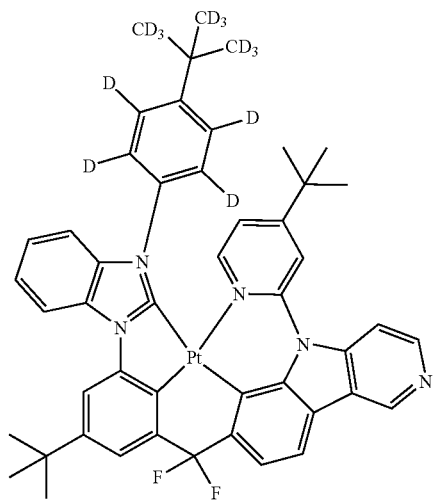

151
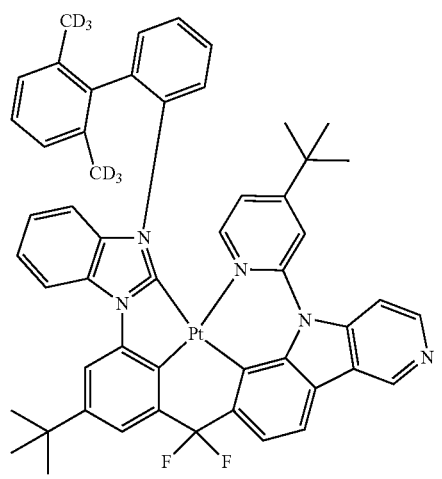
152
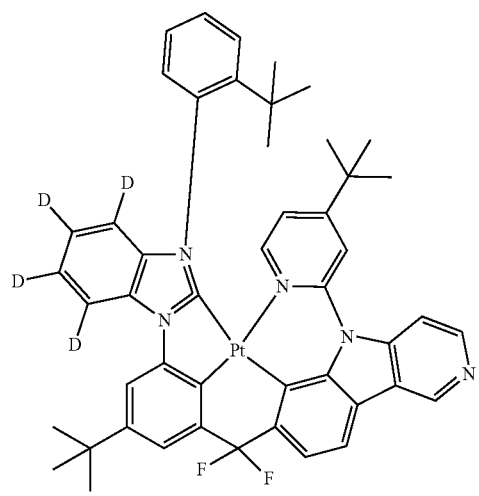
153
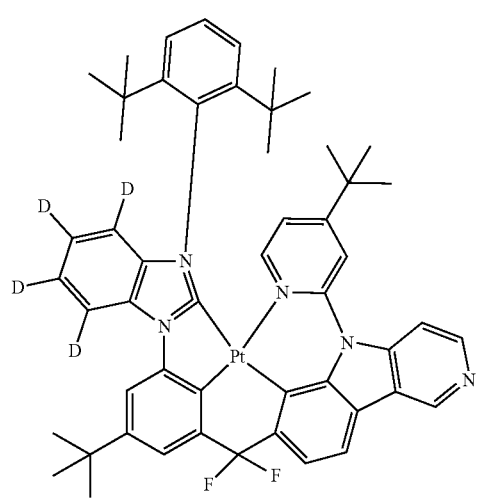
154
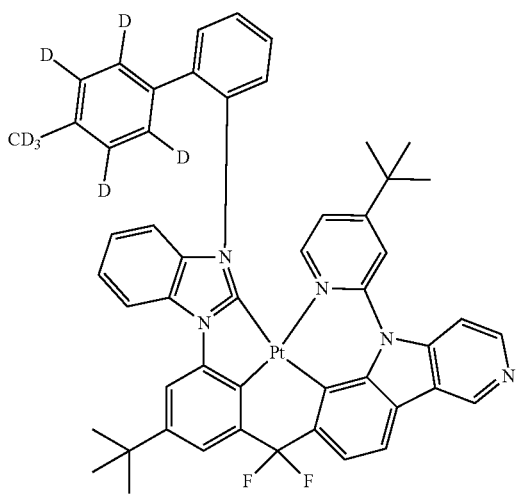
155
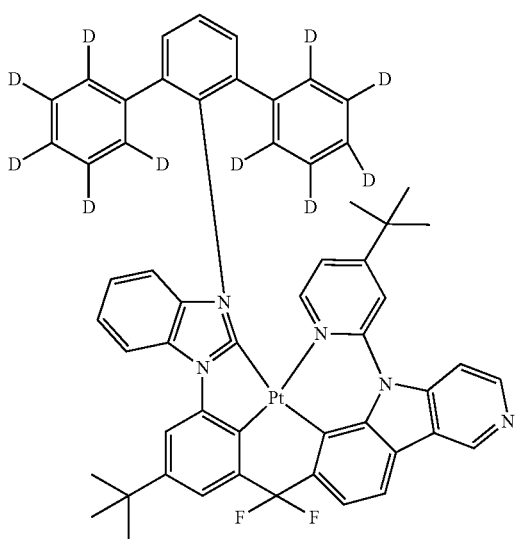
156
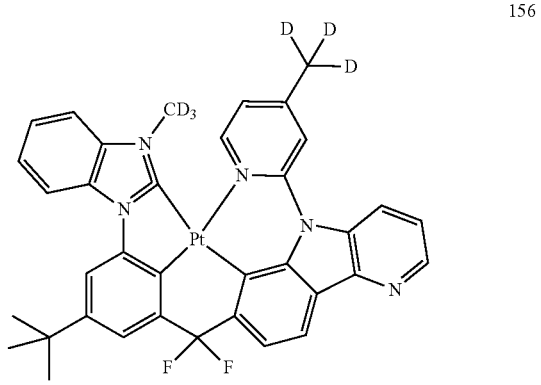

157
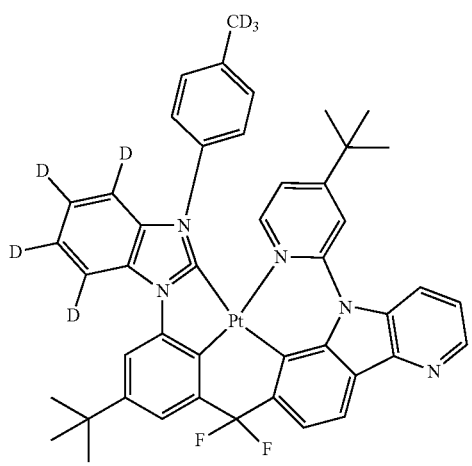
158
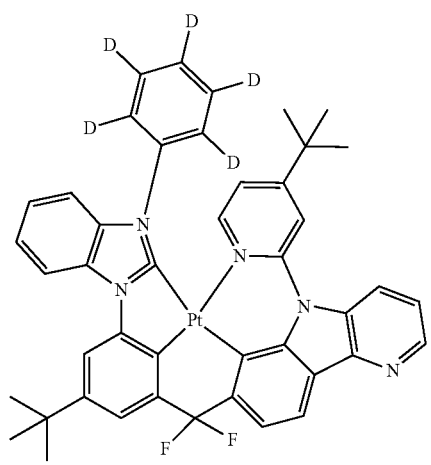
159
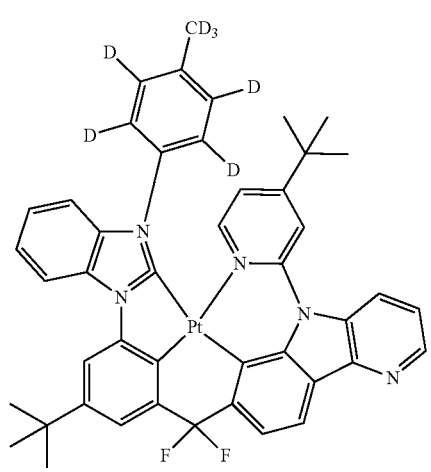
160
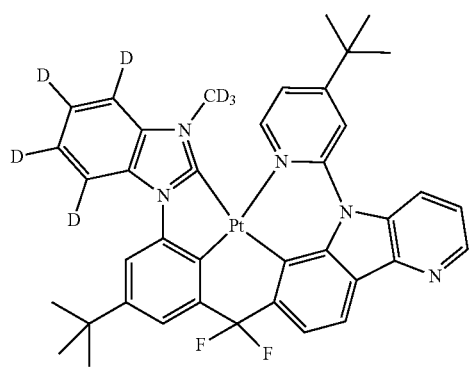
161
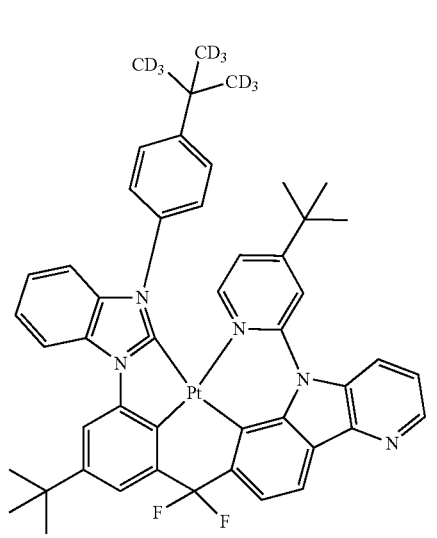
162
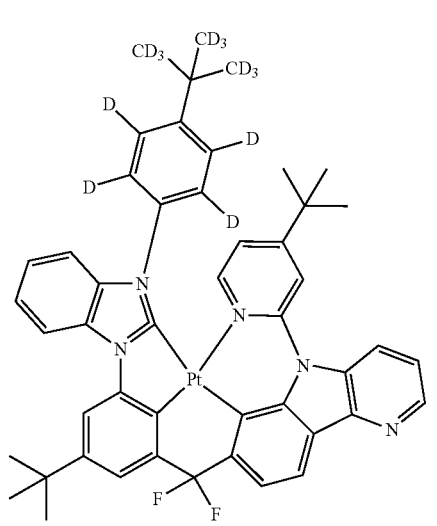

239
-continued
163
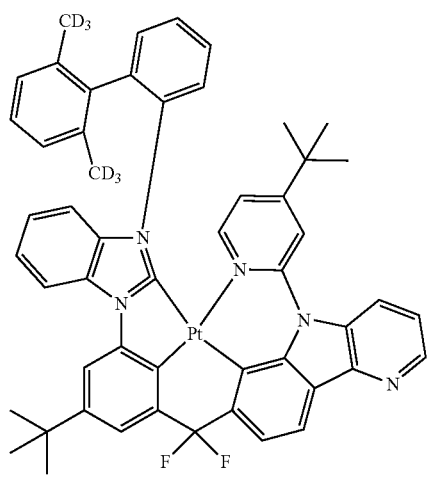
164
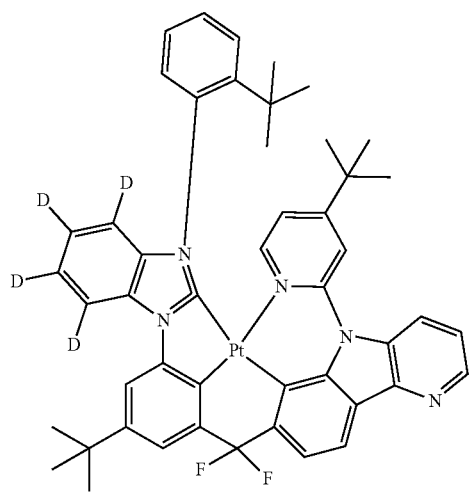
165
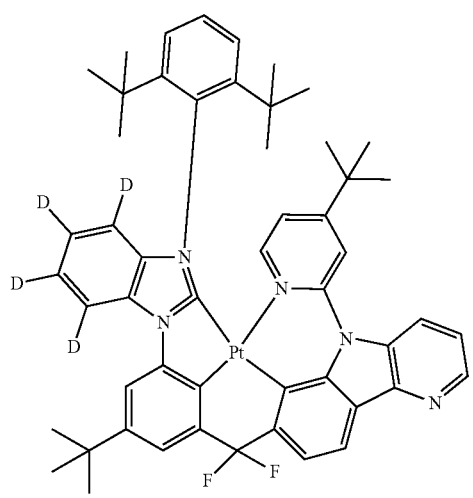
240
-continued
166
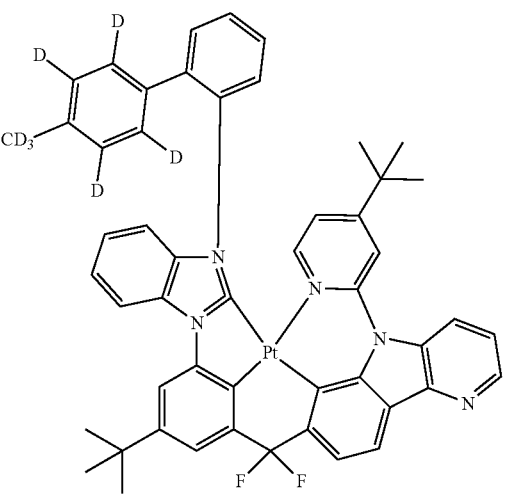
167
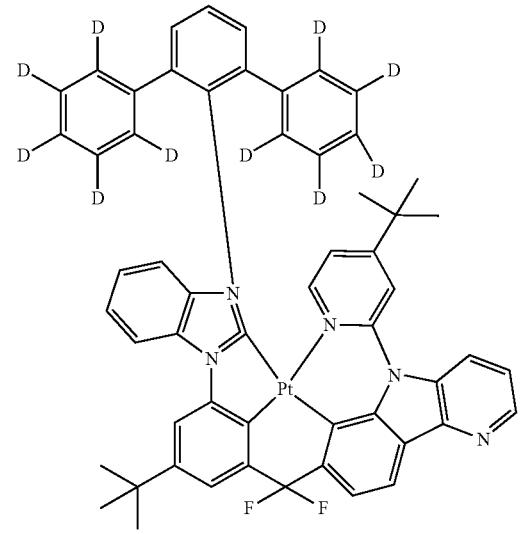
168
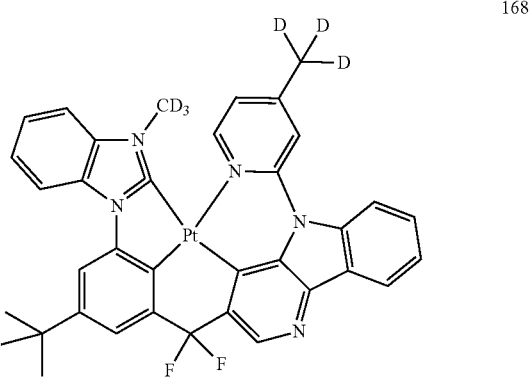

169
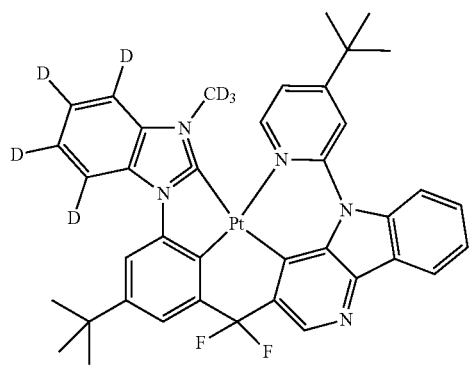
170
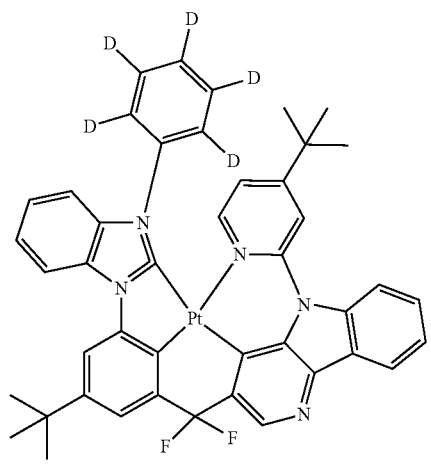
171
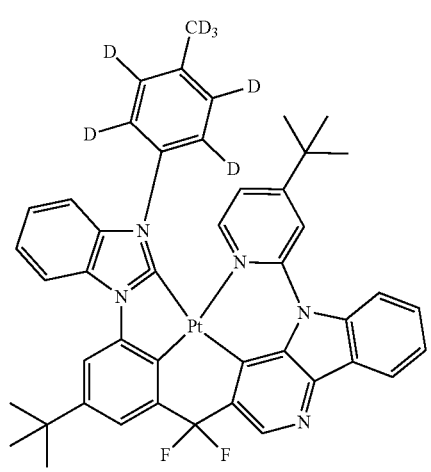
172
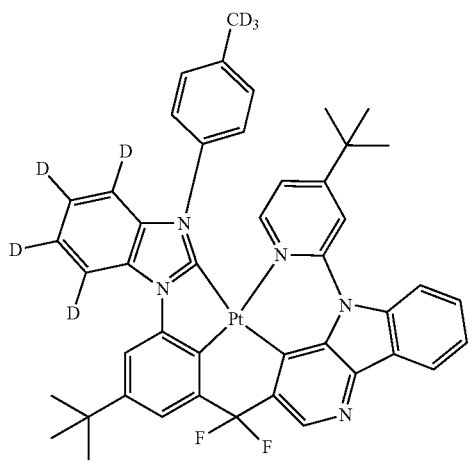
173
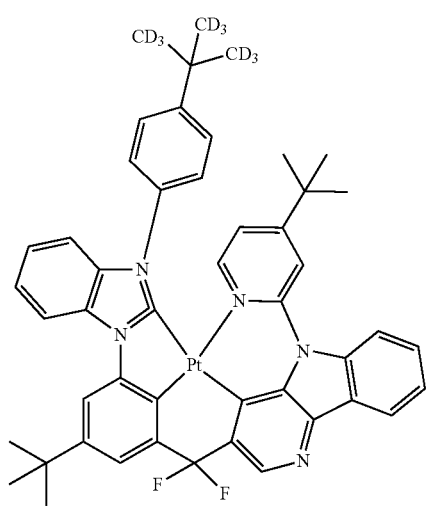
174
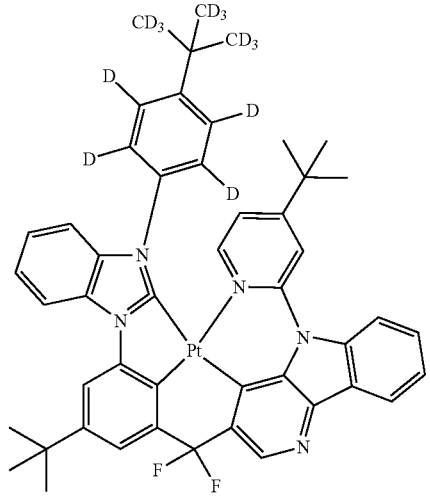

243
-continued
175
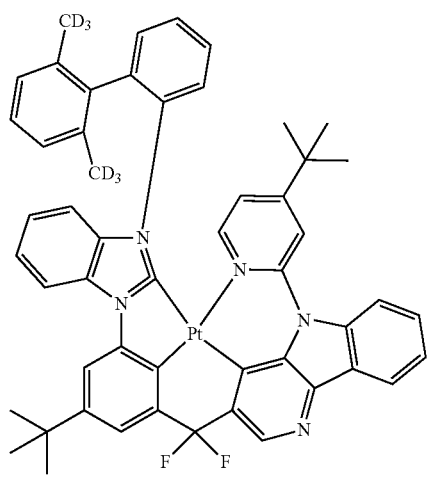
176
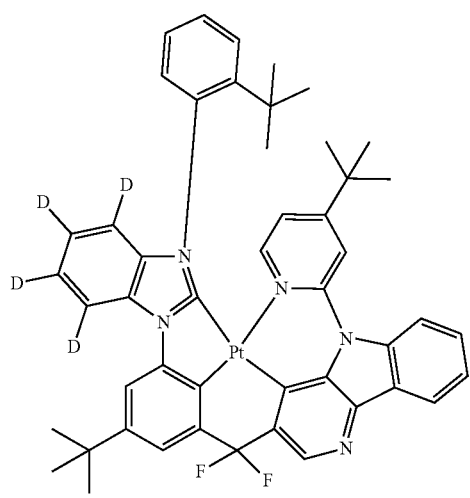
177
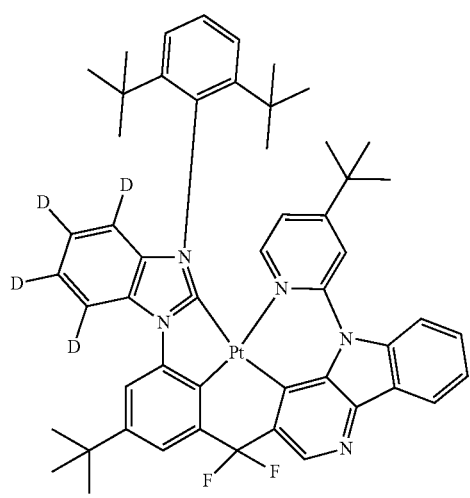
244
-continued
178
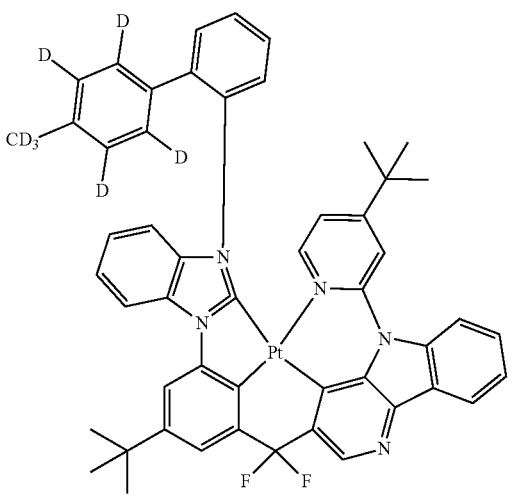
179
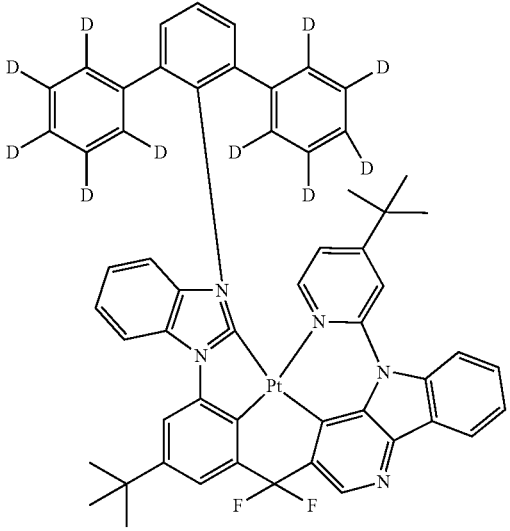
180
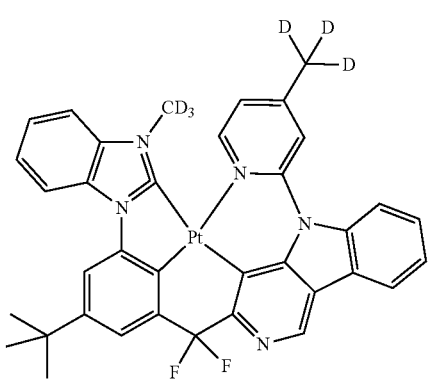

181
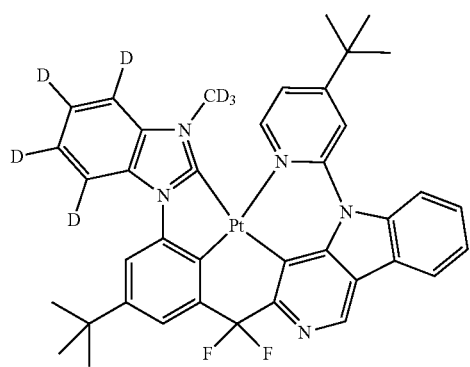
182
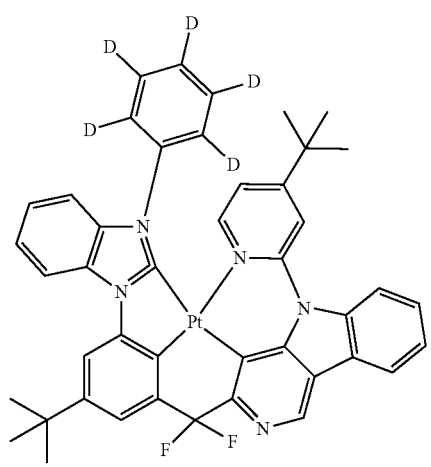
183
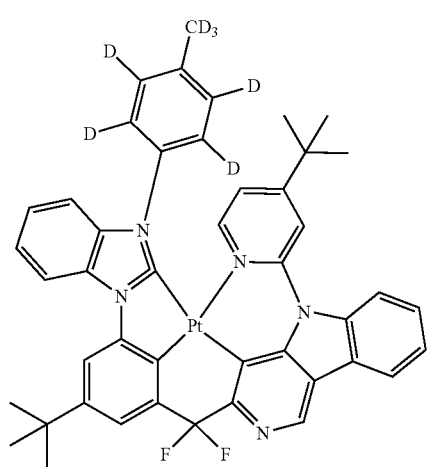
184
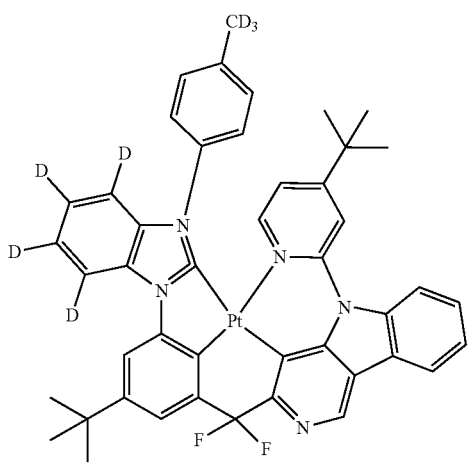
185
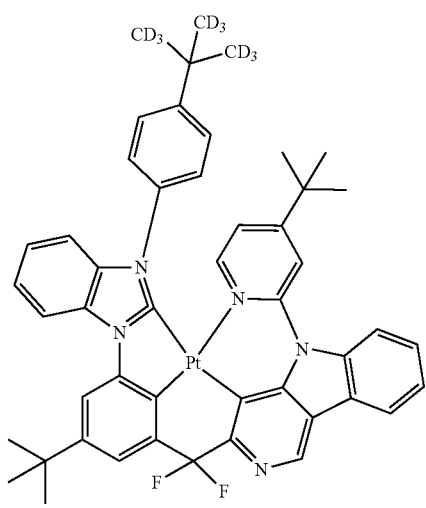
186
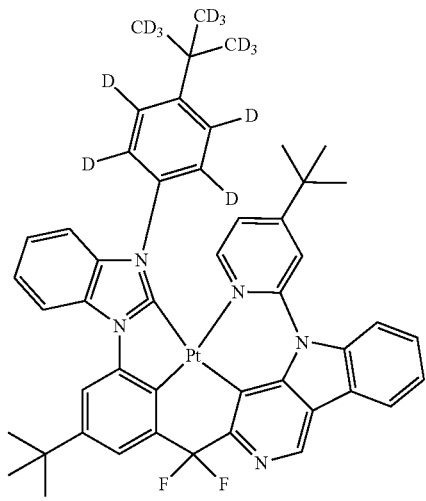

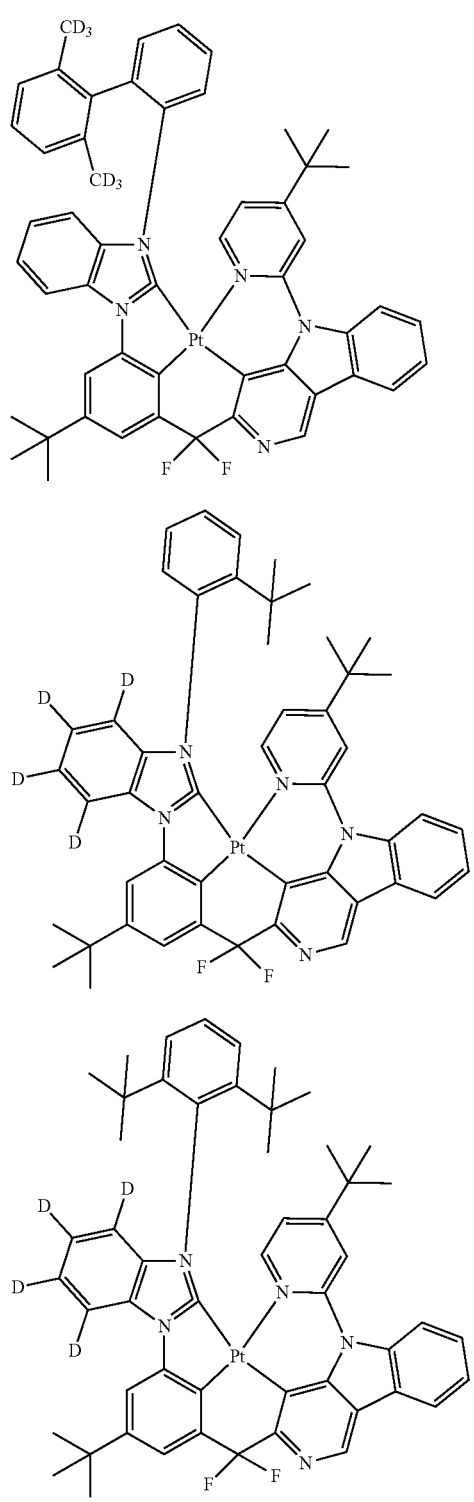
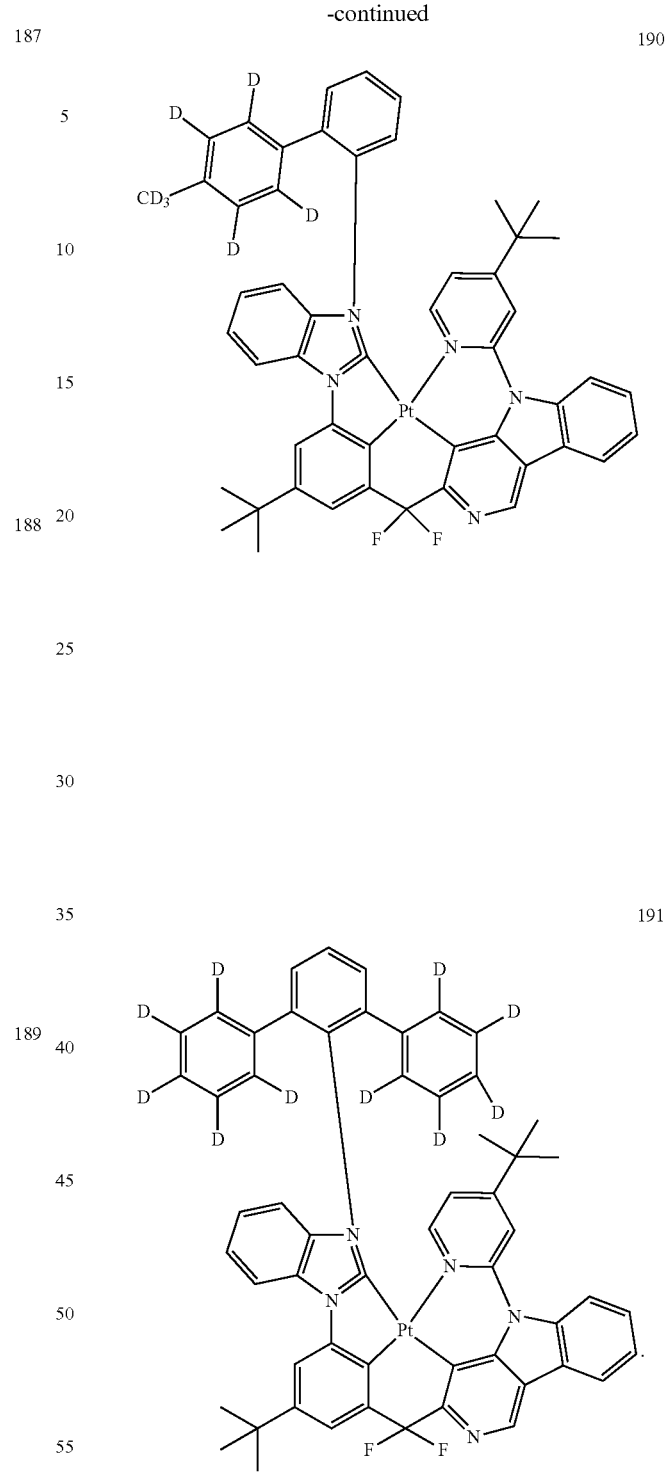

UNITED STATES PATENT AND TRADEMARK OFFICE
CERTIFICATE OF CORRECTION

PATENT NO. : 11,849,630 B2
APPLICATION NO. : 17/074493
DATED : December 19, 2023
INVENTOR(S) : Eunyoung Lee et al.

It is certified that error appears in the above-identified patent and that said Letters Patent is hereby corrected as shown below:

In the Claims

In Column 109, Line 48, in Claim 1, delete "—C=C—," and insert -- —C≡C—, --.

In Column 111, Line 62, in Claim 8, delete "$b_4$" and insert -- b4 --.

In Column 179, Line 9, in Claim 12, delete "$b_1$ to $b_3$" and insert -- b1 to b3 --.

In Column 179, Line 25, in Claim 12, delete "—C=C—," and insert -- —C≡C—, --.

In Column 179, Line 26, in Claim 12, delete "—BRAS—," and insert -- —BR$_{15}$—, --.

Signed and Sealed this
Twentieth Day of August, 2024

Katherine Kelly Vidal
*Director of the United States Patent and Trademark Office*